US011158811B2

(12) United States Patent
Hayashi et al.

(10) Patent No.: US 11,158,811 B2
(45) Date of Patent: Oct. 26, 2021

(54) ORGANIC ELECTROLUMINESCENT DEVICE

(71) Applicants: Hodogaya Chemical Co., Ltd., Tokyo (JP); SFC Co., Ltd., Cheongju-si (KR)

(72) Inventors: Shuichi Hayashi, Tokyo (JP); Naoaki Kabasawa, Tokyo (JP); Daizou Kanda, Tokyo (JP); Shunji Mochizuki, Tokyo (JP); Soon-wook Cha, Cheongju-si (KR); Sang-woo Park, Cheongju-si (KR); Ju-man Song, Cheongju-si (KR); Kyung-seok Jeon, Cheongju-si (KR)

(73) Assignees: Hodogaya Chemical Co., Ltd., Tokyo (JP); SFC Co., Ltd., Cheongju-Si (KR)

( * ) Notice: Subject to any disclaimer, the term of this patent is extended or adjusted under 35 U.S.C. 154(b) by 260 days.

(21) Appl. No.: 15/532,701

(22) PCT Filed: Dec. 1, 2015

(86) PCT No.: PCT/JP2015/083776

§ 371 (c)(1),
(2) Date: Jun. 2, 2017

(87) PCT Pub. No.: WO2016/088759

PCT Pub. Date: Jun. 9, 2016

(65) Prior Publication Data

US 2017/0346015 A1 Nov. 30, 2017

(30) Foreign Application Priority Data

Dec. 5, 2014 (JP) ............................ JP2014-246681

(51) Int. Cl.
*H01L 51/50* (2006.01)
*H01L 51/00* (2006.01)
(Continued)

(52) U.S. Cl.
CPC ........ *H01L 51/0059* (2013.01); *C09B 57/008* (2013.01); *C09K 11/025* (2013.01);
(Continued)

(58) Field of Classification Search
None
See application file for complete search history.

(56) References Cited

U.S. PATENT DOCUMENTS

2004/0170863 A1* 9/2004 Kim ........................ C07C 13/72 428/690
2008/0108839 A1* 5/2008 Yabunouchi ......... C07D 333/58 549/472
(Continued)

FOREIGN PATENT DOCUMENTS

EP 2682997 A1 1/2014
JP 2008-115093 A 5/2008
(Continued)

OTHER PUBLICATIONS

International Search Report dated Feb. 16, 2016, issued for PCT/JP2015/083776.
(Continued)

*Primary Examiner* — Gregory D Clark
(74) *Attorney, Agent, or Firm* — Locke Lord LLP; James E. Armstrong, IV; Nicholas J. DiCeglie, Jr.

(57) ABSTRACT

In the organic electroluminescent device having at least an anode, a hole injection layer, a hole transport layer, a light emitting layer, an electron transport layer and a cathode in this order, the hole injection layer includes an arylamine compound of the following general formula (1) and an electron acceptor.

[Chemical Formula 1]

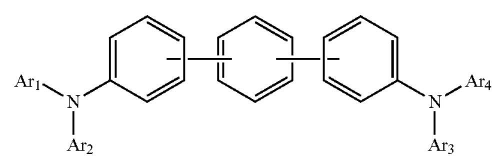

(1)

In the formula, $Ar_1$ to $Ar_4$ may be the same or different, and represent a substituted or unsubstituted aromatic hydrocarbon group, a substituted or unsubstituted aromatic heterocyclic group, or a substituted or unsubstituted condensed polycyclic aromatic group.

20 Claims, 1 Drawing Sheet

(51) Int. Cl.

| | |
|---|---|
| ***C09K 11/06*** | (2006.01) |
| ***C09B 57/00*** | (2006.01) |
| ***C09K 11/02*** | (2006.01) |
| *H01L 51/52* | (2006.01) |

(52) U.S. Cl.

CPC ............ *C09K 11/06* (2013.01); *H01L 51/006* (2013.01); *H01L 51/0052* (2013.01); *H01L 51/0061* (2013.01); *H01L 51/0067* (2013.01); *H01L 51/50* (2013.01); *C09K 2211/1007* (2013.01); *C09K 2211/1011* (2013.01); *C09K 2211/1014* (2013.01); *C09K 2211/1029* (2013.01); *C09K 2211/1088* (2013.01); *C09K 2211/1092* (2013.01); *C09K 2211/1096* (2013.01); *H01L 51/0054* (2013.01); *H01L 51/0058* (2013.01); *H01L 51/0072* (2013.01); *H01L 51/0073* (2013.01); *H01L 51/5012* (2013.01); *H01L 51/5056* (2013.01); *H01L 51/5072* (2013.01); *H01L 51/5088* (2013.01); *H01L 51/5206* (2013.01); *H01L 51/5221* (2013.01)

(56) References Cited

U.S. PATENT DOCUMENTS

| | | | | |
|---|---|---|---|---|
| 2009/0267491 | A1 | 10/2009 | Takashima et al. | |
| 2010/0244008 | A1* | 9/2010 | Lee ...................... | C07D 409/10 257/40 |
| 2012/0181521 | A1* | 7/2012 | Yabunouchi ........ | H01L 51/0061 257/40 |
| 2013/0193414 | A1* | 8/2013 | Werner .................. | C09K 11/06 257/40 |
| 2013/0328040 | A1* | 12/2013 | Yokoyama ............. | C09K 11/06 257/40 |
| 2014/0077200 | A1* | 3/2014 | Yabunouchi ......... | C07D 333/58 257/40 |
| 2015/0034923 | A1* | 2/2015 | Kim .................... | H01L 51/5044 257/40 |
| 2015/0380657 | A1* | 12/2015 | Yokoyama .......... | H01L 51/0059 257/40 |

FOREIGN PATENT DOCUMENTS

| | | | |
|---|---|---|---|
| JP | 5110198 | B1 | 12/2012 |
| JP | 2013-118288 | A | 6/2013 |
| JP | 2013-531360 | A | 8/2013 |
| TW | 201437328 | A | 10/2014 |
| WO | 2011/134458 | A1 | 11/2011 |
| WO | 2012/117973 | A1 | 9/2012 |
| WO | 2013/094951 | A1 | 6/2013 |
| WO | 2014/129201 | A1 | 8/2014 |

OTHER PUBLICATIONS

Supplementary European Search Report dated Jul. 12, 2018, issued for the European patent application No. 15866092.8.

Office Action dated Jul. 11, 2018, issued for the Chinese patent application No. 201580066266.9 and Japanese translation thereof.

Office Action issued in corresponding Taiwanese Patent Application No. TW 104140651, dated Jun. 13, 2019, and the Japanese translation thereof.

* cited by examiner

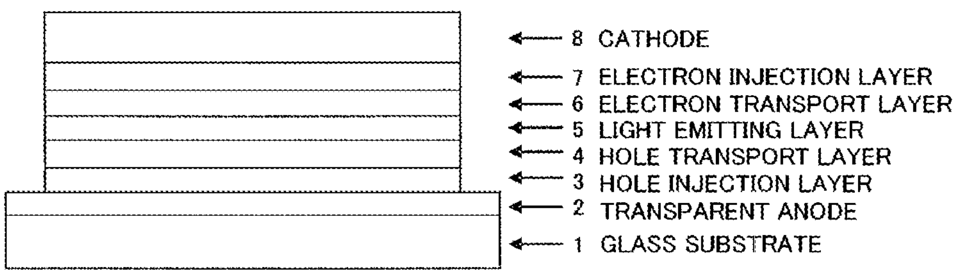
8 CATHODE
7 ELECTRON INJECTION LAYER
6 ELECTRON TRANSPORT LAYER
5 LIGHT EMITTING LAYER
4 HOLE TRANSPORT LAYER
3 HOLE INJECTION LAYER
2 TRANSPARENT ANODE
1 GLASS SUBSTRATE

ORGANIC ELECTROLUMINESCENT DEVICE

CROSS REFERENCE TO RELATED APPLICATIONS

This Application is the National Phase entry under 35 U.S.C. § 371 of PCT International Application No. PCT/JP2015/083776 filed on Dec. 1, 2015 which application claims priority to Japanese Patent Application No. 2014-246681 filed on Dec. 5, 2014. The entire contents of these applications are incorporated herein by reference in their entirety.

TECHNICAL FIELD

The present invention relates to an organic electroluminescent device which is a preferred self-luminous device for various display devices. Specifically, this invention relates to organic electroluminescent devices (hereinafter referred to as organic EL devices) using specific arylamine compounds doped with an electron acceptor.

BACKGROUND ART

The organic EL device is a self-luminous device and has been actively studied for their brighter, superior visibility and the ability to display clearer images in comparison with liquid crystal devices.

In 1987, C. W. Tang and colleagues at Eastman Kodak developed a laminated structure device using materials assigned with different roles, realizing practical applications of an organic EL device with organic materials. These researchers laminated an electron-transporting phosphor and a hole-transporting organic substance, and injected both charges into a phosphor layer to cause emission in order to obtain a high luminance of 1,000 cd/$m^2$ or more at a voltage of 10 V or less (refer to Patent Documents 1 and 2, for example).

To date, various improvements have been made for practical applications of the organic EL device, Various roles of the laminated structure are further subdivided to provide an electroluminescence device that includes an anode, a hole injection layer, a hole transport layer, a light emitting layer, an electron transport layer, an electron injection layer, and a cathode successively formed on a substrate, and high efficiency and durability have been achieved by the electroluminescence device (refer to Non-Patent Document 1, for example).

Further, there have been attempts to use triplet excitons for further improvements of luminous efficiency, and the use of a phosphorescence-emitting compound has been examined (refer to Non-Patent Document 2, for example).

Devices that use light-emission caused by thermally activated delayed fluorescence (TADF) have also been developed. In 2011, Adachi et al. at Kyushu University, National University Corporation realized 5.3% external quantum efficiency with a device using a thermally activated delayed fluorescent material (refer to Non-Patent Document 3, for example).

The light emitting layer can be also fabricated by doping a charge-transporting compound generally called a host material, with a fluorescent compound, a phosphorescence-emitting compound, or a delayed fluorescent-emitting material. As described in the Non-Patent Document, the selection of organic materials in an organic EL device greatly influences various device characteristics such as efficiency and durability (refer to Non-Patent Document 2, for example).

In an organic EL device, charges injected from both electrodes recombine in a light emitting layer to cause emission. What is important here is how efficiently the hole and electron charges are transferred to the light emitting layer in order to form a device having excellent carrier balance. The probability of hole-electron recombination can be improved by improving hole injectability and electron blocking performance of blocking injected electrons from the cathode, and high luminous efficiency can be obtained by confining excitons generated in the light emitting layer. The role of a hole transport material is therefore important, and there is a need for a hole transport material that has high hole injectability, high hole mobility, high electron blocking performance, and high durability to electrons.

Heat resistance and amorphousness of the materials are also important with respect to the lifetime of the device. The materials with low heat resistance cause thermal decomposition even at a low temperature by heat generated during the drive of the device, which leads to the deterioration of the materials. The materials with low amorphousness cause crystallization of a thin film even in a short time and lead to the deterioration of the device. The materials in use are therefore required to have characteristics of high heat resistance and satisfactory amorphousness.

N,N'-diphenyl-N,N'-di(α-naphthyl)benzidine (NPD) and various aromatic amine derivatives are known as the hole transport materials used for the organic EL device (refer to Patent Documents 1 and 2, for example). Although NPD has desirable hole transportability, its glass transition point (Tg), which is an index of heat resistance, is as low as 96° C., which causes the degradation of device characteristics by crystallization under a high-temperature condition (refer to Non-Patent Document 4, for example). The aromatic amine derivatives described in the Patent Documents include a compound known to have an excellent hole mobility of 10-3 $cm^2$/Vs or higher (refer to Patent Documents 1 and 2, for example). However, since the compound is insufficient in terms of electron blocking performance, some of the electrons pass through the light emitting layer, and improvements in luminous efficiency cannot be expected. For such a reason, a material with higher electron blocking performance, a more stable thin-film state and higher heat resistance is needed for higher efficiency. Although an aromatic amine derivative having high durability is reported (refer to Patent Document 3, for example), the derivative is used as a charge transporting material used in an electrophotographic photoconductor, and there is no example of using the derivative in the organic EL device.

Arylamine compounds having a substituted carbazole structure are proposed as compounds improved in the characteristics such as heat resistance and hole injectability (refer to Patent Documents 4 and 5, for example). Further, it is proposed that hole injectability can be improved by p-doping materials such as trisbromophenylamine hexachloroantimony, radialene derivatives, and F4-TCNQ into a material commonly used for the hole injection layer or the hole transport layer (refer to Patent Document 6 and Non-Patent Document 5). However, while the devices using these compounds for the hole injection layer or the hole transport layer have been improved in lower driving voltage and heat resistance, luminous efficiency and the like, the improvements are still insufficient. Further lower driving voltage and higher luminous efficiency are therefore needed.

In order to improve characteristics of the organic EL device and to improve the yield of the device production, it has been desired to develop a device having high luminous efficiency, low driving voltage and a long lifetime by using in combination the materials that excel in hole and electron injection/transport performances, stability as a thin film and durability, permitting holes and electrons to be highly efficiently recombined together.

Further, in order to improve characteristics of the organic EL device, it has been desired to develop a device that maintains carrier balance and has high efficiency, low driving voltage and a long lifetime by using in combination the materials that excel in hole and electron injection/transport performances, stability as a thin film and durability.

CITATION LIST

Patent Documents

Patent Document 1: JP-A-8-048656
Patent Document 2: Japanese Patent No. 3194657
Patent Document 3: Japanese Patent No. 4943840
Patent Document 4: JP-A-2006-151979
Patent Document 5: WO2008/62636
Patent Document 6: WO2014/009310
Patent Document 7: WO2005/115970
Patent Document 8: JP-A-7-126615
Patent Document 9: JP-A-8-048656
Patent Document 10: JP-A-2005-108804
Patent Document 11: WO2011/059000
Patent Document 12: WO2003/060956
Patent Document 13: KR-A-2013-060157

Non-Patent Documents

Non-Patent Document 1: The Japan Society of Applied Physics, 9th Lecture Preprints, pp. 55 to 61 (2001)
Non-Patent Document 2: The Japan Society of Applied Physics, 9th Lecture Preprints, pp. 23 to 31 (2001)
Non-Patent Document 3: Appl. Phys. Let., 98, 083302 (2011)
Non-Patent Document 4: Organic EL Symposium, the 3rd Regular presentation Preprints, pp. 13 to 14 (2006)
Non-Patent Document 5: Appl. Phys. Let., 89, 253506 (2006)

SUMMARY OF THE INVENTION

Technical Problem

An object of the present invention is to provide an organic EL device having low driving voltage, high luminous efficiency and a long lifetime, by combining various materials for an organic EL device, which are excellent, as materials for an organic EL device having high luminous efficiency and high durability, in hole and electron injection/transport performances, electron blocking ability, stability in a thin-film state and durability, so as to allow the respective materials to effectively reveal their characteristics.

Physical properties of the organic EL device to be provided by the present invention include (1) low turn on voltage, (2) low actual driving voltage, (3) high luminous efficiency and high power efficiency, and (4) a long lifetime.

Solution to Problem

For achieving the object, the present inventors, who pay attention to the fact that an arylamine compound doped with an electron acceptor is excellent in the hole injection/transport performances and the stability and durability of the thin film, select a particular arylamine compound (having a particular-structure), so as to perform efficiently injection/transport of holes from the anode, and produce various organic EL devices having a material of a hole injection layer doped with an electron acceptor, and the devices are earnestly evaluated for characteristics. Furthermore, the inventors produce various organic EL devices having a combination of a particular arylamine compound (having a particular structure) doped with an electron acceptor and a particular arylamine compound (having a particular structure) not doped with an electron acceptor, and the devices are earnestly evaluated for characteristics. As a result, the present invention has been completed.

According to the present invention, the following organic EL devices are provided.

1) An organic electroluminescent device having at least an anode, a hole injection layer, a hole transport layer, a light emitting layer, an electron transport layer, and a cathode, in this order, wherein the hole injection layer includes an arylamine compound of the following general formula (1) and an electron acceptor:

[Chemical Formula 1]

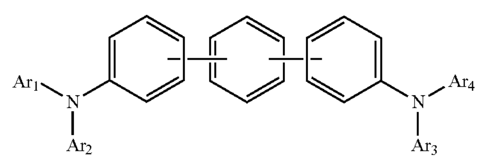

(1)

In the formula, $Ar_1$ to $Ar_4$ may be the same or different, and represent a substituted or unsubstituted aromatic hydrocarbon group, a substituted or unsubstituted aromatic heterocyclic group, or a substituted or unsubstituted condensed polycyclic aromatic group.

2) The organic electroluminescent device of 1), wherein the layers that are adjacent to the light emitting layer do not include an electron acceptor.

3) The organic EL device of 1) or 2), wherein the electron acceptor is an electron acceptor selected from trisbromophenylamine hexachloroantimony, tetracyanoquinodimethane (TCNQ), 2,3,5,6-tetrafluoro-tetracyano-1,4-benzoquinodimethane (F4TCNQ), and a radialene derivative.

4) The organic EL device of any one of 1) to 3), wherein the electron acceptor is a radialene derivative of the following general formula (2):

[Chemical Formula 2]

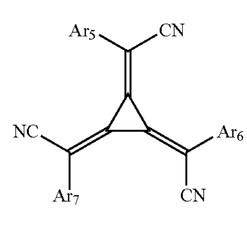

(2)

In the formula, $Ar_5$ to $Ar_7$ may be the same or different, and represent an aromatic hydrocarbon group, an aromatic heterocyclic group, or a condensed polycyclic aromatic group, having an electron acceptor group as a substituent.

5) The organic EL device of any one of 1) to 4), wherein the hole transport layer includes an arylamine compound having a structure in which two to six triphenylamine structures are joined within a molecule via a single bond or a divalent group that does not contain a heteroatom.

6) The organic EL device of 5), wherein the arylamine compound having a structure in which two to six triphenylamine structures are joined within a molecule via a single bond or a divalent group that does not contain a heteroatom is an arylamine compound of the following general formula (3).

[Chemical Formula 3]

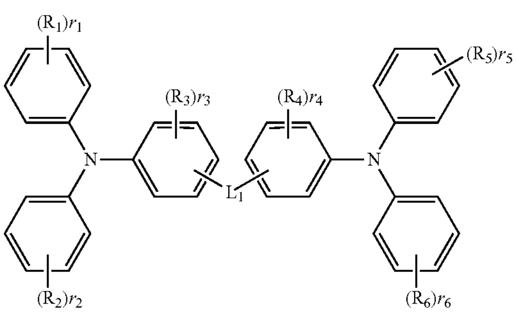

(3)

In the formula, $R_1$ to $R_6$ represent a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy. $r_1$ to $r_6$ may be the same or different, $r_1$, $r_2$, $r_5$, and $r_6$ representing an integer of 0 to 5, and $r_3$ and $r_4$ representing an integer of 0 to 4. When $r_1$, $r_2$, $r_5$, and $r_6$ are an integer of 2 to 5, or when $r_3$ and $r_4$ are an integer of 2 to 4, $R_1$ to $R_6$, a plurality of which bind to the same benzene ring, may be the same or different and may bind to each other via a single bond, substituted or unsubstituted methylene, an oxygen atom, or a sulfur atom to form a ring. $L_1$ represents a divalent linking group.

7) The organic EL device of 5), wherein the arylamine compound having a structure in which two to six triphenylamine structures are joined within a molecule via a single bond or a divalent group that does not contain a heteroatom is an arylamine compound of the following general formula (4).

[Chemical Formula 4]

(4)

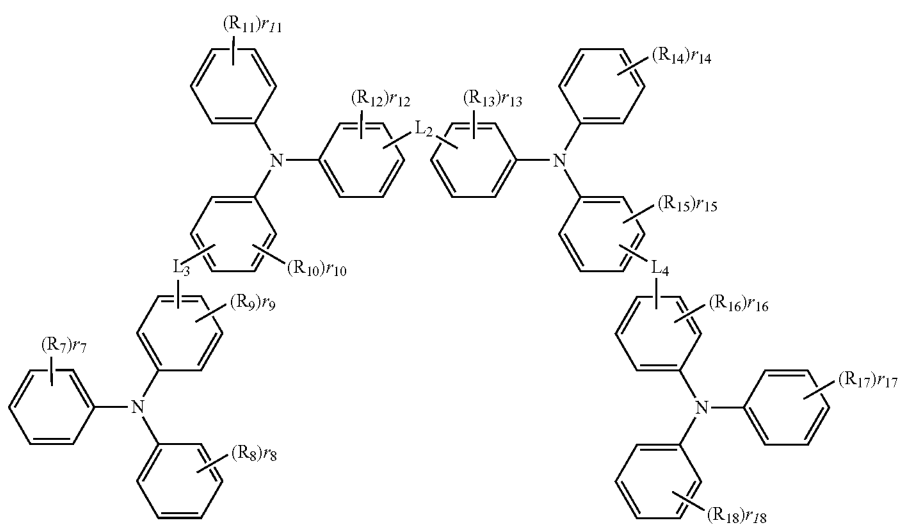

In the formula, $R_7$ to $R_{18}$ represent a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy. $r_7$ to $r_{18}$ may be the same or different, $r_7$, $r_8$, $r_{11}$, $r_{14}$, $r_{17}$, and $r_{18}$ representing an integer of 0 to 5, and $r_9$, $r_{10}$, $r_{12}$, $r_{13}$, $r_{15}$, and $r_{16}$ representing an integer of 0 to 4. When $r_7$, $r_8$, $r_{11}$, $r_{14}$, $r_{17}$, and ria are an integer of 2 to 5, or when $r_9$, $r_{10}$, $r_{12}$, $r_{13}$, $r_{15}$, and $r_{16}$ are an integer of 2 to 4, $R_7$ to $R_{18}$, a plurality of which bind to the same benzene ring, may be the same or different and may bind to each other via a single bond, substituted or unsubstituted methylene, an oxygen atom, or a sulfur atom to form a ring. $L_2$, $L_3$, and $L_4$ may be the same or different, and represent a divalent linking group or a single bond.

8) The organic EL device of any one of 1) to 7), wherein the electron transport layer includes a compound of the following general formula (5) having an anthracene ring structure.

[Chemical Formula 5]

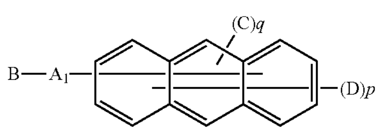

(5)

In the formula, $A_1$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond. B represents a substituted or unsubstituted aromatic heterocyclic group. C represents a substituted or unsubstituted aromatic hydrocarbon group, a substituted or unsubstituted aromatic heterocyclic group, or a substituted or unsubstituted condensed polycyclic aromatic group. D may be the same or different, and represents a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group. p represents 7 or 8, and q represents 1 or 2 while maintaining a relationship that a sum of p and q is 9.

9) The organic EL device of any one of 1) to 7), wherein the electron transport layer includes a compound of the following general formula (6) having a pyrimidine ring structure.

[Chemical Formula 6]

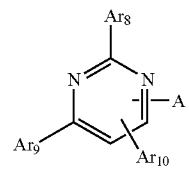

(6)

In the formula, $Ar_8$ represents a substituted or unsubstituted aromatic hydrocarbon group, a substituted or unsubstituted aromatic heterocyclic group, or a substituted or unsubstituted condensed polycyclic aromatic group. $Ar_9$ and $Ar_{10}$ may be the same or different, and represent a hydrogen atom, a substituted or unsubstituted aromatic hydrocarbon group, a substituted or unsubstituted aromatic heterocyclic group, or a substituted or unsubstituted condensed polycyclic aromatic group. A represents a monovalent group of the following structural formula (7). Herein, $Ar_9$ and $Ar_{10}$ are not simultaneously a hydrogen atom.

[Chemical Formula 7]

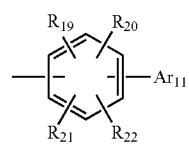

(7)

In the formula, $Ar_{11}$ represents a substituted or unsubstituted aromatic heterocyclic group. $R_{19}$ to $R_{22}$ may be the same or different, and represent a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group, where $R_{19}$ to $R_{22}$ may bind to $Ar_{11}$ via a single bond, substituted or unsubstituted methylene, an oxygen atom, or a sulfur atom to form a ring.

10) The organic EL device of any one of 1) to 9), wherein the light emitting layer includes a blue light emitting dopant.

11) The organic EL device of 10), wherein the light emitting layer includes a pyrene derivative as the blue light emitting dopant.

12) The organic EL device of 10), wherein the blue light emitting dopant includes a light emitting dopant which is an amine derivative having a condensed ring structure of the following general formula (8).

[Chemical Formula 8]

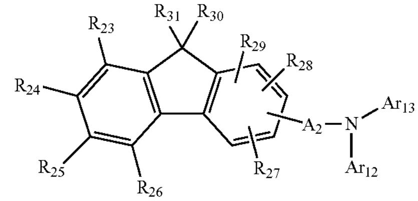

(8)

In the formula, $A_2$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond. $Ar_{12}$ and $Ar_{13}$ may be the same or different, represent a substituted or unsubstituted aromatic hydrocarbon group, a substituted or unsubstituted aromatic heterocyclic group, or a substituted or unsubstituted condensed polycyclic aromatic group, and may bind to each other via a single bond, substituted or unsubstituted methylene, an oxygen atom, or a sulfur atom to form a ring. $R_{23}$ to $R_{26}$ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, substituted or unsubstituted aryloxy, or a disubstituted amino group substituted by groups selected from an aromatic hydrocarbon group, an aromatic heterocyclic group, and a condensed polycyclic aromatic group, where these groups may bind to each other via a single bond, substituted or unsubstituted methylene, an oxygen atom, or a sulfur atom to form a ring, and may bind to the benzene ring binding to $R_{23}$ to $R_{26}$ via substituted or unsubstituted methylene, an oxygen atom, a sulfur atom, or a monosubstituted amino group to form a ring. $R_{27}$ to $R_{29}$ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy, where these groups may bind to each other via a single bond, substituted or unsubstituted methylene, an oxygen atom, or a sulfur atom to form a ring, and may bind to the benzene ring binding to $R_{27}$ to $R_{29}$ via substituted or unsubstituted methylene, an oxygen atom, a sulfur atom, or a monosubstituted amino group to form a ring. $R_{30}$ and $R_{31}$ may be the same or different, and represent linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy, where these groups may bind to each other via a single bond, substituted or unsubstituted methylene, an oxygen atom, a sulfur atom, or a monosubstituted amino group to form a ring.

13) The organic EL device of any one of 1) to 12), wherein the light emitting layer includes an anthracene derivative.

14) The organic EL device of 13), wherein the light emitting layer includes a host material which is the anthracene derivative.

Specific examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1) include phenyl, biphenylyl, terphenylyl, naphthyl, anthracenyl, phenanthrenyl, fluorenyl, indenyl, pyrenyl, perylenyl, fluoranthenyl, triphenylenyl, pyridyl, pyrimidinyl, triazinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, naphthyridinyl, phenanthrolinyl, acridinyl, and carbolinyl.

Specific examples of the "substituent" in the "substituted aromatic hydrocarbon group", the "substituted aromatic heterocyclic group", or the "substituted condensed polycyclic aromatic group" represented by $Ar_1$ to $Ar_4$ in the general formula (1) include a deuterium atom; cyano; nitro; halogen atoms such as a fluorine atom, a chlorine atom, a bromine atom, and an iodine atom; linear or branched alkyls of 1 to 6 carbon atoms such as methyl, ethyl, n-propyl, isopropyl, n-butyl, isobutyl, tert-butyl, n-pentyl, isopentyl, neopentyl, and n-hexyl; linear or branched alkyloxys of 1 to 6 carbon atoms such as methyloxy, ethyloxy, and propyloxy; alkenyls such as allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; aromatic heterocyclic groups such as pyridyl, pyrimidinyl, triazinyl, thienyl, furyl, pyrrolyl, quinolyl, isoquinolyl, benzofuranyl, benzothienyl, indolyl-, carbazolyl, benzoxazolyl, benzothiazolyl, quinoxalinyl, benzoimidazolyl, pyrazolyl, dibenzofuranyl, dibenzothienyl, and carbolinyl; arylvinyls such as styryl and naphthylvinyl; acyls such as acetyl and benzoyl; and silyls, such as trimethylsilyl and triphenylsilyl. These substituents may be further substituted with the exemplified substituents above. These substituents may bind to each other via a single bond, substituted or unsubstituted methylene, an oxygen atom, or a sulfur atom to form a ring.

Specific examples of the "electron acceptor group" in the "aromatic hydrocarbon group, aromatic heterocyclic group, or condensed polycyclic aromatic ring having an electron acceptor group as a substituent" represented by $Ar_5$ to $Ar_7$ in the general formula (2) include a fluorine atom, a chlorine atom, a bromine atom, cyano, trimethylfluoro, and nitro.

Examples of the "aromatic hydrocarbon group", the "aromatic heterocyclic group", or the "condensed polycyclic aromatic group" in the "aromatic hydrocarbon group, aromatic heterocyclic group, or condensed polycyclic aromatic ring having an electron acceptor group as a substituent" represented by $Ar_5$ to $Ar_7$ in the general formula (2) include the same groups exemplified as the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1).

These groups may have a substituent, in addition to the electron acceptor group, and specific examples of the substituent include a deuterium atom; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; and aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl. These substituents may be further substituted with the exemplified substituents or electron acceptor groups above. These substituents may bind to each other via a single bond, substituted or unsubstituted methylene, an oxygen atom, or a sulfur atom to form a ring.

Specific examples of the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_1$ to $R_6$ in the general formula (3) include methyl, ethyl, n-propyl, isopropyl, n-butyl, isobutyl, tert-butyl, n-pentyl, isopentyl, neopentyl, n-hexyl, cyclopentyl, cyclohexyl, 1-adamantyl, 2-adamantyl, vinyl, allyl, isopropenyl, and 2-butenyl. These groups may bind to each other via a single bond, substituted or unsubstituted methylene, an oxygen atom, or a sulfur atom to form a ring.

Specific examples of the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_1$ to $R_6$ in the general formula (3) include a deuterium atom; cyano; nitro; halogen atoms such as a fluorine atom, a chlorine atom, a bromine atom, and an iodine atom; linear or branched alkyloxys of 1 to 6 carbon atoms such as methyloxy, ethyloxy, and propyloxy; alkenyls such as allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; and aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl. These substituents may be further substituted with the exemplified substituents above. These substituents may bind to each other via a single bond, substituted or unsubstituted methylene, an oxygen atom, or a sulfur atom to form a ring.

Specific examples of the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent" or the "cycloalkyloxy of 5 to 10 carbon atoms that may have a substituent" represented by $R_1$ to $R_6$ in the general formula (3) include methyloxy, ethyloxy, n-propyloxy, isopropyloxy, n-butyloxy, tert-butyloxy, n-pentyloxy, n-hexyloxy, cyclopentyloxy, cyclohexyloxy, cycloheptyloxy, cyclooctyloxy, 1-adamantyloxy, and 2-adamantyloxy. These groups may bind to each other via a single bond, substituted or unsubstituted methylene, an oxygen atom, or a sulfur atom to form a ring.

These groups may have a substituent. Examples of the substituent include the same groups exemplified as the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_1$ to $R_6$ in the general formula (3), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_1$ to $R_6$ in the general formula (3) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1). These groups may bind to each other via a single bond, substituted or unsubstituted methylene, an oxygen atom, or a sulfur atom to form a ring.

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Specific examples of the "aryloxy group" in the "substituted or unsubstituted aryloxy group" represented by $R_1$ to $R_6$ in the general formula (3) include phenyloxy, biphenylyloxy, terphenylyloxy, naphthyloxy, anthracenyloxy, phenanthrenyloxy, fluorenyloxy, indenyloxy, pyrenyloxy, and perylenyloxy. These groups may bind to each other via a single bond, substituted or unsubstituted methylene, an oxygen atom, or a sulfur atom to form a ring.

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

In the general formula (3), $r_1$ to $r_6$ may be the same or different, $r_1$, $r_2$, $r_5$, and $r_6$ representing an integer of 0 to 5, and $r_3$ and $r_4$ representing an integer of 0 to 4. When $r_1$, $r_2$, $r_5$, and $r_6$ are an integer of 2 to 5, or when $r_3$ and $r_4$ are an integer of 2 to 4, $R_1$ to $R_6$, a plurality of which bind to the same benzene ring, may be the same or different and may bind to each other via a single bond, substituted or unsubstituted methylene, an oxygen atom, or a sulfur atom to form a ring.

Examples of the "divalent linking group" represented by $L_1$ in the general formula (3) include "linear or branched alkylenes of 1 to 6 carbon atoms", such as methylene, ethylene, propylene, isopropylene, n-butylene, isobutylene, tert-butylene, n-pentylene, isopentylene, neopentylene, and n-hexylene; "cycloalkylenes of 5 to 10 carbon atoms", such as cyclopentylene, cyclohexylene, and adamantylene; "linear or branched alkenylenes of 2 to 6 carbon atoms", such as vinylene, arylene, isopropenylene, and butenylene; "divalent groups of aromatic hydrocarbons" that result from the removal of two hydrogen atoms from aromatic hydrocarbons, such as benzene, biphenyl, terphenyl, and tetrakisphenyl; and "divalent groups of condensed polycyclic aromatics" that result from the removal of two hydrogen atoms from condensed polycyclic aromatics, such as naphthalene, anthracene, acenaphthalene, fluorene, phenanthrene, indane, pyrene, and triphenylene.

These divalent groups may have a substituent. Examples of the substituent of the "linear or branched alkylene of 1 to 6 carbon atoms", the "cycloalkylene of 5 to 10 carbon atoms", or the "linear or branched alkenylene of 2 to 6 carbon atoms" include the same groups exemplified as the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_1$ to $R_6$ in the general formula (3), and examples of the substituent in the "divalent group of aromatic hydrocarbons" or the "divalent group of condensed polycyclic aromatics" include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1).

Examples of the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_7$ to $R_{18}$ in the general formula (4) include the same groups exemplified as the groups for the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_1$ to $R_6$ in the general formula (3), and possible embodiments may also be the same embodiments as the exemplified embodiments.

Examples of the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent" or the "cycloalkyloxy of 5 to 10 carbon atoms that may have a substituent" represented by $R_7$ to $R_{18}$ in the general formula (4) include the same groups exemplified as the groups for the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent" or the "cycloalkyloxy of 5 to 10 carbon atoms that may have a substituent" represented by $R_1$ to $R_6$ in the general formula (3), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_7$ to $R_{18}$ in the general formula (4) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1). These groups may bind to each other via a single bond, substituted or unsubstituted methylene, an oxygen atom, or a sulfur atom to form a ring.

These groups may have a substituent, and examples of the substituent include the same substituents exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Examples of the "aryloxy" in the "substituted or unsubstituted aryloxy" represented by $R_7$ to $R_{18}$ in the general formula (4) include the same groups exemplified as the groups for the "aryloxy" in the "substituted or unsubstituted aryloxy" represented by $R_1$ to $R_6$ in the general formula (3), and possible embodiments may also be the same embodiments as the exemplified embodiments.

In the general formula (4), $r_7$ to $r_{18}$ may be the same or different, $r_7$, $r_5$, $r_{11}$, $r_{14}$, $r_{17}$, and $r_{18}$ representing an integer of 0 to 5, and $r_9$, $r_{10}$, $r_{12}$, $r_{13}$, $r_{15}$ and $r_{16}$ representing an integer of 0 to 4. When $r_7$, $r_8$, $r_{11}$, $r_{14}$, $r_{17}$, and $r_{18}$ is an integer of 2 to 5, or $r_9$, $r_{10}$, $r_{12}$, $r_{13}$, $r_{15}$ and $r_{16}$ is an integer of 2 to 4, $R_7$ to $R_{18}$, a plurality of which bind to the same benzene ring, may be the same or different and may bind to each other via a single bond, substituted or unsubstituted methylene, an oxygen atom, or a sulfur atom to form a ring.

Examples of the "divalent linking group" represented by $L_2$, $L_3$, and $L_4$ in the general formula (4) include the same groups exemplified as the groups for the "divalent linking group" represented by $L_1$ in the general formula (3), and possible embodiments may also be the same embodiments as the exemplified embodiments.

Specific examples of the "aromatic hydrocarbon", the "aromatic heterocyclic ring", or the "condensed polycyclic aromatics" of the "substituted or unsubstituted aromatic hydrocarbon", the "substituted or unsubstituted aromatic heterocyclic ring", or the "substituted or unsubstituted condensed polycyclic aromatics" in the "divalent group of a substituted or unsubstituted aromatic hydrocarbon", the "divalent group of a substituted or unsubstituted aromatic heterocyclic ring", or the "divalent group of substituted or unsubstituted condensed polycyclic aromatics" represented by $A_1$ in the general formula (5) include benzene, biphenyl, terphenyl, tetrakisphenyl, styrene, naphthalene, anthracene, acenaphthalene, fluorene, phenanthrene, indane, pyrene, triphenylene, pyridine, pyrimidine, triazine, pyrrole, furan, thiophene, quinoline, isoquinoline, benzofuran, benzothiophene, indoline, carbazole, carboline, benzoxazole, benzothiazole, quinoxaline, benzimidazole, pyrazole, dibenzofuran, dibenzothiophene, naphthyridine, phenanthroline, and acridine.

The "divalent group of a substituted or unsubstituted aromatic hydrocarbon", the "divalent group of a substituted or unsubstituted aromatic heterocyclic ring", or the "divalent group of substituted or unsubstituted condensed polycyclic aromatics" represented by $A_1$ in the general formula (5) is a divalent group that results from the removal of two hydrogen atoms from the above "aromatic hydrocarbon", "aromatic heterocyclic ring", or "condensed polycyclic aromatics".

These divalent groups may have a substituent, and examples of the substituent include the same substituents exemplified as the "substituent" in the "substituted aromatic hydrocarbon group", the "substituted aromatic heterocyclic group", or the "substituted condensed polycyclic aromatic group" represented by $Ar_1$ to $Ar_2$ in the general formula (1), and possible embodiments may also be the same embodiments as the exemplified embodiments.

Specific examples of the "aromatic heterocyclic group" in the "substituted or unsubstituted aromatic heterocyclic group" represented by B in the general formula (5) include triazinyl, pyridyl, pyrimidinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, naphthyridinyl, phenanthrolinyl, acridinyl, and carbolinyl.

Specific examples of the "substituent" in the "substituted aromatic heterocyclic group" represented by B in the general formula (5) include a deuterium atom; cyano; nitro; halogen atoms such as a fluorine atom, a chlorine atom, a bromine atom, and an iodine atom; linear or branched alkyls of 1 to 6 carbon atoms such as methyl, ethyl, n-propyl, isopropyl, n-butyl, isobutyl, tert-butyl, n-pentyl, isopentyl, neopentyl, and n-hexyl; cycloalkyls of 5 to 10 carbon atoms such as cyclopentyl, cyclohexyl, 1-adamantyl, and 2-adamantyl; linear or branched alkyloxys of 1 to 6 carbon atoms such as methyloxy, ethyloxy, and propyloxy; cycloalkyloxys of 5 to 10 carbon atoms such as cyclopentyloxy, cyclohexyloxy, 1-adamantyloxy, and 2-adamantyloxy; alkenyls such as allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl; aryloxys such as phenyloxy, biphenylyloxy, naphthyloxy, anthracenyloxy, and phenanthrenyloxy; arylvinyls such as styryl and naphthylvinyl; and acyls such as acetyl and benzoyl. These substituents may be further substituted with the exemplified substituents above. These substituents may bind to each other via a single bond, substituted or unsubstituted methylene, an oxygen atom, or a sulfur atom to form a ring.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by C in the general formula (5) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1). When a plurality of these groups binds to the same anthracene ring (when q is 2), these groups may be the same or different.

These groups may have a substituent, and examples of the substituent include the same substituents exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Specific examples of the "linear or branched alkyl of 1 to 6 carbon atoms" represented by D in the general formula (5) include methyl, ethyl, n-propyl, isopropyl, n-butyl, isobutyl, tert-butyl, n-pentyl, isopentyl, neopentyl, and n-hexyl.

The plural groups represented by D may be the same or different, and may bind to each other via a single bond, substituted or unsubstituted methylene, an oxygen atom, or a sulfur atom to form a ring.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by D in the general formula (5) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1). The plural groups represented by D may be the same or different, and may bind to each other via a single bond, substituted or unsubstituted methylene, an oxygen atom, or a sulfur atom to form a ring.

These groups may have a substituent, and examples of the substituent include the same substituents exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_8$, $Ar_9$, and $Ar_{10}$ in the general formula (6) include phenyl, biphenylyl, terphenylyl, tetrakisphenyl, styryl, naphthyl, anthracenyl, acenaphthenyl, phenanthrenyl, fluorenyl, indenyl, pyrenyl, perylenyl, fluoranthenyl, triphenylenyl, spirobifluorenyl, furyl, thienyl, benzofuranyl, benzothienyl, dibenzofuranyl, and dibenzothienyl.

Specific examples of the "substituent" in the "substituted aromatic hydrocarbon group", the "substituted aromatic heterocyclic group", and the "substituted condensed polycyclic aromatic group" represented by $Ar_8$, $Ar_9$, and $Ar_{10}$ in the general formula (6) include a deuterium atom; cyano; nitro; halogen atoms such as a fluorine atom, a chlorine atom, a bromine atom, and an iodine atom; linear or branched alkyls of 1 to 6 carbon atoms such as methyl, ethyl, n-propyl, isopropyl, n-butyl, isobutyl, tert-butyl, n-pentyl, isopentyl, neopentyl, and n-hexyl; linear or branched alkyloxys of 1 to 6 carbon atoms such as methyloxy, ethyloxy, and propyloxy; alkenyls such as vinyl and allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, triphenylenyl, and spirobifluorenyl; aromatic heterocyclic groups such as pyridyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, azafluorenyl, diazafluorenyl, carbolinyl, azaspirobifluorenyl, and diazaspirobifluorenyl; arylvinyls such as styryl and naphthylvinyl; and acyls such as acetyl and benzoyl. These substituents may be further substituted with the exemplified substituents above.

These substituents may bind to each other via a single bond, substituted or unsubstituted methylene, an oxygen atom, or a sulfur atom to form a ring. These substituents may bind to $Ar_8$, $Ar_9$, or $Ar_{10}$ that bind to the substituents, via an oxygen atom or a sulfur atom to form a ring.

Specific examples of the “aromatic heterocyclic group” in the “substituted or unsubstituted aromatic heterocyclic group” represented by $Ar_{11}$ in the structural formula (7) include triazinyl, pyridyl, pyrimidinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, azafluorenyl, diazafluorenyl, naphthyridinyl, phenanthrolinyl, acridinyl, carbolinyl, azaspirobifluorenyl, and diazaspirobifluorenyl.

These groups may have a substituent, and examples of the substituent include the same substituents exemplified as the “substituent” in the “substituted aromatic hydrocarbon group”, the “substituted aromatic heterocyclic group”, or the “substituted condensed polycyclic aromatic group” represented by $Ar_8$, $Ar_9$, or $Ar_{10}$ in the general formula (6), and possible embodiments may also be the same embodiments as the exemplified embodiments.

Specific examples of the “linear or branched alkyl of 1 to 6 carbon atoms” represented by $R_{19}$ to $R_{22}$ in the structural formula (7) include methyl, ethyl, n-propyl, i-propyl, n-butyl, 2-methylpropyl, t-butyl, n-pentyl, 3-methylbutyl, tert-pentyl, n-hexyl, iso-hexyl, and tert-hexyl.

Specific examples of the “aromatic hydrocarbon group”, the “aromatic heterocyclic group”, or the “condensed polycyclic aromatic group” in the “substituted or unsubstituted aromatic hydrocarbon group”, the “substituted or unsubstituted aromatic heterocyclic group”, or the “substituted or unsubstituted condensed polycyclic aromatic group” represented by $R_{19}$ to $R_{22}$ in the structural formula (7) include phenyl, biphenylyl, terphenylyl, tetrakisphenyl, styryl, naphthyl, anthracenyl, acenaphthenyl, phenanthrenyl, fluorenyl, indenyl, pyrenyl, perylenyl, fluoranthenyl, triphenylenyl, spirobifluorenyl, triazinyl, pyridyl, pyrimidinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, azafluorenyl, diazafluorenyl, naphthyridinyl, phenanthrolinyl, acridinyl, carbolinyl, phenoxazinyl, phenothiazinyl, phenazinyl, azaspirobifluorenyl, and diazaspirobifluorenyl.

These groups may have a substituent, and examples of the substituent include the same substituents exemplified as the “substituent” in the “substituted aromatic hydrocarbon group”, the “substituted aromatic heterocyclic group”, or the “substituted condensed polycyclic aromatic group” represented by $Ar_8$, $Ar_9$, or $Ar_{10}$ in the general formula (6), and possible embodiments may also be the same embodiments as the exemplified embodiments.

Examples of the “aromatic hydrocarbon”, the “aromatic heterocyclic ring”, or the “condensed polycyclic aromatics” of the “substituted or unsubstituted aromatic hydrocarbon”, the “substituted or unsubstituted aromatic heterocyclic ring”, or the “substituted or unsubstituted condensed polycyclic aromatics” in the “divalent group of a substituted or unsubstituted aromatic hydrocarbon”, the “divalent group of a substituted or unsubstituted aromatic heterocyclic ring”, or the “divalent group of substituted or unsubstituted condensed polycyclic aromatics” represented by $A_2$ in the general formula (8) include the same groups exemplified as the groups for the “aromatic hydrocarbon”, the “aromatic heterocyclic ring”, or the “condensed polycyclic aromatics” of the “substituted or unsubstituted aromatic hydrocarbon”, the “substituted or unsubstituted aromatic heterocyclic ring”, or the “substituted or unsubstituted condensed polycyclic aromatics” in the “divalent group of a substituted or unsubstituted aromatic hydrocarbon”, the “divalent group of a substituted or unsubstituted aromatic heterocyclic ring”, or the “divalent group of substituted or unsubstituted condensed polycyclic aromatics” represented by $A_1$ in the general formula (5).

The “divalent group of a substituted or unsubstituted aromatic hydrocarbon”, the “divalent group of a substituted or unsubstituted aromatic heterocyclic ring”, or the “divalent group of substituted or unsubstituted condensed polycyclic aromatics” represented by $A_2$ in the general formula (8) is a divalent group that results from the removal of two hydrogen atoms from the above “aromatic hydrocarbon”, “aromatic heterocyclic ring”, or “condensed polycyclic aromatics”. These divalent groups may have a substituent, and examples of the substituent include the same substituents exemplified as the “substituent” in the “substituted aromatic hydrocarbon group”, the “substituted aromatic heterocyclic group”, or the “substituted condensed polycyclic aromatic group” represented by $Ar_1$ to $Ar_4$ in the general formula (1), and possible embodiments may also be the same embodiments as the exemplified embodiments.

Examples of the “aromatic hydrocarbon group”, the “aromatic heterocyclic group”, or the “condensed polycyclic aromatic group” in the “substituted or unsubstituted aromatic hydrocarbon group”, the “substituted or unsubstituted aromatic heterocyclic group”, or the “substituted or unsubstituted condensed polycyclic aromatic group” represented by $Ar_{12}$ and $Ar_{13}$ in the general formula (8) include the same groups exemplified as the groups for the “aromatic hydrocarbon group”, the “aromatic heterocyclic group”, or the “condensed polycyclic aromatic group” in the “substituted or unsubstituted aromatic hydrocarbon group”, the “substituted or unsubstituted aromatic heterocyclic group”, or the “substituted or unsubstituted condensed polycyclic aromatic group” represented by $Ar_1$ to $Ar_4$ in the general formula (1), and $Ar_{12}$ and $Ar_{13}$ may bind to each other via a single bond, substituted or unsubstituted methylene, an oxygen atom, or a sulfur atom to form a ring.

These groups may have a substituent, and examples of the substituent include the same substituents exemplified as the “substituent” in the “substituted aromatic hydrocarbon group”, the “substituted aromatic heterocyclic group”, or the “substituted condensed polycyclic aromatic group” represented by $Ar_1$ to $Ar_4$ in the general formula (1), and possible embodiments may also be the same embodiments as the exemplified embodiments.

Specific examples of the “linear or branched alkyl of 1 to 6 carbon atoms”, the “cycloalkyl of 5 to 10 carbon atoms”, or the “linear or branched alkenyl of 2 to 6 carbon atoms” in the “linear or branched alkyl of 1 to 6 carbon atoms that may have a substituent”, the “cycloalkyl of 5 to 10 carbon atoms that may have a substituent”, or the “linear or branched alkenyl of 2 to 6 carbon atoms that may have a substituent” represented by $R_{23}$ to $R_{29}$ in the general formula (8) include methyl, ethyl, n-propyl, isopropyl, n-butyl, isobutyl, tert-butyl, n-pentyl, isopentyl, neopentyl, n-hexyl, cyclopentyl, cyclohexyl, 1-adamantyl, 2-adamantyl, vinyl, allyl, isopropenyl, and 2-butenyl. These groups may bind to each other via a single bond, substituted or unsubstituted methylene, an oxygen atom, or a sulfur atom to form a ring. These groups ($R_{23}$ to $R_{29}$) may bind to the benzene ring, to which these groups ($R_{23}$ to $R_{29}$) directly bind, via a linking group, such as substituted or unsubstituted methylene, an oxygen atom, a sulfur atom, or a monosubstituted amino group, to form a ring.

Specific examples of the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_{23}$ to $R_{29}$ in the general formula (8) include a deuterium atom; cyano; nitro; halogen atoms such as a fluorine atom, a chlorine atom, a bromine atom, and an iodine atom; linear or branched alkyloxys of 1 to 6 carbon atoms such as methyloxy, ethyloxy, and propyloxy; alkenyls such as allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl; disubstituted amino groups substituted by an aromatic hydrocarbon group or a condensed polycyclic aromatic group, such as diphenylamino and dinaphthylamino; disubstituted amino groups substituted by an aromatic heterocyclic group, such as dipyridylamino and dithienylamino; and disubstituted amino groups substituted by substituents selected from aromatic hydrocarbon groups, condensed polycyclic aromatic groups, and aromatic heterocyclic groups. These substituents may be further substituted with the exemplified substituents above. These substituents may bind to each other via a single bond, substituted or unsubstituted methylene, an oxygen atom, or a sulfur atom to form a ring.

Specific examples of the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent" or the "cycloalkyloxy of 5 to 10 carbon atoms that may have a substituent" represented by $R_{23}$ to $R_{29}$ in the general formula (8) include methyloxy, ethyloxy, n-propyloxy, isopropyloxy, n-butyloxy, tert-butyloxy, n-pentyloxy, n-hexyloxy, cyclopentyloxy, cyclohexyloxy, cycloheptyloxy, cyclooctyloxy, 1-adamantyloxy, and 2-adamantyloxy. These groups may bind to each other via a single bond, substituted or unsubstituted methylene, an oxygen atom, or a sulfur atom to form a ring. These groups ($R_{23}$ to $R_{29}$) may bind to the benzene ring, to which these groups ($R_{23}$ to $R_{29}$) directly bind, via a linking group, such as substituted or unsubstituted methylene, an oxygen atom, a sulfur atom, or a monosubstituted amino group, to form a ring.

These groups may have a substituent. Examples of the substituent include the same groups exemplified as the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_{23}$ to $R_{29}$ in the general formula (8), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_{23}$ to $R_{29}$ in the general formula (8) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1). These groups may bind to each other via a single bond, substituted or unsubstituted methylene, an oxygen atom, or a sulfur atom to form a ring. These groups ($R_{23}$ to $R_{29}$) may bind to the benzene ring, to which these groups ($R_{23}$ to $R_{29}$) directly bind, via a linking group, such as substituted or unsubstituted methylene, an oxygen atom, a sulfur atom, or a monosubstituted amino group, to form a ring.

Specific examples of the "substituent" in the "substituted or unsubstituted aromatic hydrocarbon group", the "substituted or unsubstituted aromatic heterocyclic group", and the "substituted or unsubstituted condensed polycyclic aromatic group" represented by $R_{23}$ to $R_{29}$ in the general formula (8) include a deuterium atom; cyano; nitro; halogen atoms such as a fluorine atom, a chlorine atom, a bromine atom, and an iodine atom; linear or branched alkyls of 1 to 6 carbon atoms such as methyl, ethyl, n-propyl, isopropyl, n-butyl, isobutyl, tert-butyl, n-pentyl, isopentyl, neopentyl, and n-hexyl; linear or branched alkyloxys of 1 to 6 carbon atoms such as methyloxy, ethyloxy, and propyloxy; alkenyls such as allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl; arylvinyls such as styryl and naphthylvinyl; acyls such as acetyl and benzoyl; silyls, such as trimethylsilyl and triphenylsilyl; disubstituted amino groups substituted by an aromatic hydrocarbon group or a condensed polycyclic aromatic group, such as diphenylamino and dinaphthylamino; disubstituted amino groups substituted by an aromatic heterocyclic group, such as dipyridylamino and dithienylamino; and disubstituted amino groups substituted by substituents selected from aromatic hydrocarbon groups, condensed polycyclic aromatic groups, and aromatic heterocyclic groups. These substituents may be further substituted with the exemplified substituents above. These substituents may bind to each other via a single bond, substituted or unsubstituted methylene, an oxygen atom, or a sulfur atom to form a ring.

Specific examples of the "aryloxy group" in the "substituted or unsubstituted aryloxy group" represented by $R_{23}$ to $R_{29}$ in the general formula (8) include phenyloxy, biphenylyloxy, terphenylyloxy, naphthyloxy, anthracenyloxy, phenanthrenyloxy, fluorenyloxy, indenyloxy, pyrenyloxy, and perylenyloxy. These groups may bind to each other via a single bond, substituted or unsubstituted methylene, an oxygen atom, or a sulfur atom to form a ring. These groups ($R_{23}$ to $R_{29}$) may bind to the benzene ring, to which these groups ($R_{23}$ to $R_{29}$) directly bind, via a linking group, such as substituted or unsubstituted methylene, an oxygen atom, a sulfur atom, or a monosubstituted amino group, to form a ring.

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $R_{23}$ to $R_{29}$ in the general formula (8), and possible embodiments may also be the same embodiments as the exemplified embodiments.

Examples of the "aromatic hydrocarbon group", the "aromatic heterocyclic group", or the "condensed polycyclic aromatic group" in the "disubstituted amino group substituted by substituents selected from aromatic hydrocarbon groups, condensed polycyclic aromatic groups, and aromatic heterocyclic groups" represented by $R_{23}$ to $R_{26}$ in the general formula (8) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1).

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $R_{23}$ to $R_{29}$ in the general formula (8), and possible embodiments may also be the same embodiments as the exemplified embodiments.

As for the "disubstituted amino group substituted by substituents selected from aromatic hydrocarbon groups, condensed polycyclic aromatic groups, and aromatic heterocyclic groups" represented by $R_{23}$ to $R_{26}$ in the general formula (8), these groups ($R_{23}$ to $R_{26}$) may bind to each other via a single bond, substituted or unsubstituted methylene, an oxygen atom, or a sulfur atom and via the "aromatic hydrocarbon group", the "aromatic heterocyclic group", or the "condensed polycyclic aromatic group" of these groups ($R_{23}$ to $R_{26}$) to form a ring, and these groups ($R_{23}$ to $R_{26}$) may bind to the benzene ring, to which these groups ($R_{23}$ to $R_{26}$) directly bind, via a linking group, such as substituted or unsubstituted methylene, an oxygen atom, a sulfur atom, or amonosubstituted amino group, and via the "aromatic hydrocarbon group", the "aromatic heterocyclic group", or the "condensed polycyclic aromatic group" of these groups ($R_{23}$ to $R_{26}$) to form a ring.

Examples of the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_{30}$ and $R_{31}$ in the general formula (8) include the same groups exemplified as the groups for the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_{23}$ to $R_{29}$ in the general formula (8). These groups may bind to each other via a linking group, such as a single bond, substituted or unsubstituted methylene, an oxygen atom, a sulfur atom, or a monosubstituted amino group to form a ring.

These groups may have a substituent. Examples of the substituent include the same groups exemplified as the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_{23}$ to $R_{29}$ in the general formula (8), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_{30}$ and $R_{31}$ in the general formula (8) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1). These groups may bind to each other via a linking group, such as a single bond, substituted or unsubstituted methylene, an oxygen atom, a sulfur atom, or a monosubstituted amino group to form a ring.

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $R_{23}$ to $R_{29}$ in the general formula (8), and possible embodiments may also be the same embodiments as the exemplified embodiments.

Examples of the "aryloxy" in the "substituted or unsubstituted aryloxy" represented by $R_{30}$ and $R_{31}$ in the general formula (8) include the same groups exemplified as the groups for the "aryloxy" in the "substituted or unsubstituted aryloxy" represented by $R_{23}$ to $R_{29}$ in the general formula (8), and possible embodiments may also be the same embodiments as the exemplified embodiments. These groups may bind to each other via a single bond, substituted or unsubstituted methylene, an oxygen atom, or a sulfur atom to form a ring.

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $R_{23}$ to $R_{29}$ in the general formula (8), and possible embodiments may also be the same embodiments as the exemplified embodiments.

Examples of the "substituent" in the "monosubstituted amino group" as the linking group in the general formula (8) include the same groups exemplified as the "linear or branched alkyl of 1 to 6 carbon atoms", the "cycloalkyl of 5 to 10 carbon atoms", the "aromatic hydrocarbon group", the "aromatic heterocyclic group", or the "condensed polycyclic aromatic group" in the "linear or branched alkyl of 1 to 6 carbon atoms that may have a substituent", the "cycloalkyl of 5 to 10 carbon atoms that may have a substituent", the "substituted or unsubstituted aromatic hydrocarbon group", the "substituted or unsubstituted aromatic heterocyclic group", or the "substituted or unsubstituted condensed polycyclic aromatic group" represented by $R_{23}$ to $R_{29}$ in the general formula (8).

These groups may have a substituent. Examples of the substituent of the "linear or branched alkyl of 1 to 6 carbon atoms that has a substituent" and the "cycloalkyl of 5 to 10 carbon atoms that has a substituent" include the same groups exemplified as the "substituent" in the "linear or branched alkyl of 1 to 6 carbon atoms that has a substituent" or the "cycloalkyl of 5 to 10 carbon atoms that has a substituent" represented by $R_{23}$ to $R_{29}$ in the general formula (8), and examples of the substituent of the "substituted aromatic hydrocarbon group", the "substituted aromatic heterocyclic group", or the "substituted condensed polycyclic aromatic group" include the same groups exemplified as the "substituent" in the "substituted aromatic hydrocarbon group", the "substituted aromatic heterocyclic group" represented by $R_{23}$ to $R_{29}$ in the general formula (8), and possible embodiments may also be the same embodiments as the exemplified embodiments.

$Ar_1$ to $Ar_4$ in the general formula (1) are preferably the "substituted or unsubstituted aromatic hydrocarbon group", the "substituted or unsubstituted sulfur-containing aromatic heterocyclic group", or the "substituted or unsubstituted condensed polycyclic aromatic group", and further preferably, phenyl, biphenylyl, terphenylyl, naphthyl, phenanthryl, fluorenyl, or dibenzothienyl.

The "substituent" in the "substituted aromatic hydrocarbon group", the "substituted aromatic heterocyclic group", or the "substituted condensed polycyclic aromatic group" represented by $Ar_1$ to $Ar_4$ in the general formula (1) is preferably a deuterium atom, the "linear or branched alkyl of 1 to 6 carbon atoms that may have a substituent", the "linear or branched alkenyl of 2 to 6 carbon atoms that may have a substituent", the "substituted or unsubstituted aromatic hydrocarbon group", or the "substituted or unsubstituted condensed polycyclic aromatic group", and further preferably, a deuterium atom, phenyl, biphenylyl, naphthyl, or vinyl. It is preferable that these groups bind to each other via a single bond to form a condensed aromatic ring.

Examples of the electron acceptor, with which the arylamine compound represented by the general formula (1) is doped, in the hole injection layer of the organic EL device of the present invention include trisbromophenylamine hexachloroantimony, tetracyanoquinodimethane (TCNQ), 2,3,5,6-tetrafluoro-tetracyano-1,4-benzoquinodimethane (F4TCNQ), and a radialene derivative (see, for example, JP-A-2011-100621), and the radialene derivative of the general formula (2) is preferably used.

$Ar_5$ to $Ar_7$ in the general formula (2) are preferably the "aromatic hydrocarbon group", the "condensed polycyclic aromatic group", or pyridyl, and further preferably phenyl, biphenylyl, terphenylyl, naphthyl, phenanthryl, fluorenyl, or pyridyl, and the "electron acceptor group" therein is preferably a fluorine atom, a chlorine atom, cyano, or trifluoromethyl.

An embodiment is preferable that $Ar_5$ to $Ar_7$ in the general formula (2) are at least partially, preferably completely, substituted by the "electron acceptor group".

$Ar_5$ to $Ar_7$ in the general formula (2) are preferably phenyl that is completely substituted by a fluorine atom, a chlorine atom, cyano, or trifluoromethyl, such as tetrafluoropyridyl, tetrafluoro(trifluoromethyl)phenyl, cyanotetrafluorophenyl, dichlorodifluoro(trifluoromethyl)phenyl, or pentafluorophenyl, or pyridyl.

$R_1$ to $R_6$ in the general formula (3) are preferably a deuterium atom, the "linear or branched alkyl of 1 to 6 carbon atoms that may have a substituent", the "linear or branched alkenyl of 2 to 6 carbon atoms that may have a substituent", the "substituted or unsubstituted aromatic hydrocarbon group", or the "substituted or unsubstituted condensed polycyclic aromatic group", and further preferably, a deuterium atom, phenyl, biphenylyl, naphthyl, or vinyl. It is also preferable that these groups bind to each other via a single bond to form a condensed aromatic ring. A deuterium atom, phenyl, and biphenylyl are particularly preferable.

$r_1$ to $r_6$ in the general formula (3) are preferably an integer of 0 to 3, and further preferably an integer of 0 to 2.

The "divalent linking group" represented by $L_1$ in the general formula (3) is preferably methylene, the "cycloalkyl of 5 to 10 carbon atoms", the "divalent group of an aromatic hydrocarbon", or the "divalent group of condensed polycyclic aromatics", or a single bond, further preferably divalent groups represented by the following structural formulae (B) to (G), or a single bond, and particularly preferably a divalent group represented by the following structural formula (B).

[Chemical Formula 9]

(B)

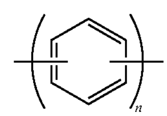

In the formula, n1 represents an integer of 1 to 3.

[Chemical Formula 10]

(C)

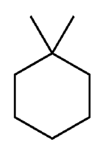

[Chemical Formula 11]

(D)

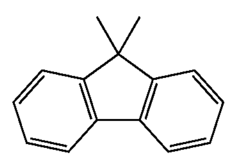

[Chemical Formula 12]

(E)

$—CH_2—$

[Chemical Formula 13]

(F)

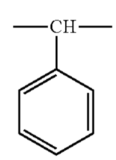

-continued

[Chemical Formula 14]

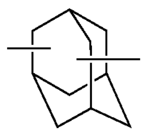

(G)

$R_7$ to $R_{18}$ in the general formula (4) are preferably a deuterium atom, the "linear or branched alkyl of 1 to 6 carbon atoms that may have a substituent", the "linear or branched alkenyl of 2 to 6 carbon atoms that may have a substituent", the "substituted or unsubstituted aromatic hydrocarbon group", or the "substituted or unsubstituted condensed polycyclic aromatic group", and further preferably, a deuterium atom, phenyl, biphenylyl, naphthyl, or vinyl. It is also preferable that these groups bind to each other via a single bond to form a condensed aromatic ring. A deuterium atom, phenyl, and biphenylyl are particularly preferable.

$r_7$ to $r_{18}$ in the general formula (4) are preferably an integer of 0 to 3, and further preferably an integer of 0 to 2.

The "divalent linking groups" represented by $L_2$ to $L_4$ in the general formula (4) are preferably methylene, the "cycloalkyl of 5 to 10 carbon atoms", the "divalent group of an aromatic hydrocarbon", or the "divalent group of condensed polycyclic aromatics", or a single bond, and further preferably divalent groups represented by the structural formulae (B) to (G), or a single bond.

The "aromatic heterocyclic group" in the "substituted or unsubstituted aromatic heterocyclic group" represented by B in the general formula (5) is preferably a nitrogen-containing aromatic heterocyclic group, such as pyridyl, pyrimidinyl, pyrrolyl, quinolyl, isoquinolyl, indolyl, carbazolyl, benzoxazolyl, benzothiazolyl, quinoxalinyl, benzoimidazolyl, pyrazolyl, or carbolinyl, and further preferably pyridyl, pyrimidinyl, quinolyl, isoquinolyl, indolyl, pyrazolyl, benzoimidazolyl, or carbolinyl.

For p and q in the general formula (5), p represents 7 or 8, and q represents 1 or 2, while maintaining the relationship, in which the sum of p and q (p+q) is 9.

$A_1$ in the general formula (5) is preferably the "divalent group of a substituted or unsubstituted aromatic hydrocarbon" or the "divalent group of substituted or unsubstituted condensed polycyclic aromatics", and further preferably divalent groups that result from the removal of two hydrogen atoms from benzene, biphenyl, naphthalene, or phenanthrene.

The compound having an anthracene ring structure of the general formula (5) is preferably a compound having an anthracene ring structure of the following general formula (5a), the following general formula (5b), or the following general formula (5c).

[Chemical Formula 15]

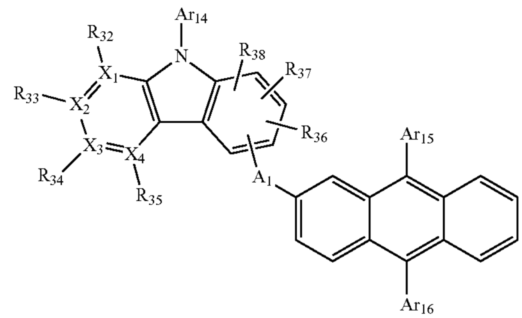

(5a)

In the formula, $A_1$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond. $Ar_{14}$, $Ar_{15}$, and $Ar_{16}$ may be the same or different, and represent a substituted or unsubstituted aromatic hydrocarbon group, a substituted or unsubstituted aromatic heterocyclic group, or a substituted or unsubstituted condensed polycydlic aromatic group. $R_{32}$ to $R_{38}$ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy, where these groups may bind to each other via a single bond, substituted or unsubstituted methylene, an oxygen atom, or a sulfur atom to form a ring. $X_1$, $X_2$, $X_3$, and $X_4$ represent a carbon atom or a nitrogen atom, and only one of $X_1$, $X_2$, $X_3$, and $X_4$ is a nitrogen atom. In this case, the nitrogen atom does not have the hydrogen atom or substituent for $R_{32}$ to $R_{35}$.

[Chemical Formula 16]

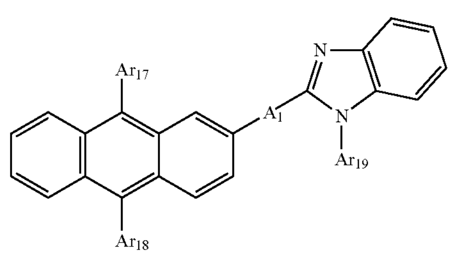

(5b)

In the formula, $A_1$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond. $Ar_{17}$, $Ar_{18}$, and $Ar_{19}$ may be the same or different, and represent a substituted or unsubstituted aromatic hydrocarbon group, a substituted or unsubstituted aromatic heterocyclic group, or a substituted or unsubstituted condensed polycyclic aromatic group.

[Chemical Formula 17]

(5c)

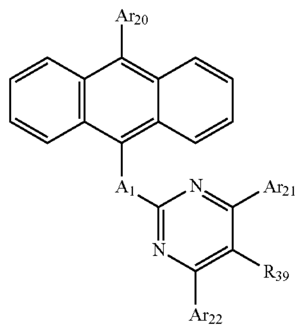

In the formula, $A_1$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond. $Ar_{20}$, $Ar_{21}$, and $Ar_{22}$ may be the same or different, and represent a substituted or unsubstituted aromatic hydrocarbon group, a substituted or unsubstituted aromatic heterocyclic group, or a substituted or unsubstituted condensed polycyclic aromatic group. $R_{39}$ represents a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_{14}$, $Ar_{15}$, and $Ar_{16}$ in the general formula (5a) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1).

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Specific examples of the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_{32}$ to $R_{38}$ in the general formula (5a) include methyl, ethyl, n-propyl, isopropyl, n-butyl, isobutyl, tert-butyl, n-pentyl, isopentyl, neopentyl, n-hexyl, cyclopentyl, cyclohexyl, 1-adamantyl, 2-adamantyl, vinyl, allyl, isopropenyl, and 2-butenyl. These groups may bind to each other via a single bond, substituted or unsubstituted methylene, an oxygen atom, or a sulfur atom to form a ring.

Specific examples of the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_{32}$ to $R_{38}$ in the general formula (5a) include a deuterium atom; cyano; nitro; halogen atoms such as a fluorine atom, a chlorine atom, a bromine atom, and an iodine atom; linear or branched alkyloxys of 1 to 6 carbon atoms such as methyloxy, ethyloxy, and propyloxy; alkenyls such as allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; and aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl. These substituents may be further substituted with the exemplified substituents above. These substituents may bind to each other via a single bond, substituted or unsubstituted methylene, an oxygen atom, or a sulfur atom to form a ring.

Specific examples of the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent" or the "cycloalkyloxy of 5 to 10 carbon atoms that may have a substituent" represented by $R_{32}$ to $R_{38}$ in the general formula (5a) include methyloxy, ethyloxy, n-propyloxy, isopropyloxy, n-butyloxy, tert-butyloxy, n-pentyloxy, n-hexyloxy, cyclopentyloxy, cyclohexyloxy, cycloheptyloxy, cyclooctyloxy, 1-adamantyloxy, and 2-adamantyloxy. These groups may bind to each other via a single bond, substituted or unsubstituted methylene, an oxygen atom, or a sulfur atom to form a ring.

These groups may have a substituent. Examples of the substituent include the same groups exemplified as the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_{32}$ to $R_{38}$ in the general formula (5a), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_{32}$ to $R_{38}$ in the general formula (5a) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1). These groups may bind to each other via a single bond, substituted or unsubstituted methylene, an oxygen atom, or a sulfur atom to form a ring.

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Specific examples of the "aryloxy group" in the "substituted or unsubstituted aryloxy group" represented by $R_{32}$ to $R_{38}$ in the general formula (5a) include phenyloxy, biphenylyloxy, terphenylyloxy, naphthyloxy, anthracenyloxy, phenanthrenyloxy, fluorenyloxy, indenyloxy, pyrenyloxy, and perylenyloxy. These groups may bind to each other via a single bond, substituted or unsubstituted methylene, an oxygen atom, or a sulfur atom to form a ring.

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

In the general formula (5a), $X_1$, $X_2$, $X_3$, and $X_4$ represent a carbon atom or a nitrogen atom, and only one of $X_1$, $X_2$, $X_3$, and $X_4$ is a nitrogen atom (and the others are carbon atoms). In this case, the nitrogen atom does not have the hydrogen atom or substituent for $R_{32}$ to $R_{35}$. That is, $R_{32}$ does not exist when $X_1$ is a nitrogen atom, $R_{33}$ does not exist when $X_2$ is a nitrogen atom, $R_{34}$ does not exist when $X_3$ is a nitrogen atom, and $R_{35}$ does not exist when $X_4$ is a nitrogen atom.

In the general formula (5a), it is preferable that $X_3$ is a nitrogen atom (and $X_1$, $X_2$, and $X_4$ are carbon atoms), and in this case, a hydrogen atom or substituent for $R_{34}$ does not exist.

The binding position of the linking group $L_1$ is preferably the position corresponding to the para-position of the nitrogen atom of the pyridoindole ring.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_{17}$, $A_{18}$, and $Ar_{19}$ in the general formula (5b) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1).

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic-group" represented by $Ar_{20}$, $Ar_{21}$, and $Ar_{22}$ in the general formula (5c) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1).

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Examples of the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_{39}$ in the general formula (5c) include the same groups exemplified as the groups for the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_{32}$ to $R_{38}$ in the general formula (5a).

These groups may have a substituent. Examples of the substituent include the same groups exemplified as the "substituent" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_{32}$ to $R_{38}$ in the general formula (5a), and possible embodiments may also be the same embodiments as the exemplified embodiments.

Examples of the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent" or the "cycloalkyloxy of 5 to 10 carbon atoms that may have a substituent" represented by $R_{39}$ in the general formula (5c) include the same groups exemplified as the "substituent" in the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent"

or the "cycloalkyloxy of 5 to 10 carbon atoms that may have a substituent" represented by $R_{32}$ to $R_{38}$ in the general formula (5a).

These groups may have a substituent. Examples of the substituent include the same groups exemplified as the "substituent" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_{32}$ to $R_{38}$ in the general formula (5a), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_{39}$ in the general formula (5c) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_4$ in the general formula (1).

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

Examples of the "aryloxy group" in the "substituted or unsubstituted aryloxy group" represented by $R_{39}$ in the general formula (5c) include the same groups exemplified as the groups for the "aryloxy group" in the "substituted or unsubstituted aryloxy group" represented by $R_{32}$ to $R_{38}$ in the general formula (5a).

These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and possible embodiments may also be the same embodiments as the exemplified embodiments.

$Ar_8$ in the general formula (6) is preferably phenyl, biphenylyl, naphthyl, anthracenyl, acenaphthenyl, phenanthrenyl, fluorenyl, indenyl, pyrenyl, perylenyl, fluoranthenyl, triphenylenyl, spirobifluorenyl, an oxygen-containing aromatic heterocyclic group, such as furyl, benzofuranyl, and dibenzofuranyl, or a sulfur-containing aromatic heterocyclic group, such as thienyl, benzothienyl, and dibenzothienyl, and further preferably phenyl, biphenylyl, naphthyl, phenanthrenyl, fluorenyl, pyrenyl, fluoranthenyl, triphenylenyl, spirobifluorenyl, dibenzofuranyl, or dibenzothienyl. The phenyl group preferably has a substituted or unsubstituted condensed polycyclic aromatic group or a phenyl group as a substituent, and further preferably has a substituent selected from naphthyl, phenanthrenyl, pyrenyl, fluoranthenyl, triphenylenyl, spirobifluorenyl, or phenyl, and it is also preferable that the substituent of the phenyl group and the phenyl group bind to each other via an oxygen atom or a sulfur atom to form a ring.

$Ar_9$ in the general formula (6) is preferably phenyl that has a substituent, substituted or unsubstituted spirobifluorenyl, an oxygen-containing aromatic heterocyclic group, such as furyl, benzofuranyl, and dibenzofuranyl, or a sulfur-containing aromatic heterocyclic group, such as thienyl, benzothienyl, and dibenzothienyl. The substituent of the phenyl in this case is preferably an aromatic hydrocarbon group, such as phenyl, biphenylyl, and terphenylyl, a condensed polycyclic aromatic group, such as naphthyl, acenaphthenyl, phenanthrenyl, fluorenyl, indenyl, pyrenyl, perylenyl, fluoranthenyl, triphenylenyl, and spirobifluorenyl, an oxygen-containing aromatic heterocyclic group, such as furyl, benzofuranyl, and dibenzofuranyl, or a sulfur-containing aromatic heterocyclic group, such as thienyl, benzothienyl, and dibenzothienyl, and further preferably phenyl, naphthyl, phenanthrenyl, fluorenyl, pyrenyl, fluoranthenyl, triphenylenyl, spirobifluorenyl, dibenzofuranyl, or dibenzothienyl, and it is also preferable that the substituent of the phenyl group and the phenyl group bind to each other via an oxygen atom or a sulfur atom to form a ring.

$Ar_{10}$ in the general formula (6) is preferably a hydrogen atom, phenyl that has a substituent, substituted or unsubstituted spirobifluorenyl, an oxygen-containing aromatic heterocyclic group, such as furyl, benzofuranyl, and dibenzofuranyl, or a sulfur-containing aromatic heterocyclic group, such as thienyl, benzothienyl, and dibenzothienyl. The substituent of the phenyl in this case is preferably an aromatic hydrocarbon group, such as phenyl, biphenylyl, and terphenylyl, a condensed polycyclic aromatic group, such as naphthyl, acenaphthenyl, phenanthrenyl, fluorenyl, indenyl, pyrenyl, perylenyl, fluoranthenyl, triphenylenyl, and spirobifluorenyl, an oxygen-containing aromatic heterocyclic group, such as furyl, benzofuranyl, and dibenzofuranyl, or a sulfur-containing aromatic heterocyclic group, such as thienyl, benzothienyl, and dibenzothienyl, and further preferably phenyl, naphthyl, phenanthrenyl, fluorenyl, pyrenyl, fluoranthenyl, triphenylenyl, spirobifluorenyl, dibenzofuranyl, or dibenzothienyl, and it is also preferable that the substituent of the phenyl group and the phenyl group bind to each other via an oxygen atom or a sulfur atom to form a ring.

In the general formula (6), it is preferable that $Ar_8$ and $Ar_9$ are not the same as each other from the viewpoint of thin film stability. In the case where $Ar_8$ and $Ar_9$ are the same groups, the groups may have different substituents and may be substituted on different positions.

In the general formula (6), $Ar_9$ and $Ar_{10}$ may be the same groups, but there may be a possibility that the compound is easily crystallized due to the high symmetry of the entire molecule, and from the viewpoint of thin film stability, it is preferable that $Ar_9$ and $Ar_{10}$ are not the same as each other, and $Ar_9$ and $Ar_{10}$ are not simultaneously a hydrogen atom.

It is preferable that one of $Ar_9$ and $Ar_{10}$ is a hydrogen atom.

Examples of the compound of the general formula (6) having a pyrimidine ring structure include compounds of the following general formula (6a) and general formula (6b) having pyrimidine ring structures with different bonding patterns of substituents.

[Chemical Formula 18]

(6a)

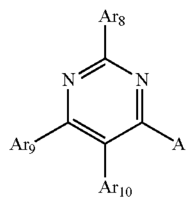

In the formula, $Ar_8$, $Ar_9$, $Ar_{10}$, and A have the same meanings as shown for the general formula (6).

[Chemical Formula 19]

(6b)

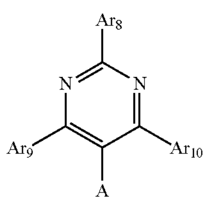

In the formula, $Ar_8$, $Ar_9$, $Ar_{10}$, and A have the same meanings as shown for the general formula (6).

$Ar_{11}$ in the general formula (7) is preferably a nitrogen-containing heterocyclic group, such as triazinyl, pyridyl, pyrimidinyl, pyrrolyl, quinolyl, isoquinolyl, indolyl, carbazolyl, benzoxazolyl, benzothiazolyl, quinoxalinyl, benzoimidazolyl, pyrazolyl, azafluorenyl, diazafluorenyl, naphthyridinyl, phenanthrolinyl, acridinyl, carbolinyl, azaspirobifluorenyl, and diazaspirobifluorenyl, further preferably triazinyl, pyridyl, pyrimidinyl, quinolyl, isoquinolyl, indolyl, quinoxalinyl, azafluorenyl, diazafluorenyl, benzoimidazolyl, naphthyridinyl, phenanthrolinyl, acridinyl, azaspirobifluorenyl, and diazaspirobifluorenyl, and particularly preferably pyridyl, pyrimidinyl, quinolyl, isoquinolyl, indolyl; azafluorenyl, diazafluorenyl, quinoxalinyl, benzoimidazolyl, naphthyridinyl, phenanthrolinyl, acridinyl, azaspirobifluorenyl, and diazaspirobifluorenyl.

In the general formula (7), the binding position of $Ar_{11}$ on the benzene ring is preferably the meta-position with respect to the binding position to the pyrimidine ring of the general formula (6) as shown in the following structural formula (7a) from the viewpoint of thin film stability.

[Chemical Formula 20]

(7a)

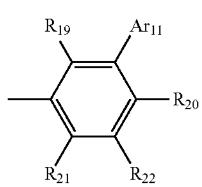

In the formula, $Ar_{11}$ and $R_{19}$ to $R_{22}$ have the same meanings as shown for the general formula (7).

$A_2$ in the general formula (8) is preferably the "divalent group of a substituted or unsubstituted aromatic hydrocarbon" or a single bond, further preferably a divalent group that result from the removal of two hydrogen atoms from benzene, biphenyl, or naphthalene, or a single bond, and particularly preferably a single bond.

$Ar_{12}$ and $Ar_{13}$ in the general formula (8) are preferably phenyl, biphenylyl, naphthyl, fluorenyl, indenyl, pyridyl, dibenzofuranyl, or pyridobenzofuranyl.

$Ar_{12}$ and $Ar_{13}$ in the general formula (8) may bind to each other via a single bond, substituted or unsubstituted methylene, an oxygen atom, or a sulfur atom and via the substituent of these groups or directly to form a ring.

In the general formula (8), at least one of $R_{23}$ to $R_{26}$ is preferably the "disubstituted amino group substituted by groups selected from an aromatic hydrocarbon group, an aromatic heterocyclic group, and a condensed polycyclic aromatic group", and the "aromatic hydrocarbon group", the "aromatic heterocyclic group", and the "condensed polycyclic aromatic group" in this case are preferably phenyl, biphenylyl, naphthyl, fluorenyl, indenyl, pyridyl, dibenzofuranyl, or pyridobenzofuranyl.

In the general formula (8), an embodiment where adjacent two or all of $R_{23}$ to $R_{26}$ are vinyls, and the adjacent vinyls bind to each other via a single bond to form a condensed ring, that is an embodiment where the groups form a naphthalene ring or a phenanthrene ring with the benzene ring, to which $R_{23}$ to $R_{26}$ bind, is also preferable.

In the general formula (8), an embodiment where any one of $R_{23}$ to $R_{26}$ is the "aromatic hydrocarbon group", and binds to the benzene ring, to which $R_{23}$ to $R_{26}$ bind, via substituted or unsubstituted methylene, an oxygen atom, or a sulfur atom to form a ring is preferable. In this case, an embodiment where the "aromatic hydrocarbon group" is phenyl, and binds to the benzene ring, to which $R_{23}$ to $R_{26}$ bind, via an oxygen atom or a sulfur atom to form a ring, that is an embodiment where the group forms a dibenzofuran ring or a dibenzothiophene ring with the benzene ring, to which $R_{23}$ to $R_{26}$ bind, is particularly preferable.

In the general formula (8), an embodiment where any one of $R_{27}$ to $R_{29}$ is the "aromatic hydrocarbon group", and binds to the benzene ring, to which $R_{27}$ to $R_{29}$ bind, via substituted or unsubstituted methylene, an oxygen atom, or a sulfur atom to form a ring is preferable. In this case, an embodiment where the "aromatic hydrocarbon group" is phenyl, and binds to the benzene ring, to which $R_{27}$ to $R_{29}$ bind, via an oxygen atom or a sulfur atom to form a ring, that is an embodiment where the group forms a dibenzofuran ring or a dibenzothiophene ring is particularly preferable.

In the amine derivative having a condensed ring structure of the general formula (8), as the embodiment where $R_{23}$ to $R_{29}$ bind to each other to form a ring, or the embodiment where $R_{23}$ to $R_{29}$ bind to the benzene rings, to which $R_{23}$ to $R_{29}$ bind, to form a ring, as described above, embodiments of the following general formulae (8a-a), (8a-b), (8b-a), (8b-b), (8b-c), (8b-d), (8c-a), and (8c-b) are preferably used.

[Chemical Formula 21]

(8a-a)

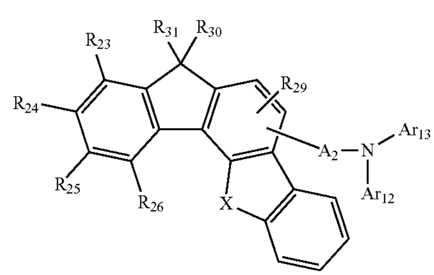

-continued (8a-b)

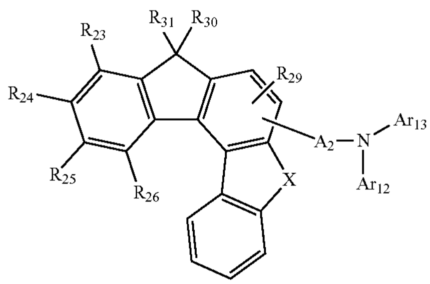

(8b-a)

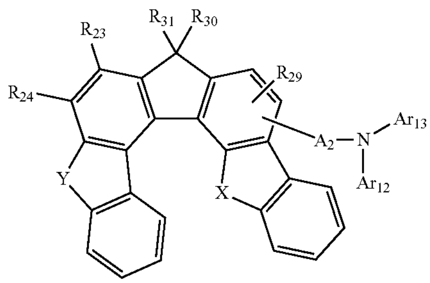

(8b-b)

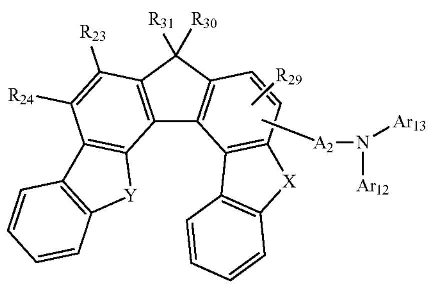

(8b-c)

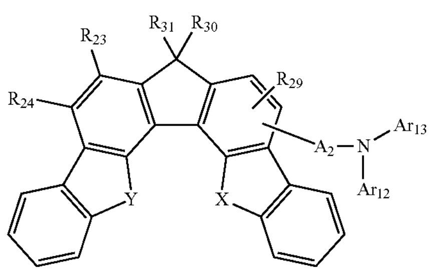

(8b-d)

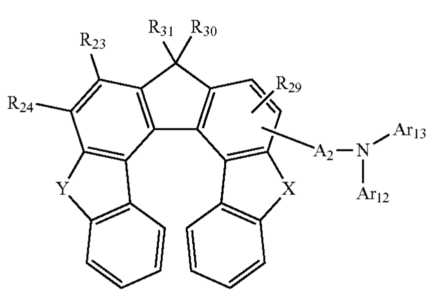

-continued (8c-a)

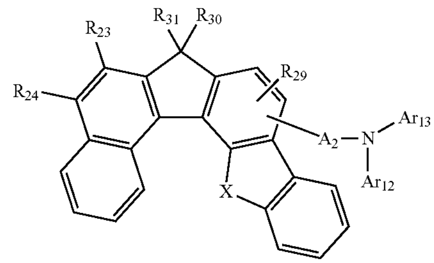

(8c-b)

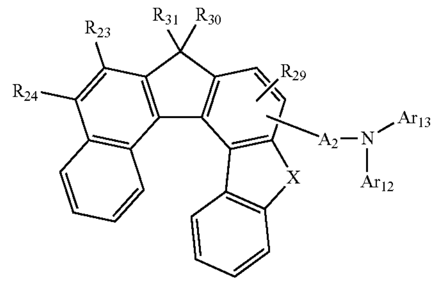

In the formulae, X and Y may be the same or different and represent an oxygen atom or a sulfur atom, and $A_2$, $Ar_{12}$, $Ar_{13}$, $R_{23}$ to $R_{26}$, $R_{29}$, and $R_{30}$ to $R_{31}$ have the same meanings as shown for the general formula (8).

$R_{30}$ and $R_{31}$ in the general formula (8) are preferably the "substituted or unsubstituted aromatic hydrocarbon group", the "substituted or unsubstituted aromatic heterocyclic group", or the "substituted or unsubstituted condensed polycyclic aromatic group", further preferably phenyl, naphthyl, phenanthrenyl, pyridyl, quinolyl, isoquinolyl, or dibenzofuranyl, and particularly preferably phenyl.

An embodiment where $R_{30}$ and $R_{31}$ bind to each other via a linking group, such as a single bond, substituted or unsubstituted methylene, an oxygen atom, a sulfur atom, or a monosubstituted amino group to form a ring is preferable, and an embodiment where the groups bind to each other via a single bond to form a ring is particularly preferable.

In the amine derivative having a condensed ring structure of the general formula (8), as the embodiment where $R_{30}$ and $R_{31}$ bind to each other to form a ring as described above, embodiments of the following general formulae (8a-a1), (8a-b1), (8b-a1), (8b-b1), (8b-c1), (8b-d1), (8c-a1), and (8c-b1) are preferably used.

[Chemical Formula 22]

(8a-a1)

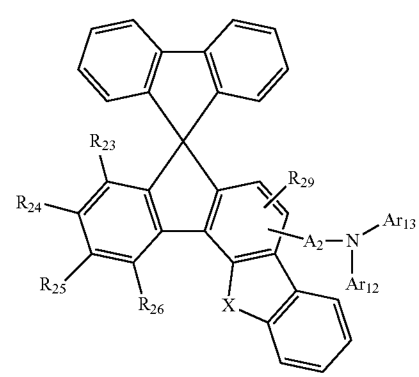

-continued (8a-b1)

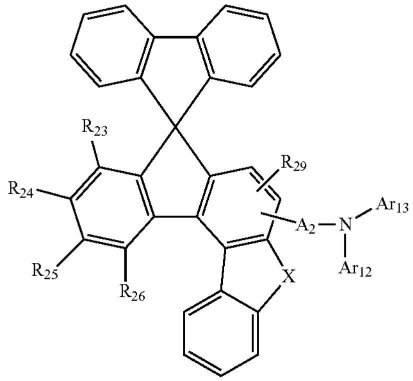

(8b-a1)

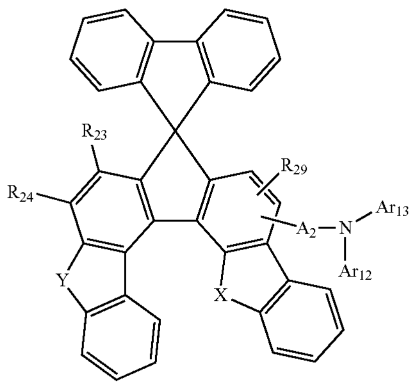

(8b-b1)

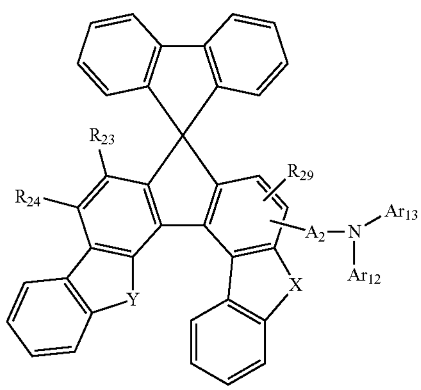

(8b-c1)

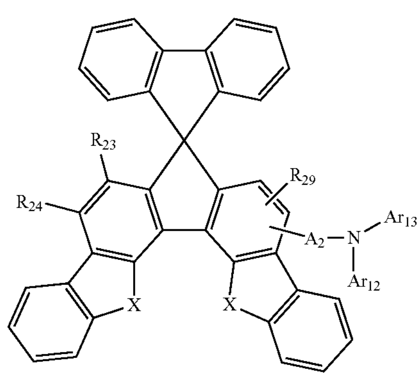

-continued (8b-d1)

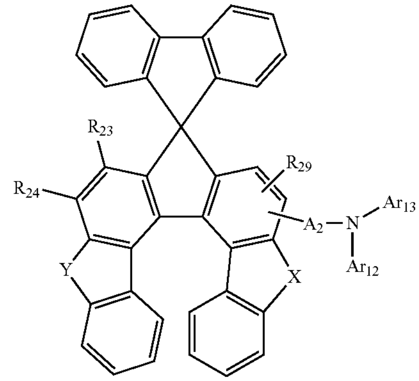

(8c-a1)

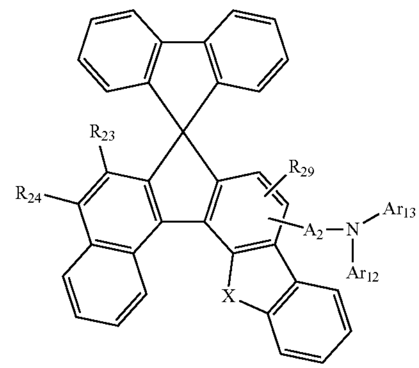

(8c-b1)

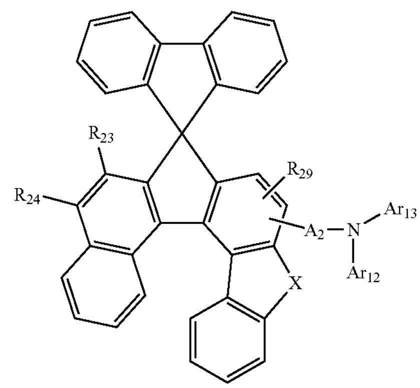

In the formulae, X and Y may be the same or different and represent an oxygen atom or a sulfur atom, and $A_2$, $Ar_{12}$, $Ar_{13}$, $R_{23}$ to $R_{26}$, and $R_{29}$ have the same meanings as shown for the general formula (8).

The arylamine compound of the general formula (1) preferably used in the organic EL device of the present invention can be used as a constitutive material of a hole injection layer or a hole transport layer of an organic EL device. The compound has high hole mobility and is a preferred compound as a material of a hole injection layer or a hole transport layer.

The radialene derivative of the general formula (2) preferably used in the organic EL device of the present invention is a preferred compound as a p-type doping material for a material generally used in a hole injection layer or a hole transport layer of an organic EL device.

The arylamine compound of general formula (3) having two triphenylamine structures in the molecule and the arylamine compound of general formula (4) having four triphenylamine structures in the molecule preferably used in the organic EL device of the present invention are a preferred compound as a constitutive material of a hole injection layer or a hole transport layer of an organic EL device.

The compound of the general formula (5) having an anthracene ring structure preferably used in the organic EL device of the present invention is a preferred compound as a constitutive material of an electron transport layer of an organic EL device.

The compound of the general formula (6) having a pyrimidine ring structure preferably used in the organic EL device of the present invention is a preferred compound as a constitutive material of an electron transport layer of an organic EL device.

The amine derivative of the general formula (8) having a condensed ring structure preferably used in the organic EL device of the present invention can be used as a constitutive material of a light emitting layer of an organic EL device. The compound is excellent in light emission efficiency as compared to the ordinary materials, and is a preferred compound as a dopant material for a light emitting layer.

The organic EL device of the present invention combines the materials for an organic EL device excellent in hole injection/transport performances, stability and durability as a thin film, taking the carrier balance into consideration. Therefore, as compared to the ordinary organic EL devices, the hole transport efficiency from the anode to the light emitting layer is improved (and furthermore the particular arylamine compound (having the particular structure) is used in the hole transport layer), and thereby the luminous efficiency is improved, and the durability of the organic EL device is improved, while retaining the lower driving voltage.

Thus, an organic EL device having a low driving voltage, a high light emission efficiency, and a long lifetime can be attained.

Effects of the Invention

The organic EL device of the present invention can achieve an organic EL device having excellent hole injection/transport performance, low driving voltage, and high luminous efficiency, as a result of attaining efficient hole injection/transport from the electrode to the hole transport layer, by selecting the particular arylamine compound (having the particular structure) that can effectively achieves the hole injection/transport roles, as the material of the hole injection layer, and subjecting the electron acceptor to p-type doping.

An organic EL device having high efficiency, low driving voltage and a long lifetime can be achieved as a result of attaining good carrier balance, by selecting the particular arylamine compound (having the particular structure) without p-type doping as the material of the hole injection layer.

The organic EL device of the present invention can improve the luminous efficiency, particularly the durability, while retaining the low driving voltage of the conventional organic EL devices.

BRIEF DESCRIPTION OF THE DRAWINGS

FIG. 1 is a diagram illustrating the configuration of the organic EL devices of Examples 52 to 59 and Comparative Examples 1 to 8.

MODE FOR CARRYING OUT THE INVENTION

The following presents specific examples of preferred compounds among the arylamine compounds of the general formula (1) preferably used in the organic EL device of the present invention. The present invention, however, is not restricted to these compounds.

[Chemical Formula 23]

(1-1)

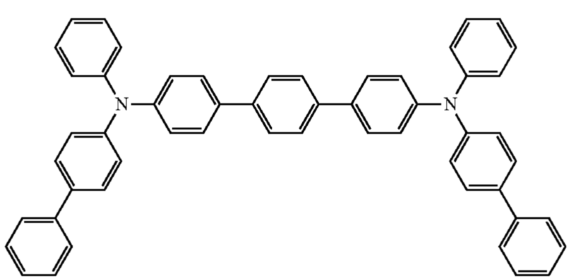

(1-2)

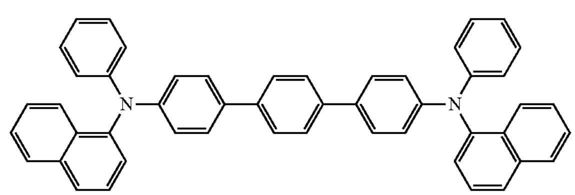

(1-3)

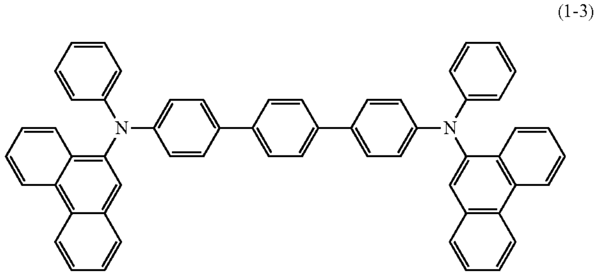

(1-4)

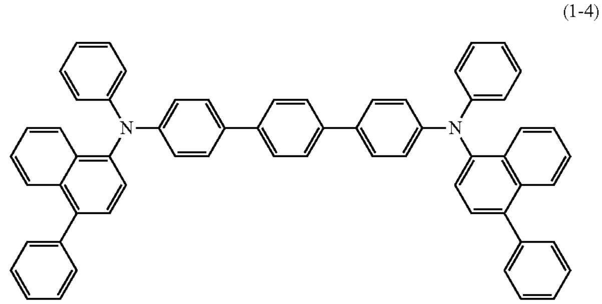

-continued
(1-5)
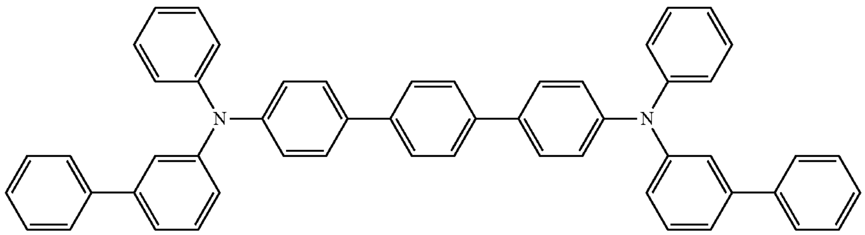
(1-6)
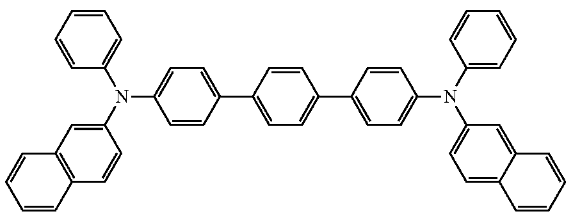
(1-7)
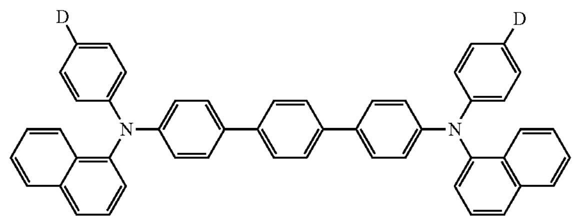
(1-8)
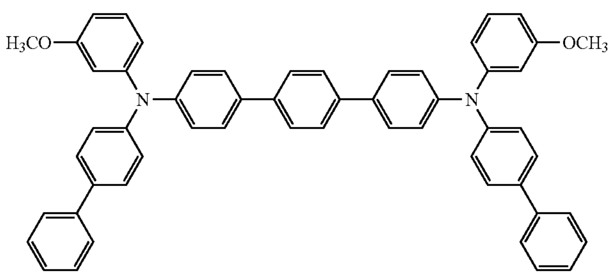
(1-9)
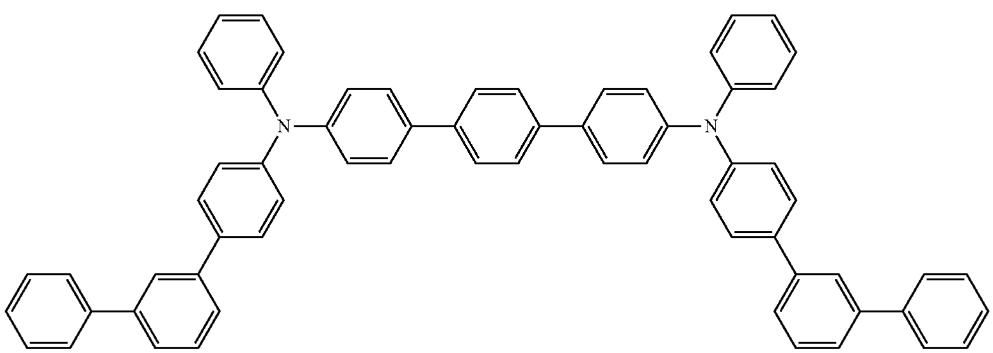
(1-10)
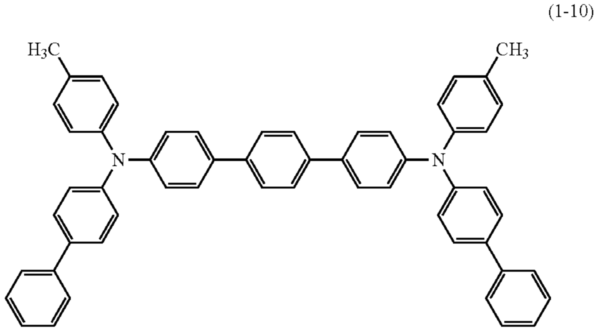
(1-11)
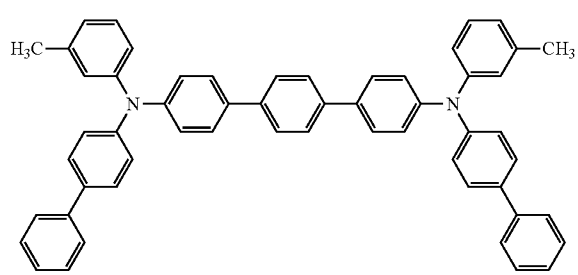

-continued
(1-12)
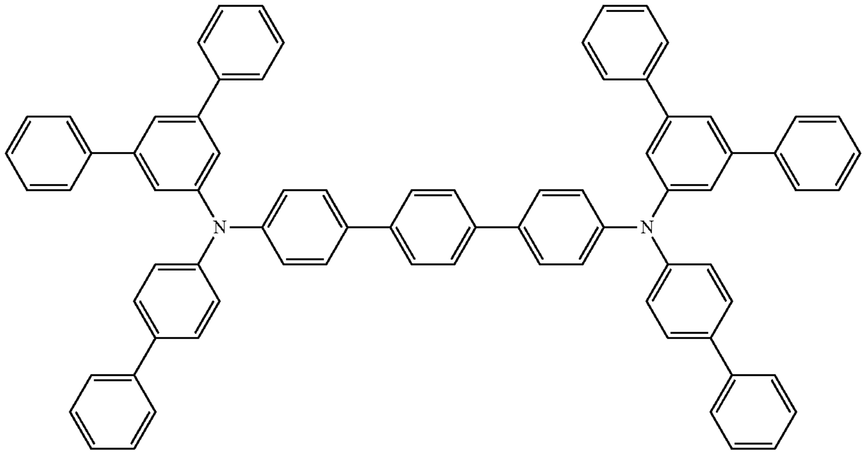
[Chemical Formula 24]
(1-13)
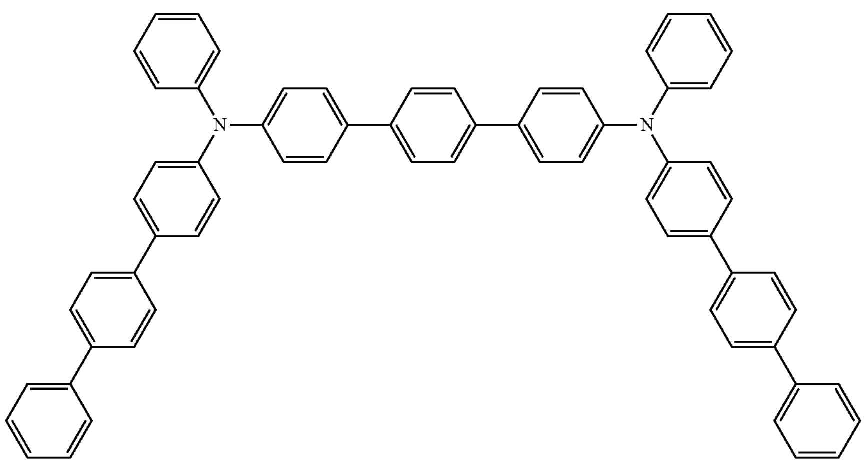
(1-14)
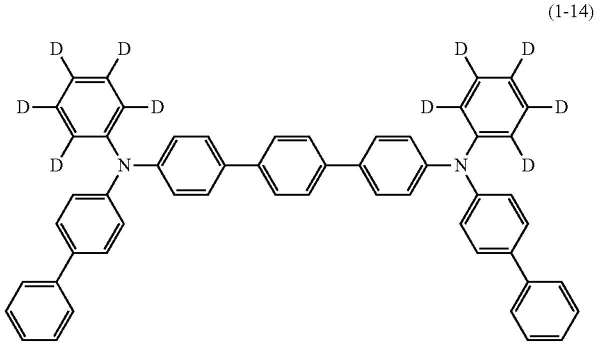
(1-15)
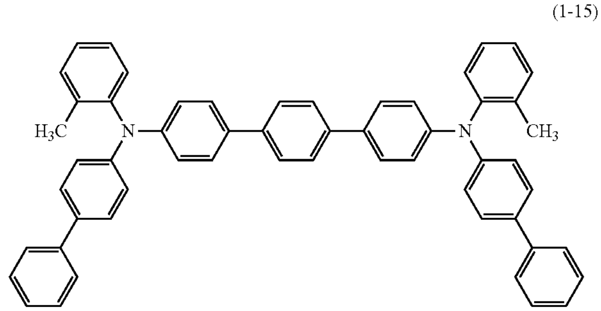

-continued
(1-16)
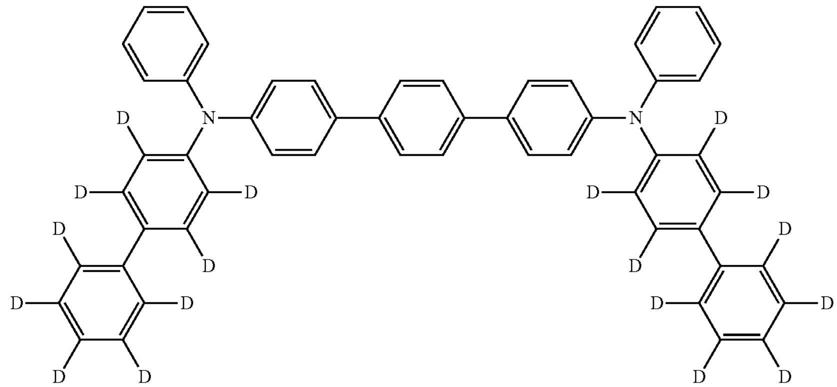
(1-17)
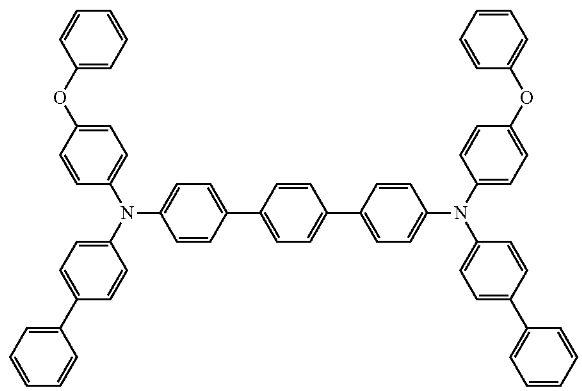
(1-18)
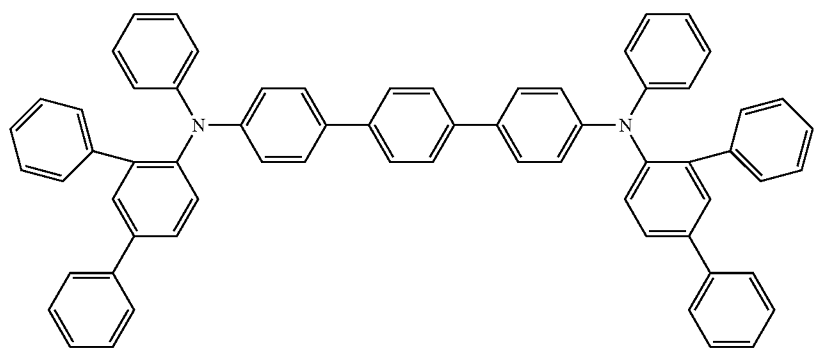
(1-19)
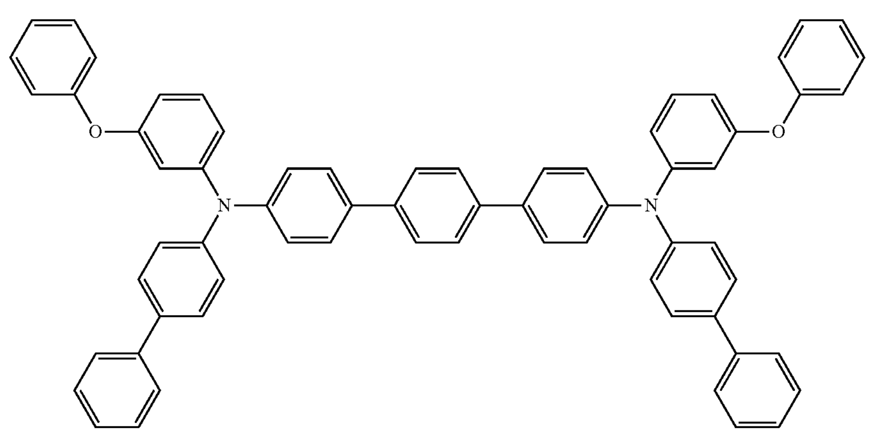

-continued
(1-20)
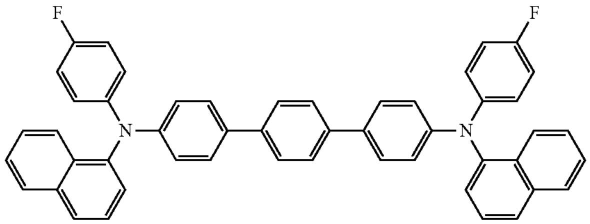
(1-21)
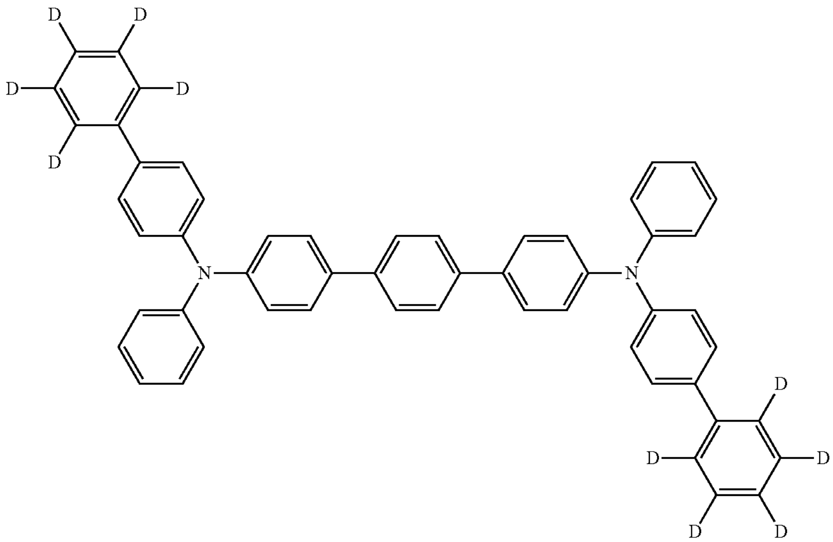
(1-22)
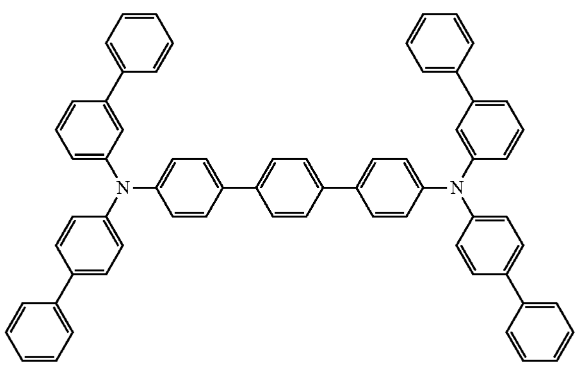
(1-23)
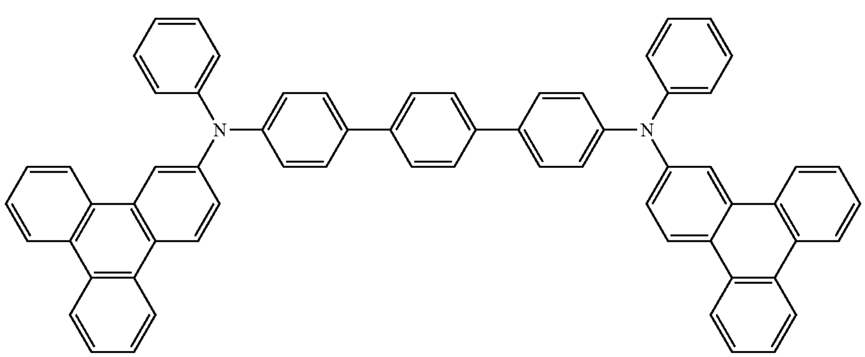

-continued
(1-24)
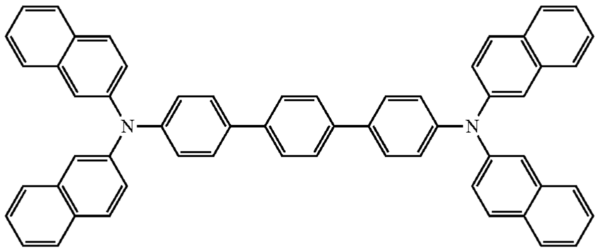
[Chemical Formula 25]
(1-25)
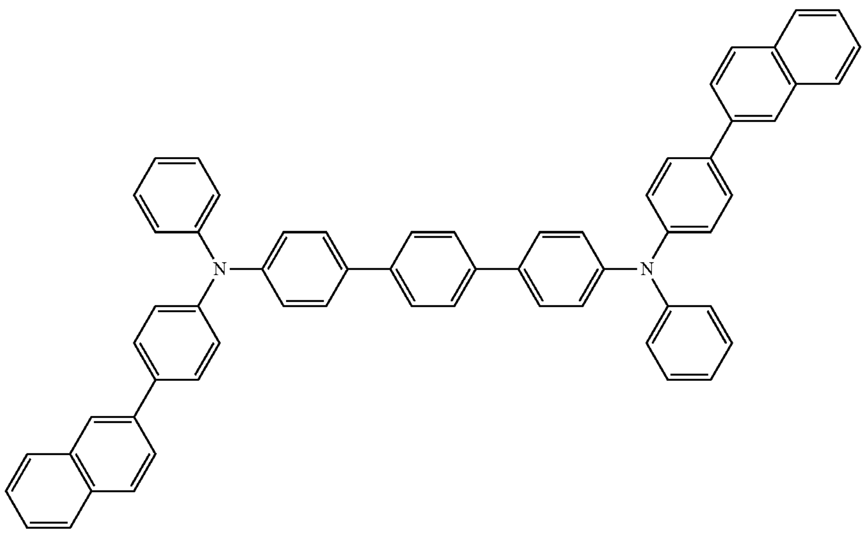
(1-26)
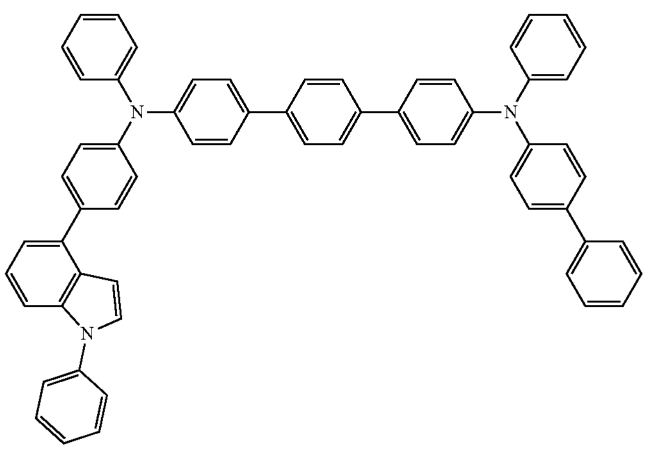
(1-27)
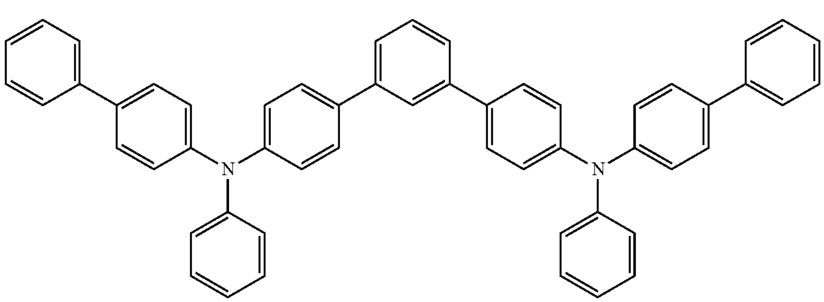

-continued
(1-28)
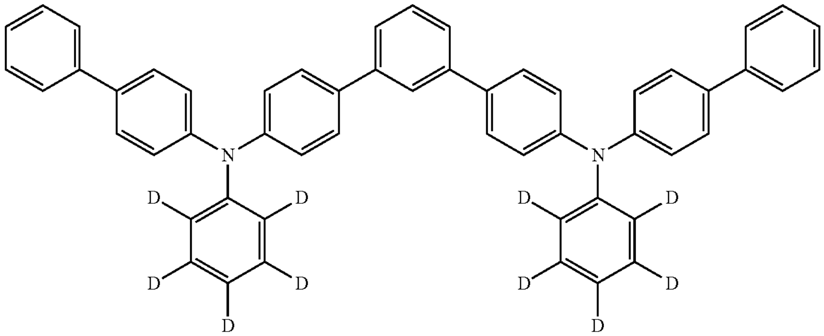
(1-29)
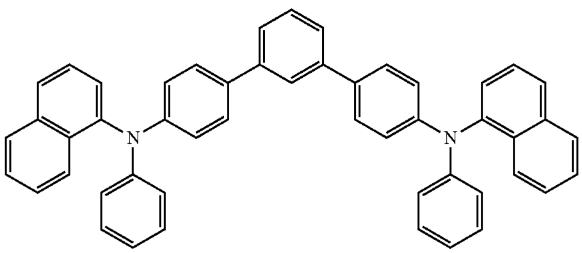
(1-30)
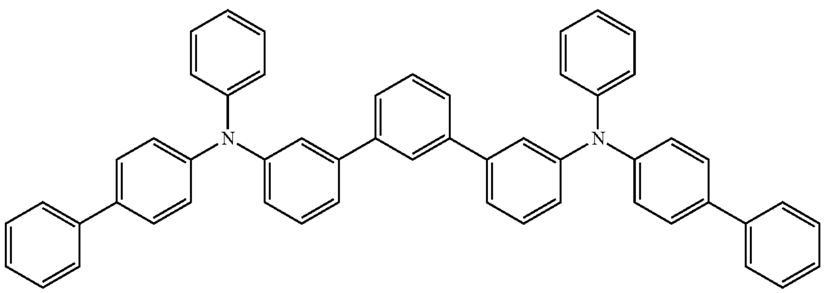
(1-31)
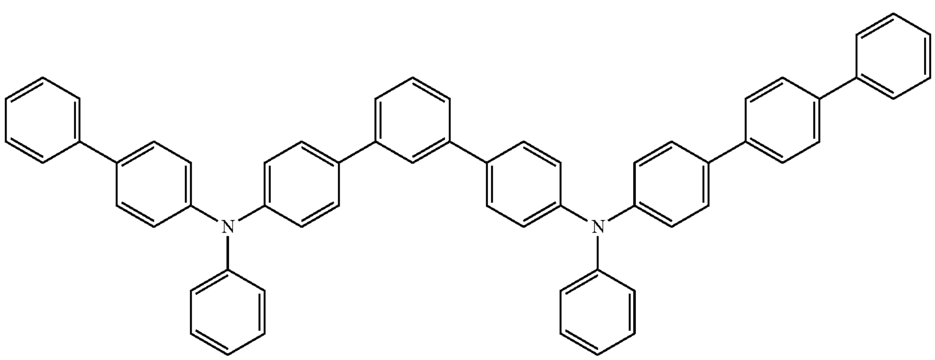
(1-32)
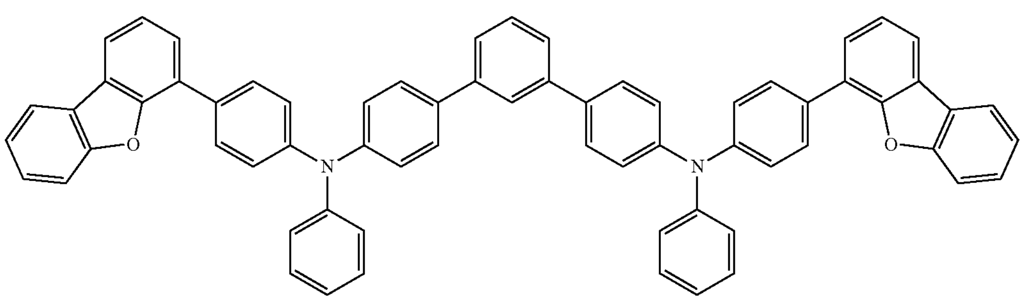

-continued
(1-33)
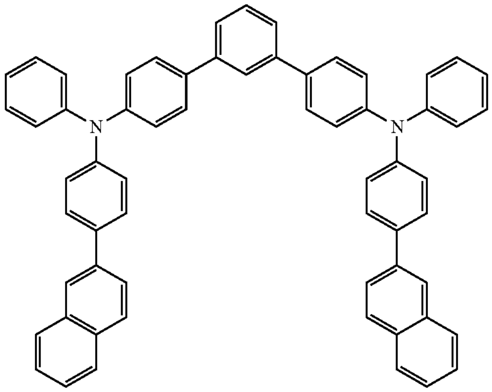
(1-34)
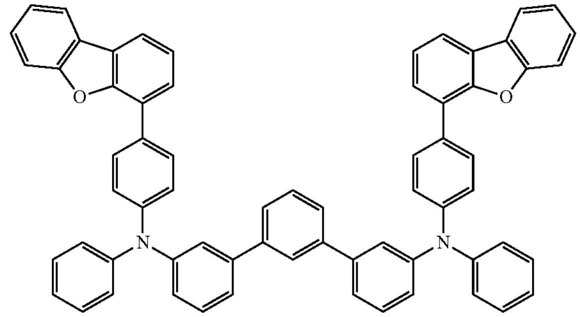
(1-35)
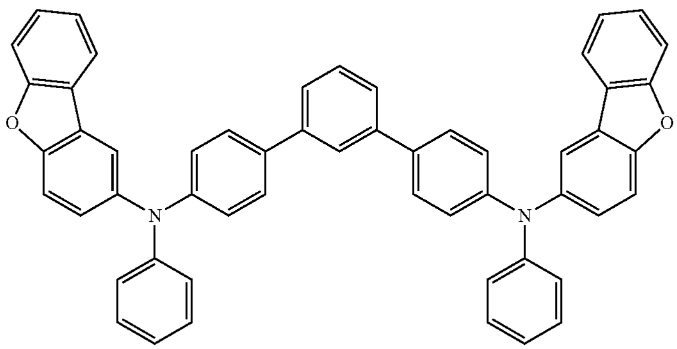
(1-36)
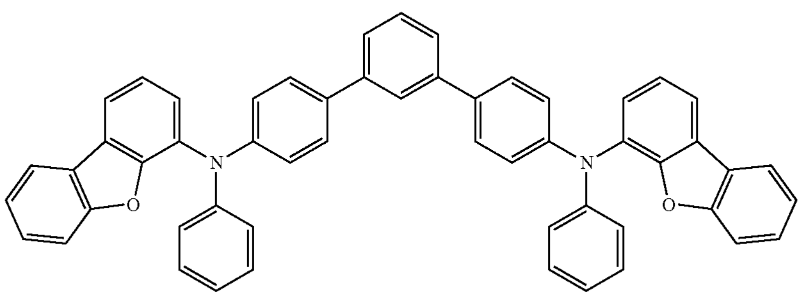
[Chemical Formula 26]
(1-37)
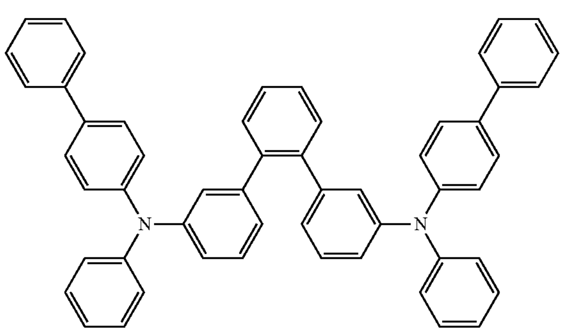
(1-38)
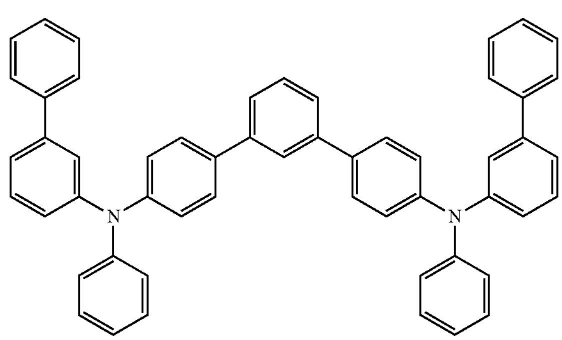

-continued
(1-39)
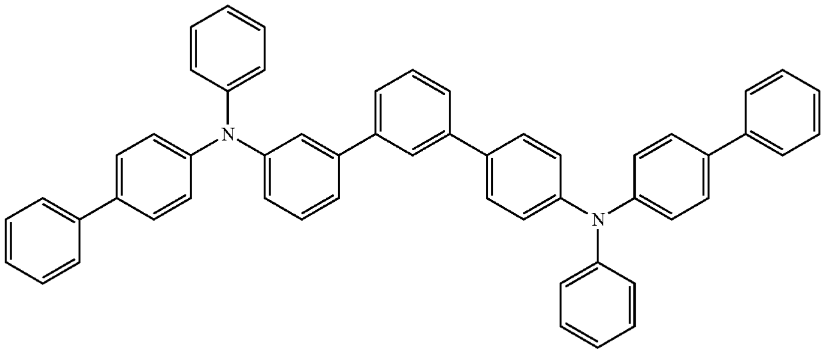
(1-40)
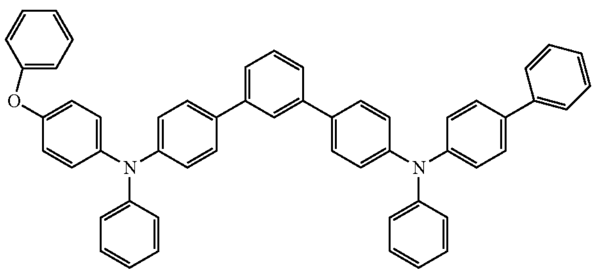
(1-41)
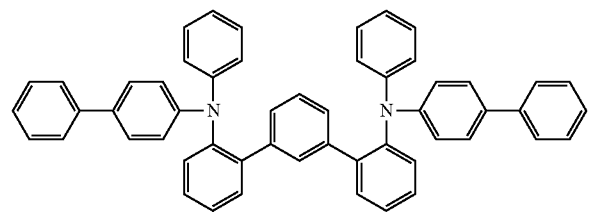
(1-42)
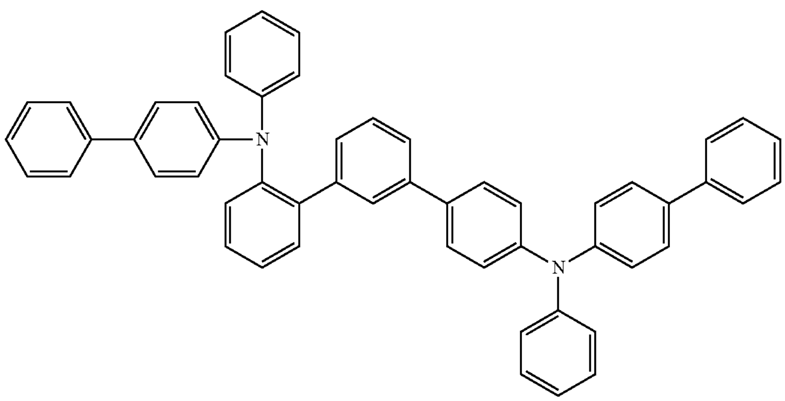
(1-43)
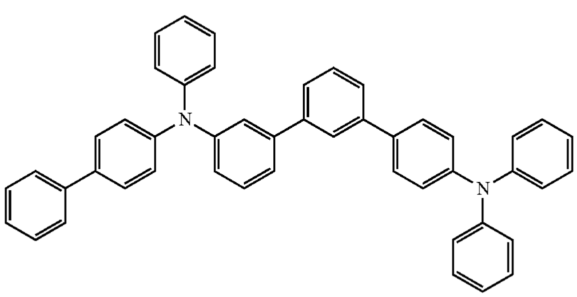
(1-44)
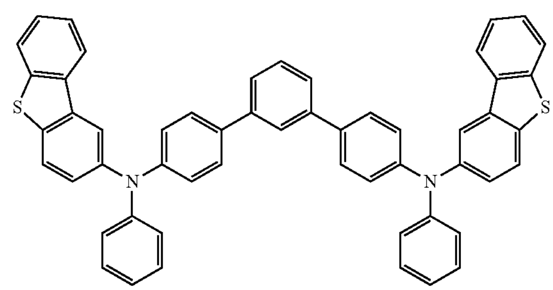
(1-45)
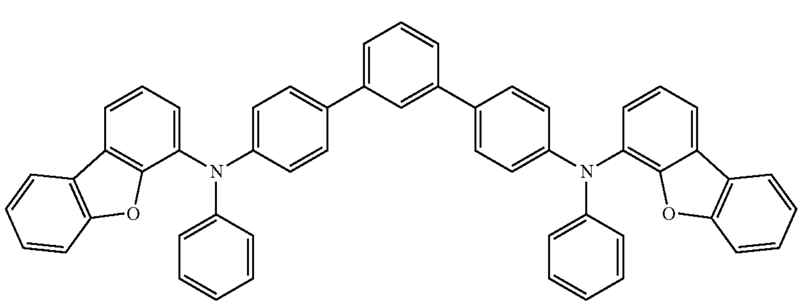

-continued
(1-46)
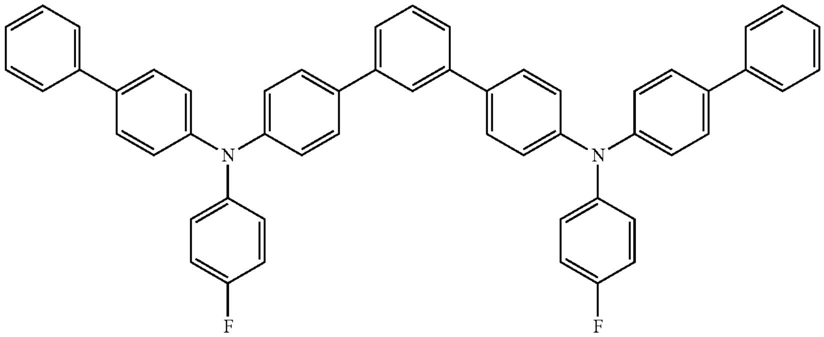
(1-47)
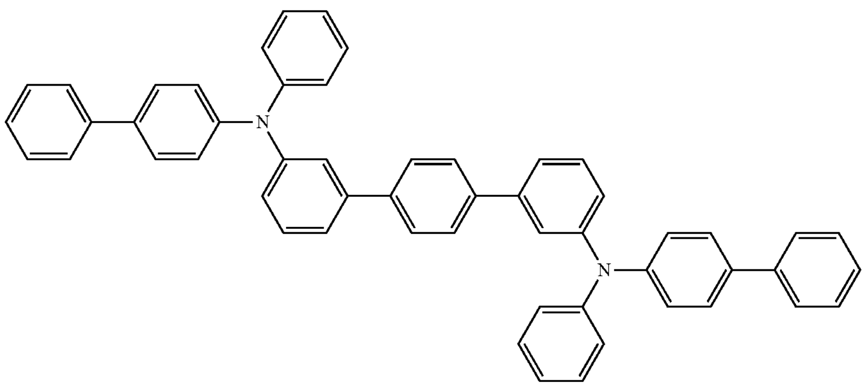
(1-48)
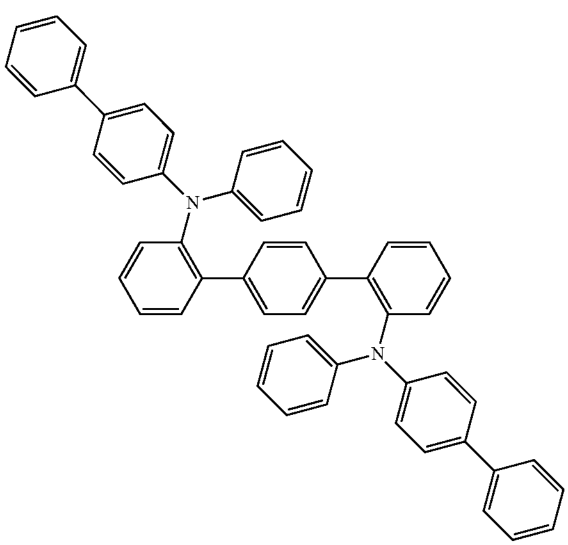

-continued
[Chemical Formula 27]
(1-49)
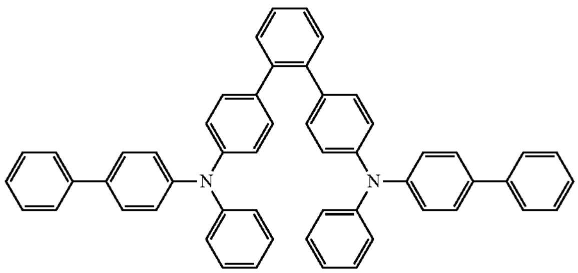
(1-50)
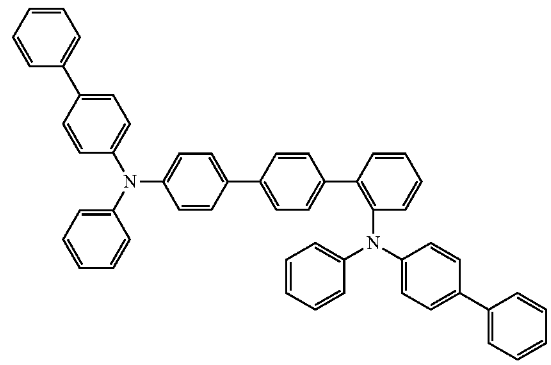
(1-51)
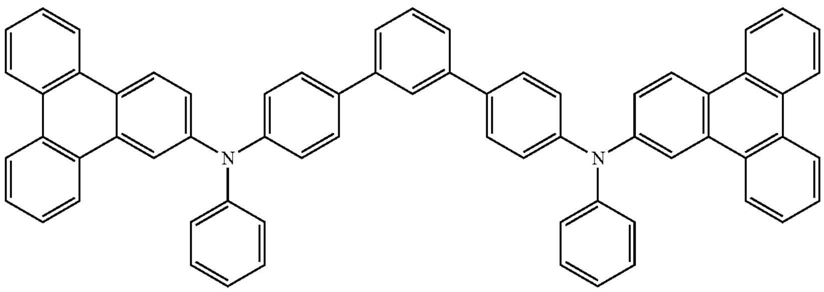
(1-52)
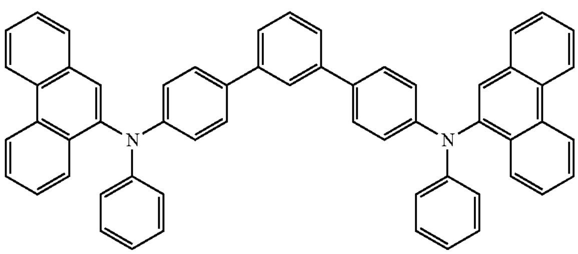
(1-53)
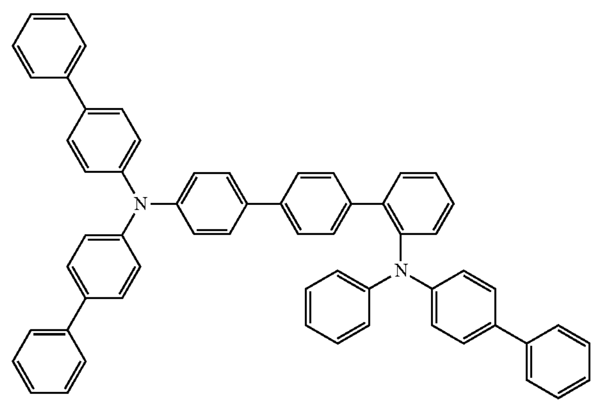
(1-54)
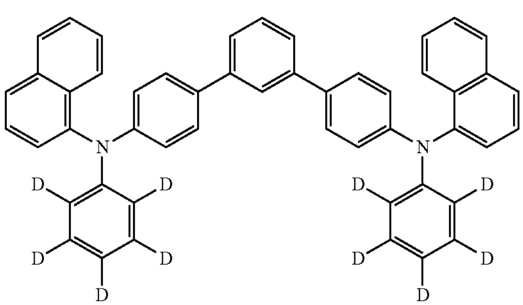
(1-55)
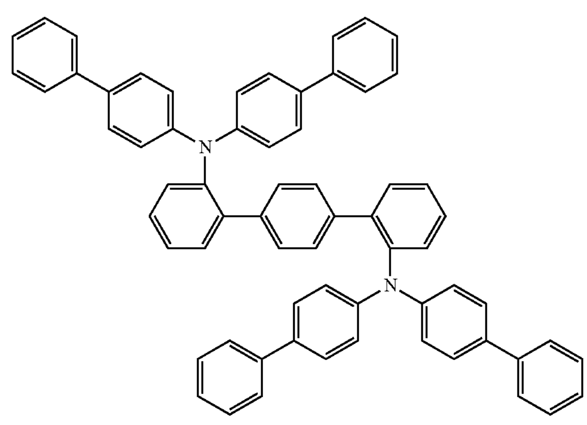

-continued
(1-56)
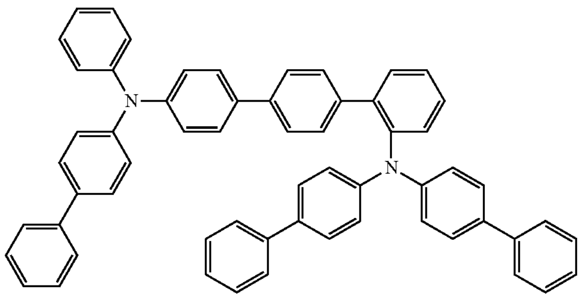
(1-57)
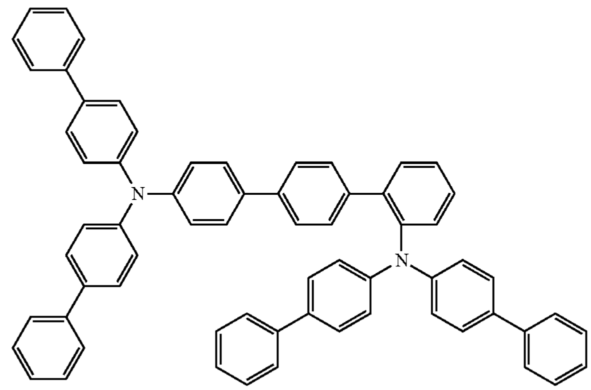
(1-58)
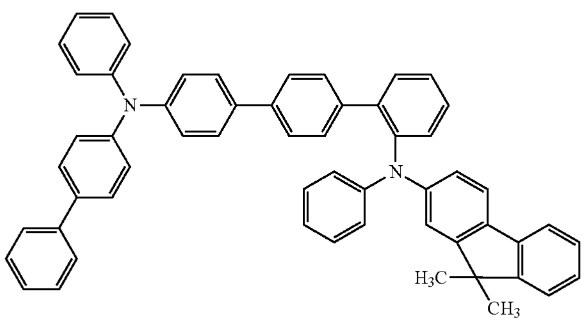
(1-59)
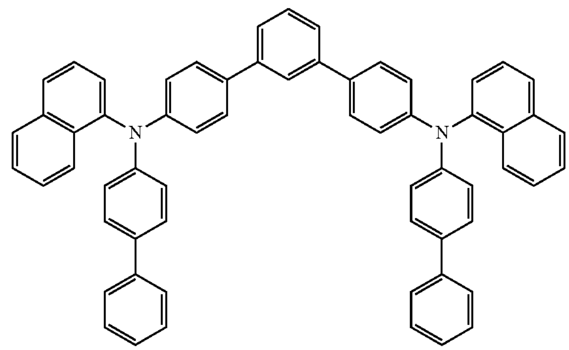
(1-60)
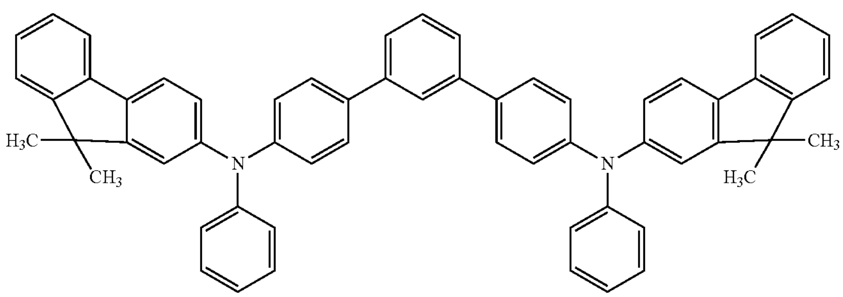
[Chemical Formula 28]
(1-61)
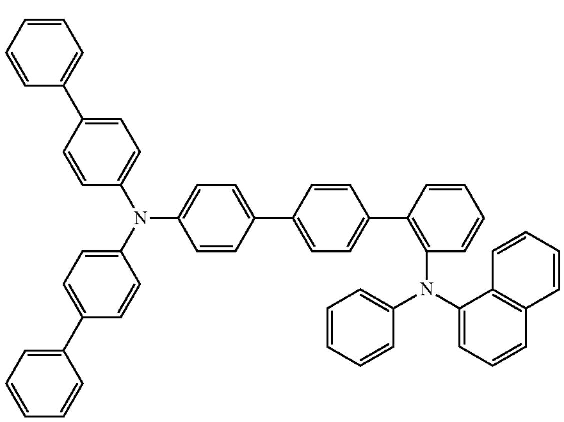
(1-62)
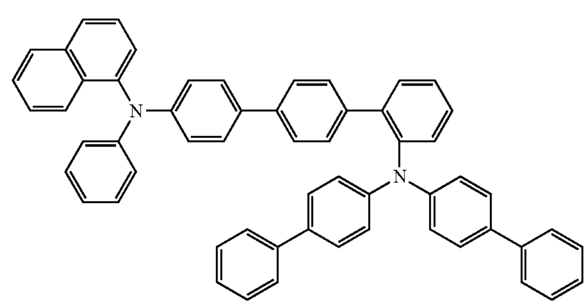

-continued
(1-63)
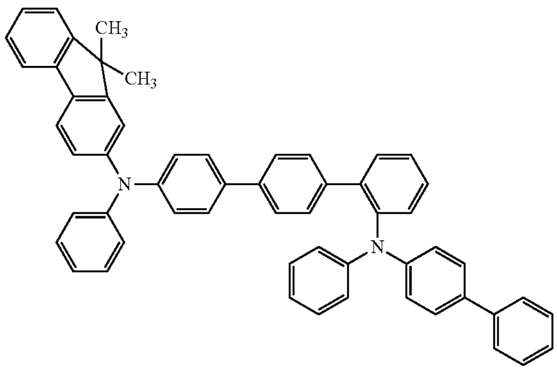
(1-64)
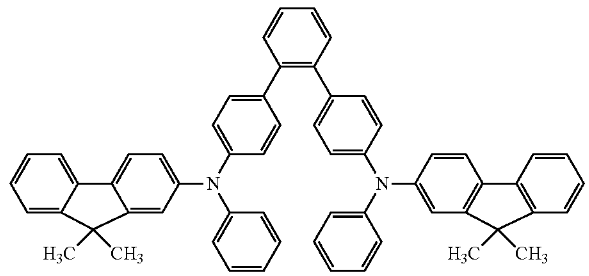
(1-65)
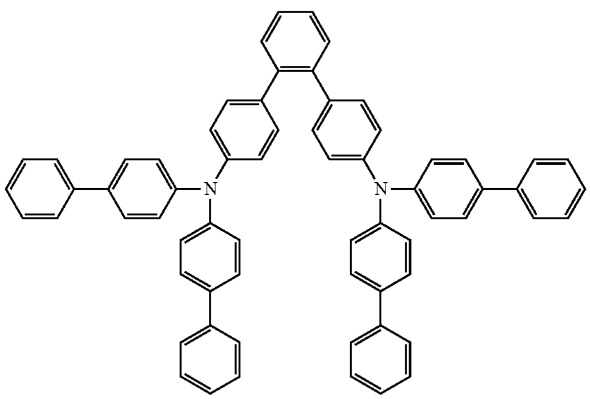
(1-66)
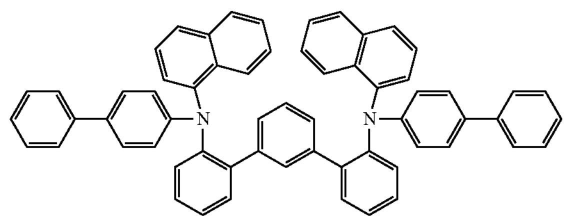
(1-67)
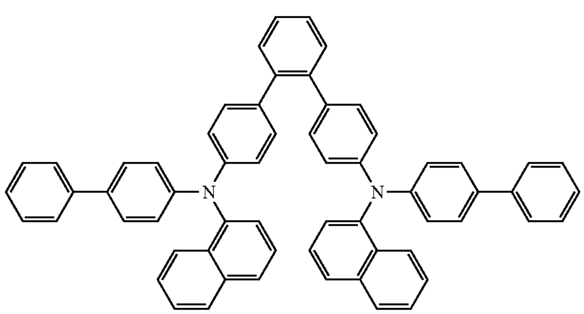
(1-68)
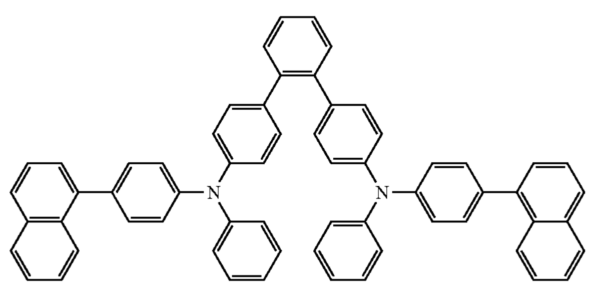
(1-69)
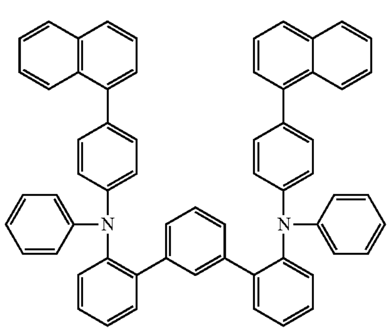
(1-70)
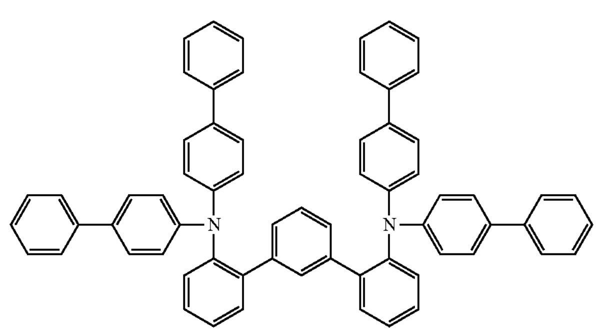

-continued
(1-71)
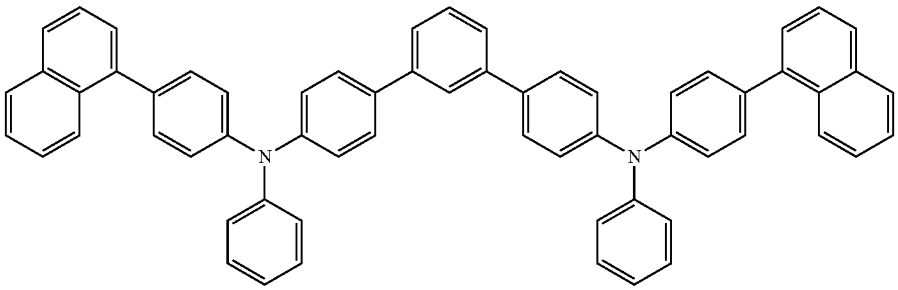
(1-72)
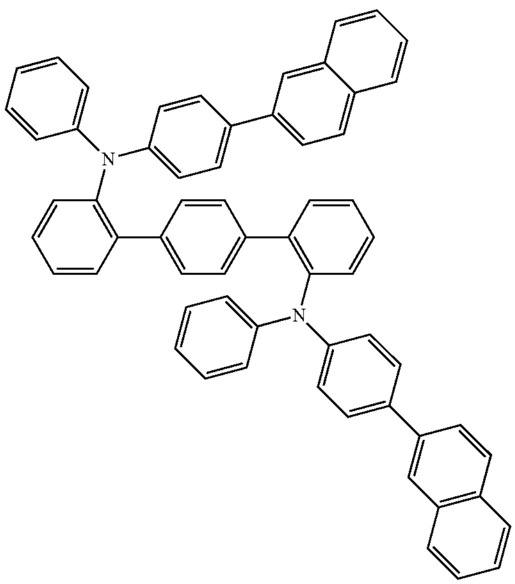
[Chemical Formula 29]
(1-73)
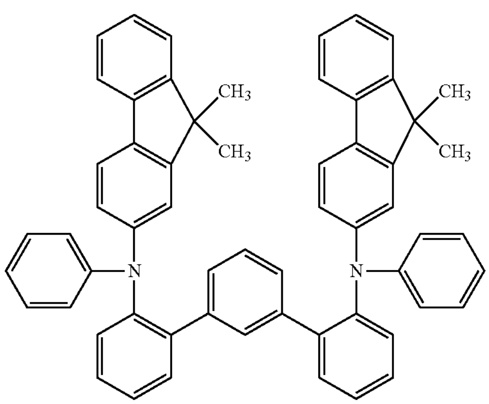
(1-74)
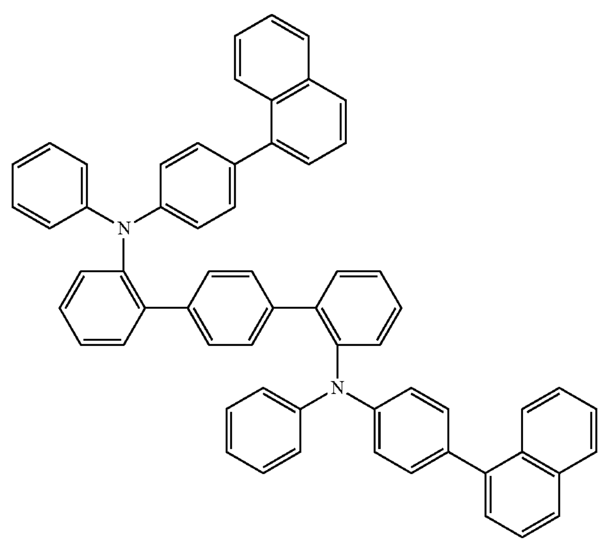

-continued
(1-75)
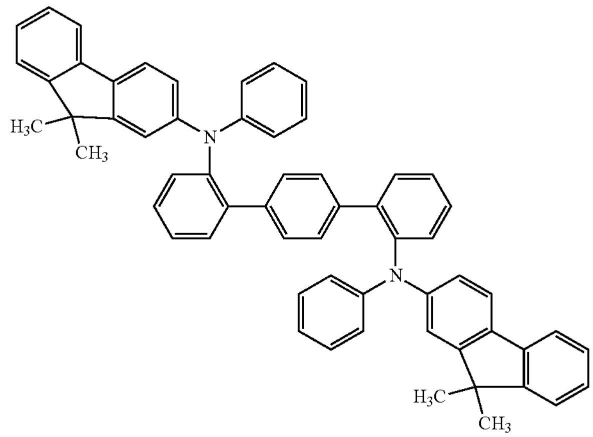
(1-76)
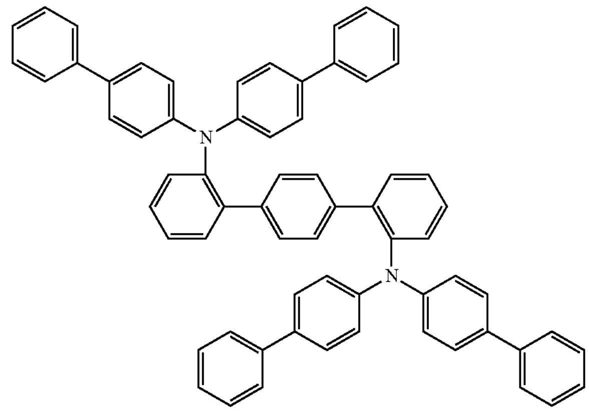
(1-77)
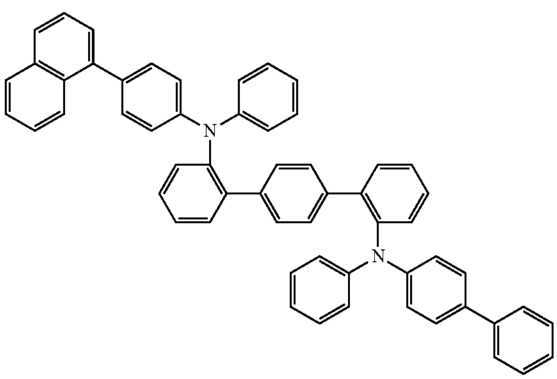
(1-78)
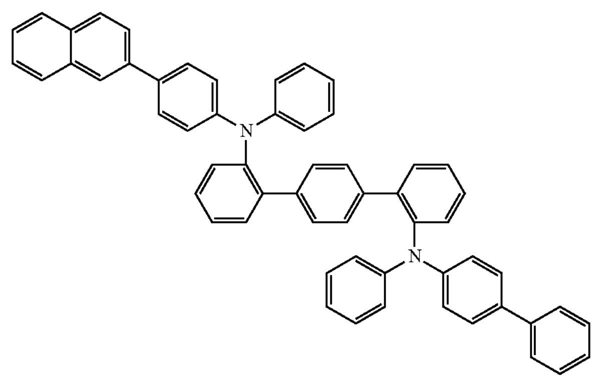
(1-79)
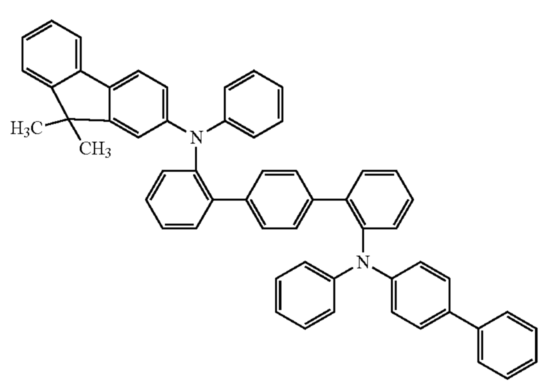
(1-80)
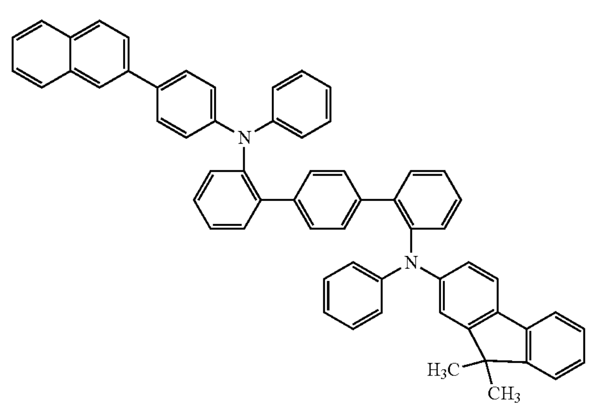

-continued
(1-81)
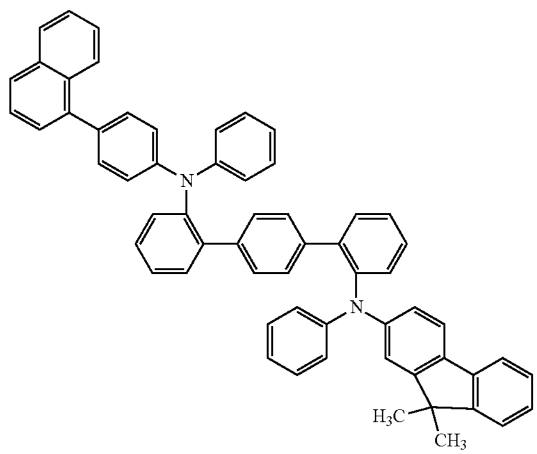
(1-82)
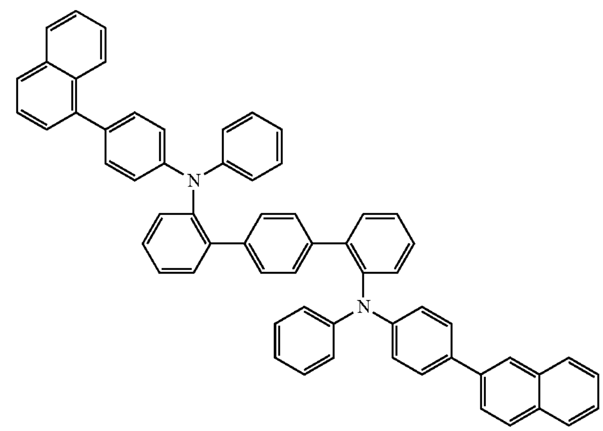
(1-83)
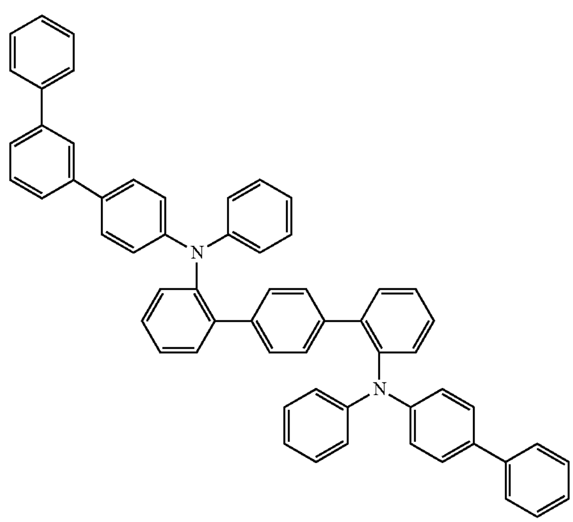
(1-84)
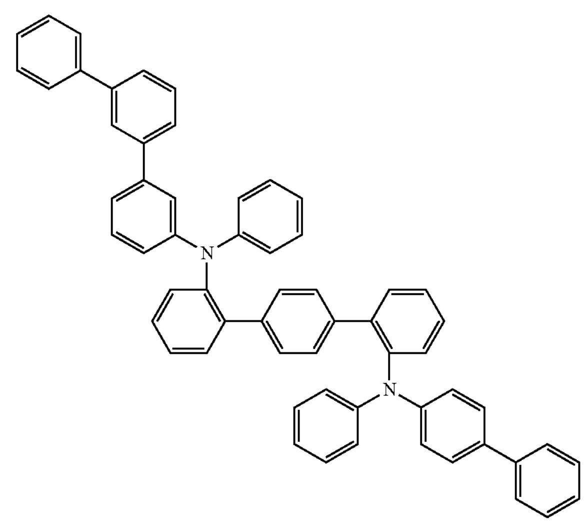
[Chemical Formula 30]
(1-85)
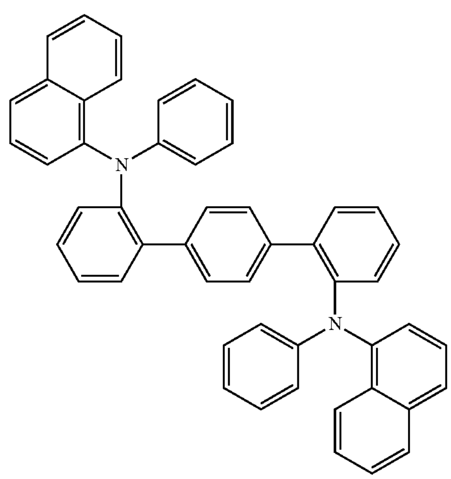
(1-86)
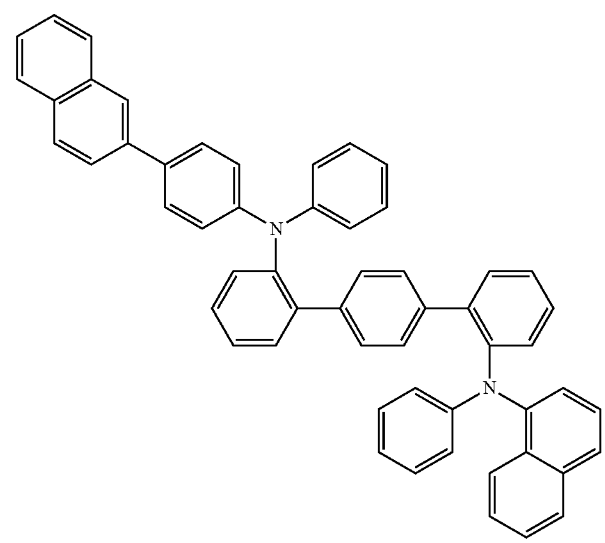

-continued
(1-87)
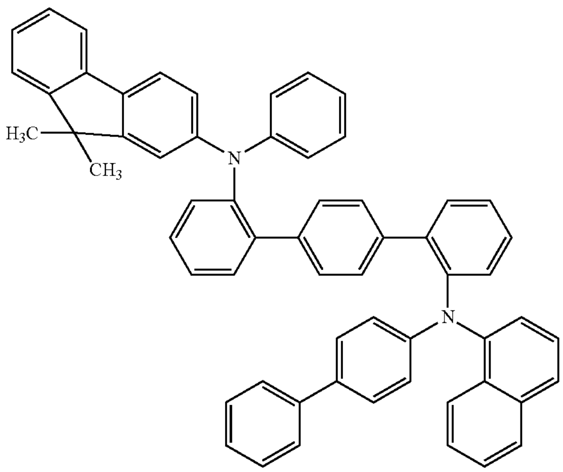
(1-88)
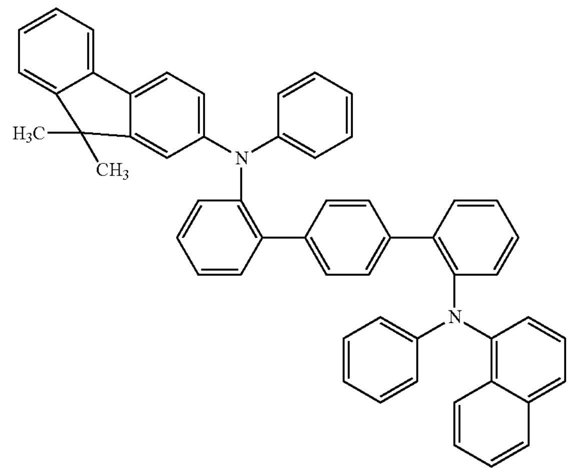
(1-89)
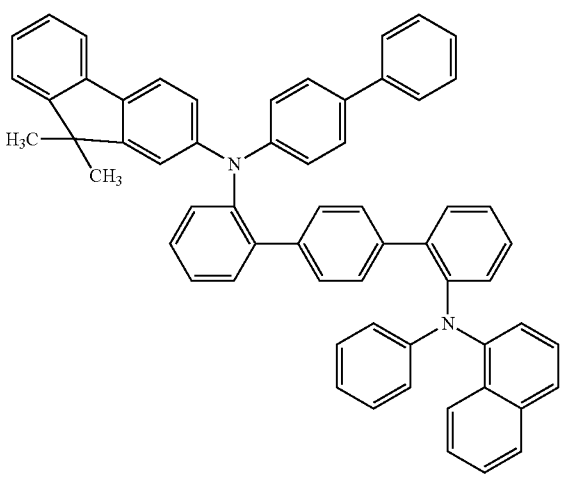
(1-90)
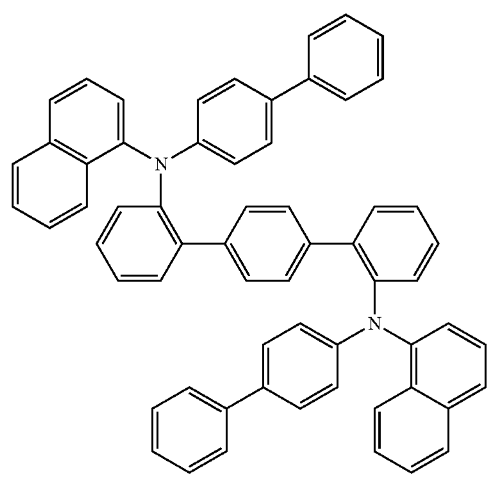
(1-91)
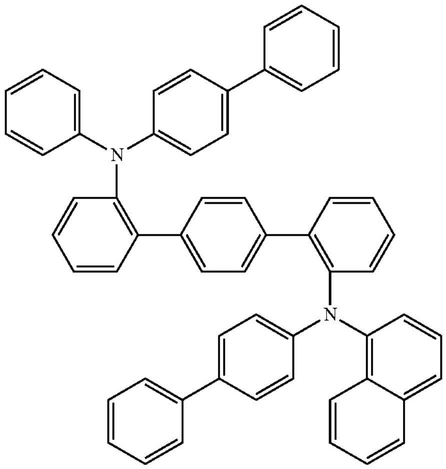

-continued
(1-92)
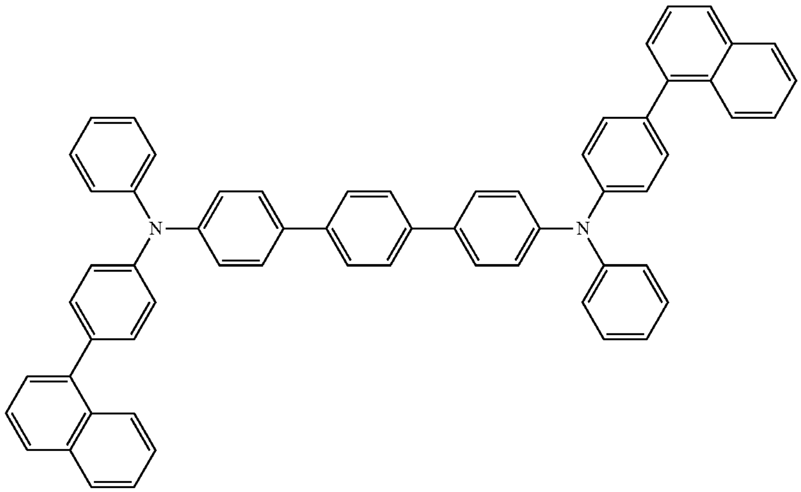
(1-93)
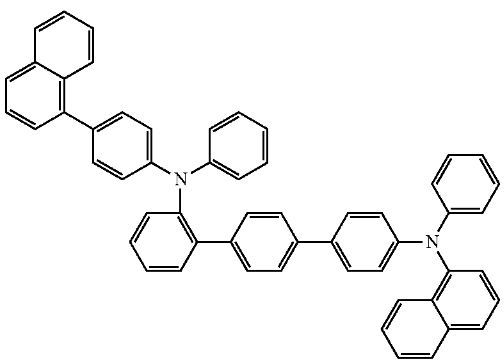
(1-94)
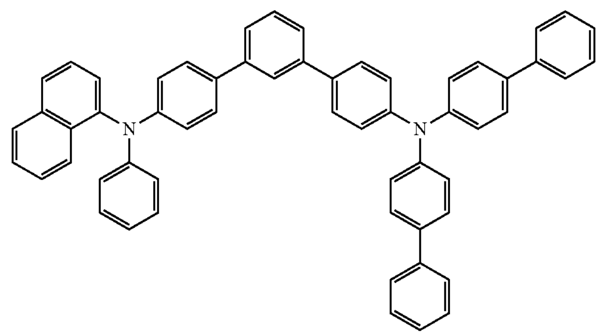
(1-95)
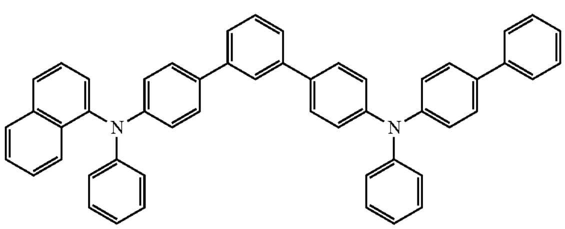
(1-96)
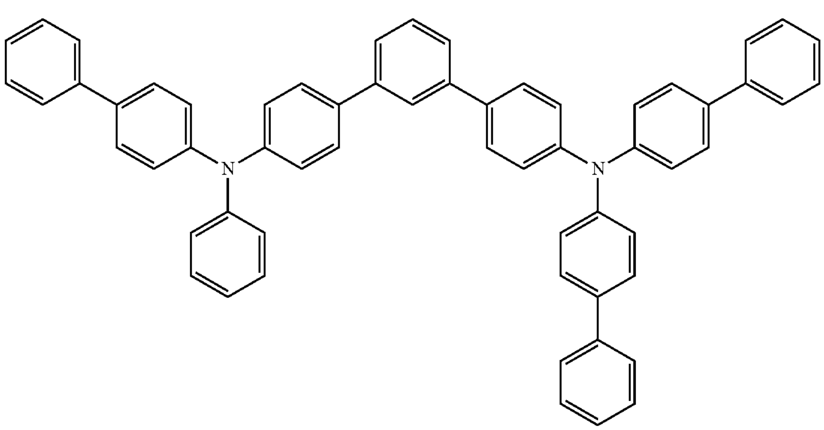

-continued
[Chemical Formula 31]
(1-97)
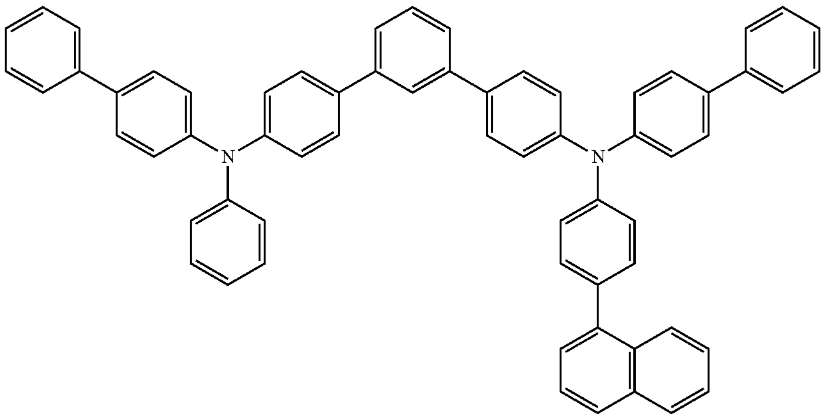
(1-98)
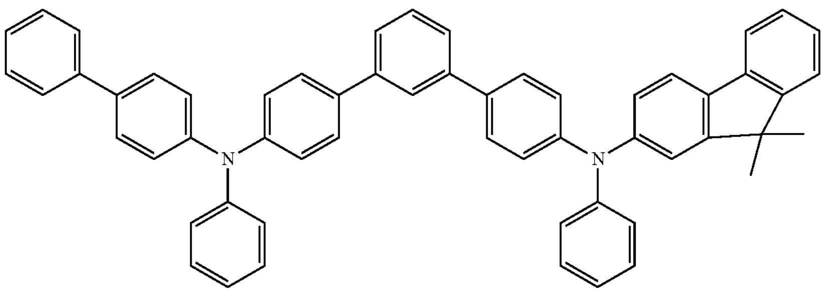
(1-99)
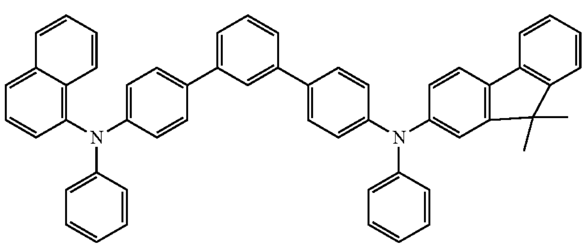
(1-100)
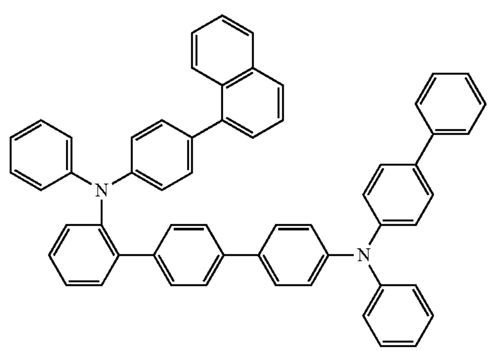
(1-101)
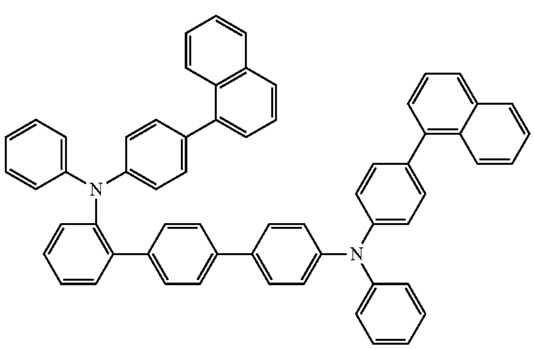
(1-102)
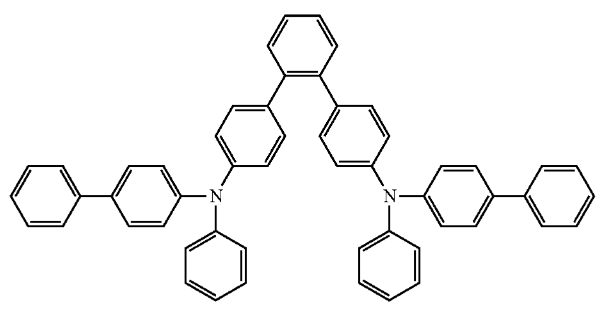

-continued
(1-103)
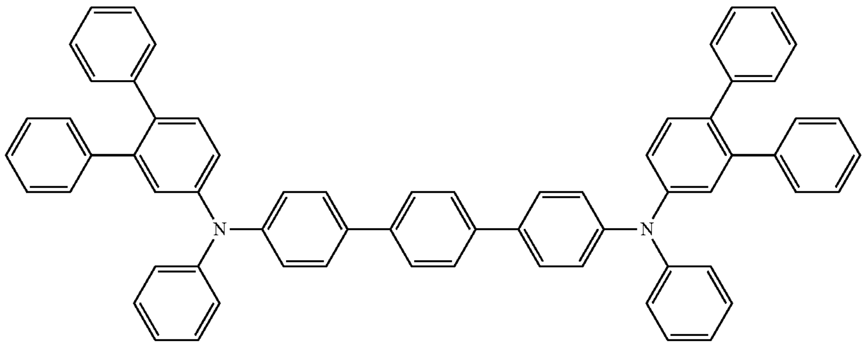
(1-104)
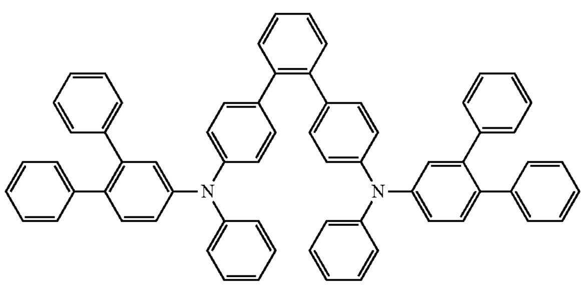
(1-105)
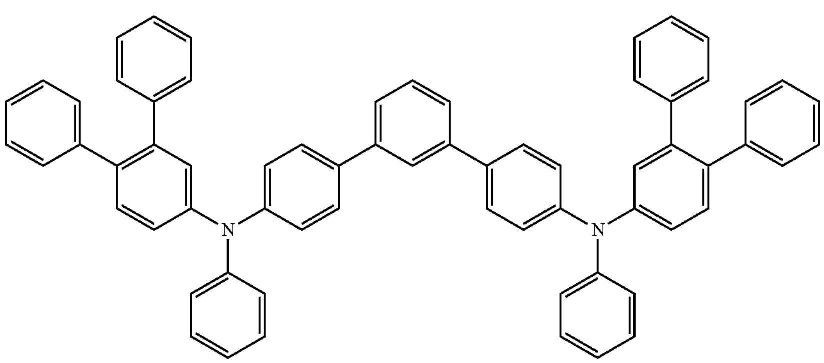

The arylamine compounds described above can be synthesized according to the known methods (refer to Patent Document 7, for example).

The following presents specific examples of preferred compounds among the arylamine compounds of the general formula (3) preferably used in the organic EL device of the present invention. The present invention, however, is not restricted to these compounds.

[Chemical Formula 32]

(3-1)

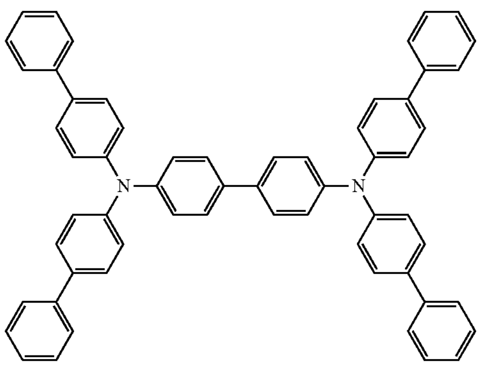

(3-2)

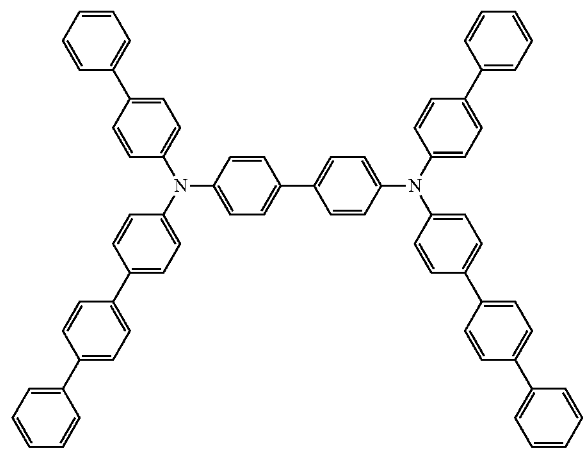

(3-3)

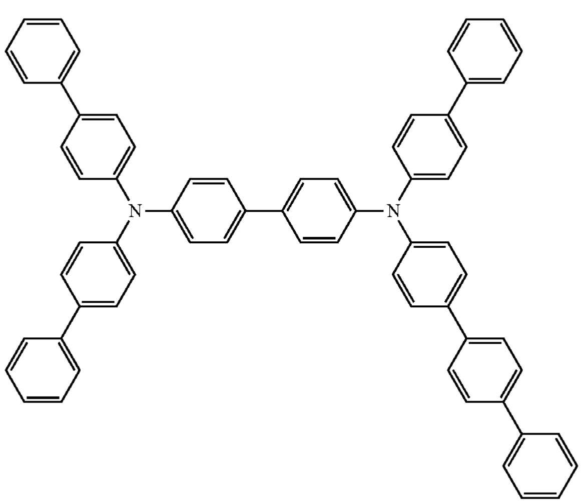

(3-4)

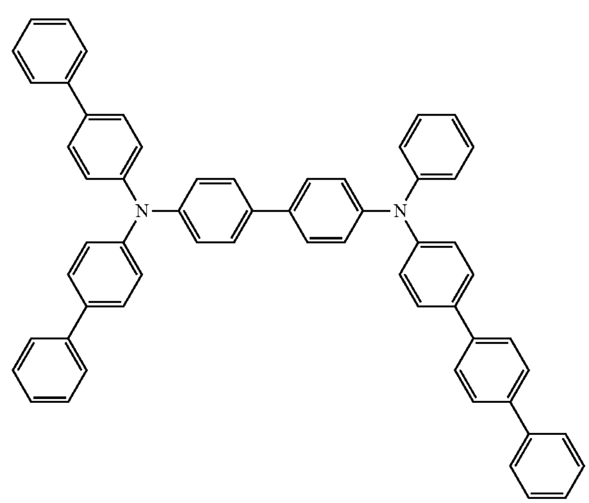

-continued
(3-5)
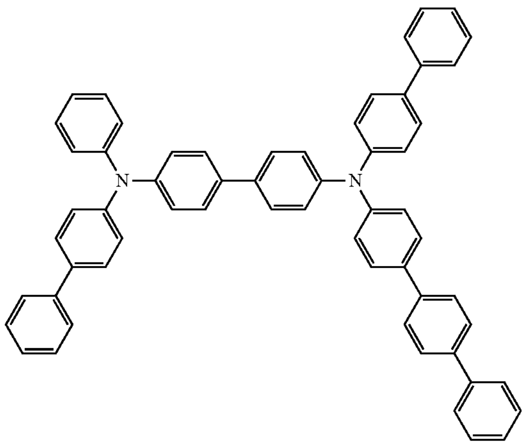
(3-6)
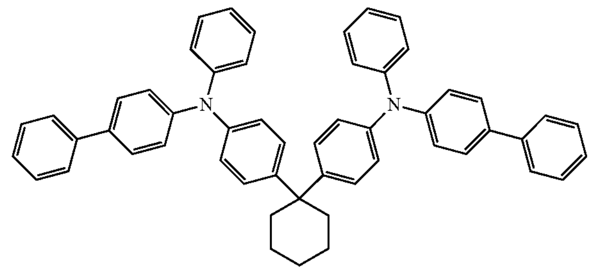
(3-7)
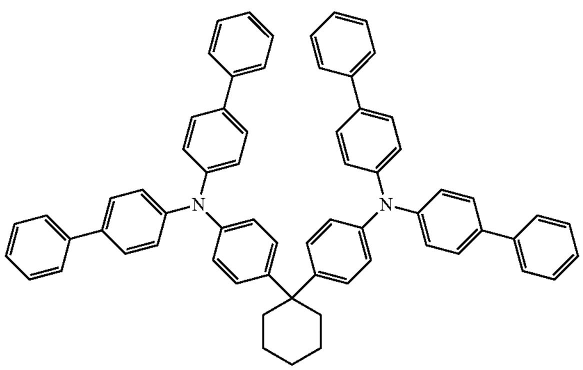
(3-8)
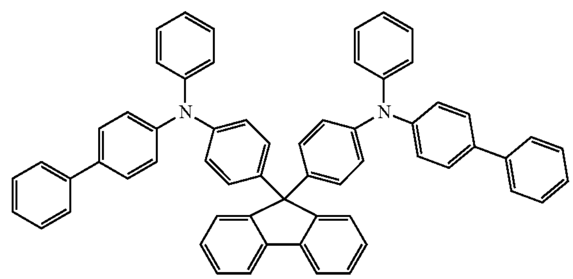
(3-9)
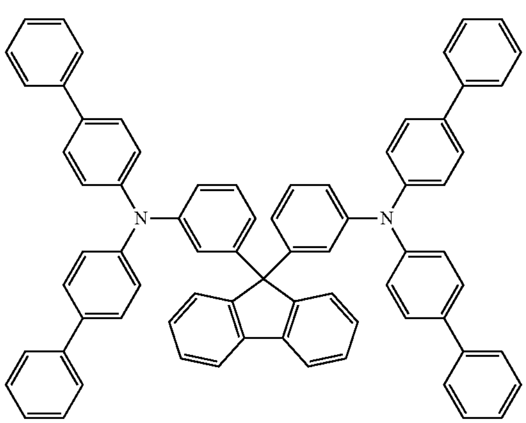
(3-10)
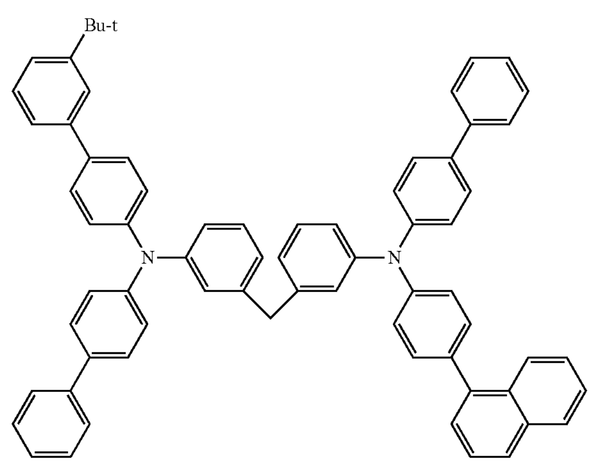

-continued
(3-10)
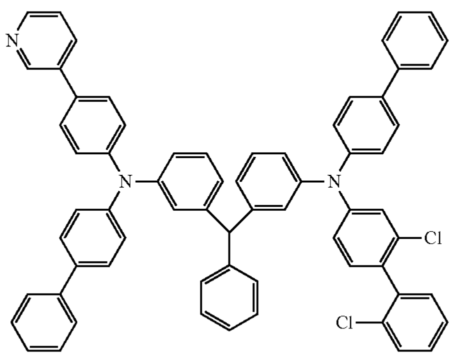
(3-12)
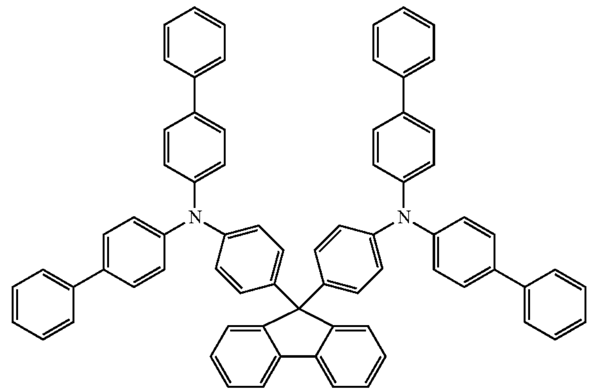
[Chemical Formula 33]
(3-13)
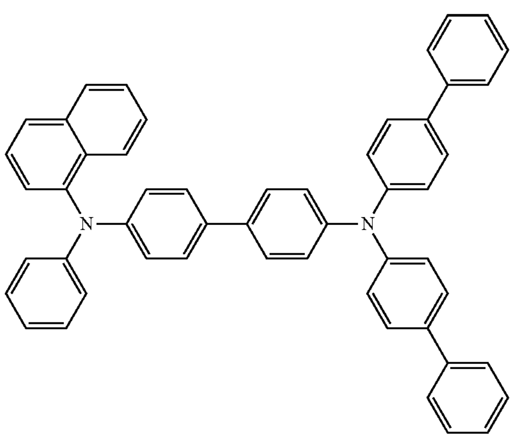
(3-14)
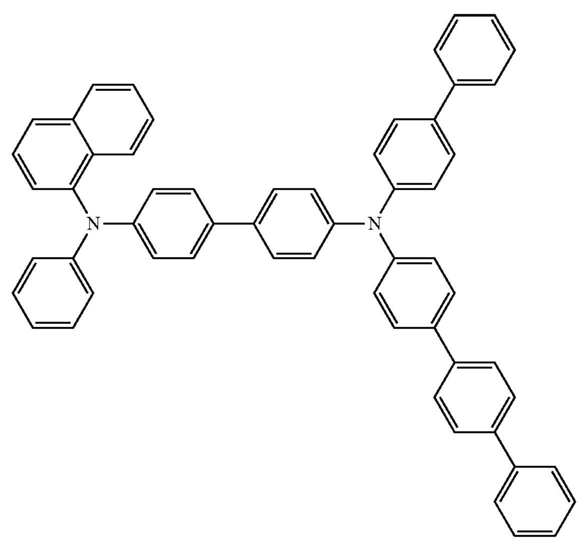
(3-15)
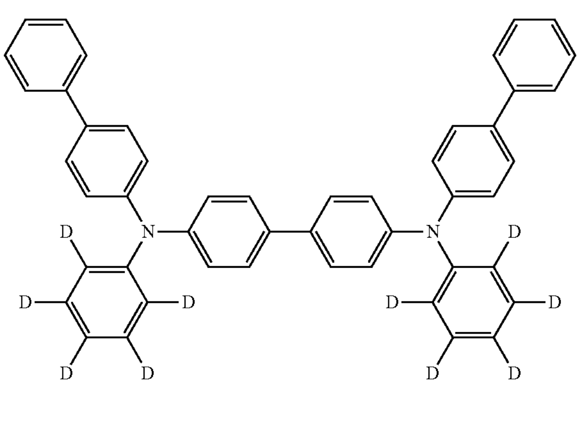
(3-16)
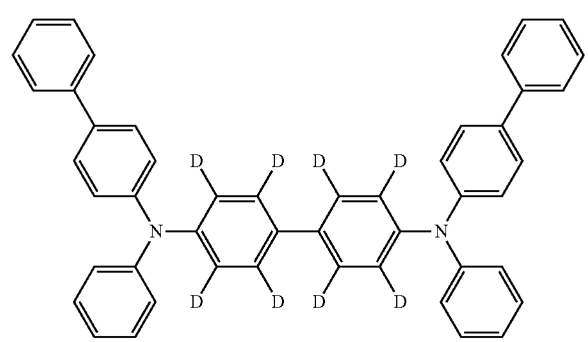

-continued
(3-17)
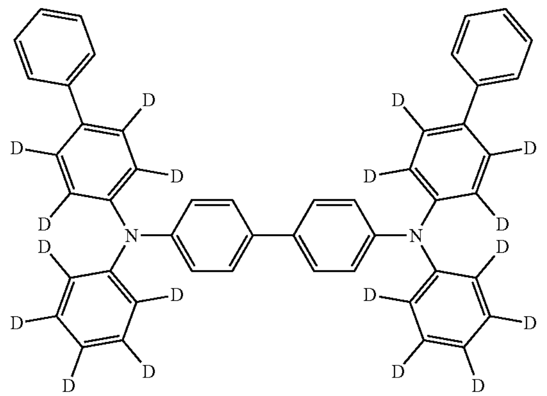
(3-18)
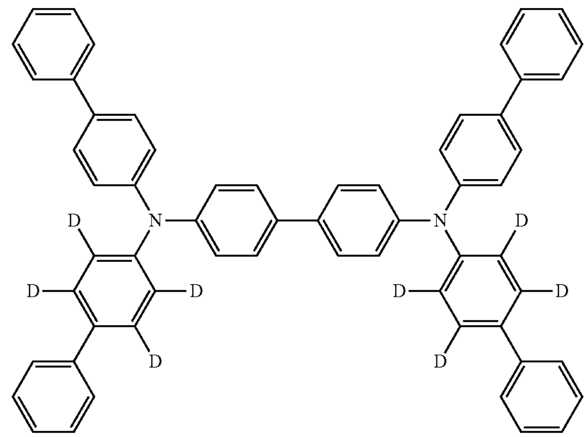
(3-19)
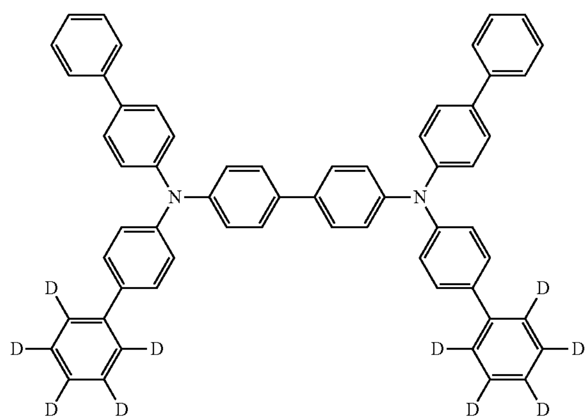
(3-20)
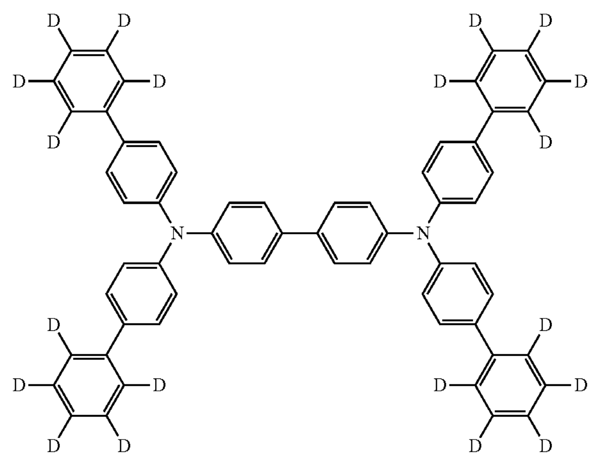
(3-21)
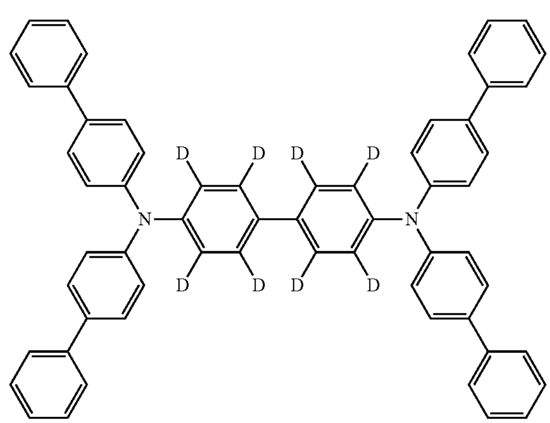
(3-22)
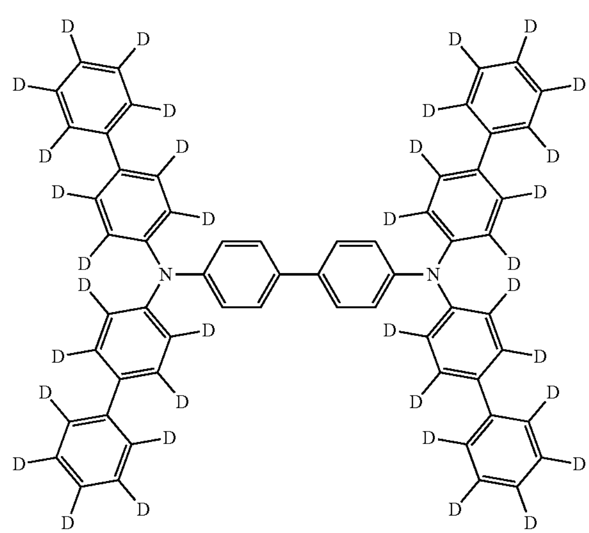

-continued (3-23)

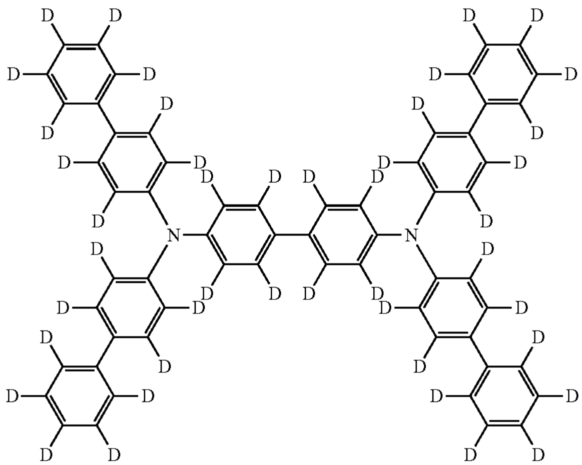

The following presents specific examples of preferred compounds of the arylamine compounds having two triphenylamine structures in the molecule among the triphenylamine compounds having a structure in which two to six triphenylamine structures in the molecule bind via a single bond or a divalent group that does not contain a heteroatom preferably used in the organic EL device of the present invention, in addition to the arylamine compounds of general formula (3). The present invention, however, is not restricted to these compounds.

[Chemical Formula 34]

(3′-1)

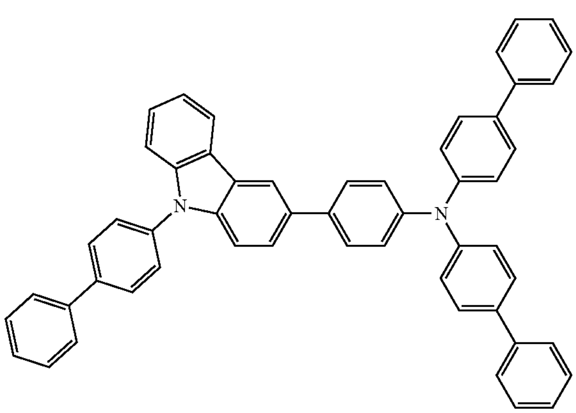

-continued (3′-2)

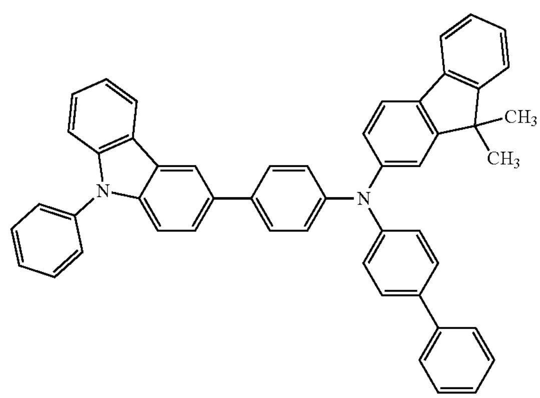

The following presents specific examples of preferred compounds among the arylamine compounds of the general formula (4) preferably used in the organic EL device of the present invention. The present invention, however, is not restricted to these compounds.

[Chemical Formula 35]
(4-1)
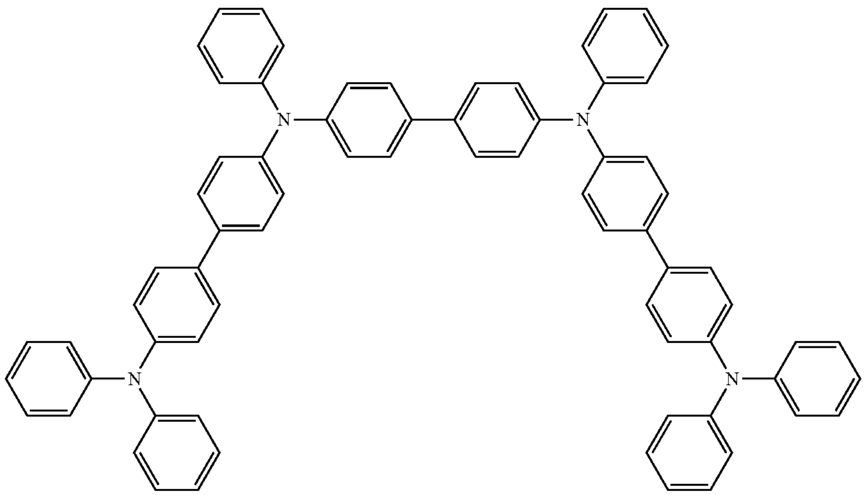
(4-2)
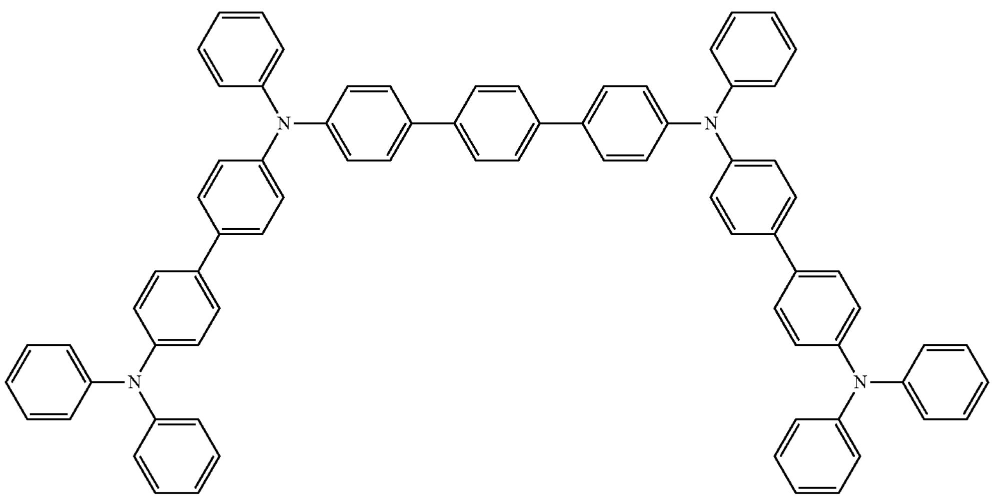
(4-3)
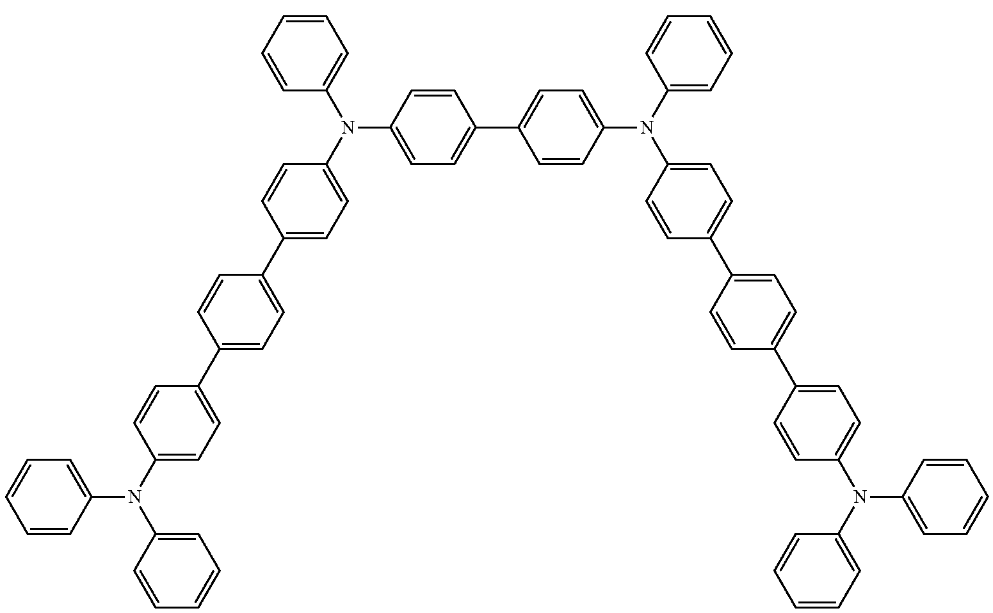

-continued
(4-4)
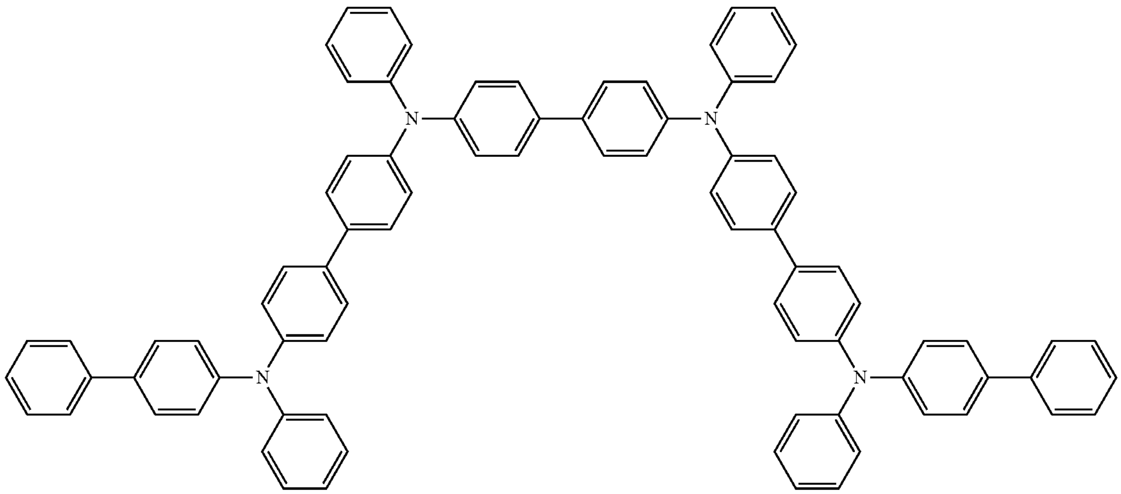
(4-5)
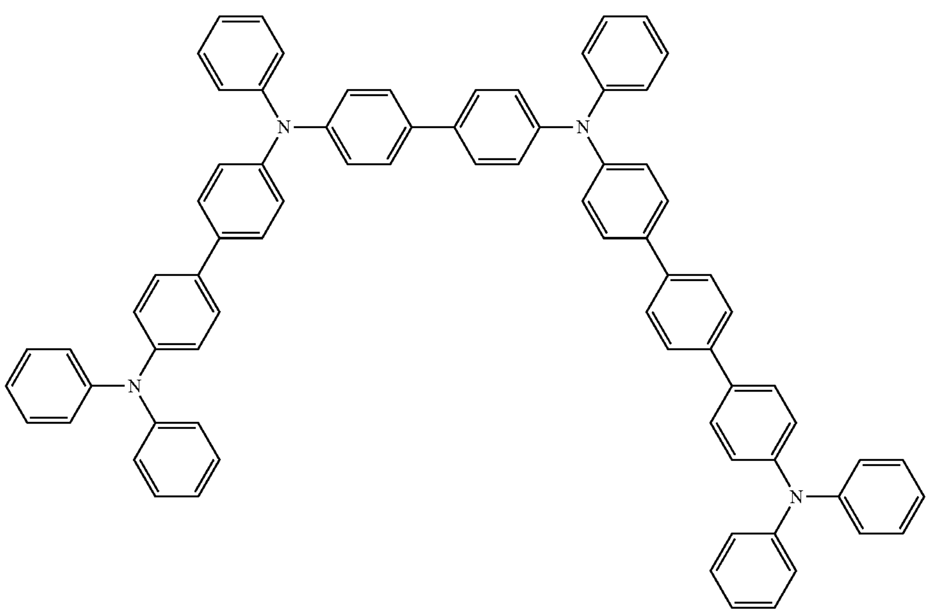

-continued
(4-6)
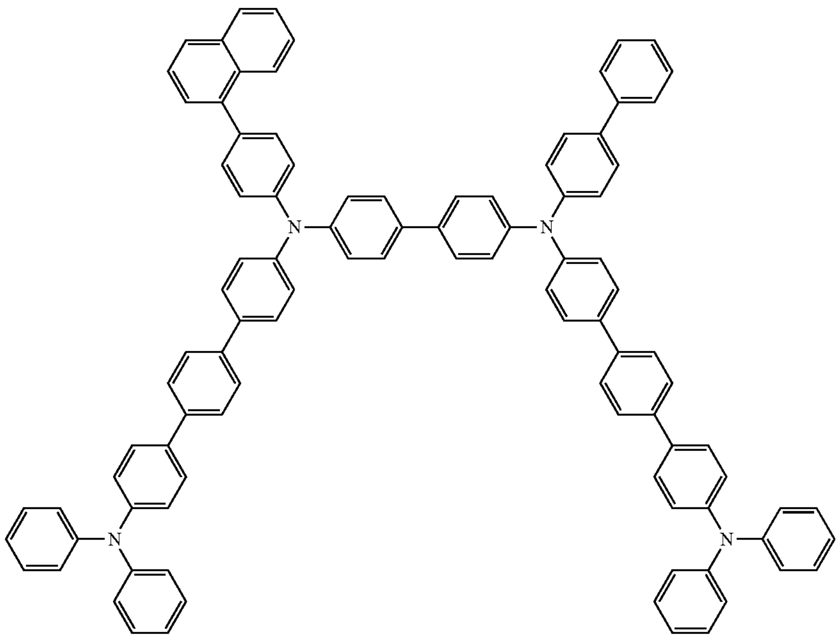
(6-7)
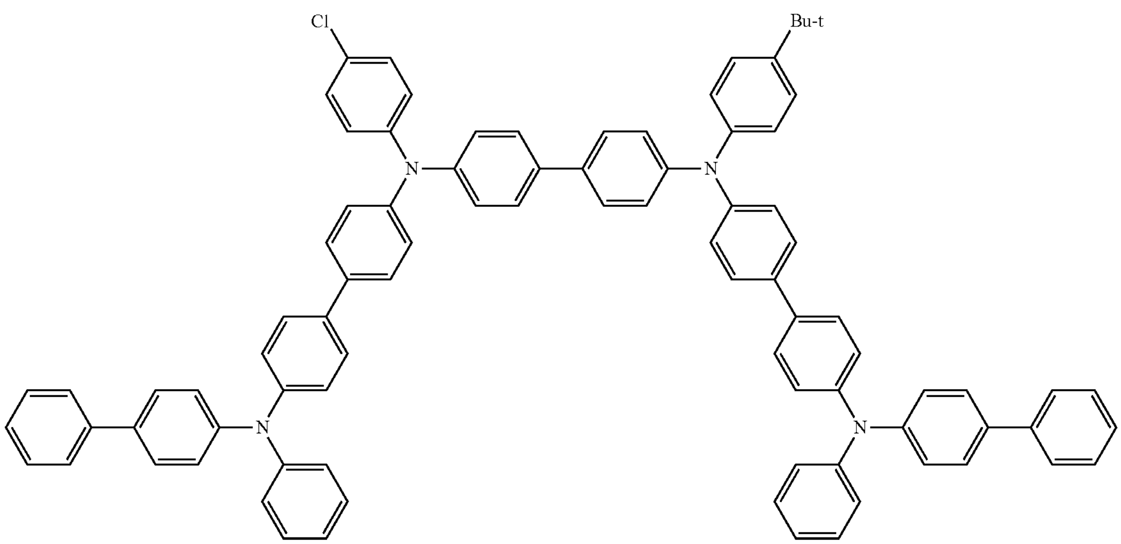
(4-8)
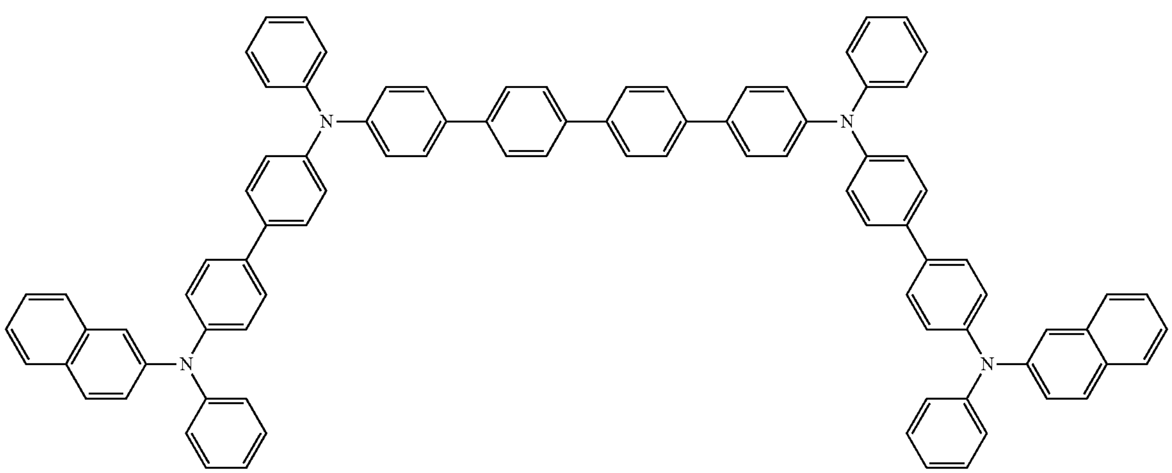

-continued
(4-9)
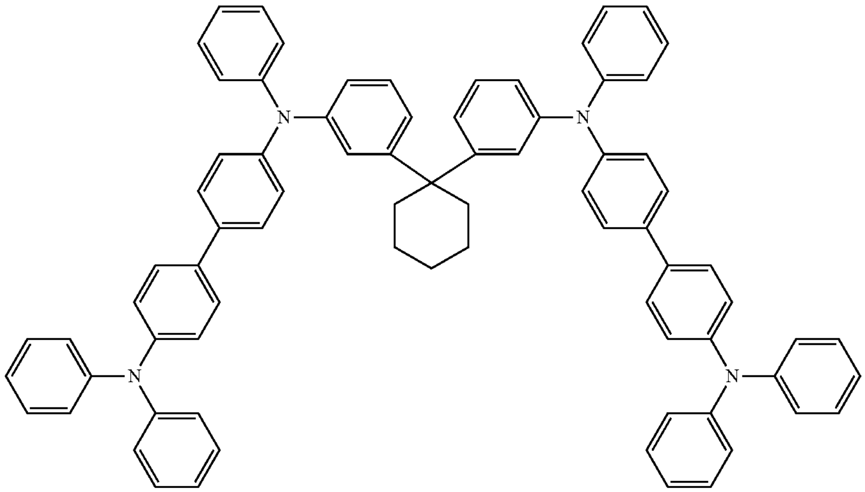
(4-10)
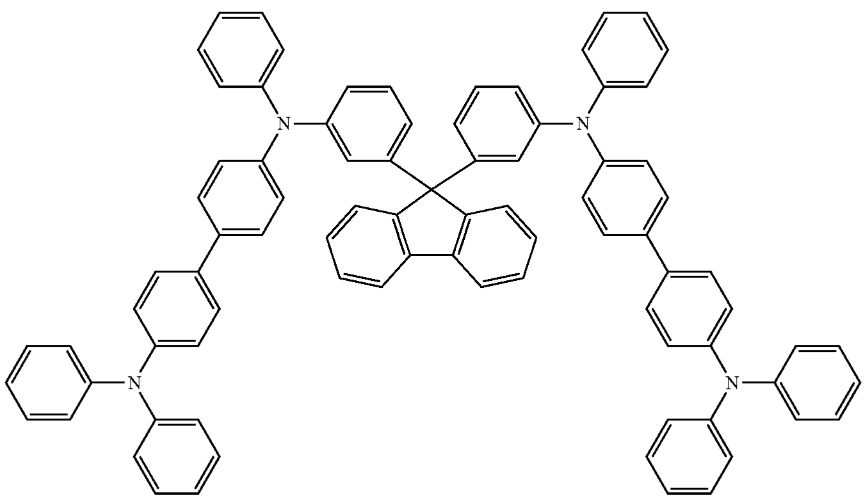
(4-11)
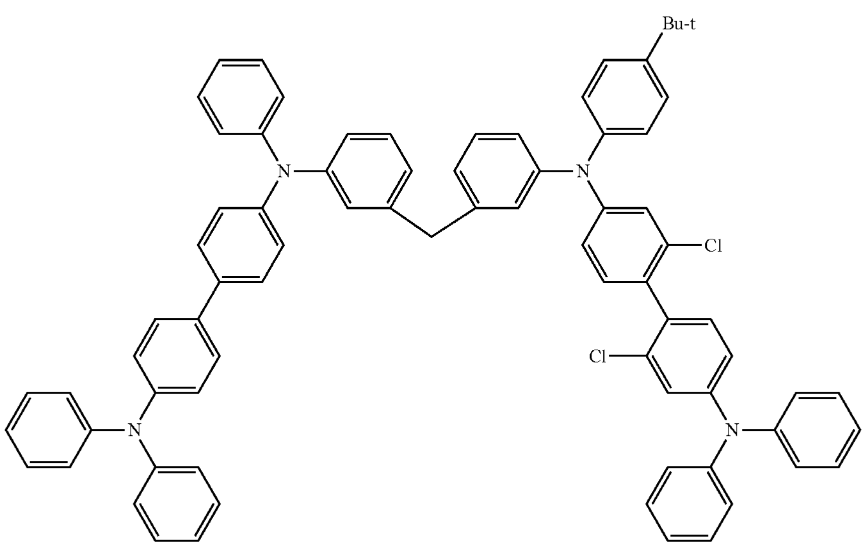

-continued
(4-12)
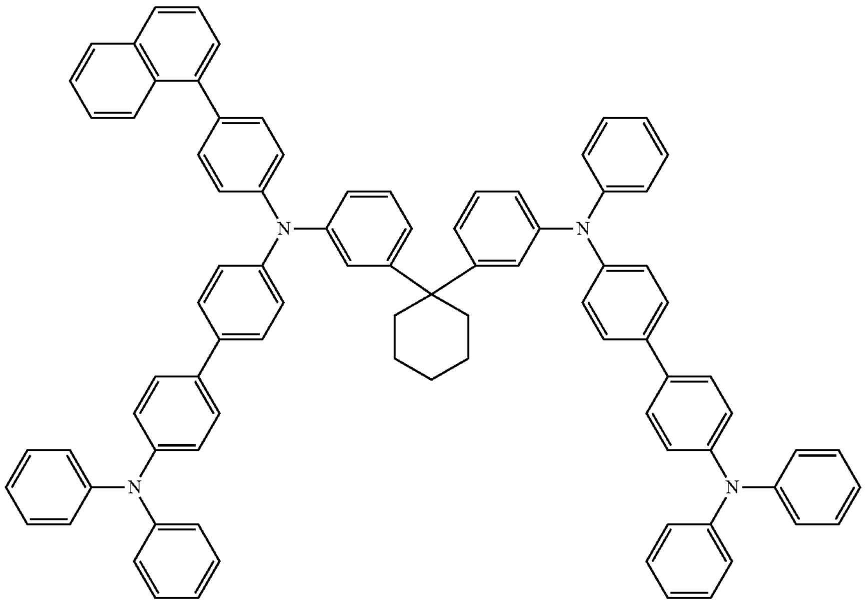
[Chemical Formula 36]
(4-13)
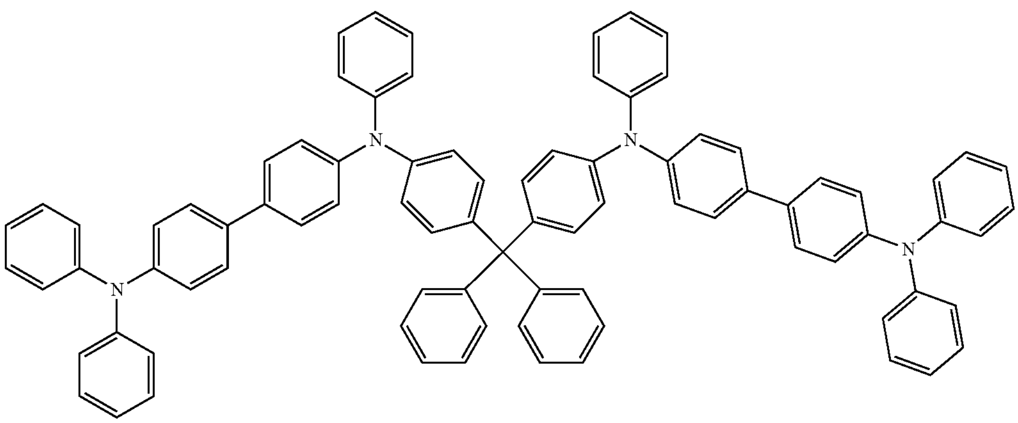
(4-14)
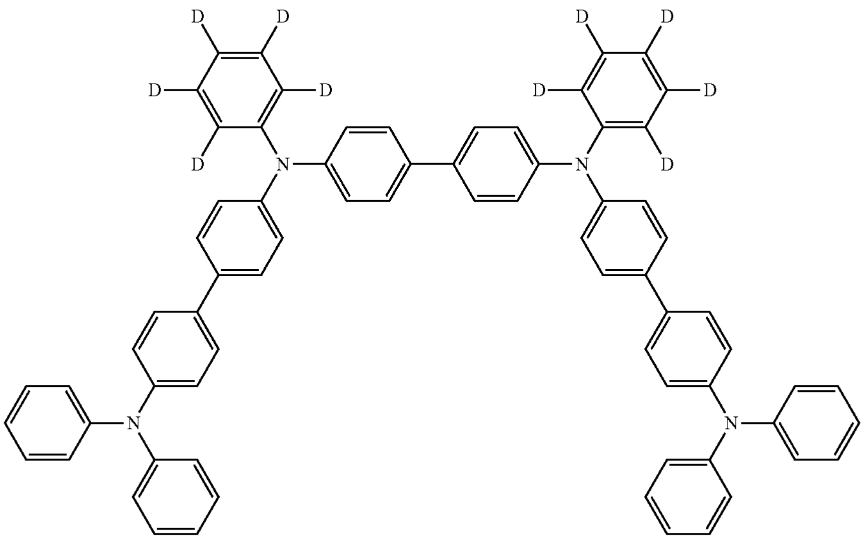

-continued
(4-15)
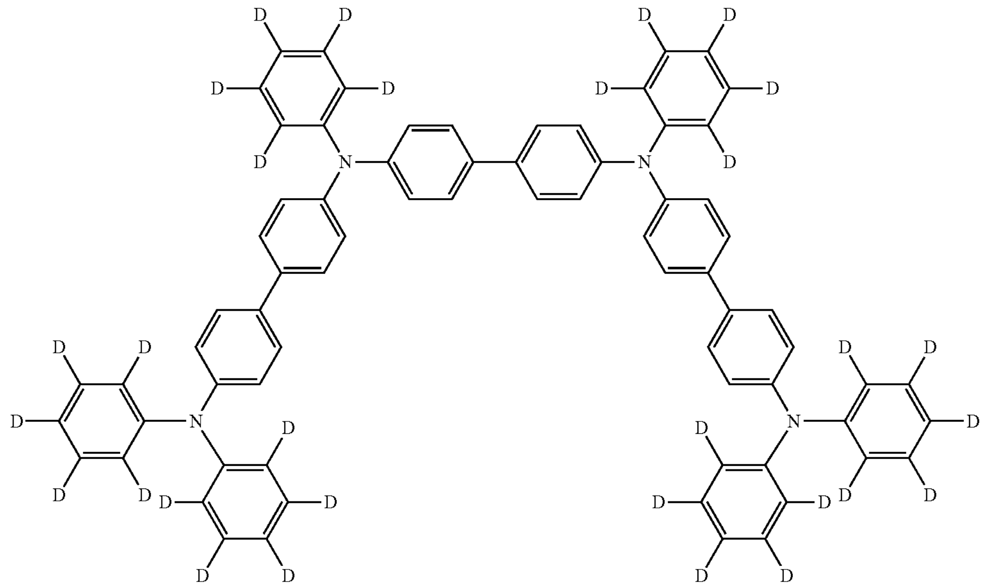
(4-16)
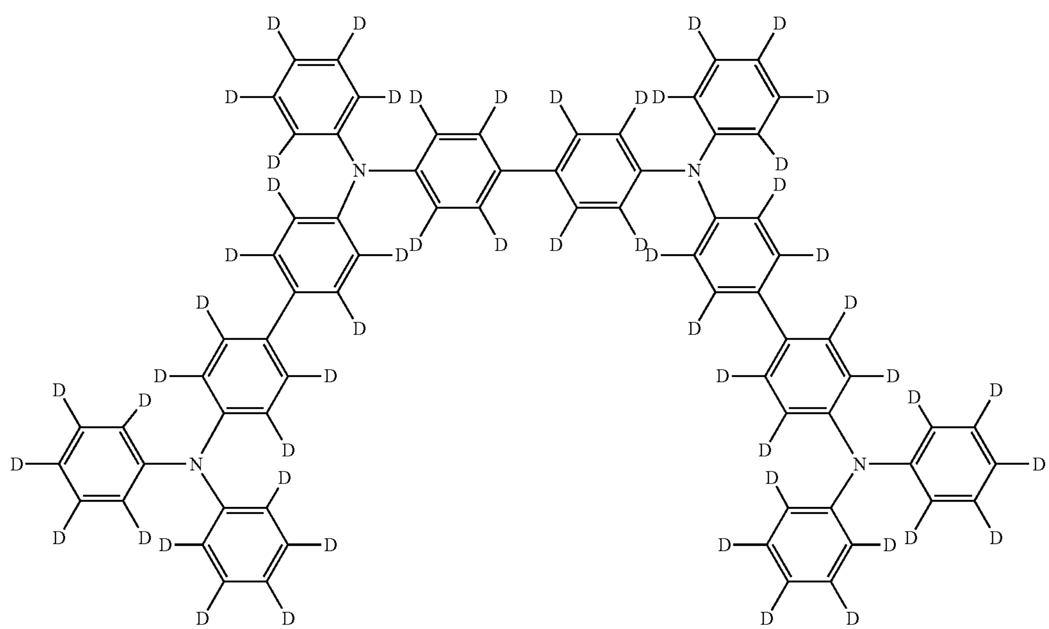

-continued (4-17)

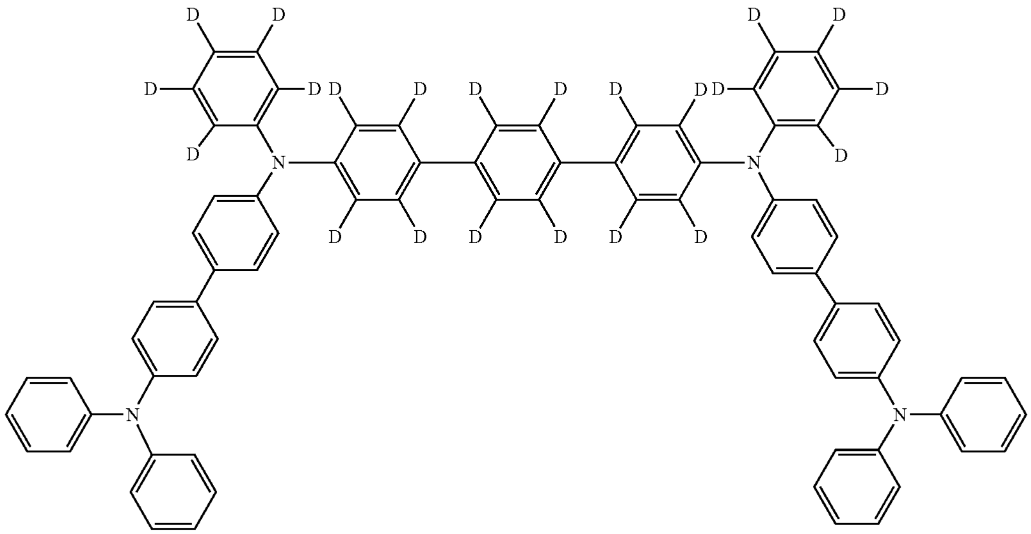

The arylamine compounds of the general formula (3) and the arylamine compounds of the general formula (4) can be synthesized by a known method (refer to Patent Documents 8 to 10, for example).

The following presents specific examples of preferred compounds among the compounds of the general formula (5a) preferably used in the organic EL device of the present invention and having an anthracene ring structure. The present invention, however, is not restricted to these compounds.

[Chemical Formula 37]

(5a-1)

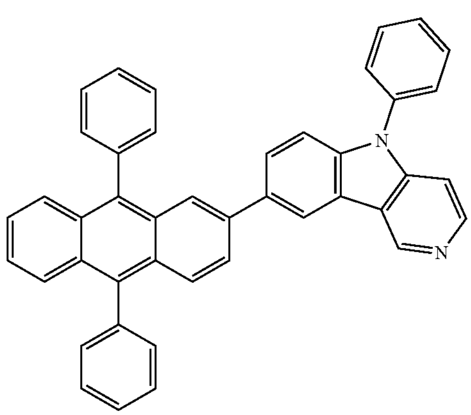

-continued (5a-2)

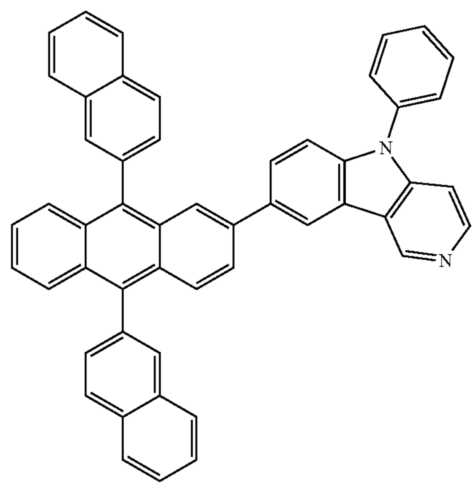

(5a-3)

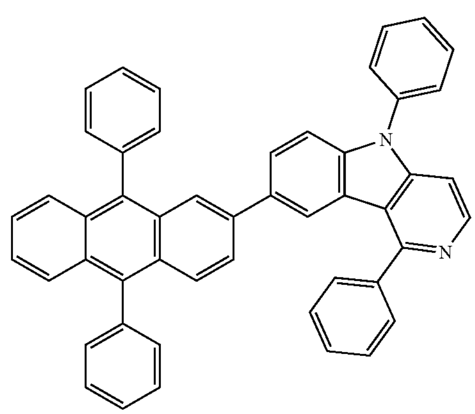

(5a-4)
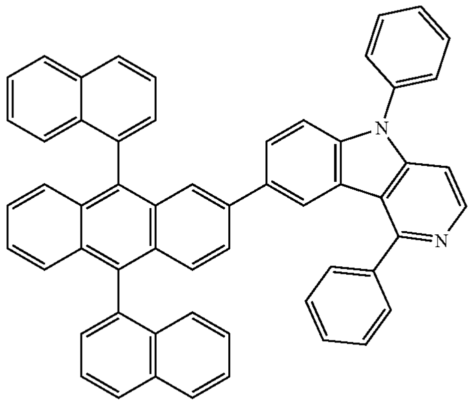
(5a-5)
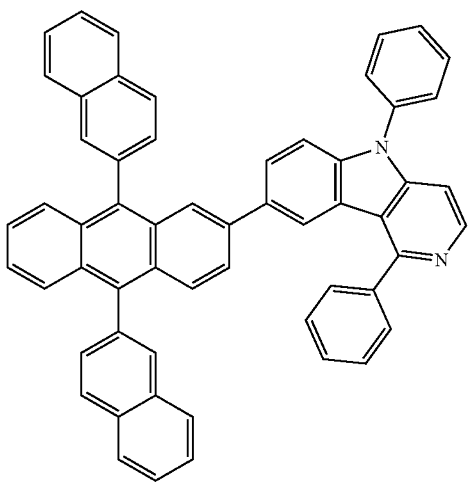
(5a-6)
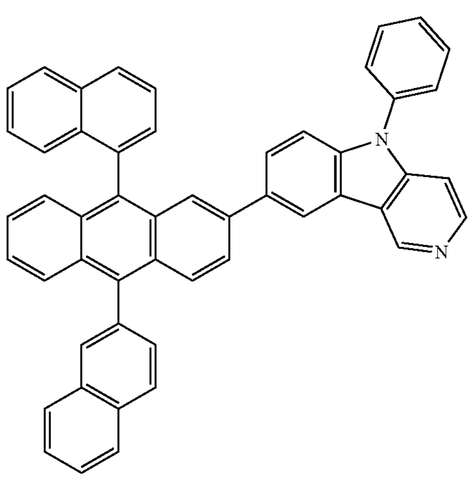
(5a-7)
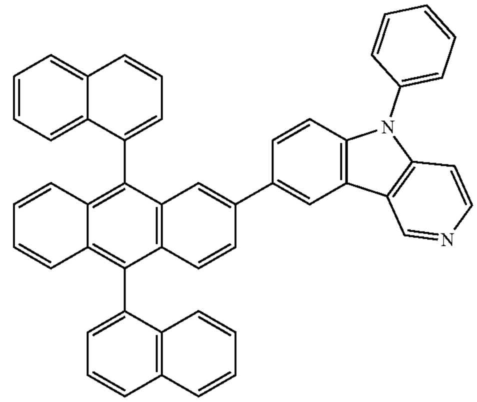
(5a-8)
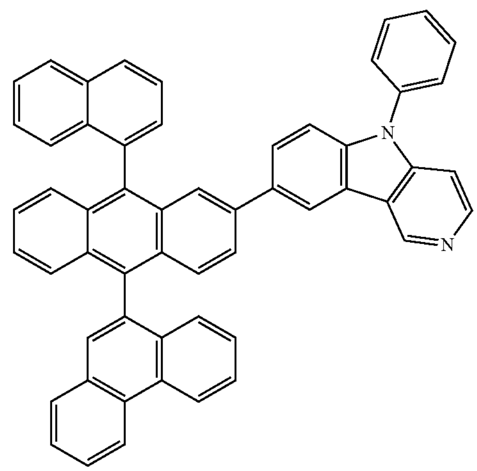
(5a-9)
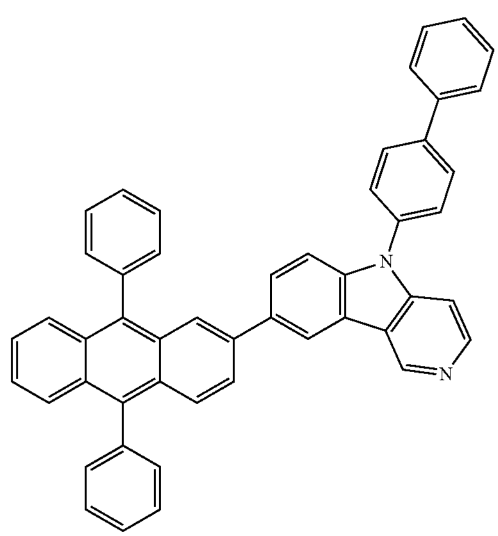

-continued
(5a-10)
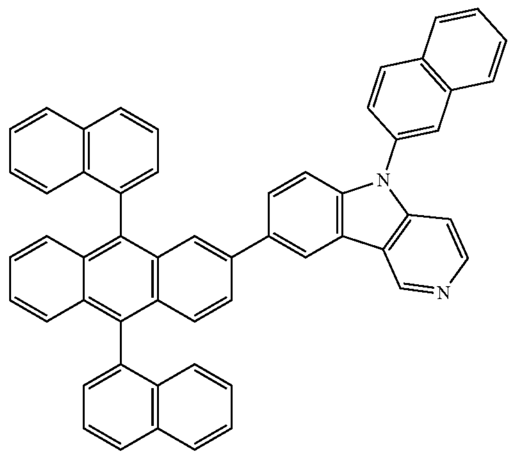
(5a-11)
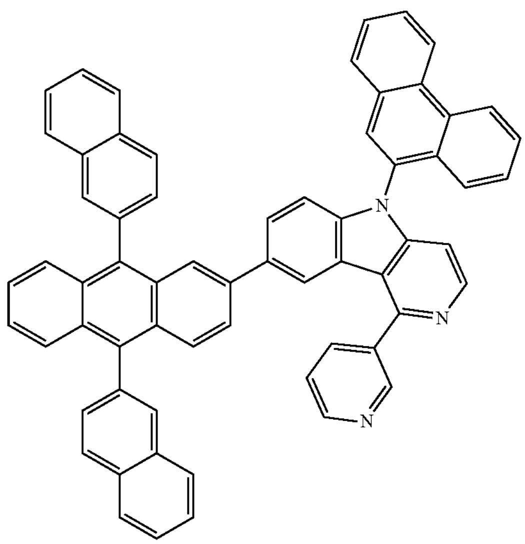
(5a-12)
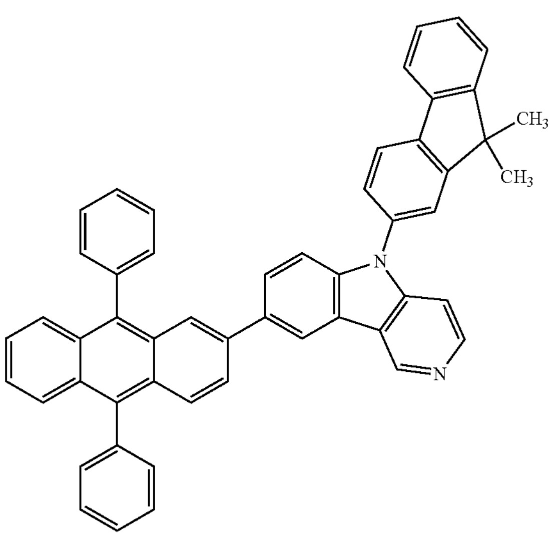
-continued
[Chemical Formula 38]
(5a-13)
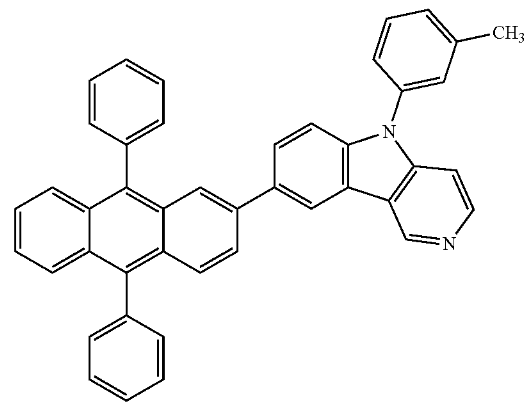
(5a-14)
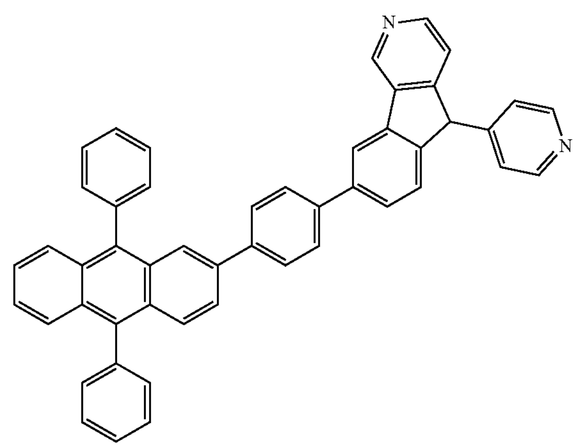
(5a-15)
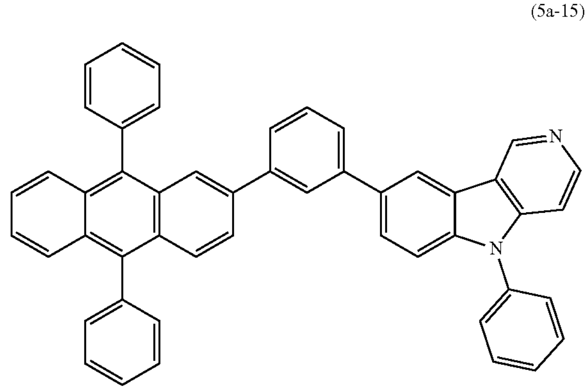

-continued
(5a-16)
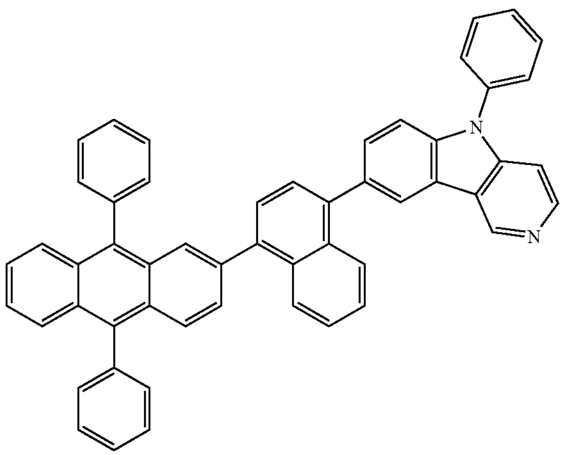
(5a-17)
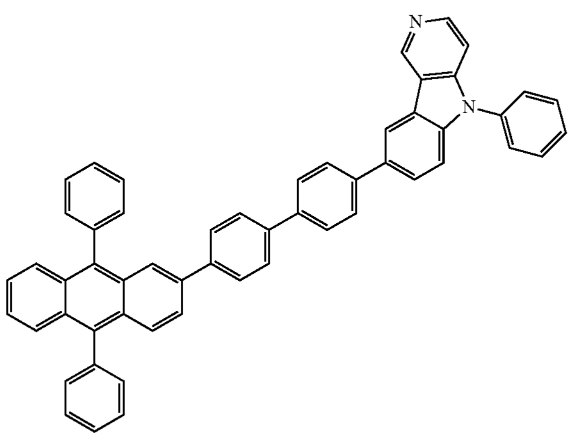
(5a-18)
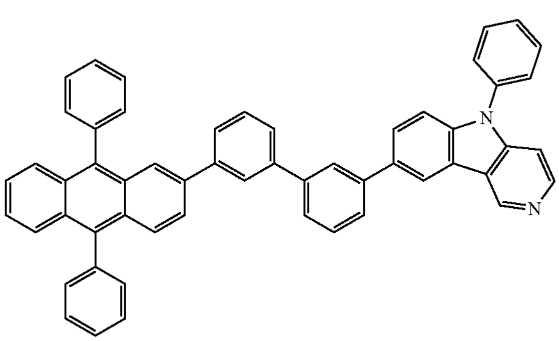
-continued
(5a-19)
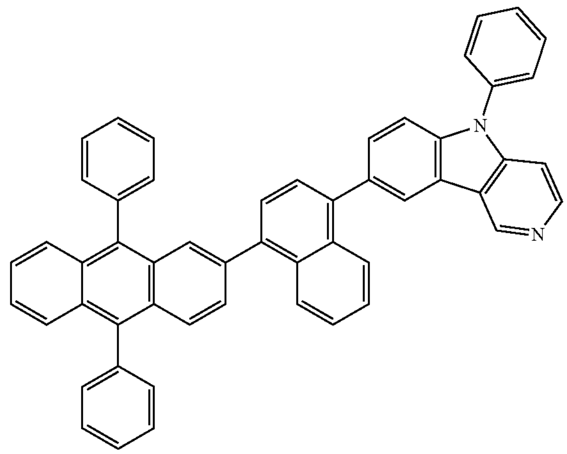
(5a-20)
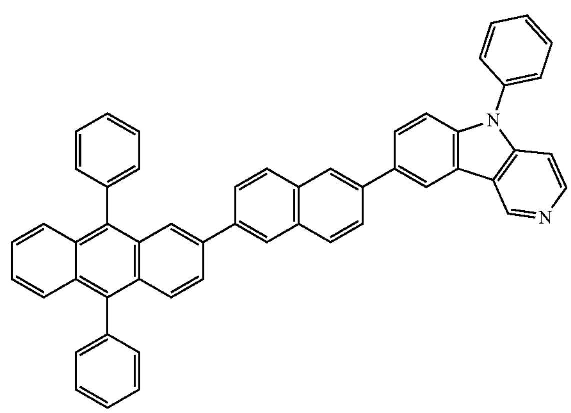
The following presents specific examples of preferred compounds among the compounds of the general formula (5b) preferably used in the organic EL device of the present invention and having an anthracene ring structure. The present invention, however, is not restricted to these compounds.

[Chemical Formula 39]
(5b-1)
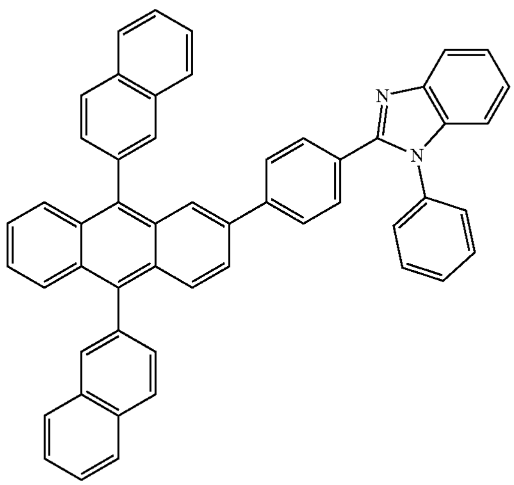
(5b-2)
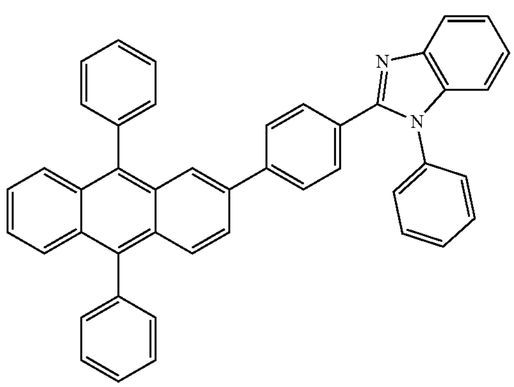
(5b-3)
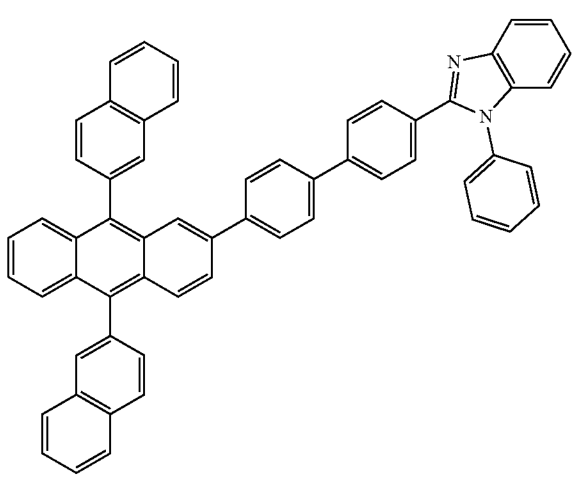
-continued
(5b-4)
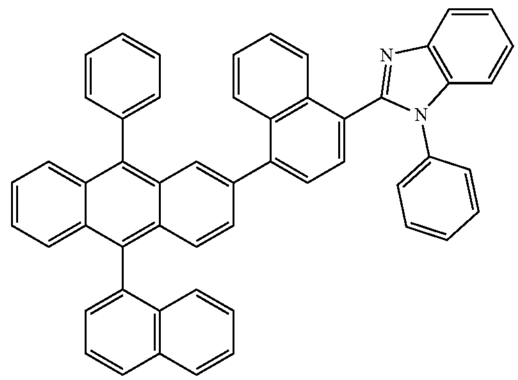
(5b-5)
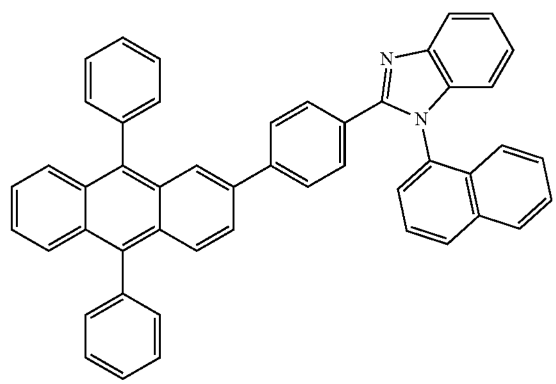
(5b-6)
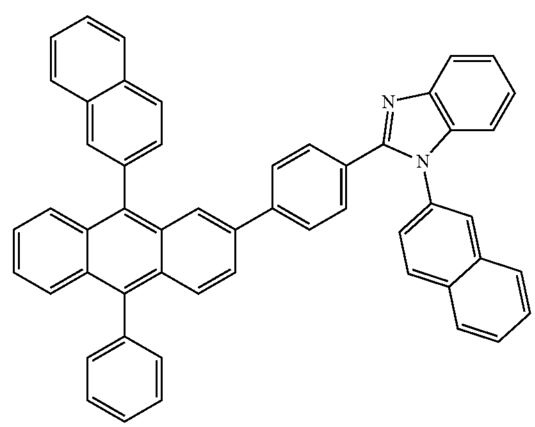

(5b-7)
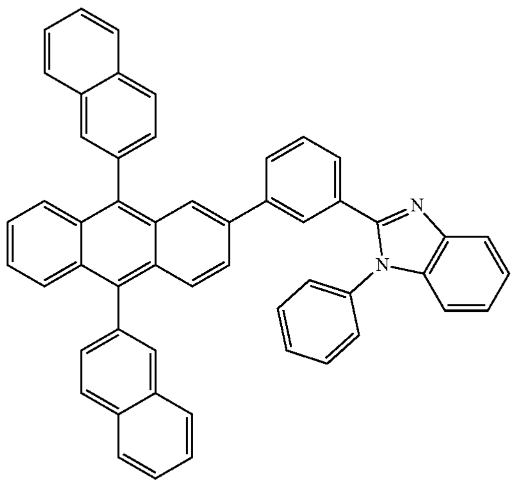
(5b-8)
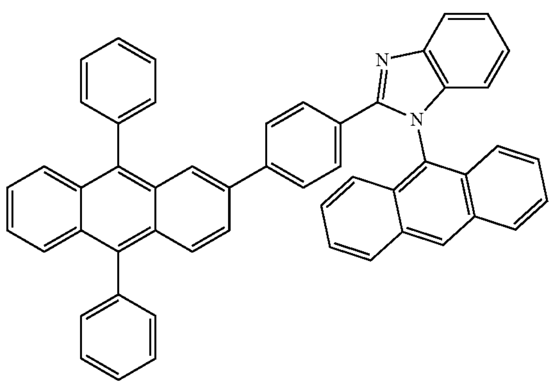
(5b-9)
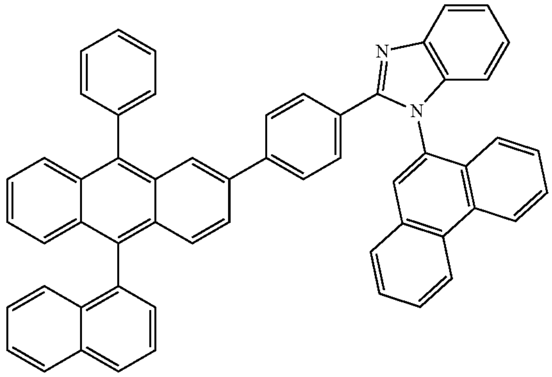
(5b-10)
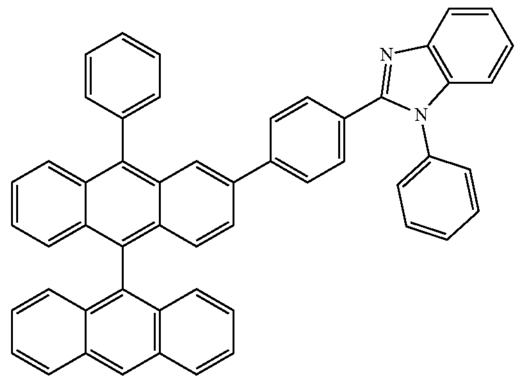
(5b=11)
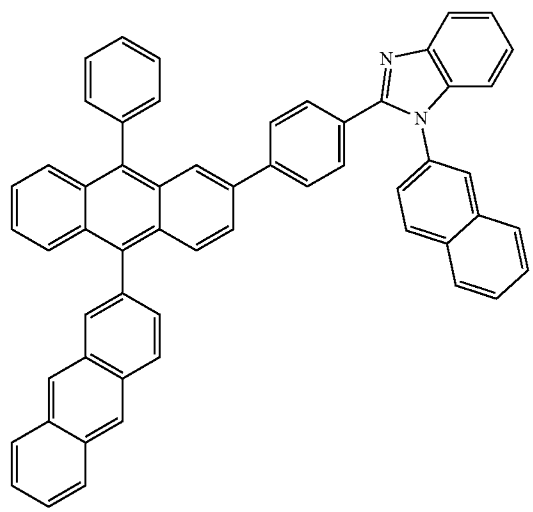
(5b-12)
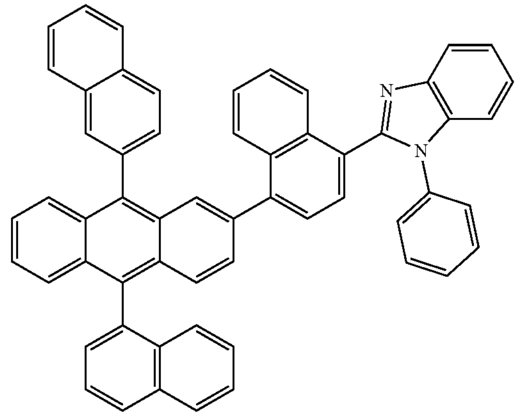

-continued
[Chemical Formula 40]
(5b-13)
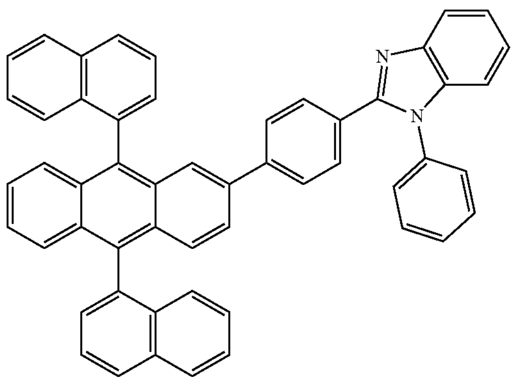
(5b-14)
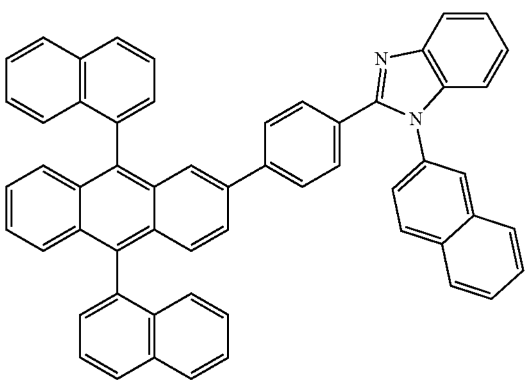
(5b-15)
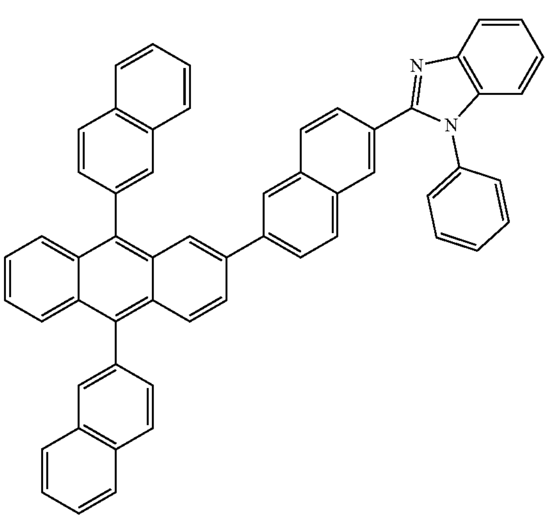
-continued
(5b-16)
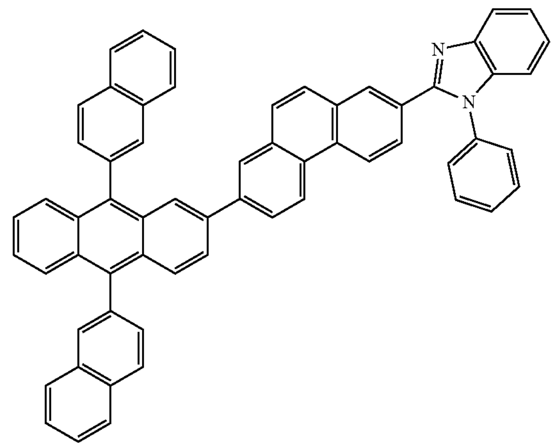
The following presents specific examples of preferred compounds among the compounds of the general formula (5c) preferably used in the organic EL device of the present invention and having an anthracene ring structure. The present invention, however, is not restricted to these compounds.
[Chemical Formula 41]
(5c-1)
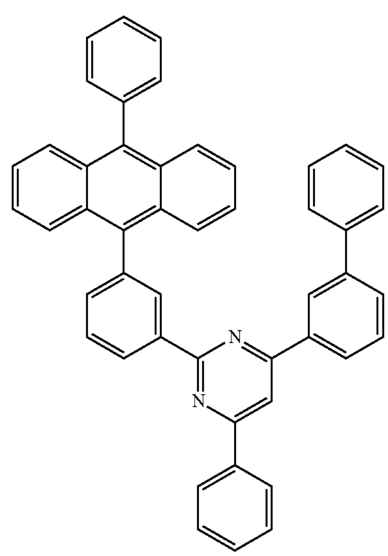

(5c-2)
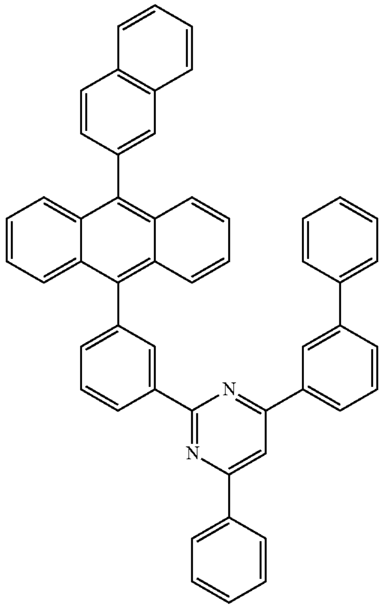
(5c-3)
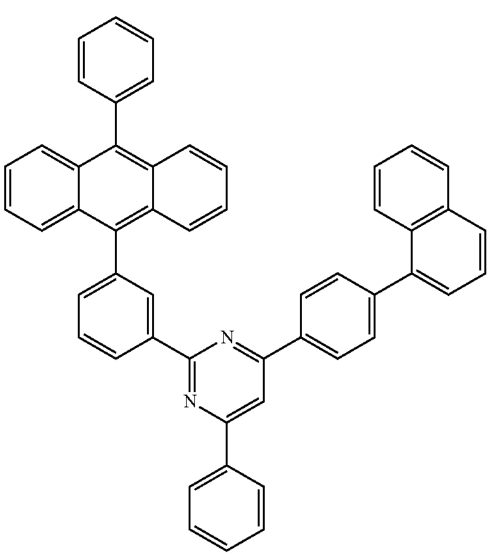
(5c-4)
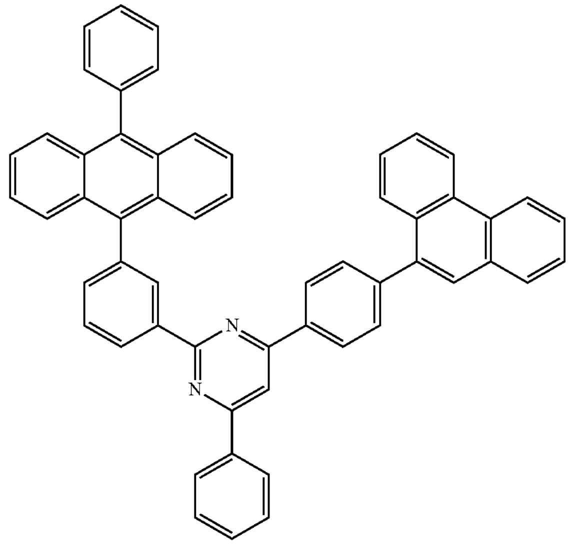
(5c-5)
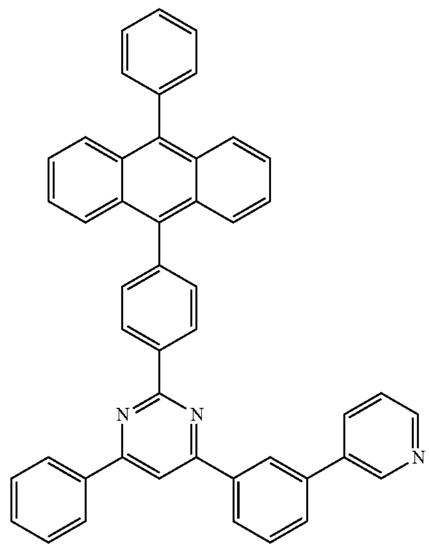
(5c-6)
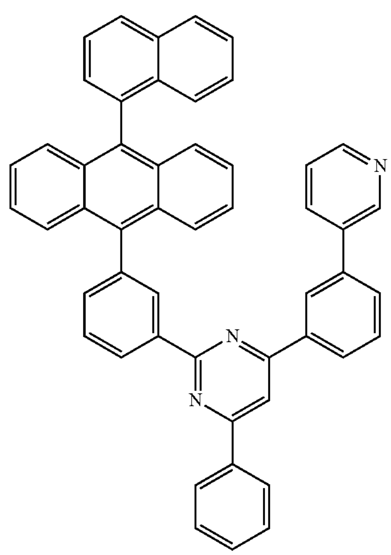

-continued
(5c-7)
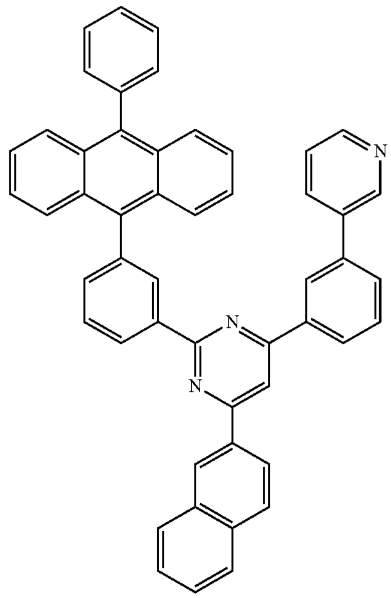
(5c-8)
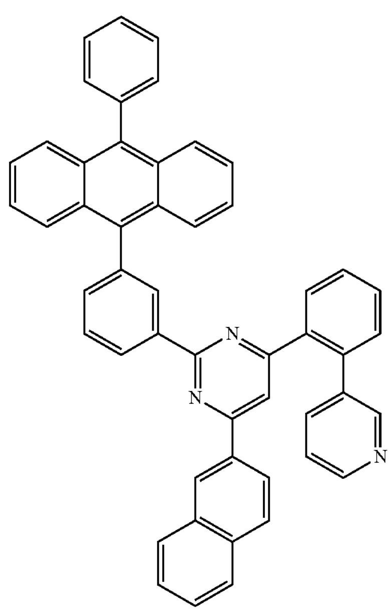
-continued
(5c-9)
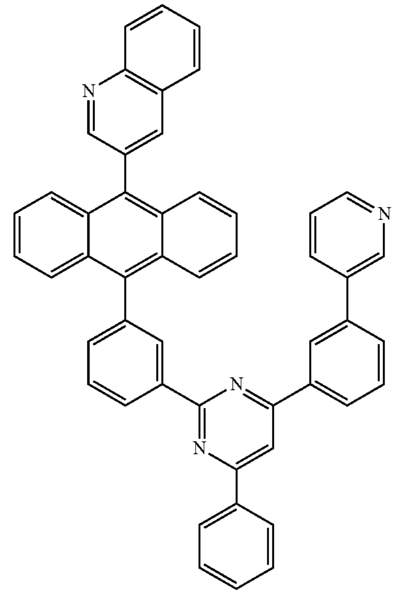
(5c-10)
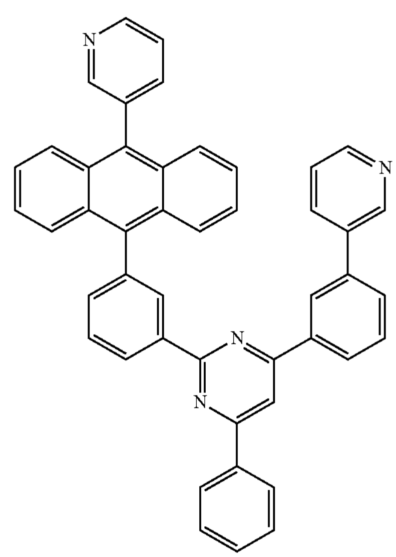

-continued
(5c-11)
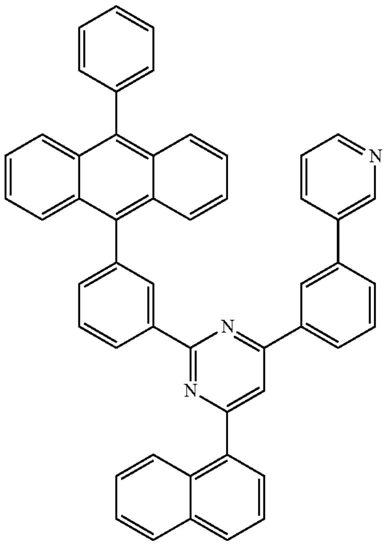
(5c-12)
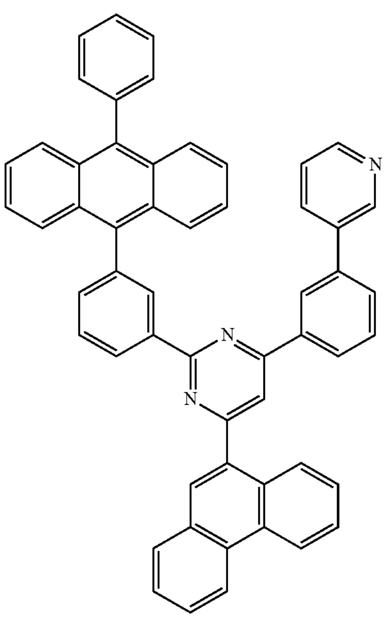
-continued
[Chemical Formula 42]
(5c-13)
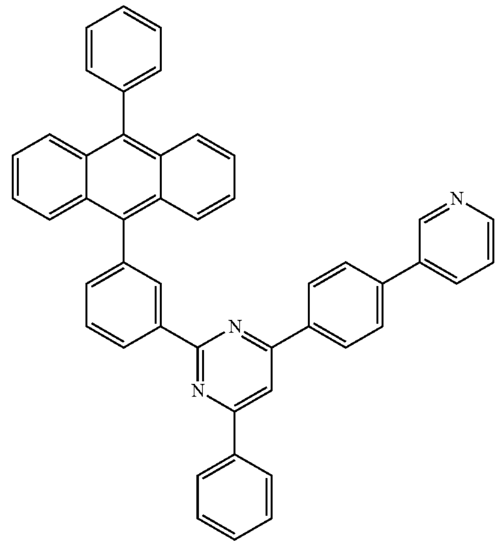
(5c-14)
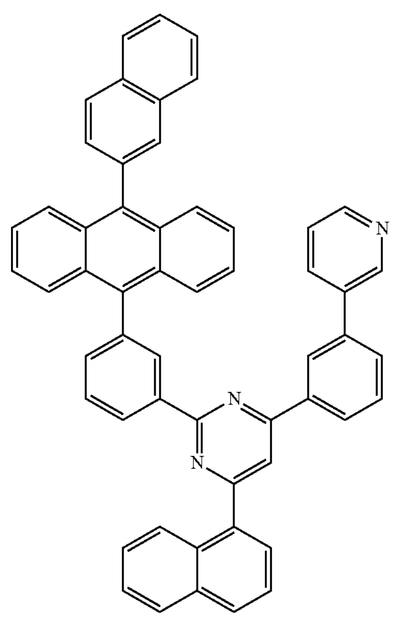

-continued
(5c-15)
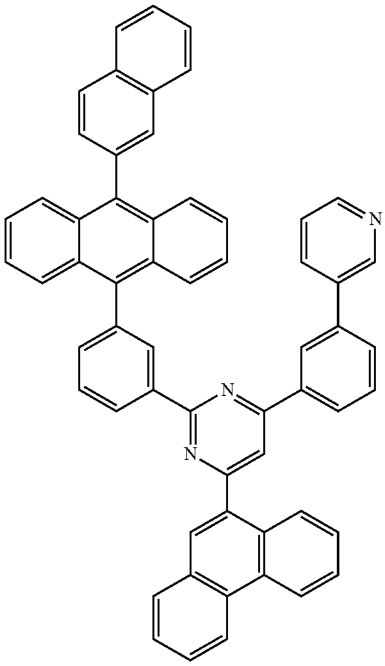
(5c-16)
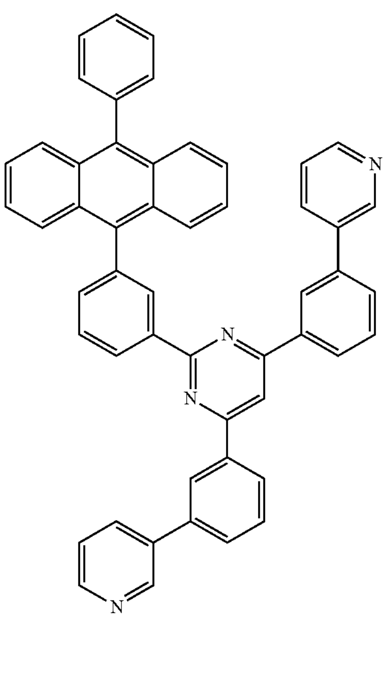
-continued
(5c-17)
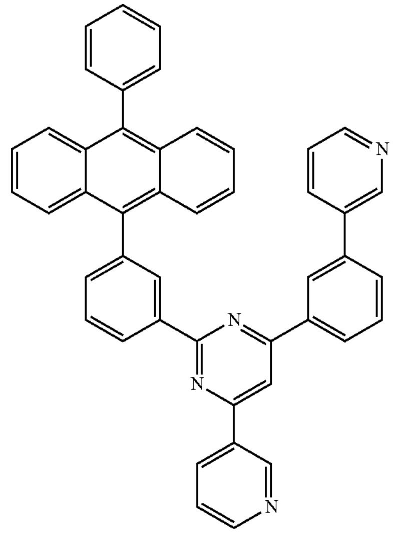
(5c-18)
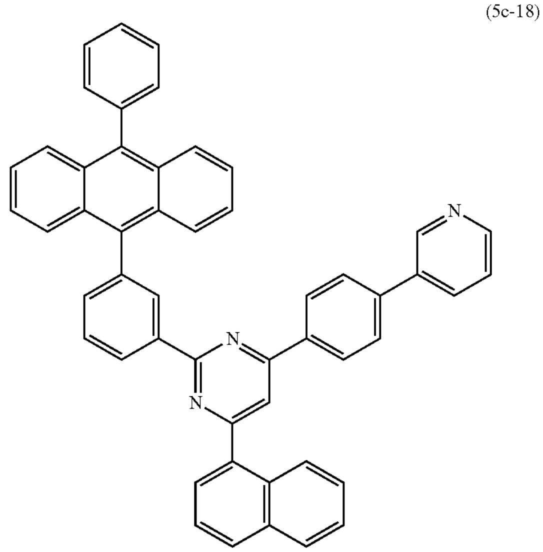
(5c-19)
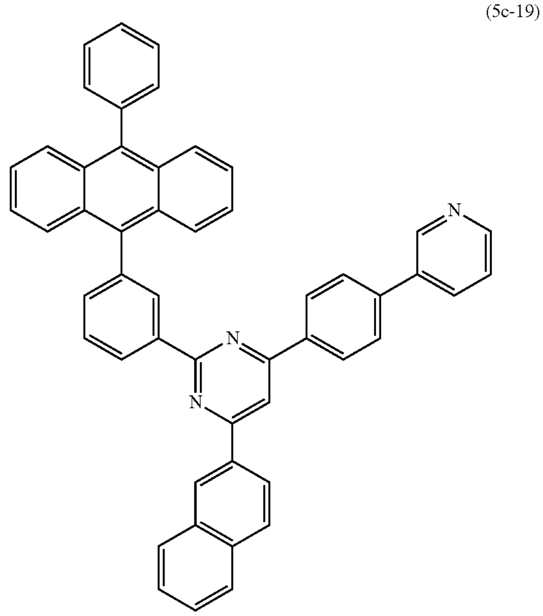

(5c-20)
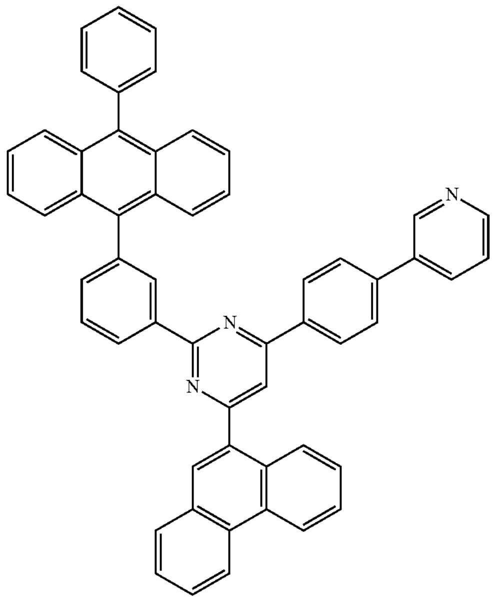
(5c-21)
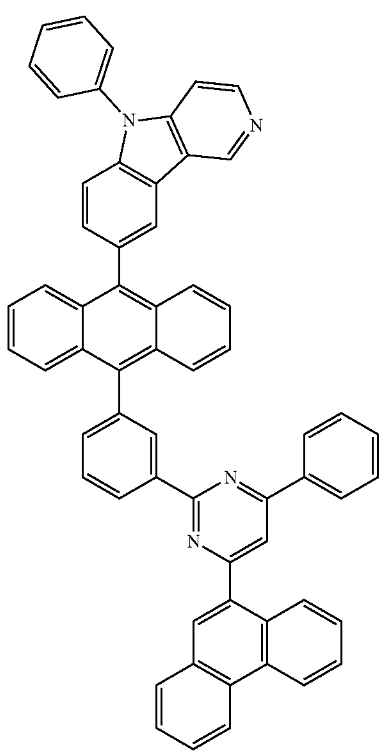
(5c-22)
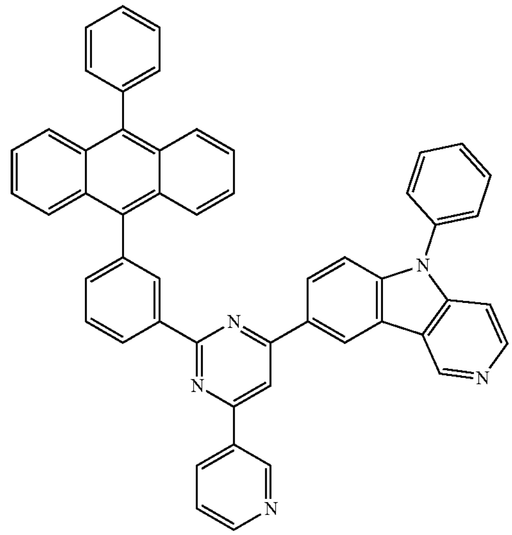
(5c-23)
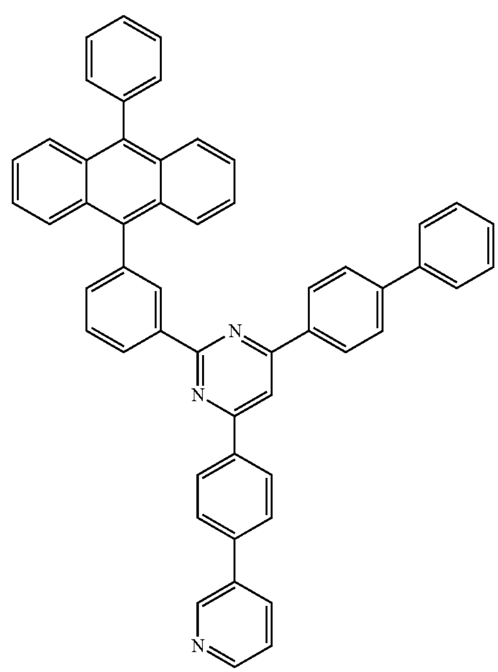

-continued
(5c-24)
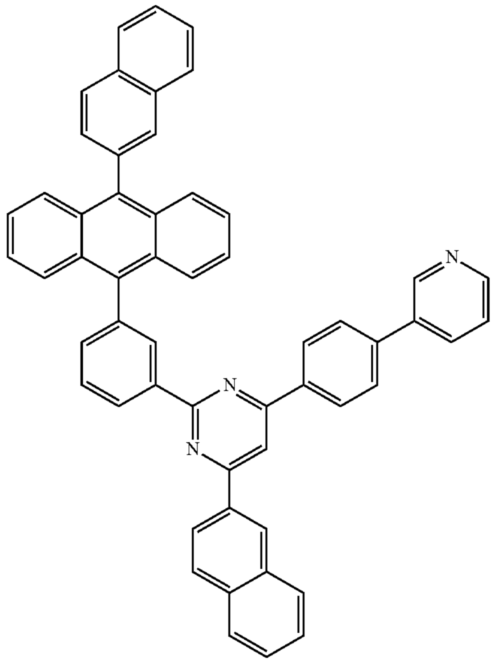
[Chemical Formula 43]
(5c-25)
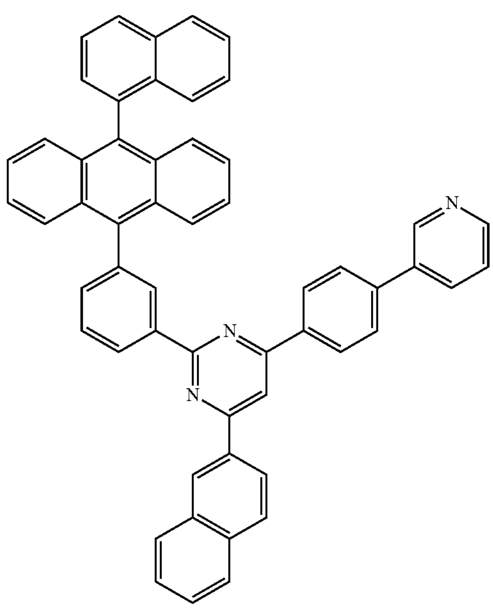
-continued
(5c-26)
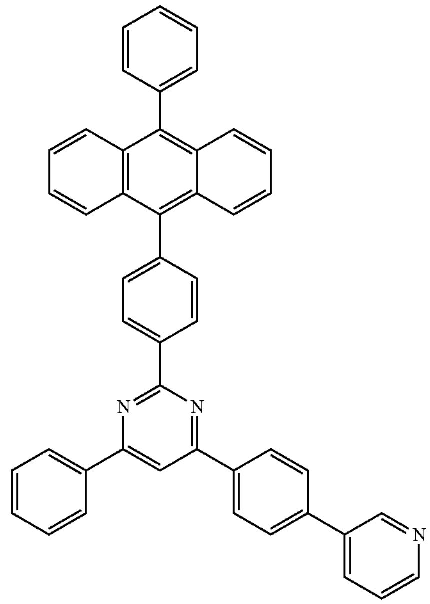
(5c-27)
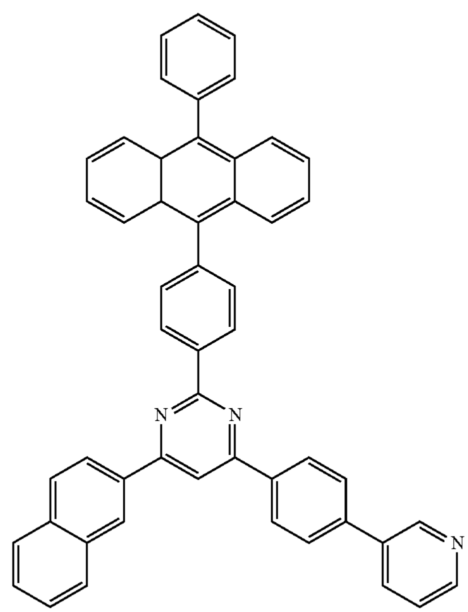

-continued (5c-28)

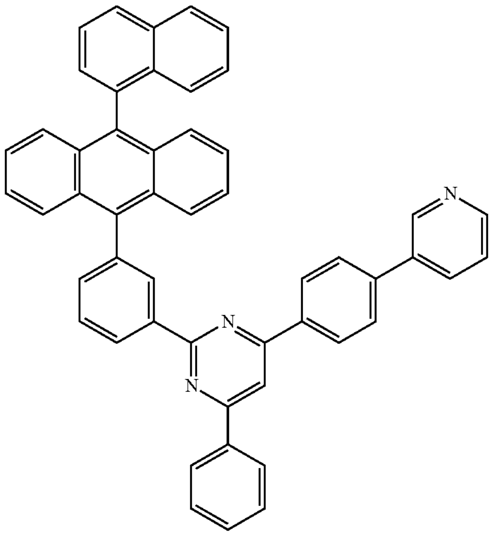

(5c-29)

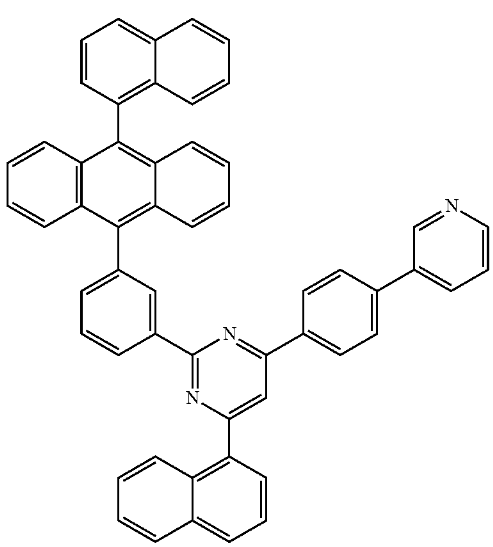

-continued (5c-30)

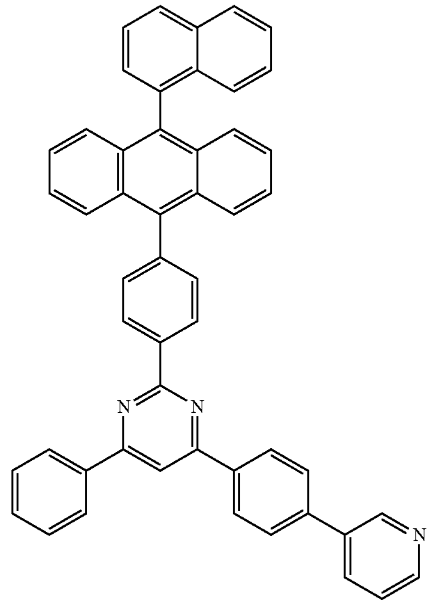

The compounds described above having an anthracene ring structure can be synthesized by a known method (refer to Patent Documents 11 to 13, for example).

The following presents specific examples of preferred compounds among the compounds of the general formula (6) preferably used in the organic EL device of the present invention and having a pyrimidine ring structure. The present invention, however, is not restricted to these compounds.

[Chemical Formula 44]

(6-1)

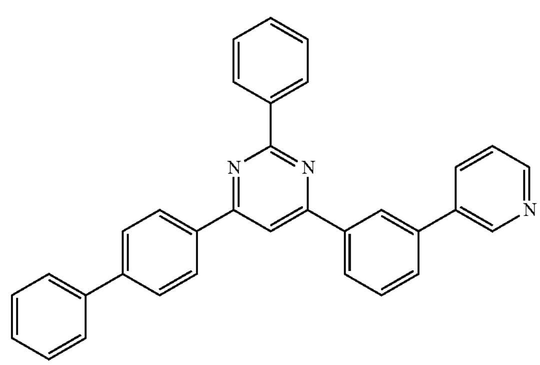

-continued
(6-2)
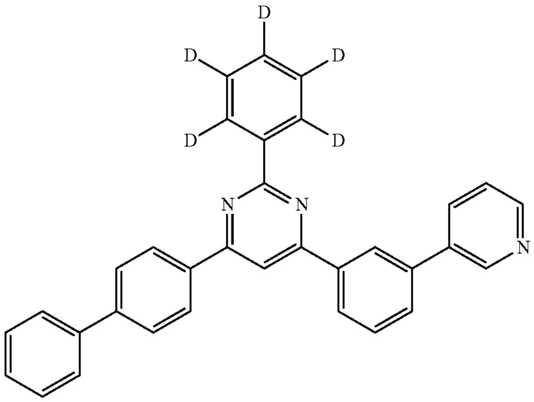
(6-3)
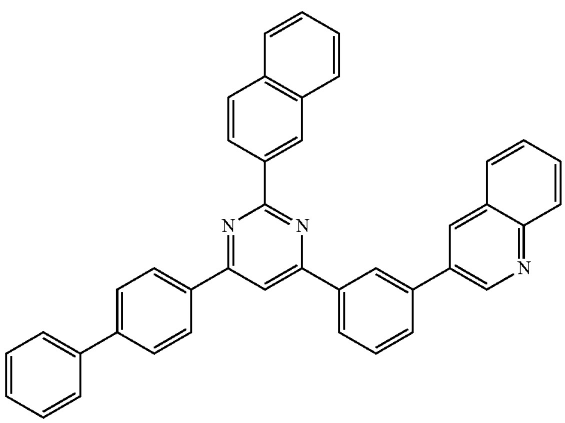
(6-4)
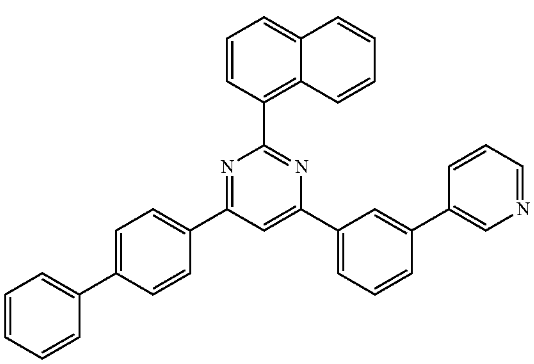
-continued
(6-5)
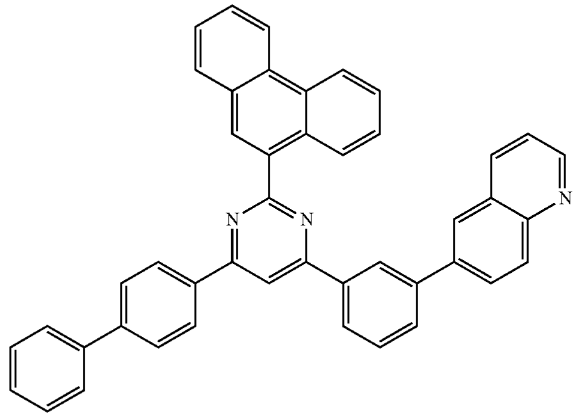
(6-6)
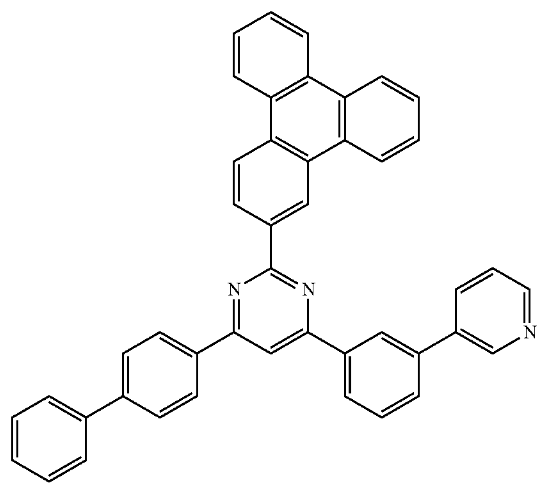
(6-7)
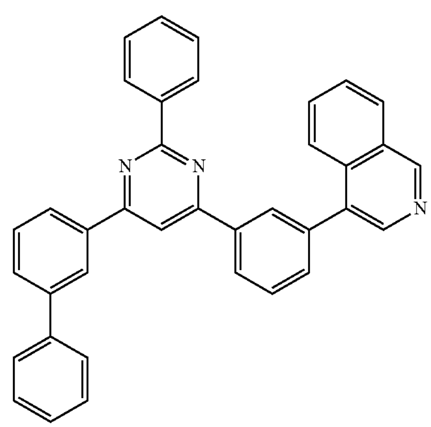

-continued
(6-8)
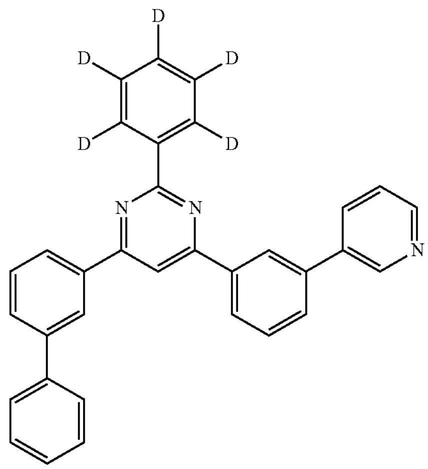
(6-9)
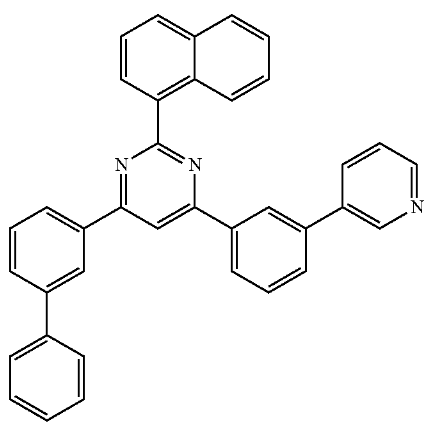
(6-10)
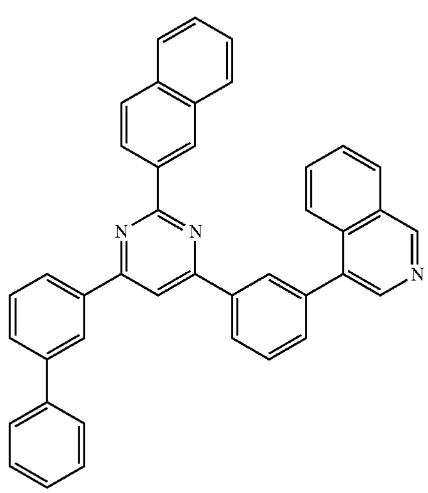
-continued
(6-11)
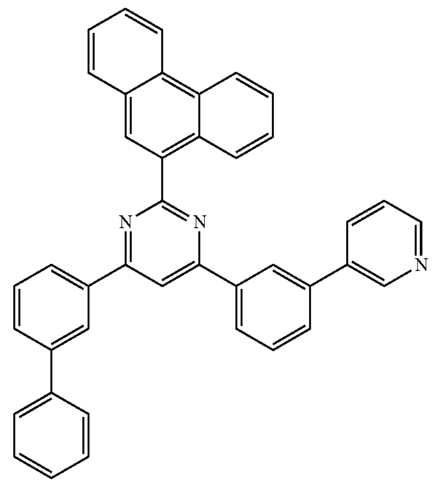
(6-12)
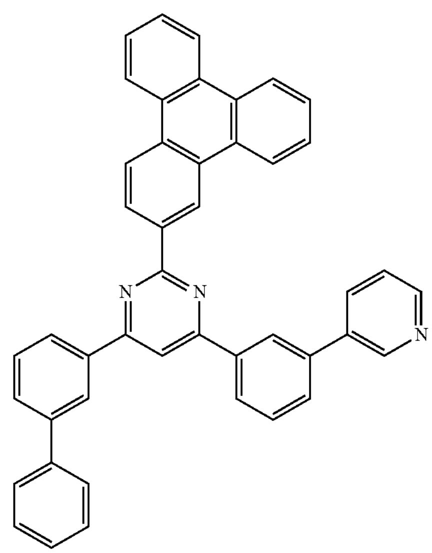
[Chemical Formula 45]
(6-13)
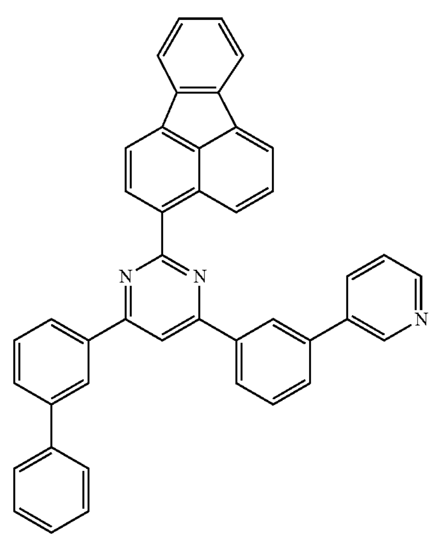

-continued
(6-14)
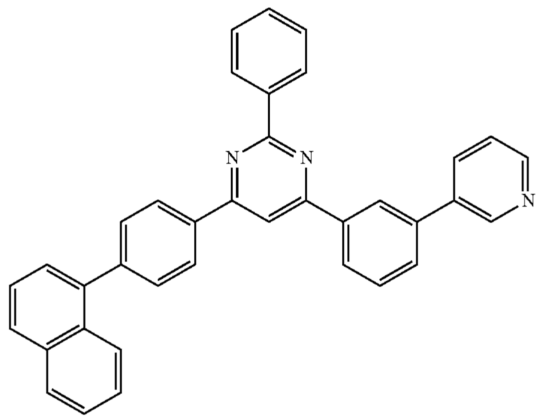
(6-15)
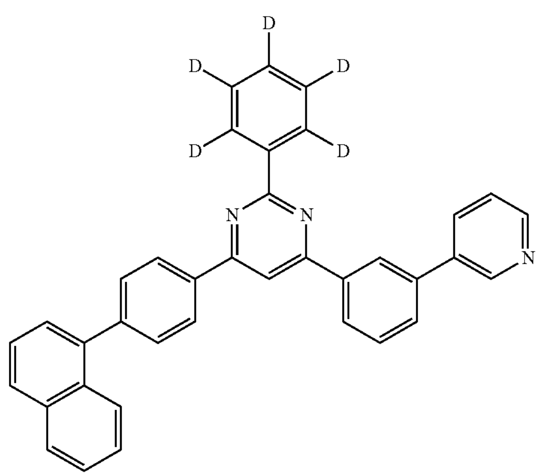
(6-16)
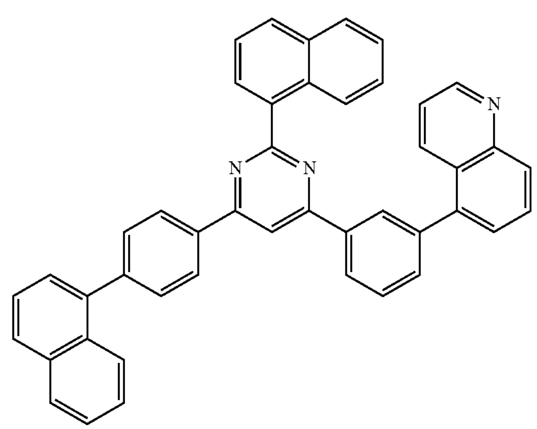
-continued
(6-17)
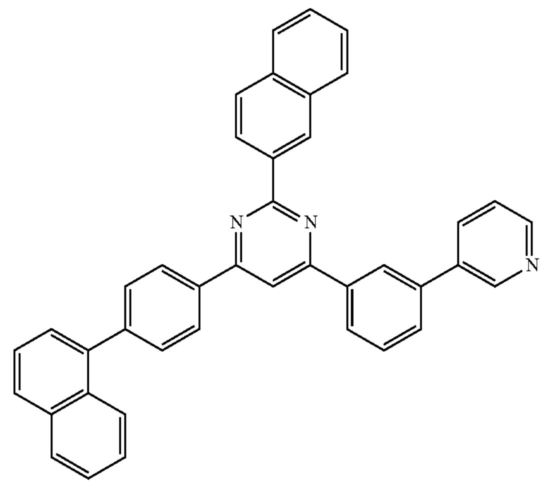
(6-18)
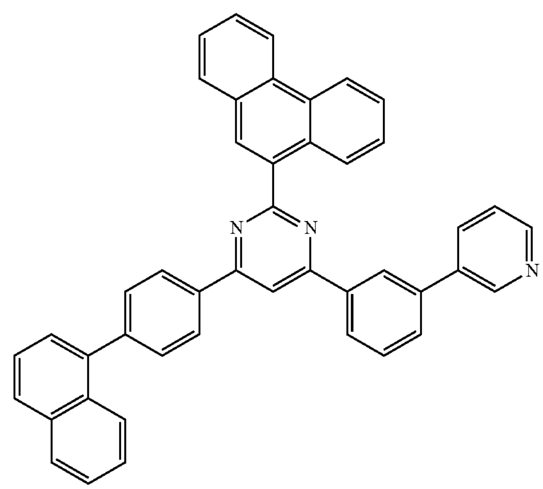
(6-19)
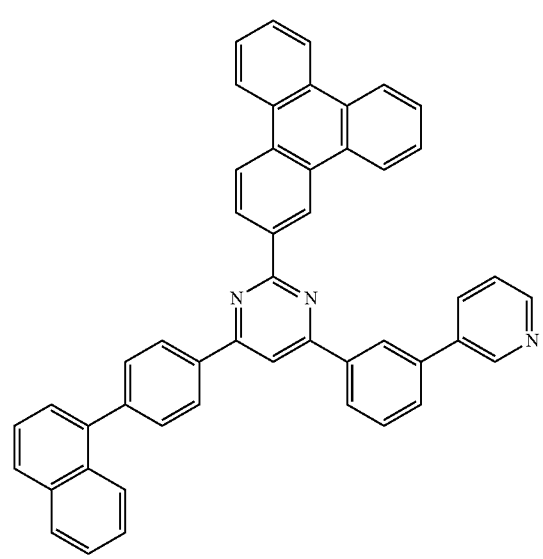

(6-20)
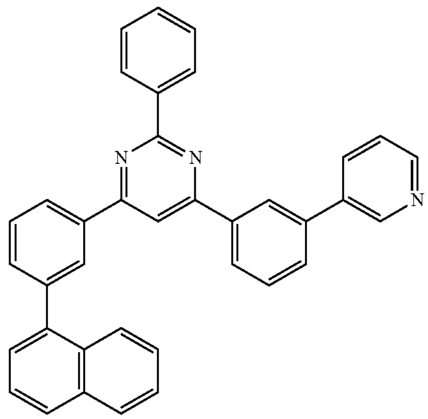
(6-21)
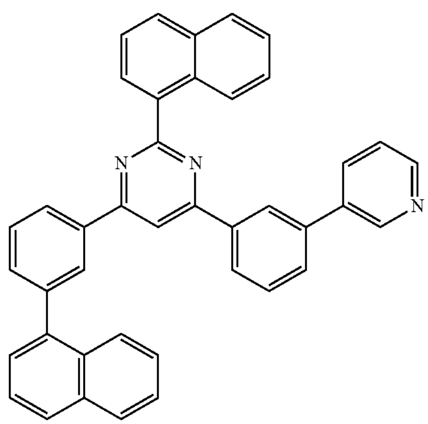
(6-22)
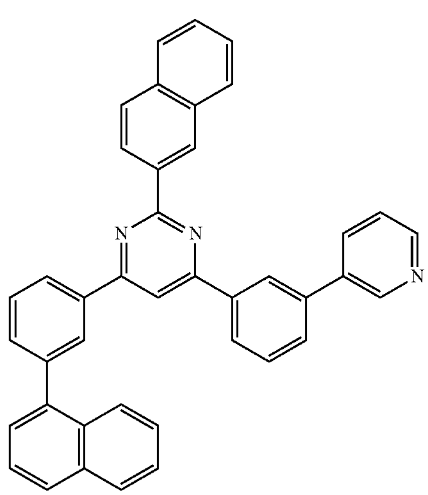
(6-23)
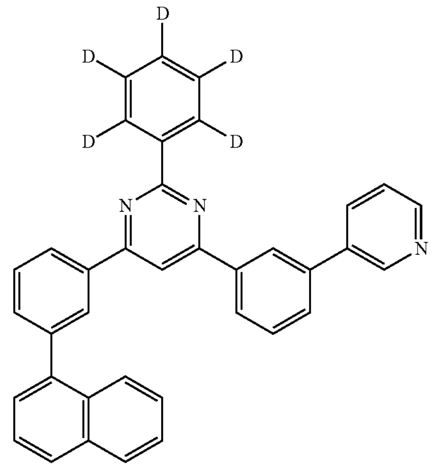
(6-24)
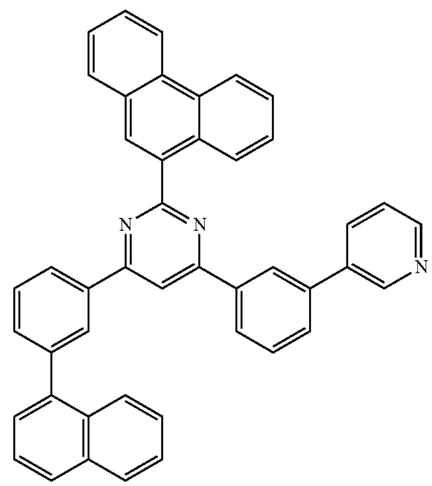
[Chemical Formula 46]
(6-25)
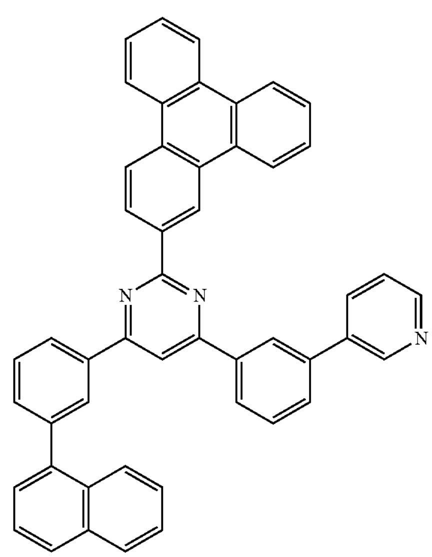

-continued
(6-26)
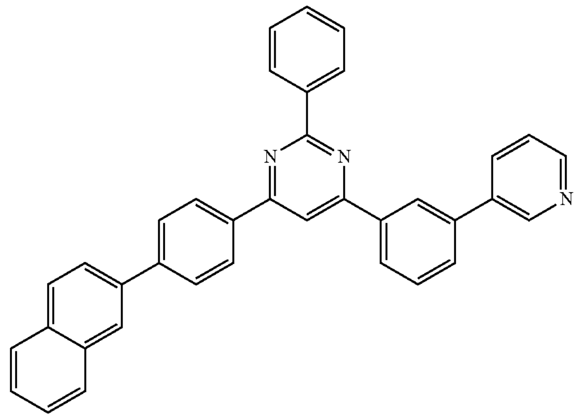
(6-27)
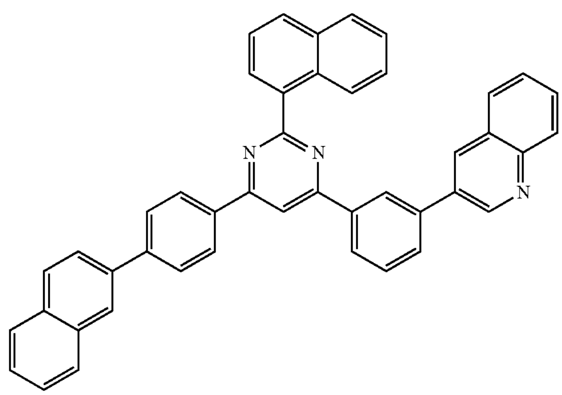
(6-28)
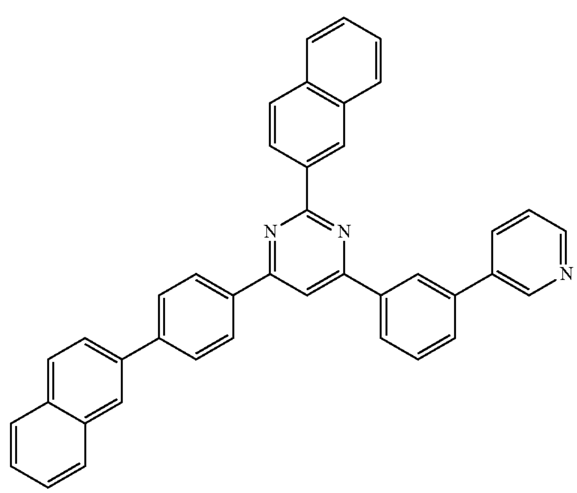
-continued
(6-29)
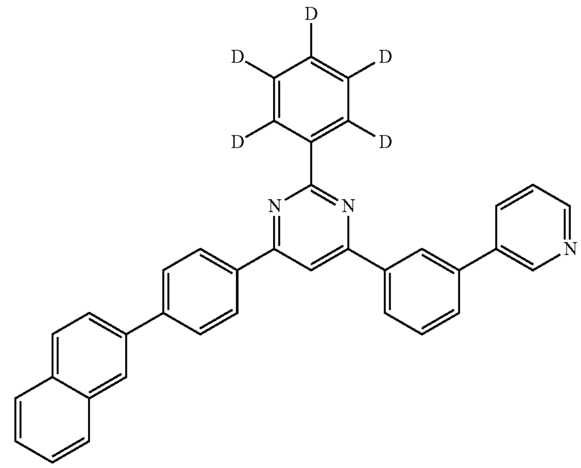
(6-30)
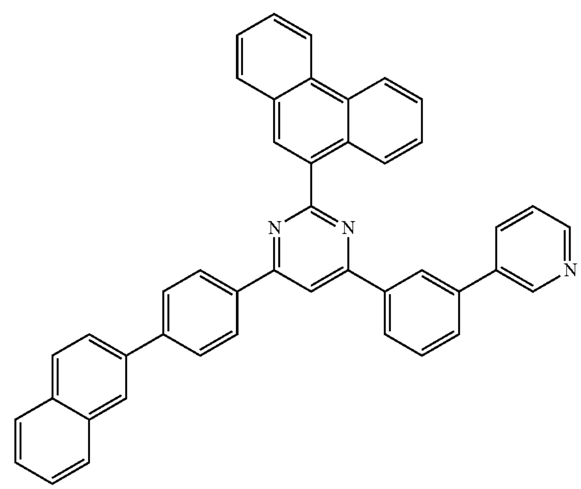
(6-31)
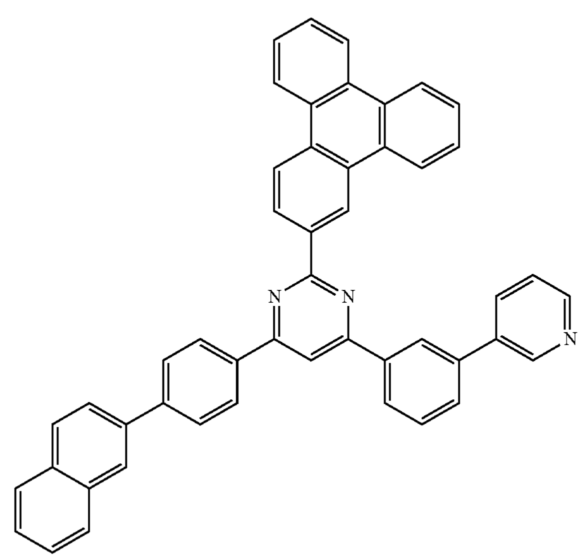

(6-32)
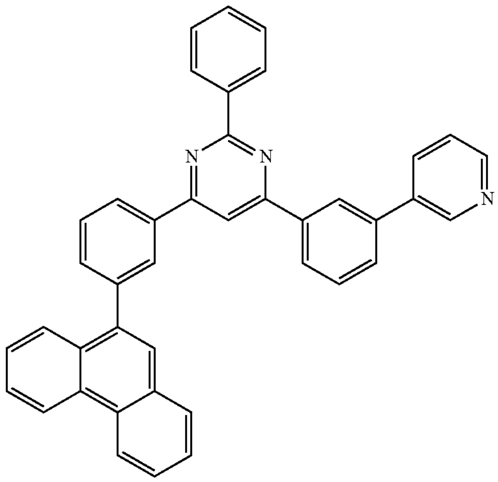
(6-33)
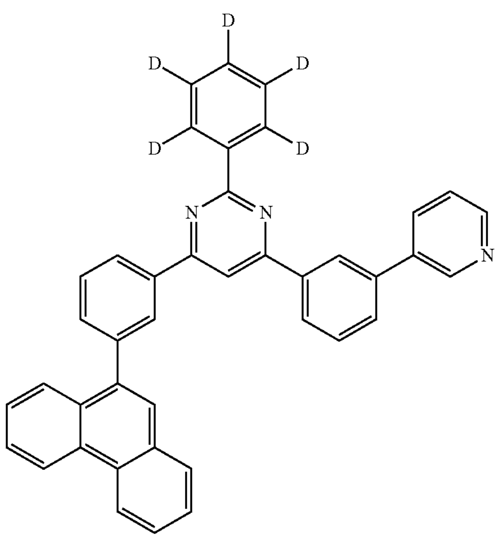
(6-34)
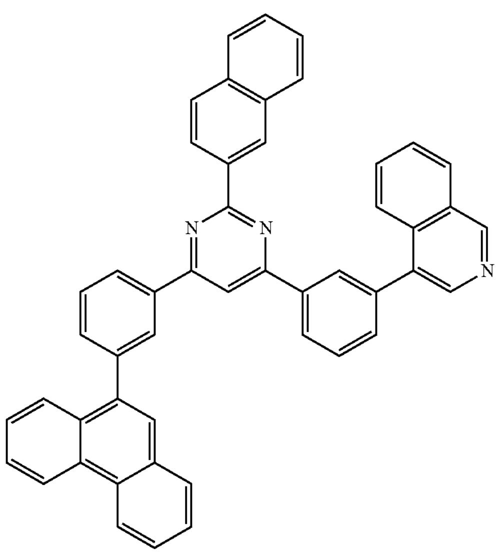
(6-35)
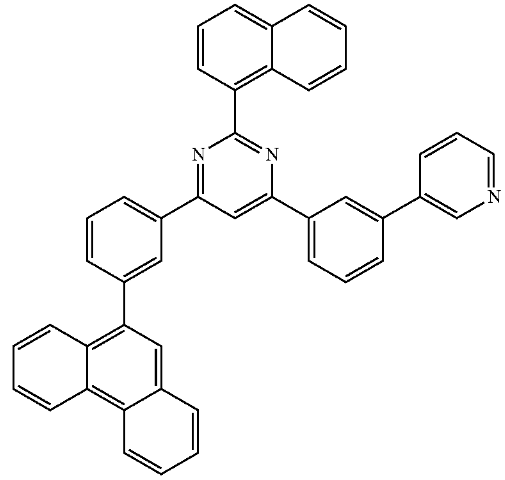
(6-36)
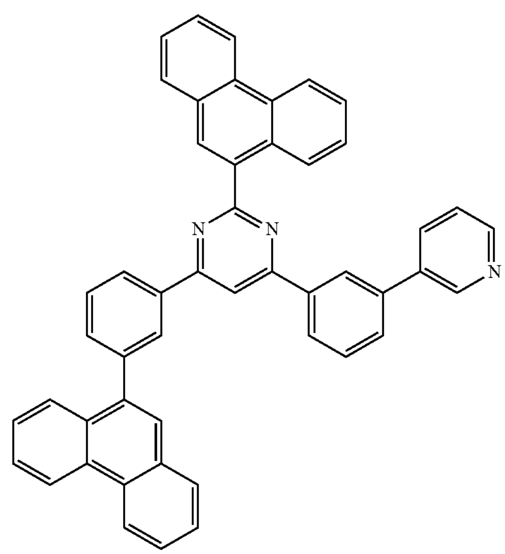

-continued
[Chemical Formula 47]
(6-37)
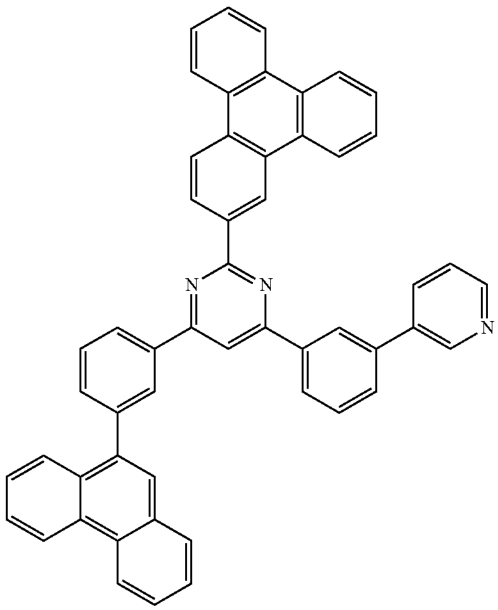
(6-38)
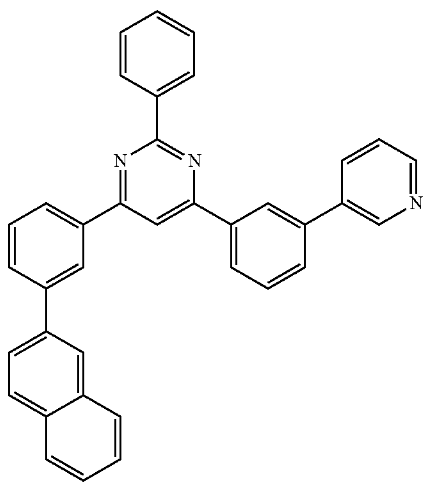
(6-39)
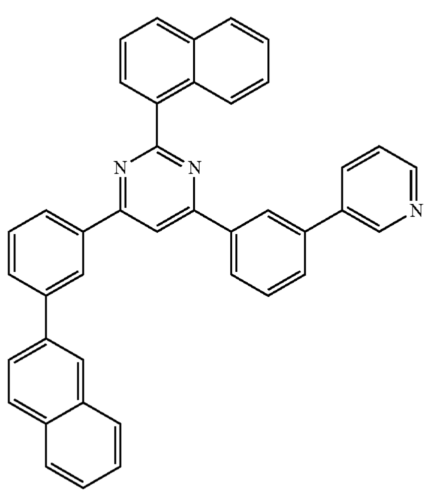
-continued
(6-40)
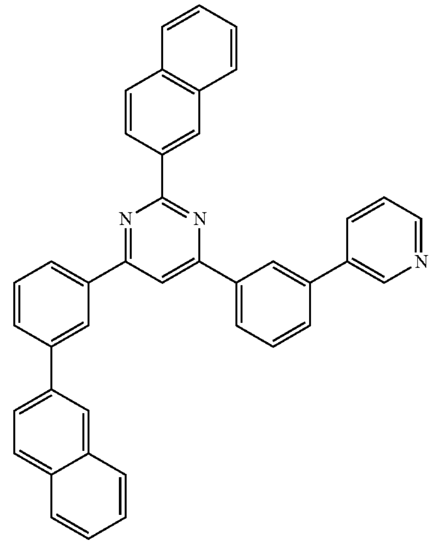
(6-41)
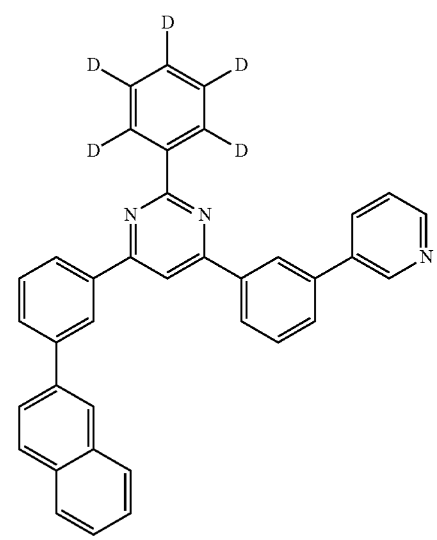
(6-42)
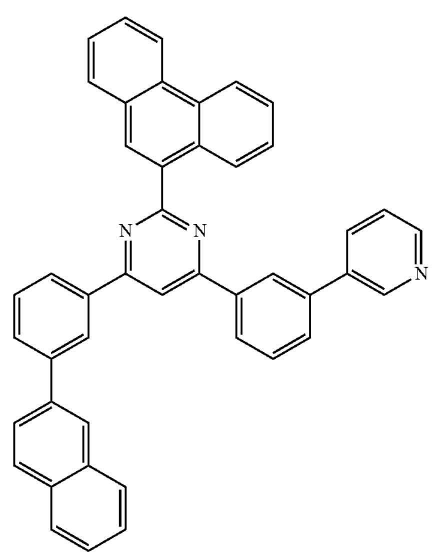

-continued
(6-43)
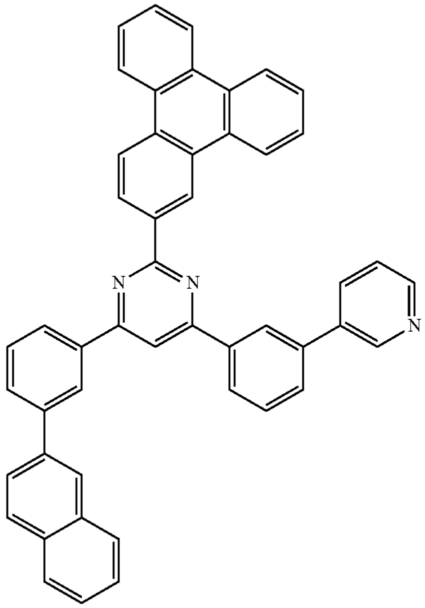
(6-44)
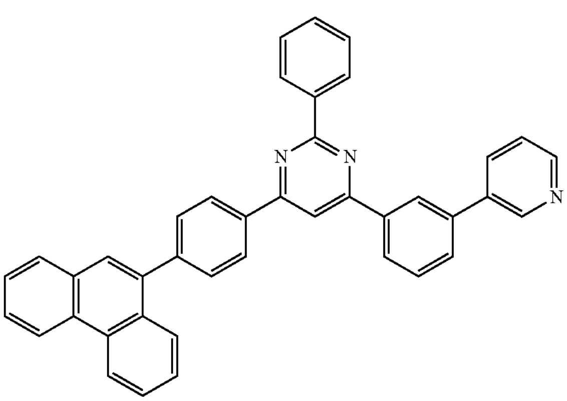
-continued
(6-45)
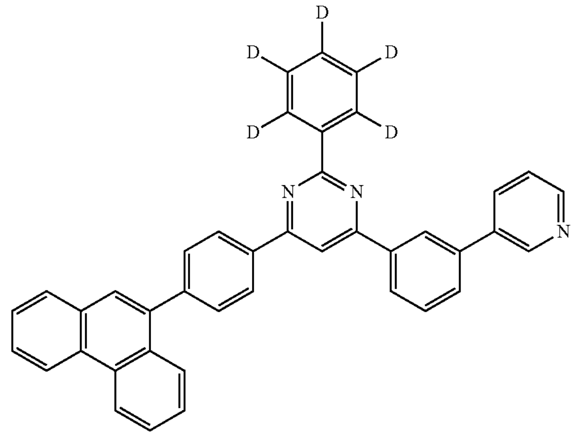
(6-46)
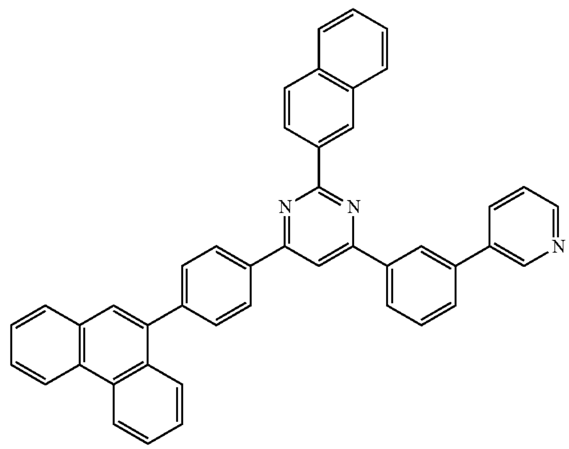
(6-47)
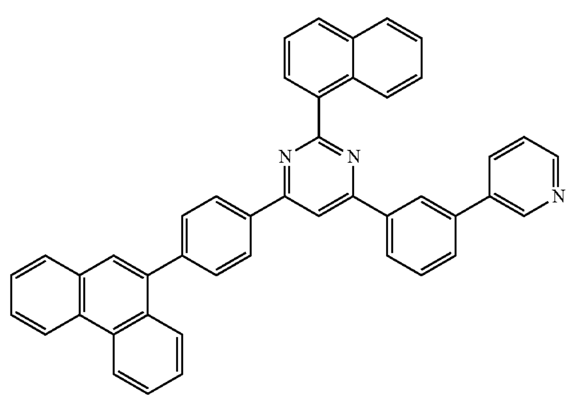

-continued
(6-48)
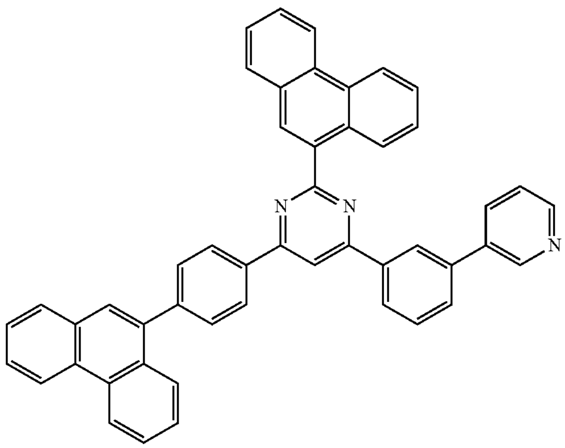
[Chemical Formula 48]
(6-49)
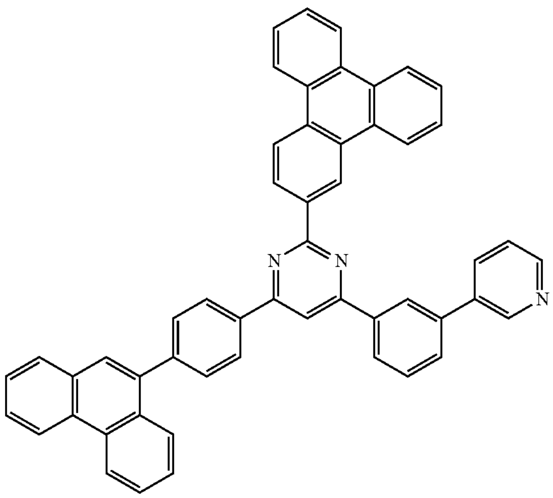
(6-50)
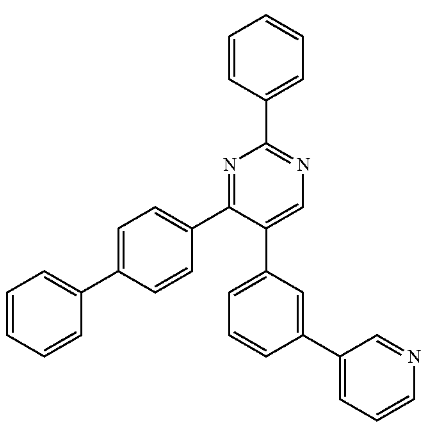
-continued
(6-51)
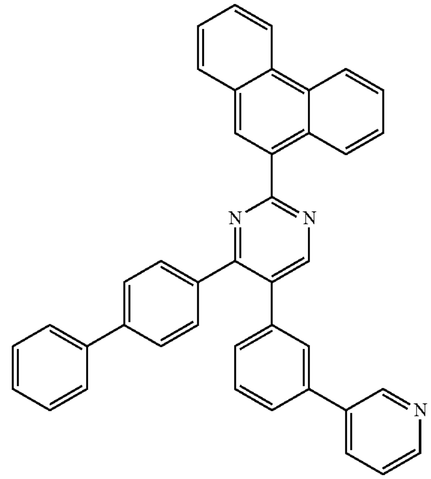
(6-52)
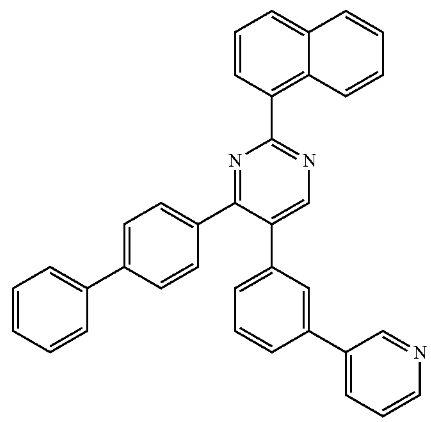
(6-53)
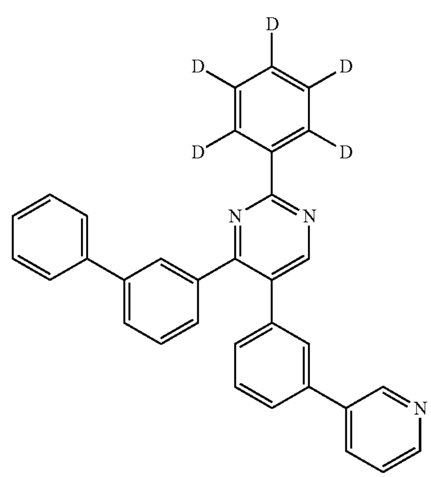

-continued
(6-54)
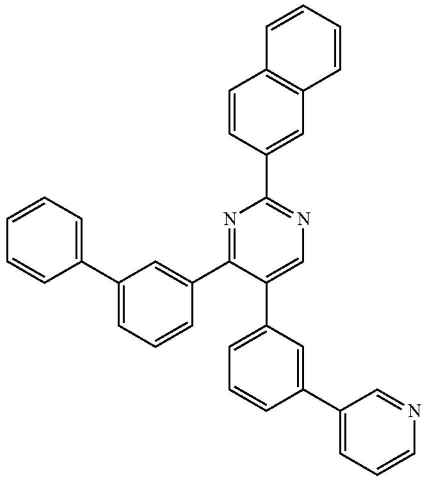
(6-55)
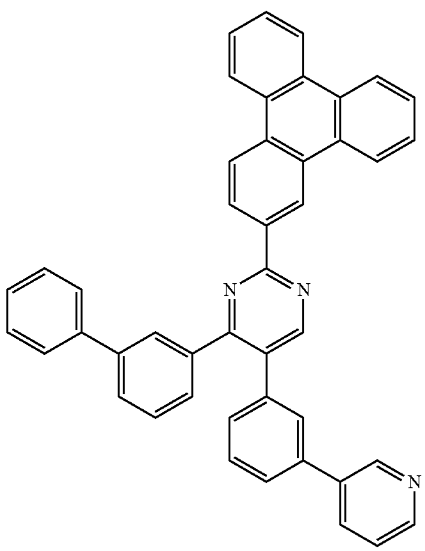
(6-56)
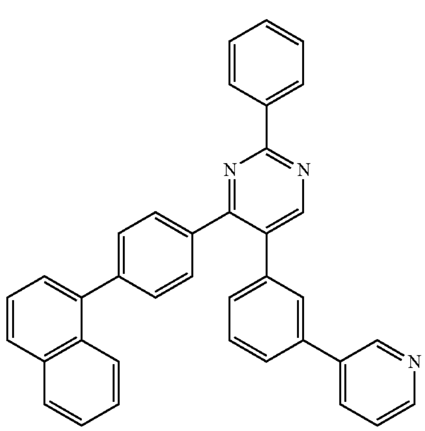
-continued
(6-57)
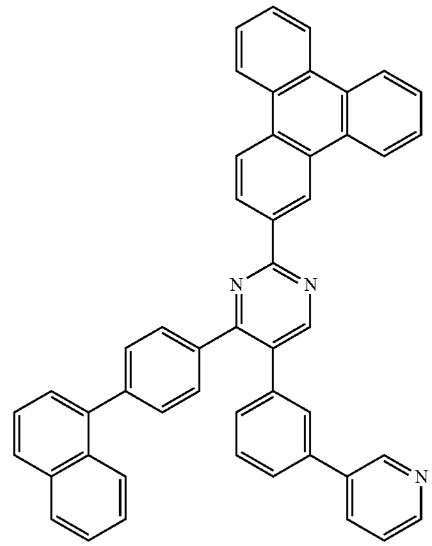
(6-58)
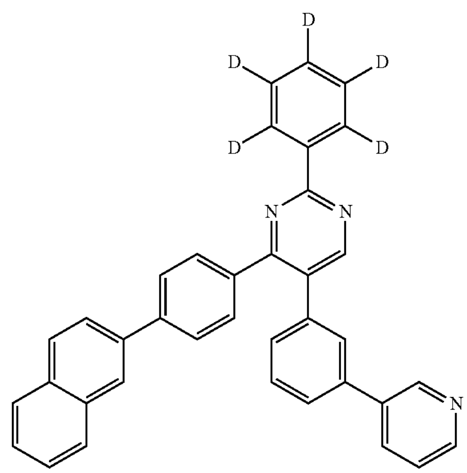
(6-59)
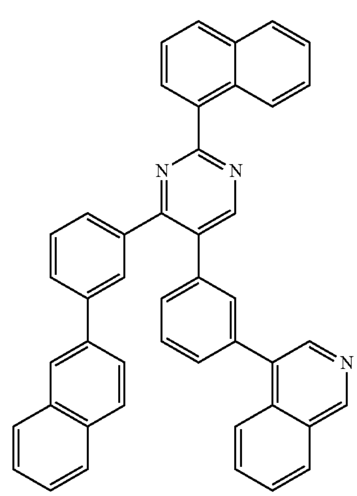

-continued
(6-60)
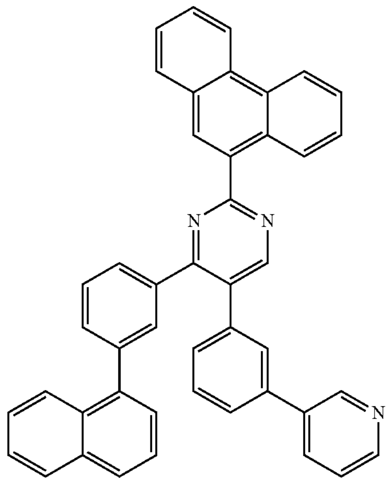
[Chemical Formula 49]
(6-61)
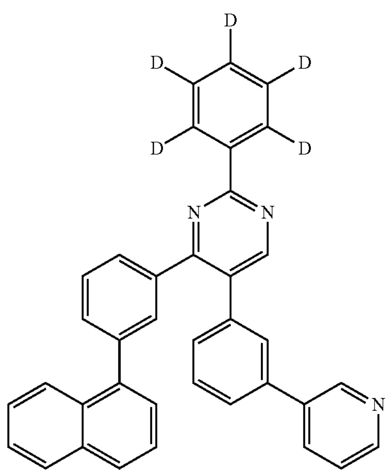
(6-62)
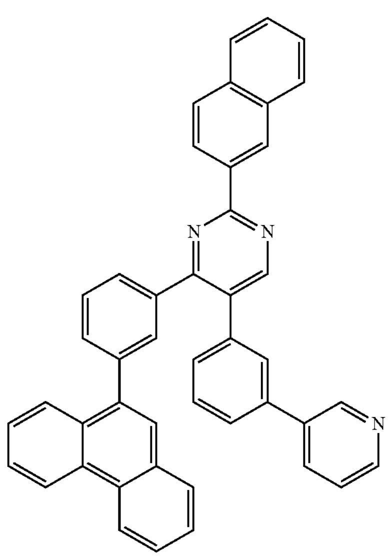
-continued
(6-63)
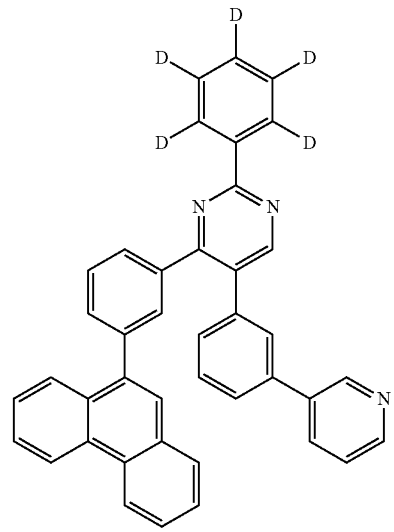
(6-64)
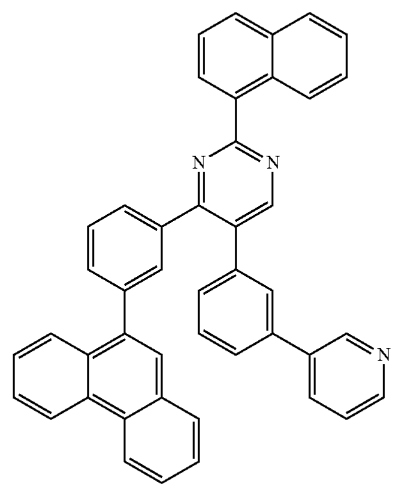
(6-65)
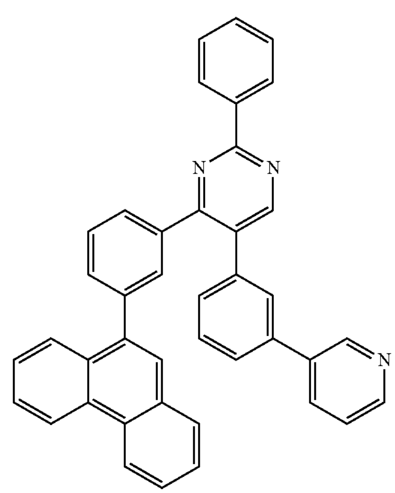

-continued
(6-66)
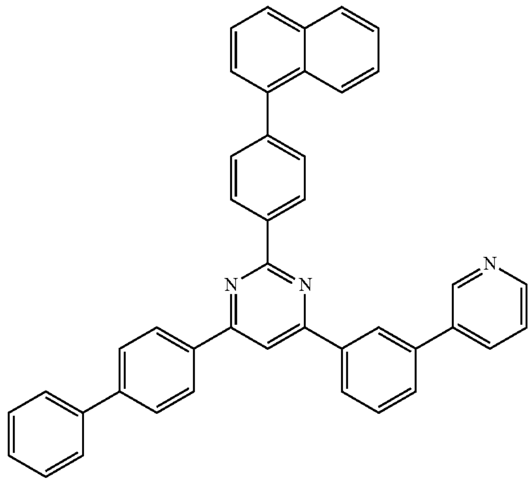
(6-67)
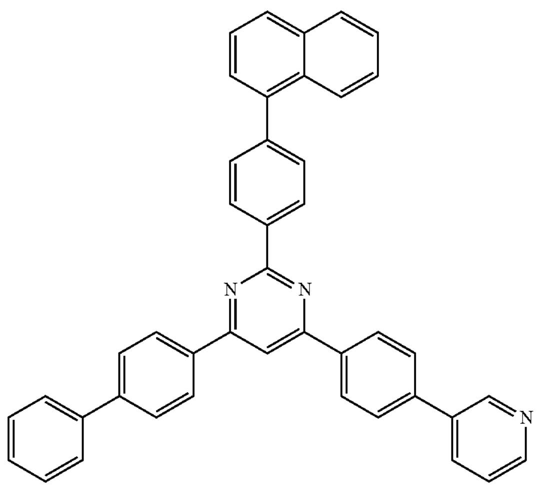
(6-68)
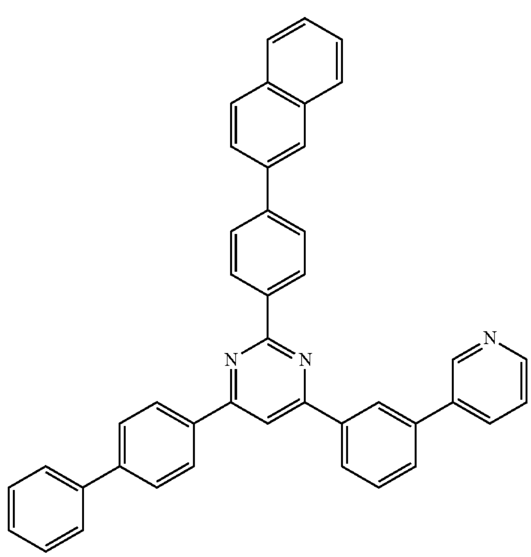
-continued
(6-69)
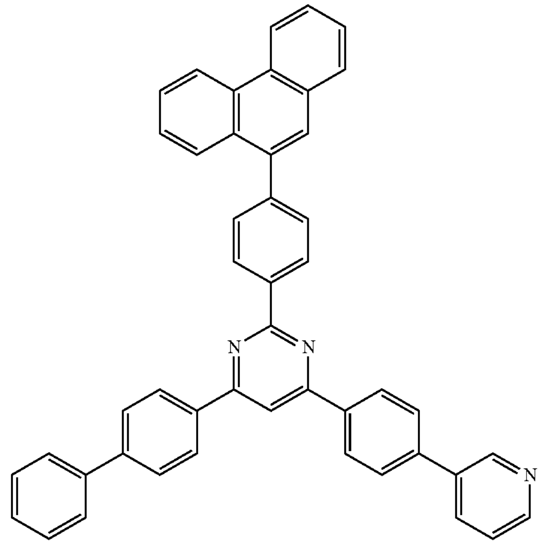
(6-70)
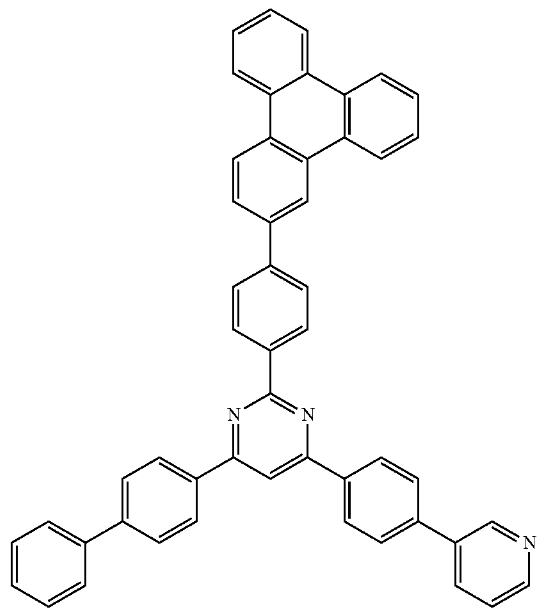
(6-71)
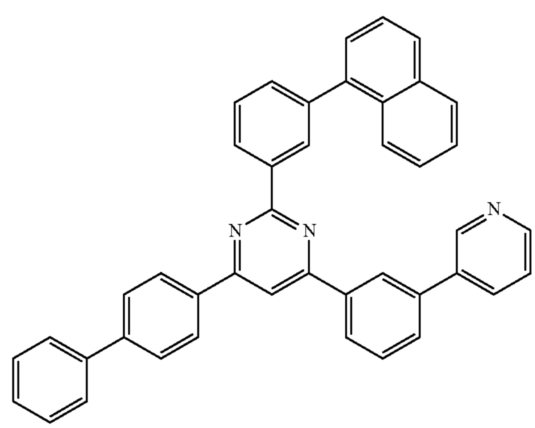

(6-72)
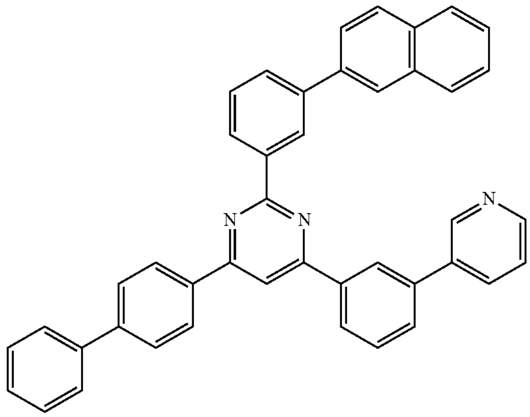
[Chemical Formula 50]
(6-73)
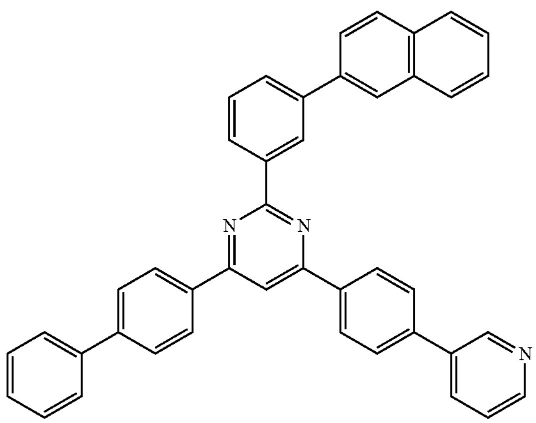
(6-74)
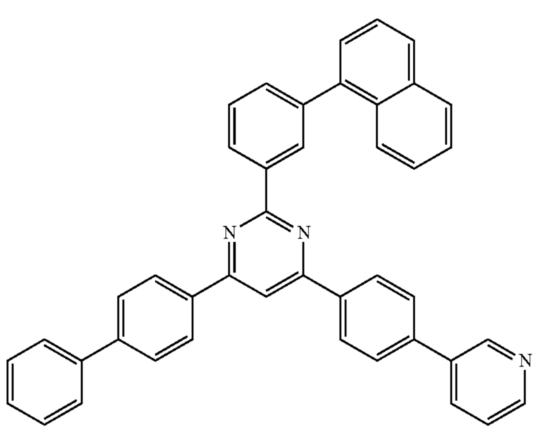
(6-75)
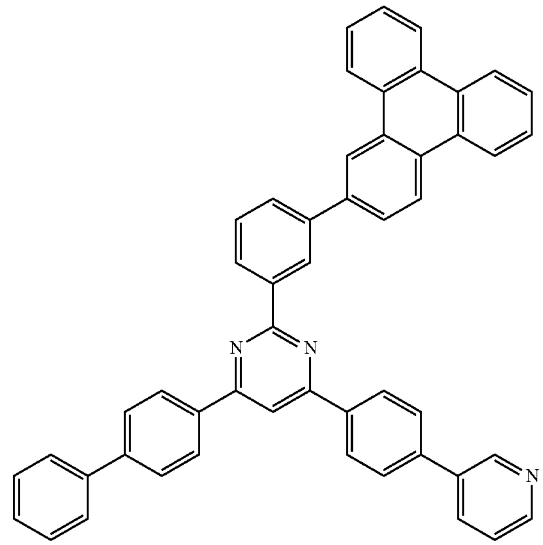
(6-76)
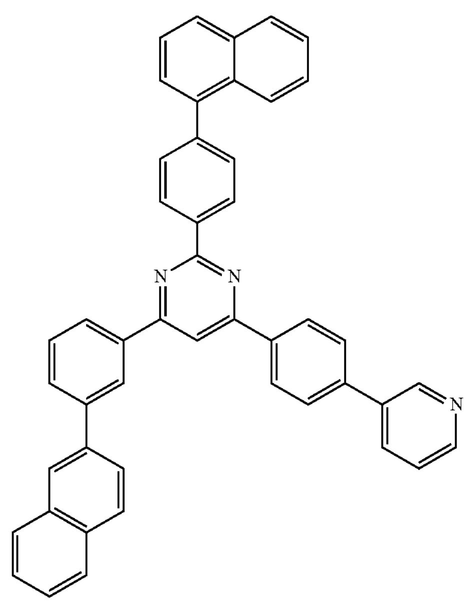

-continued
(6-77)
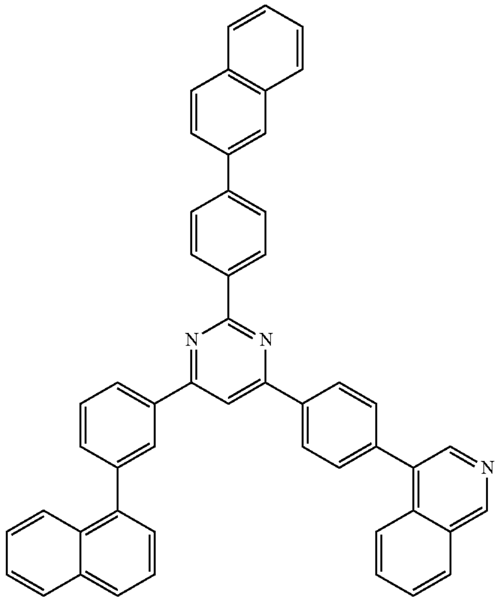
(6-78)
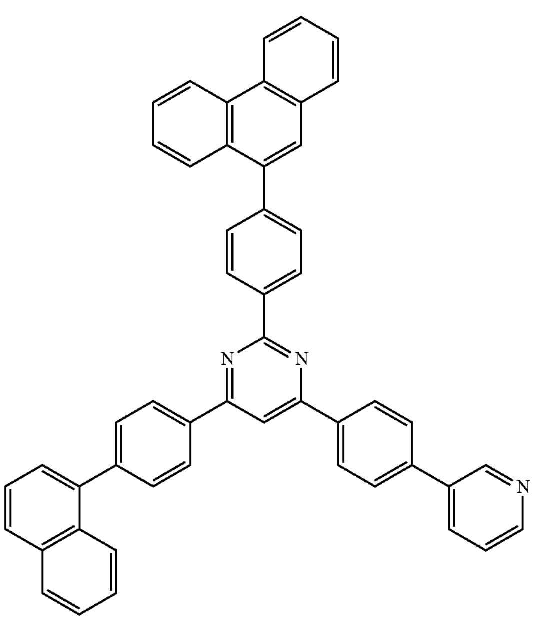
-continued
(6-79)
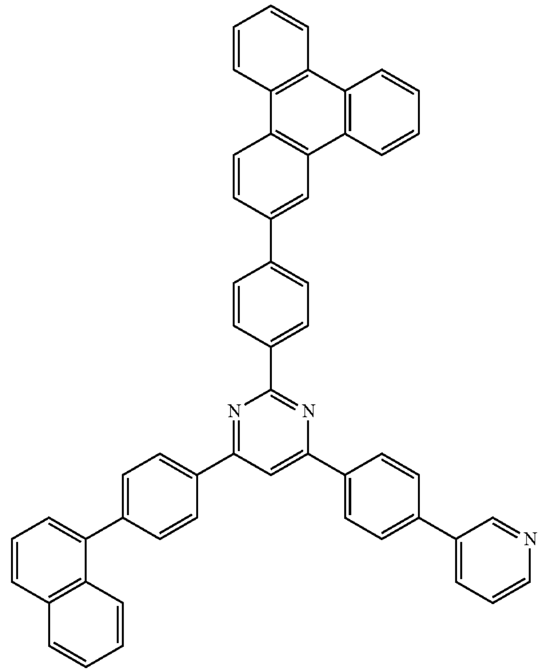
(6-80)
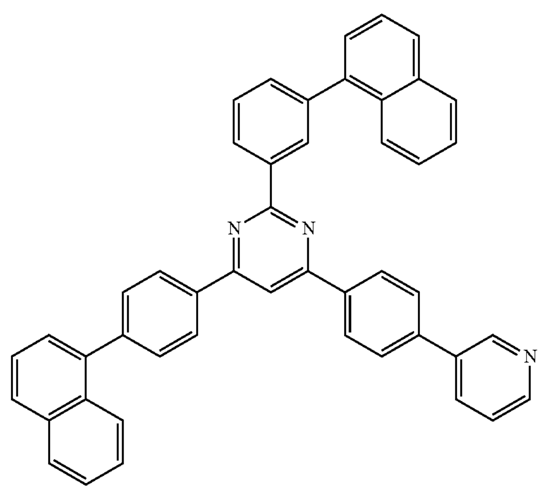

-continued
(6-81)
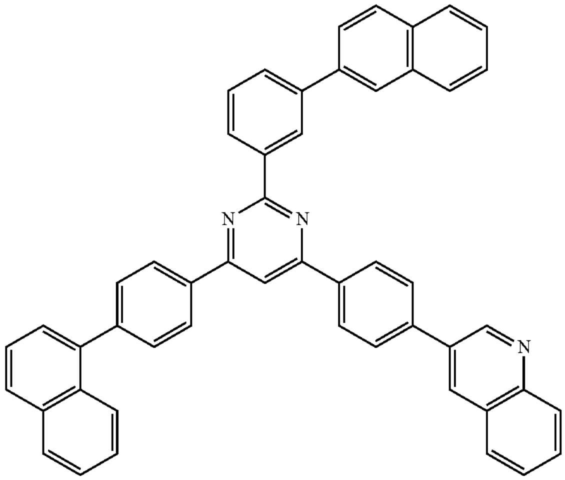
(6-82)
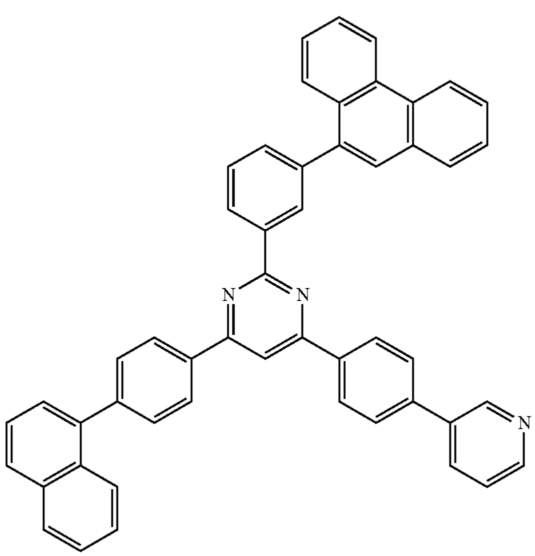
-continued
(6-83)
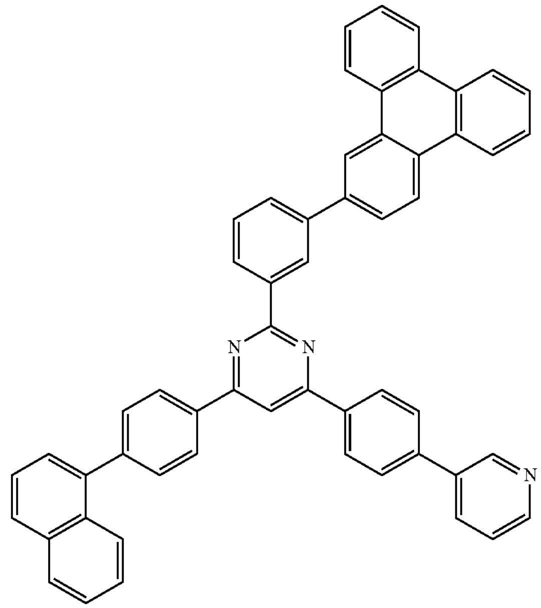
(6-84)
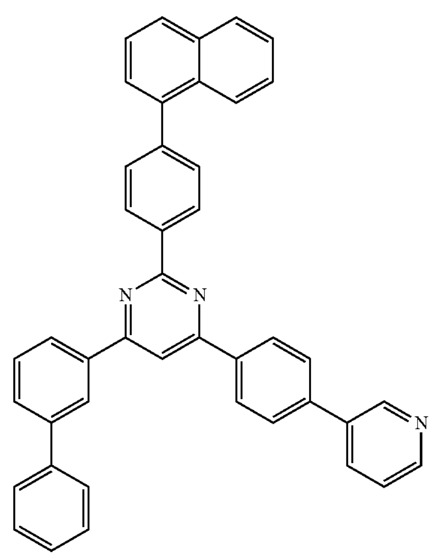

-continued
[Chemical Formula 51]
(6-85)
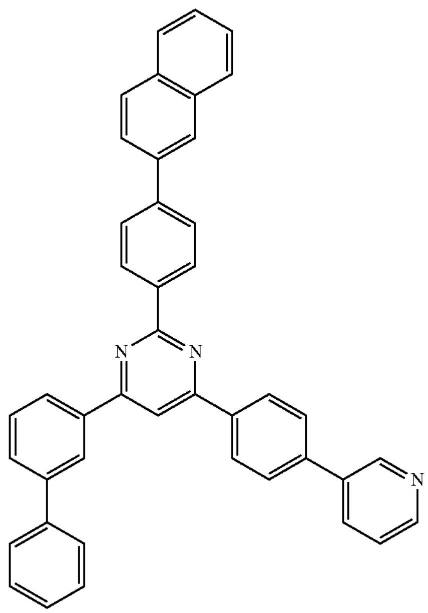
(6-86)
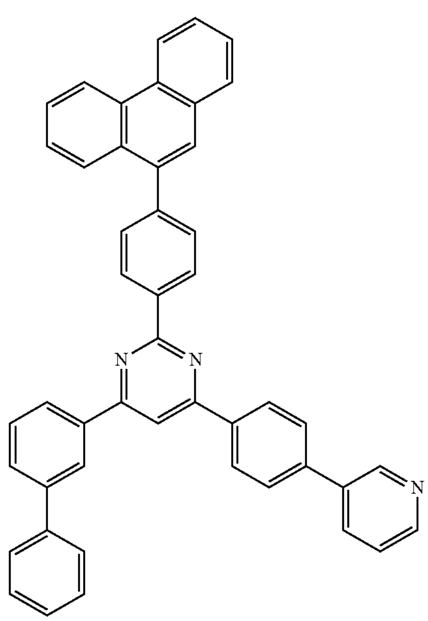
-continued
(6-87)
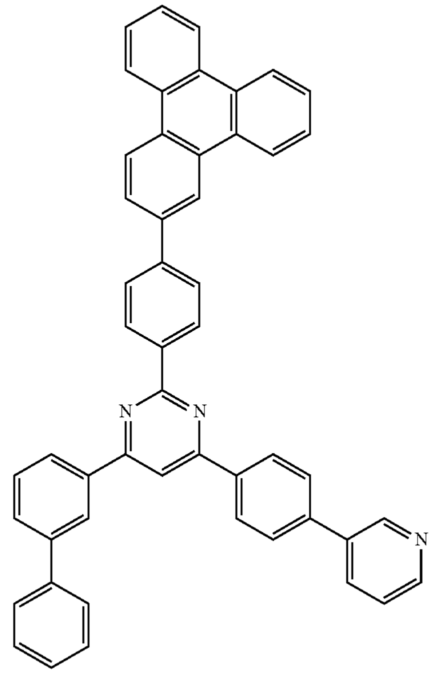
(6-88)
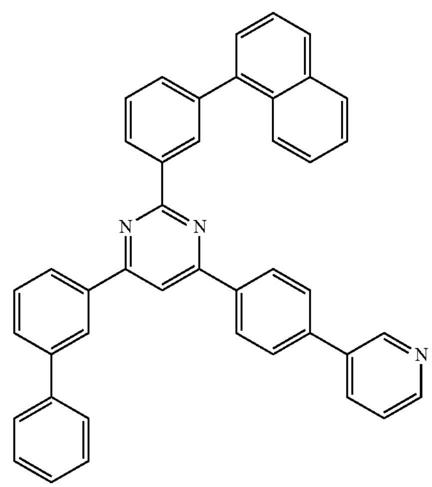
(6-89)
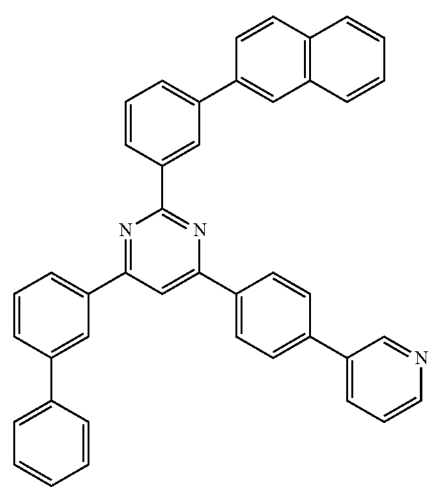

-continued
(6-90)
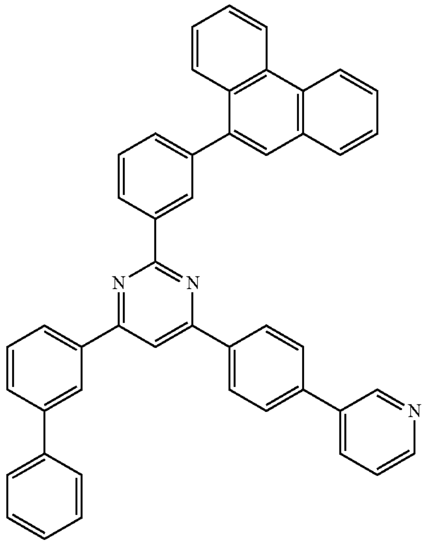
(6-91)
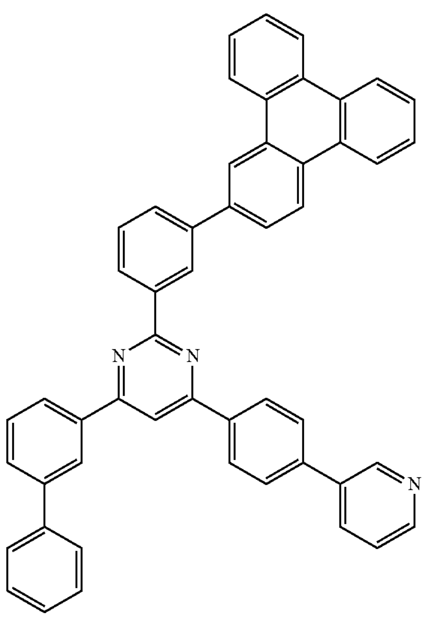
-continued
(6-92)
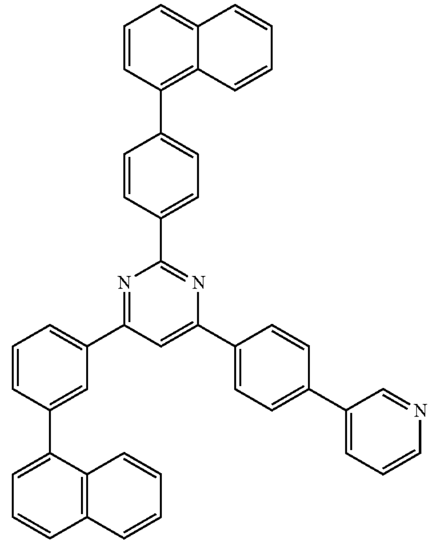
(6-93)
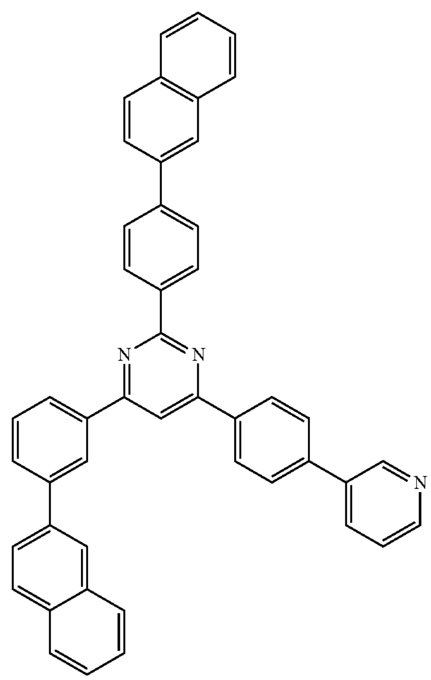

-continued
(6-94)
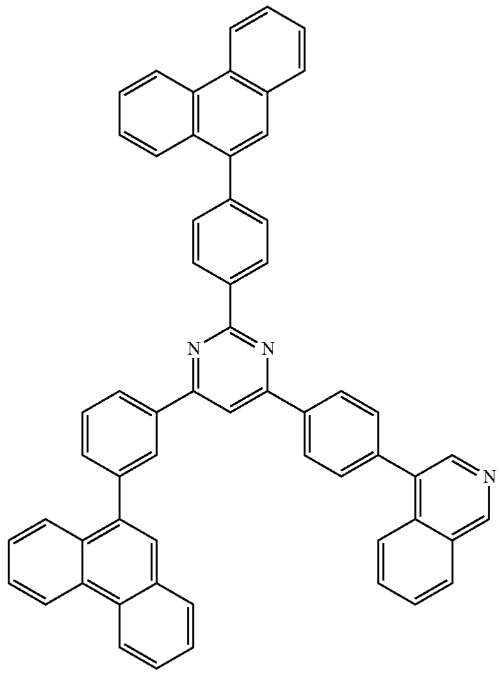
(6-95)
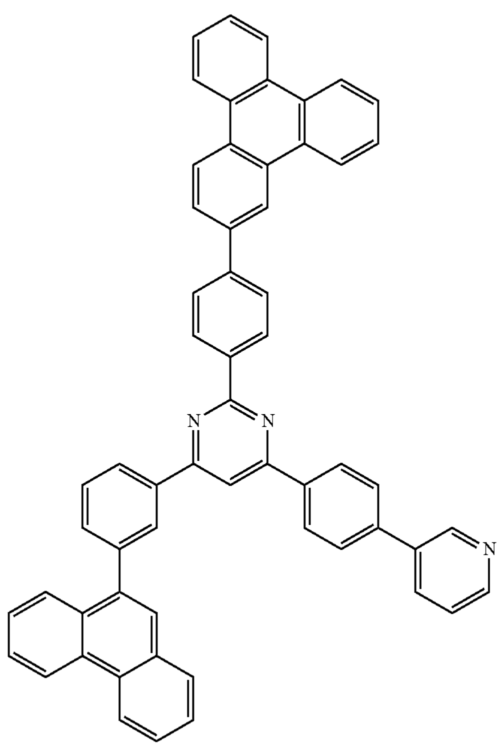
-continued
(6-96)
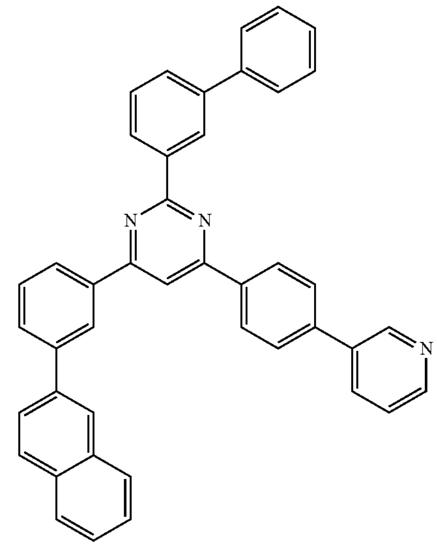
[Chemical Formula 52]
(6-97)
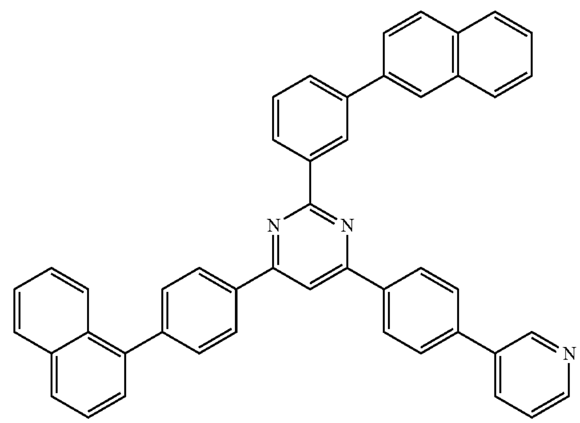
(6-98)
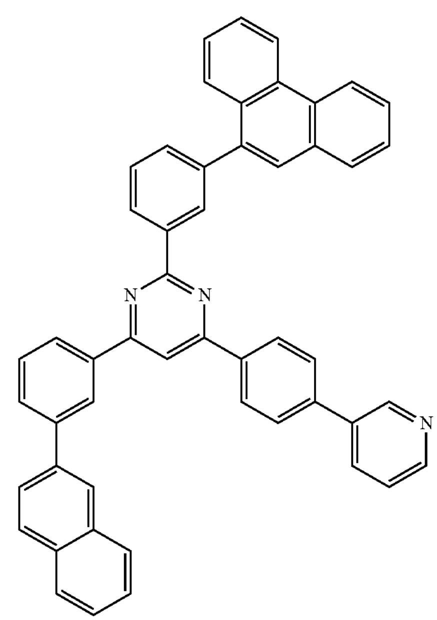

-continued
(6-99)
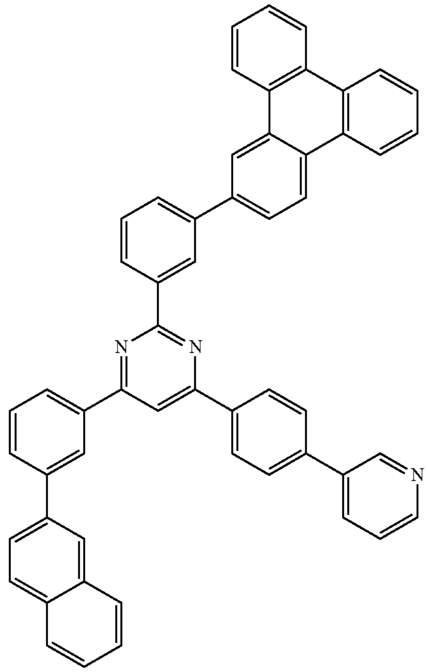
(6-100)
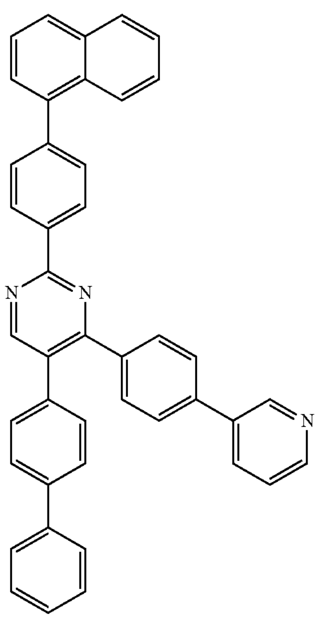
-continued
(6-101)
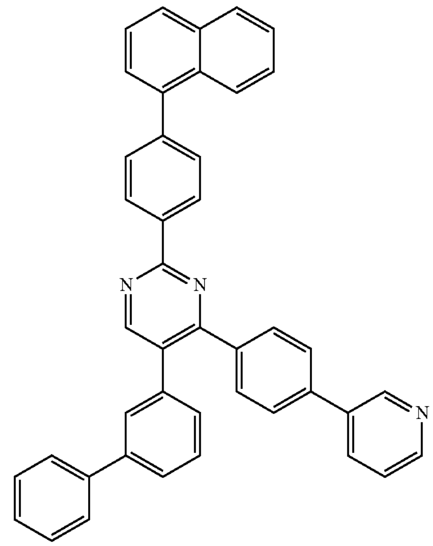
(6-102)
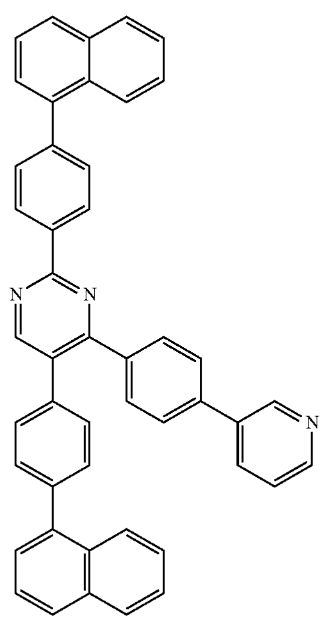

-continued
(6-103)
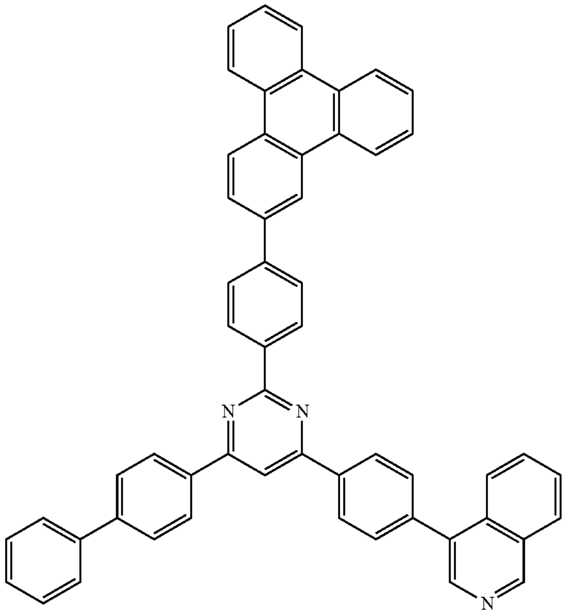
(6-104)
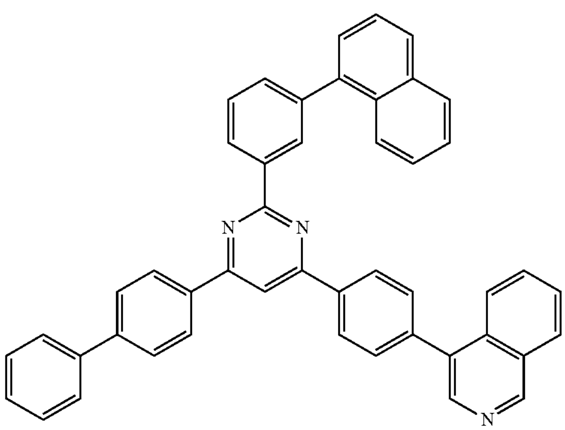
(6-105)
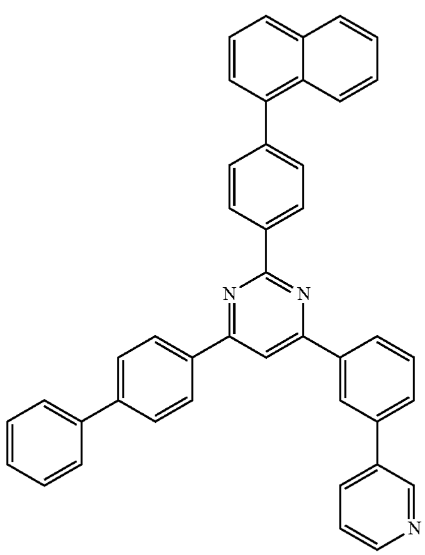
-continued
(6-106)
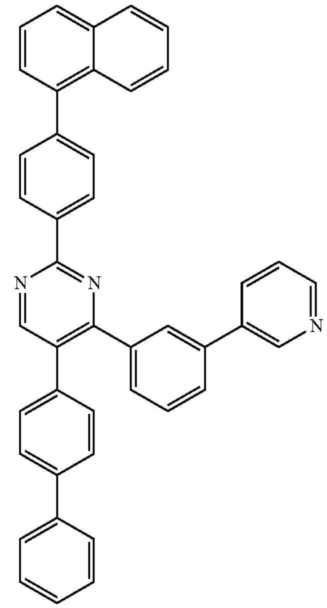
(6-107)
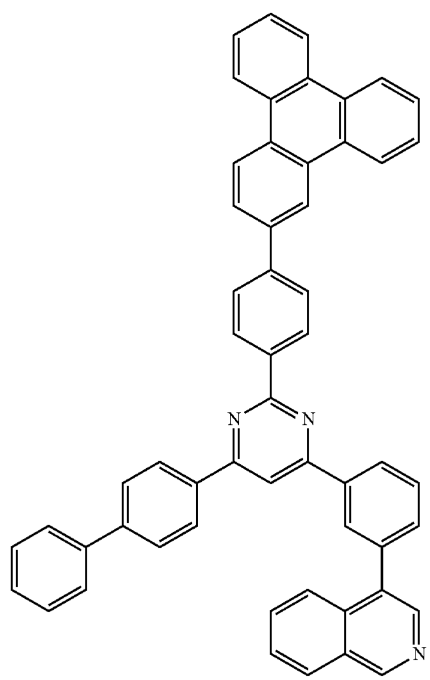

-continued
(6-108)
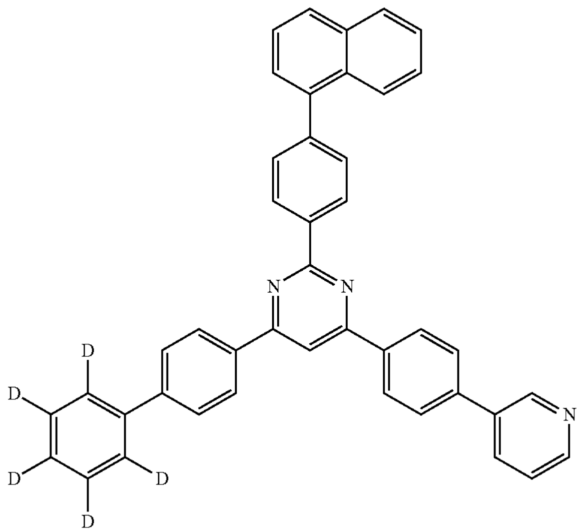
[Chemical Formula 53]
(6-109)
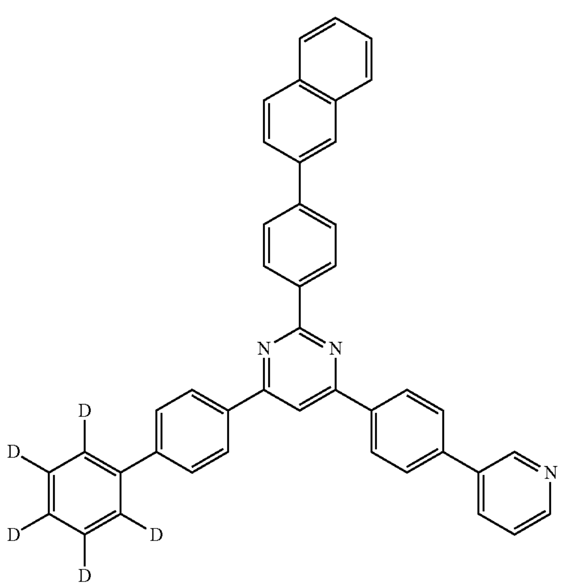
-continued
(6-110)
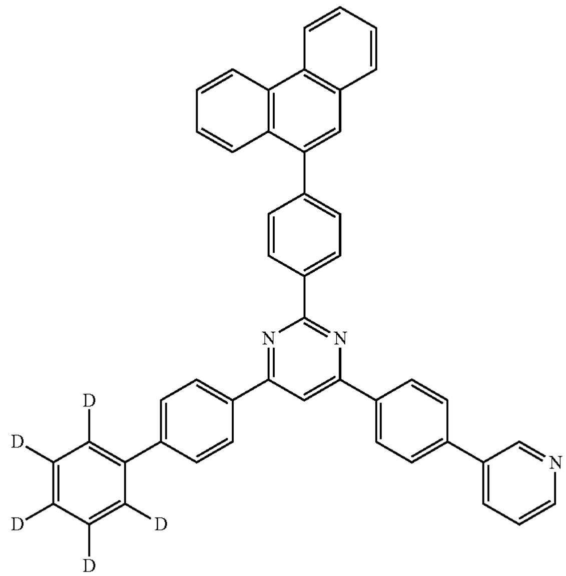
(6-111)
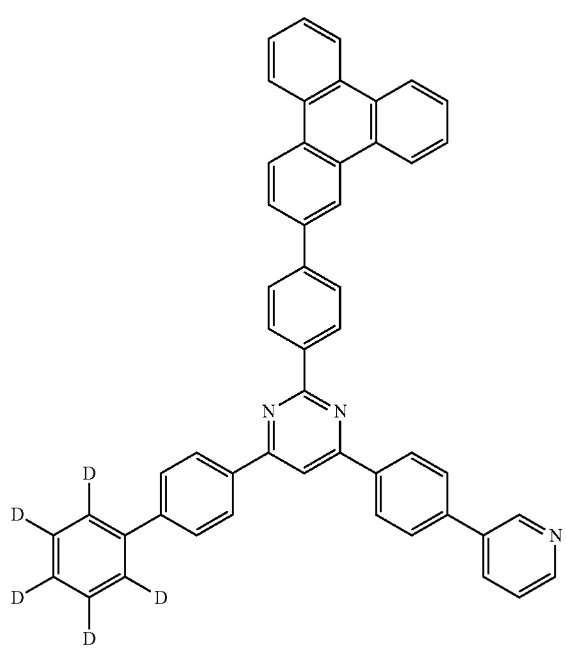

-continued
(6-112)
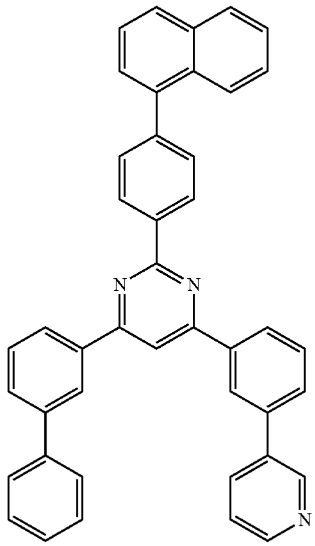
(6-113)
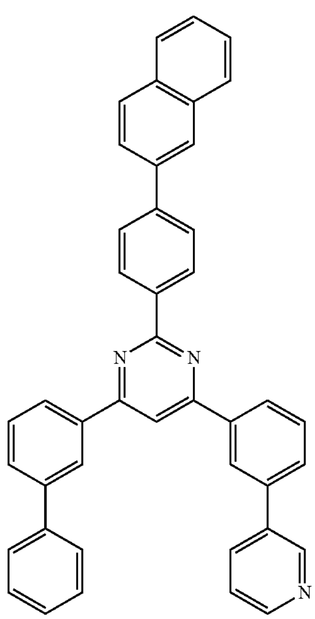
-continued
(6-114)
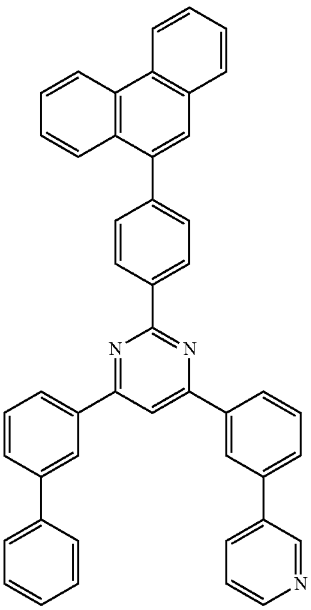
(6-115)
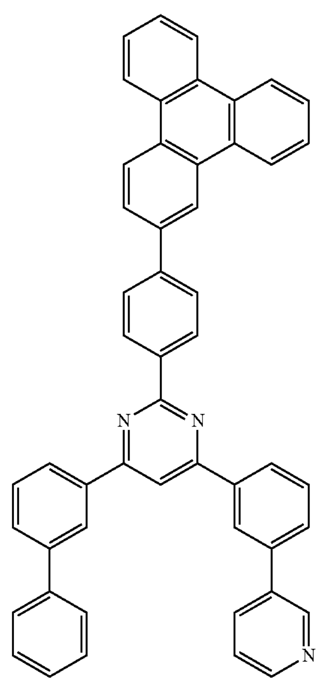

-continued
(6-116)
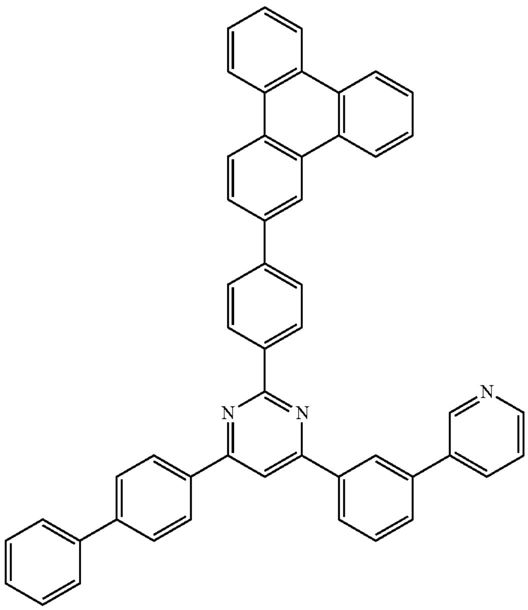
(6-117)
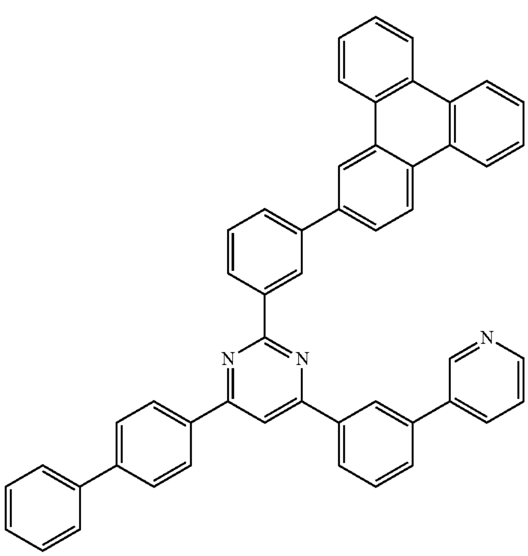
-continued
(6-118)
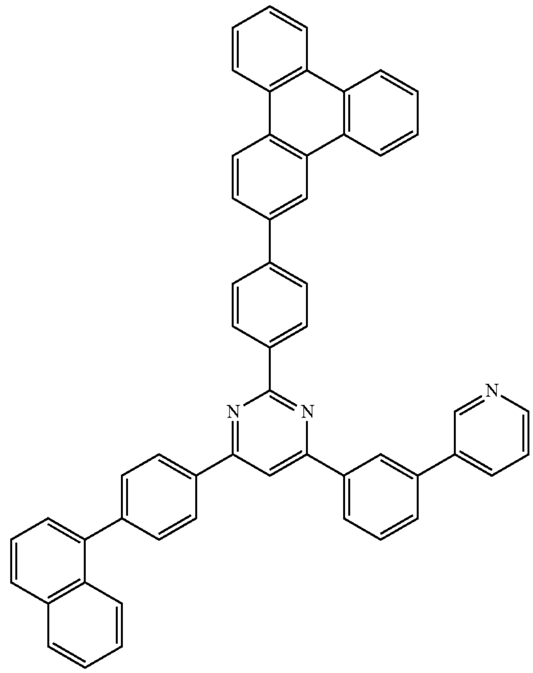
(6-119)
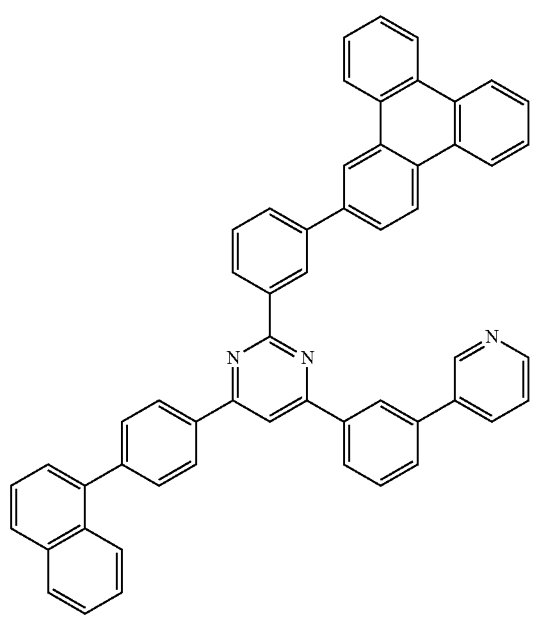

-continued
(6-120)
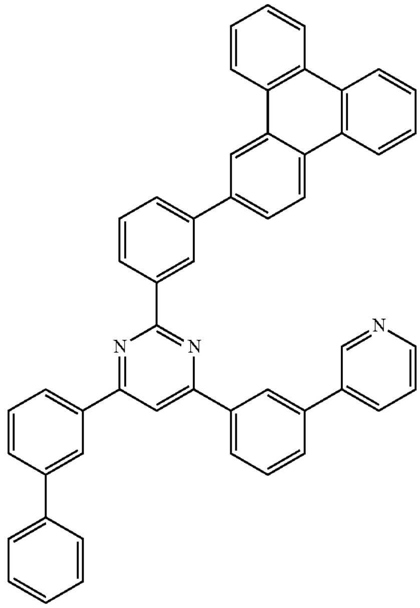
[Chemical Formula 54]
(6-121)
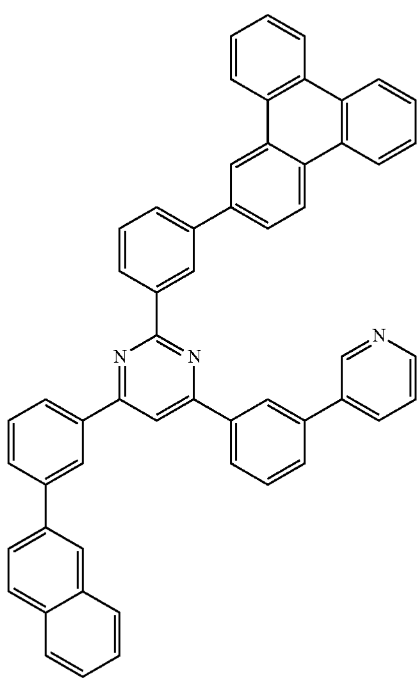
-continued
(6-122)
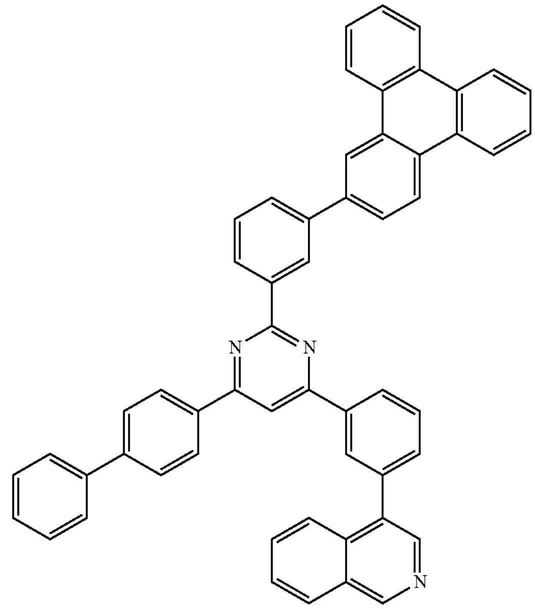
(6-123)
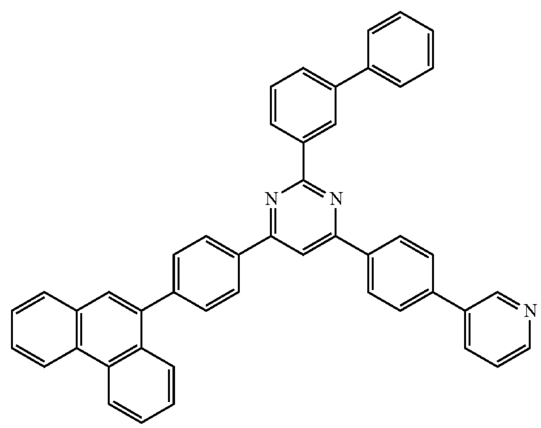
(6-124)
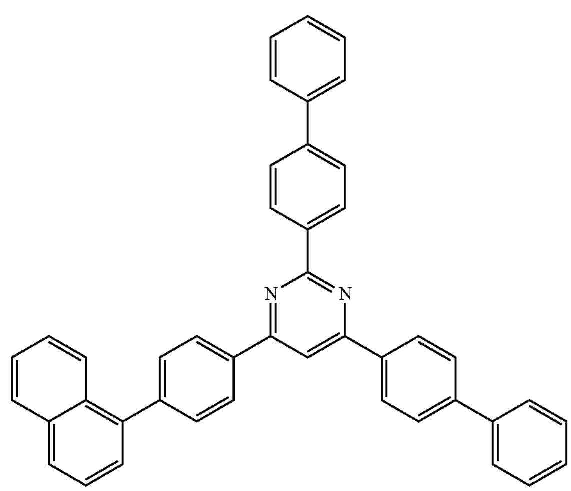

-continued
(6-125)
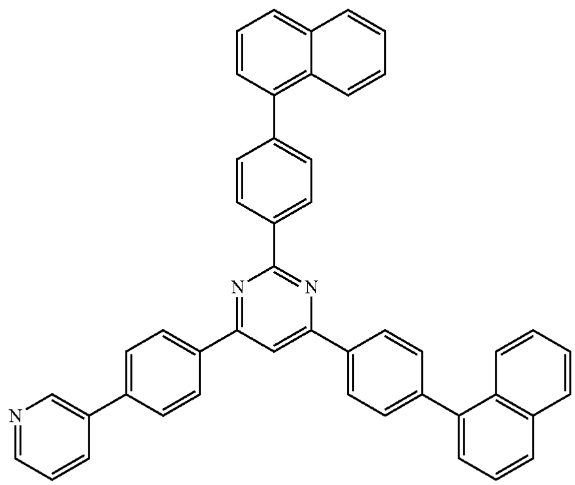
(6-126)
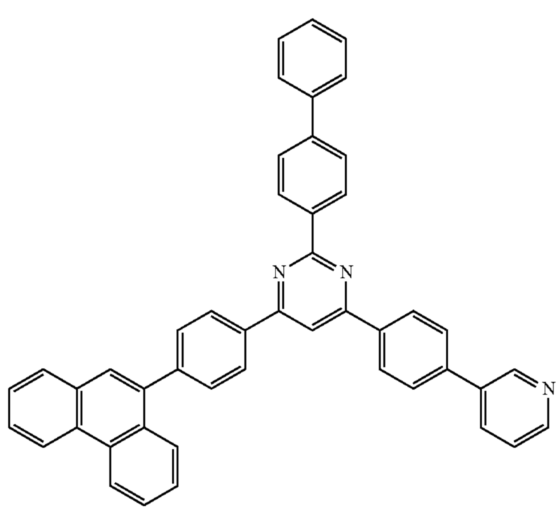
-continued
(6-127)
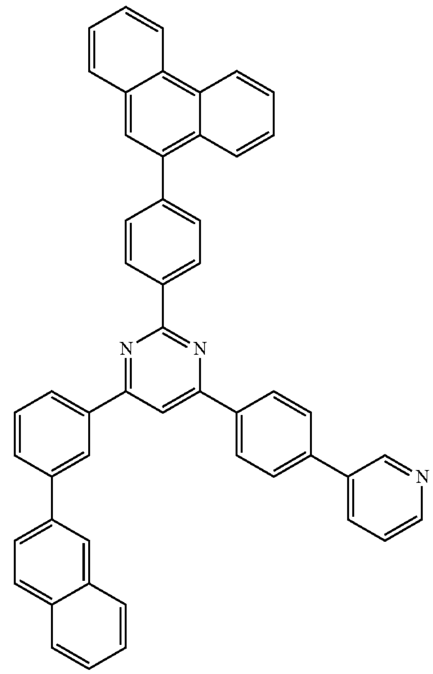
(6-128)
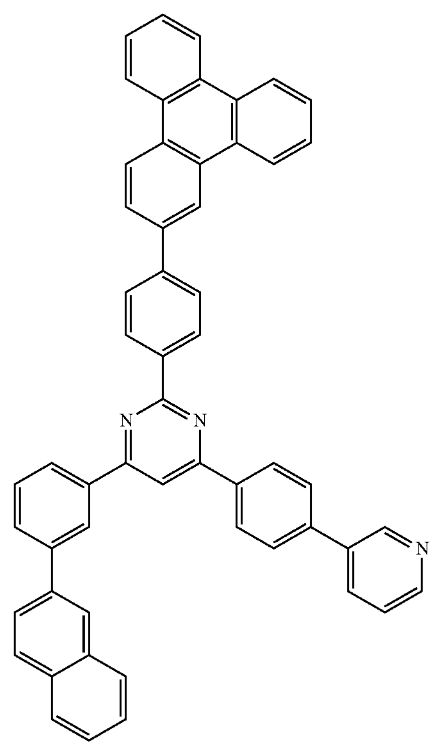

(6-129)
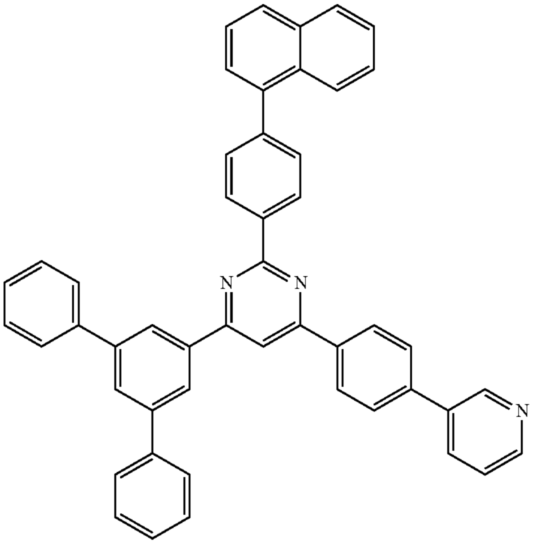
(6-130)
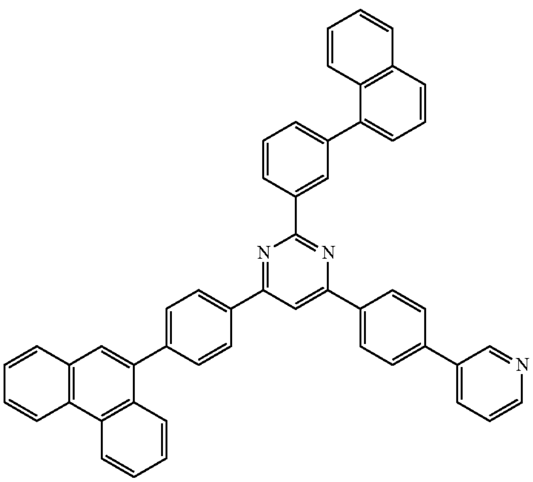
(6-131)
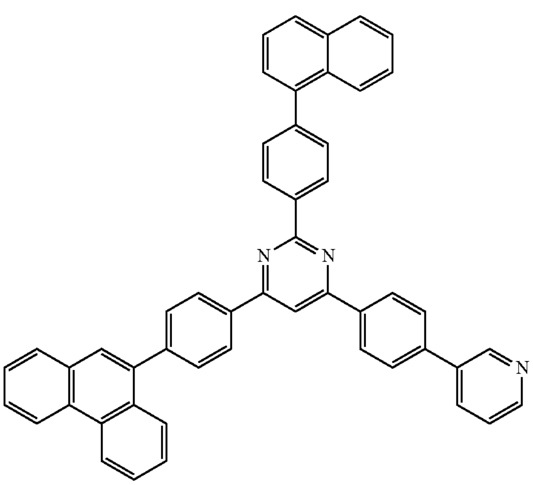
(6-132)
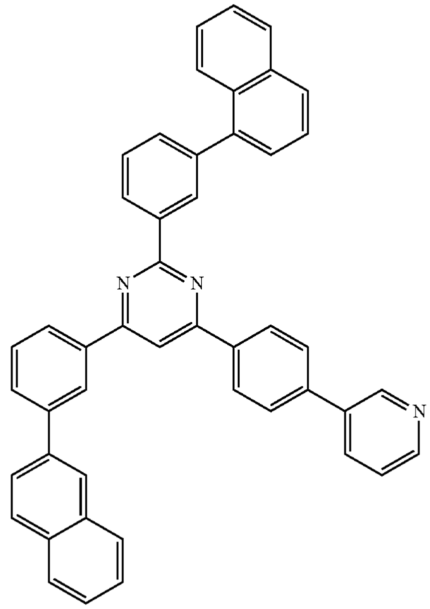
[Chemical Formula 55]
(6-133)
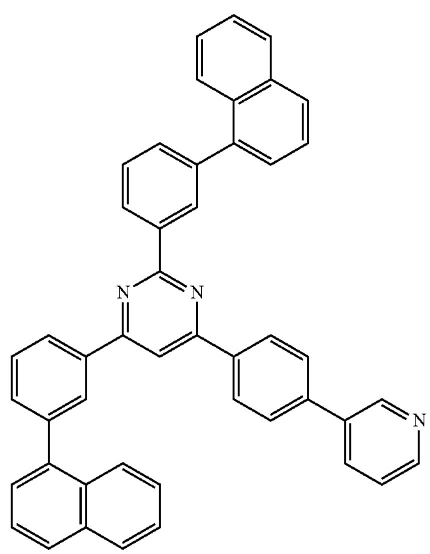

-continued
(6-134)
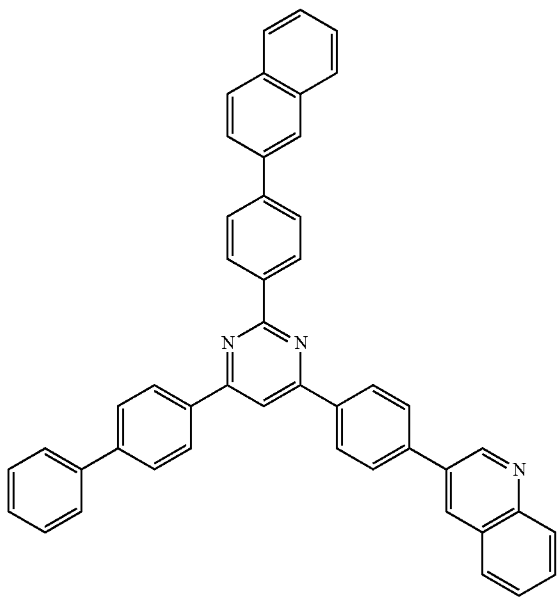
(6-135)
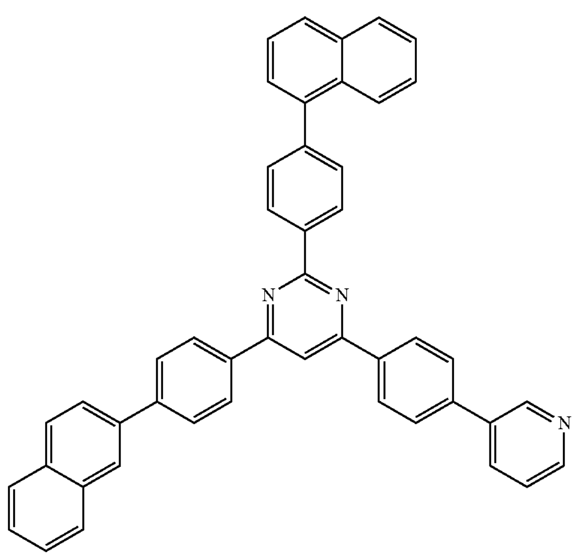
-continued
(6-136)
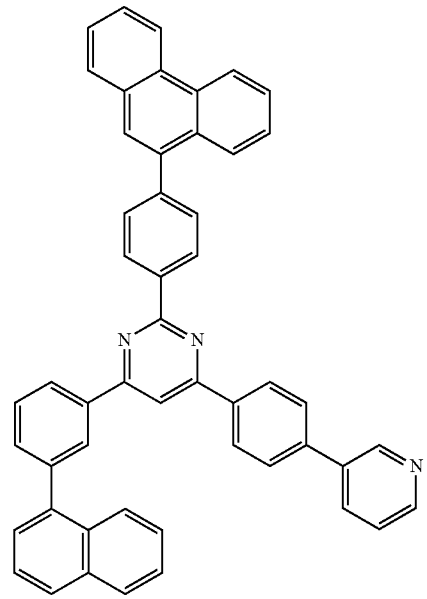
(6-137)
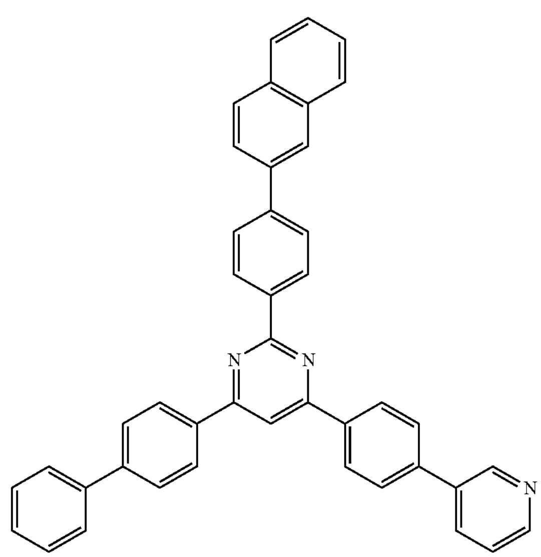

(6-138)
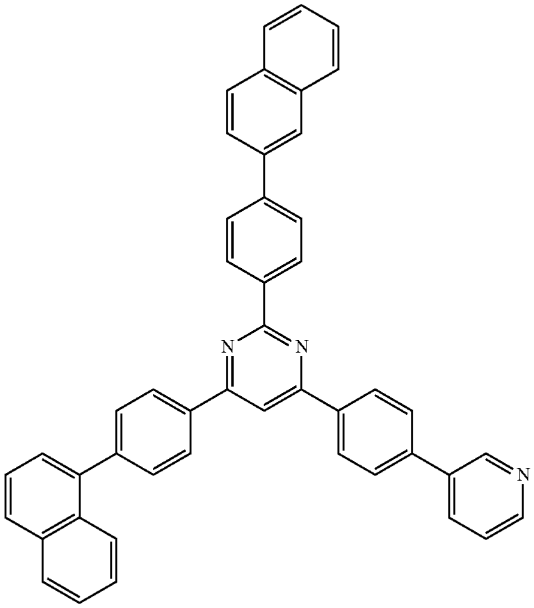
(6-139)
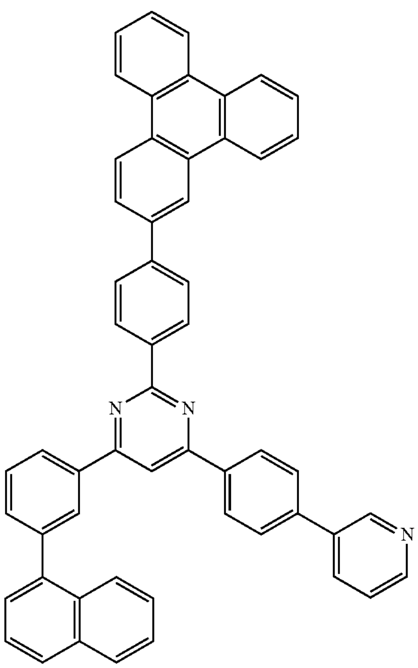
(6-140)
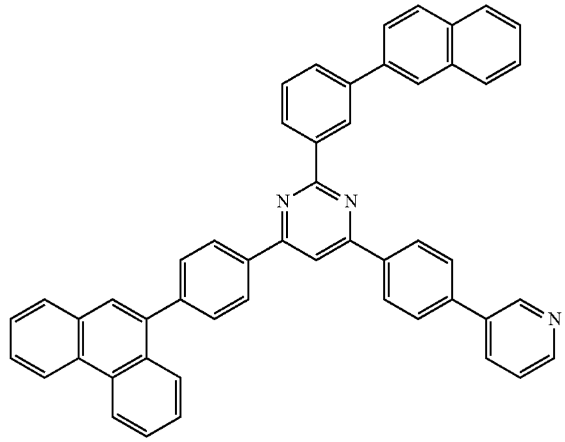
(6-141)
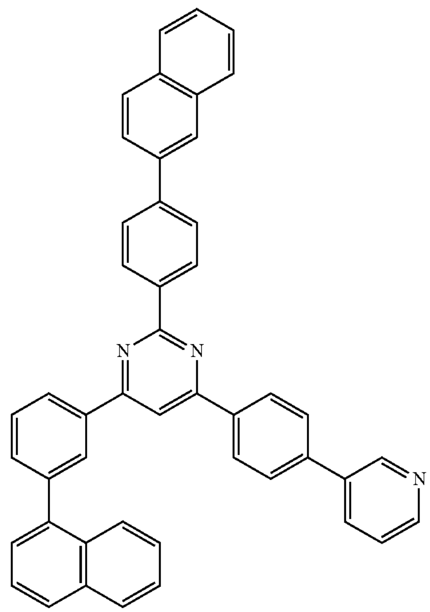
(6-142)
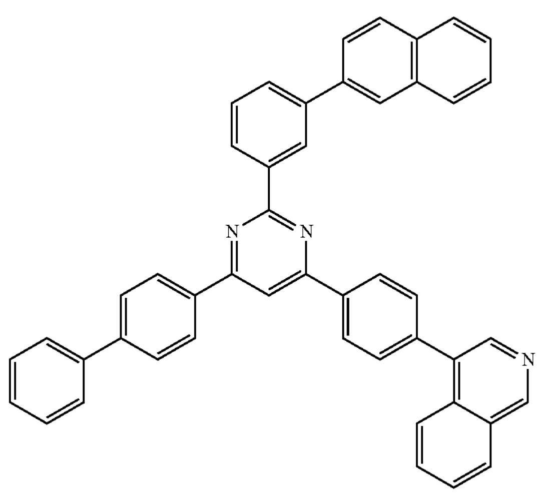

-continued
(6-143)
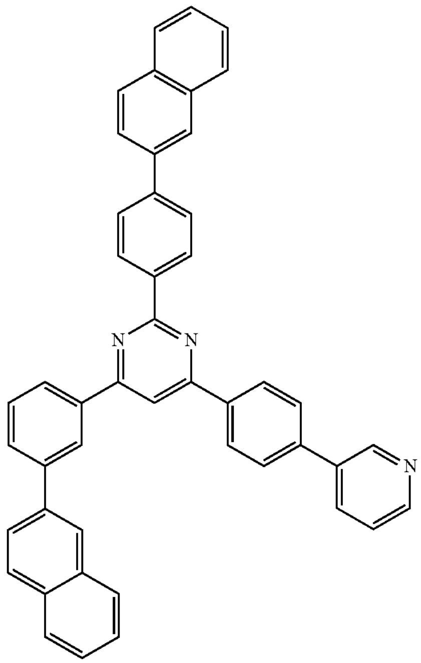
(6-144)
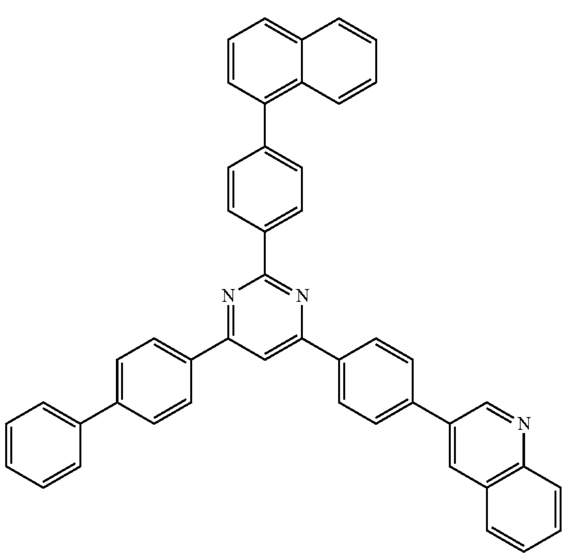
-continued
[Chemical Formula 56]
(6-145)
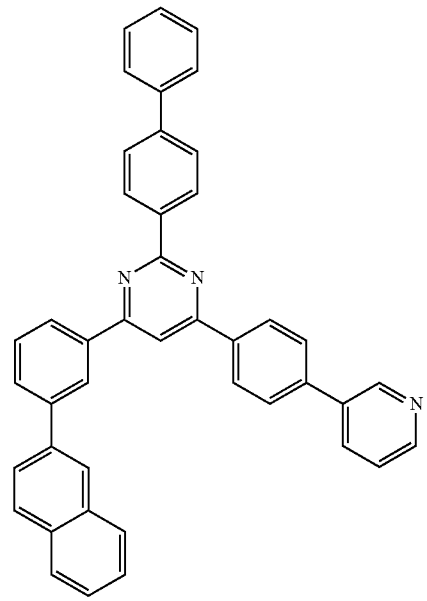
(6-146)
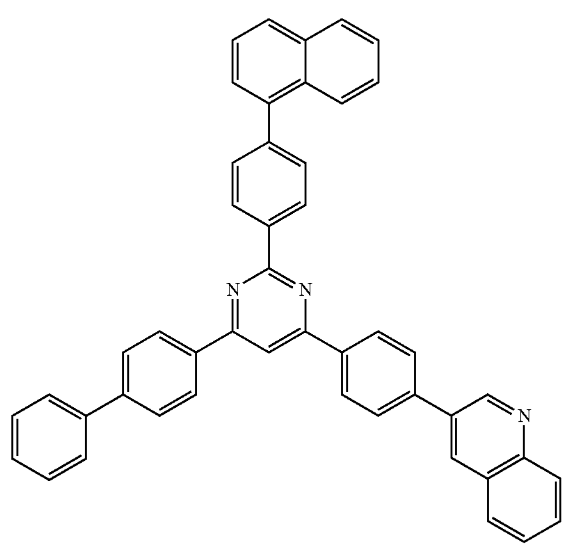

-continued
(6-147)
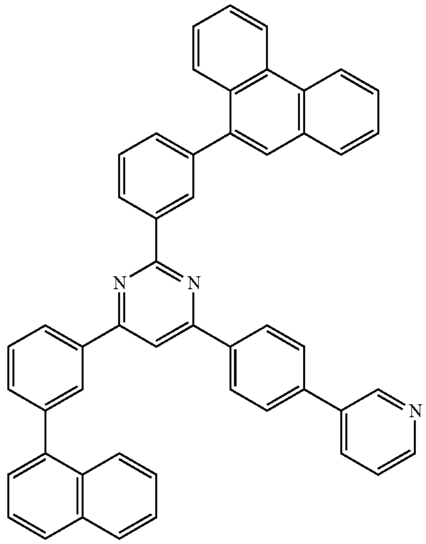
(6-148)
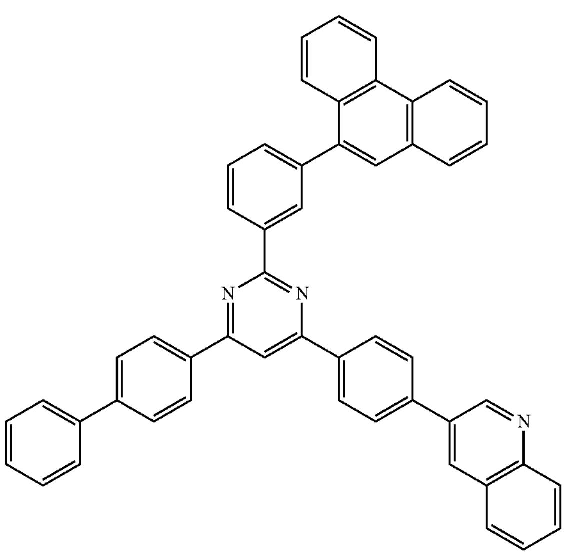
-continued
(6-149)
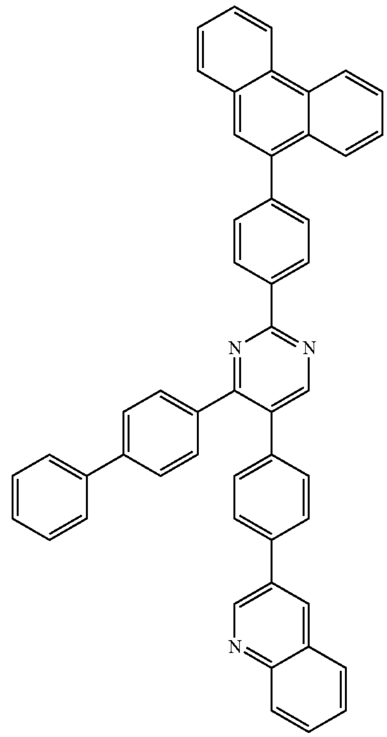
(6-150)
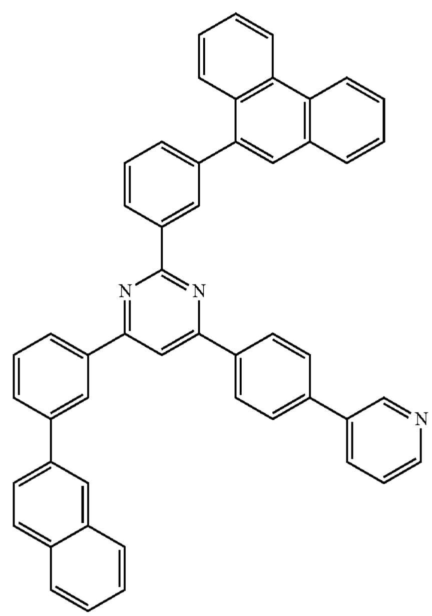

-continued
(6-151)
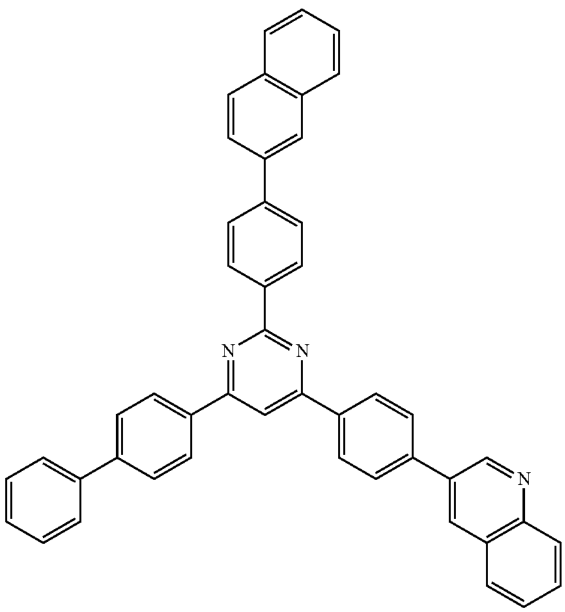
(6-152)
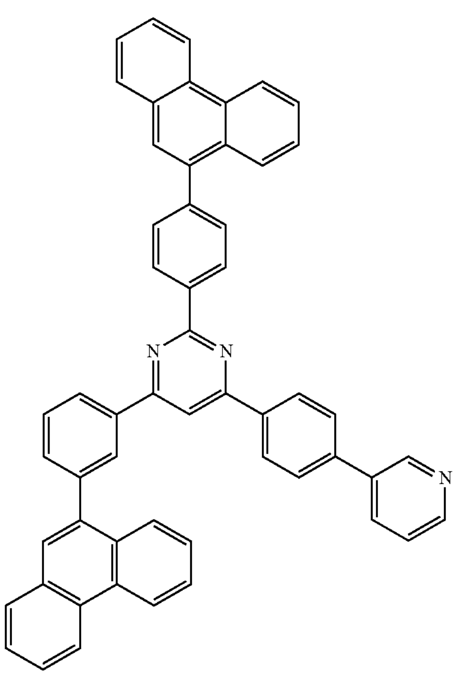
-continued
(6-153)
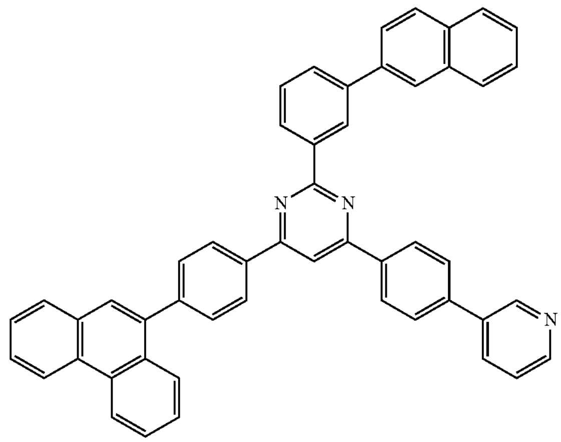
(6-154)
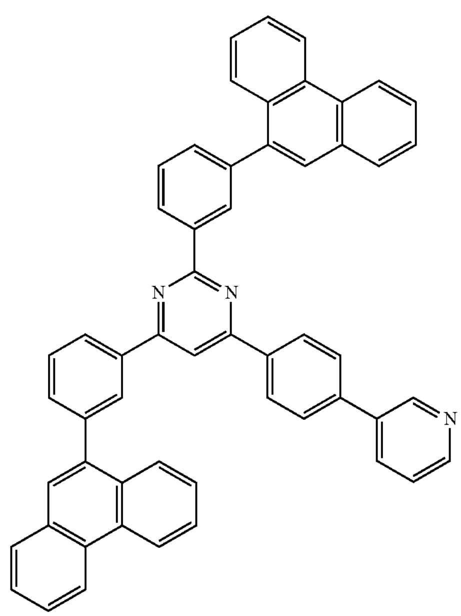

-continued
(6-155)
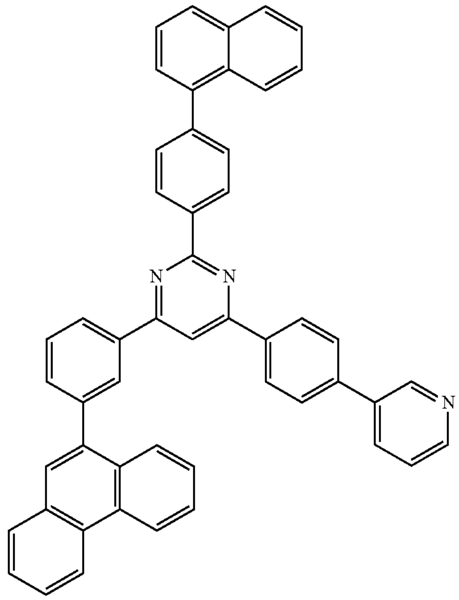
(6-156)
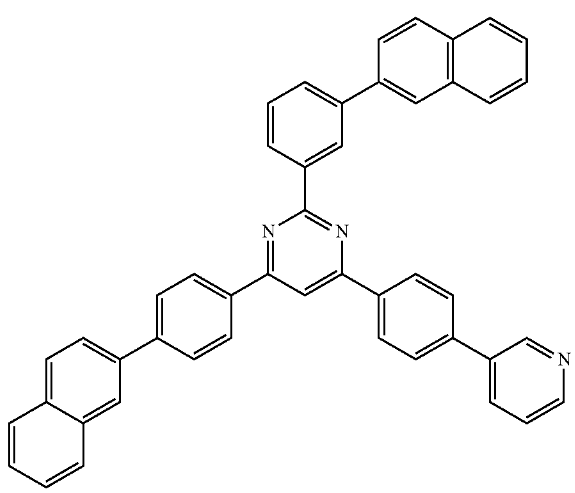
-continued
[Chemical Formula 57]
(6-157)
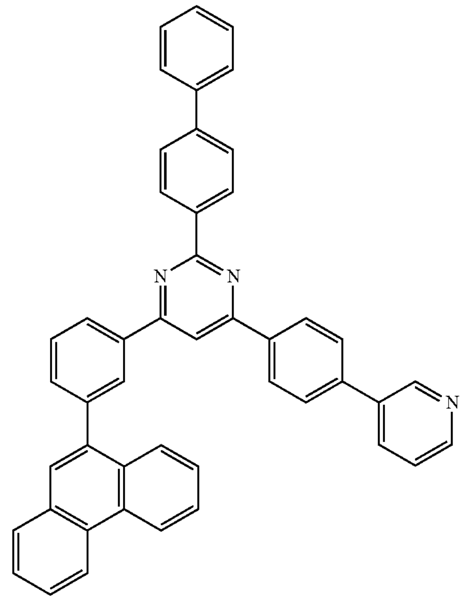
(6-158)
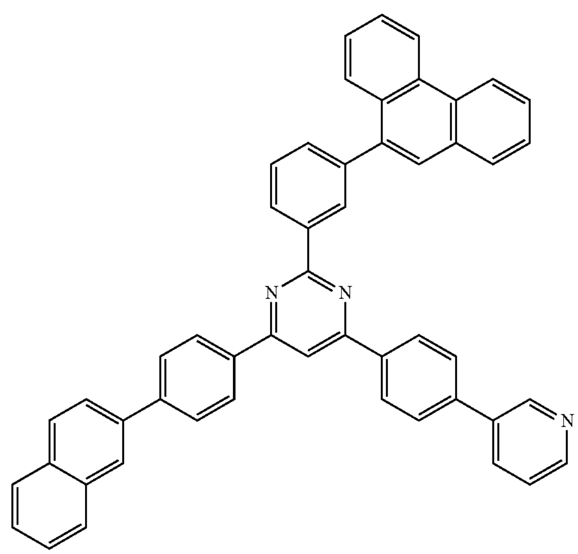

-continued
(6-159)
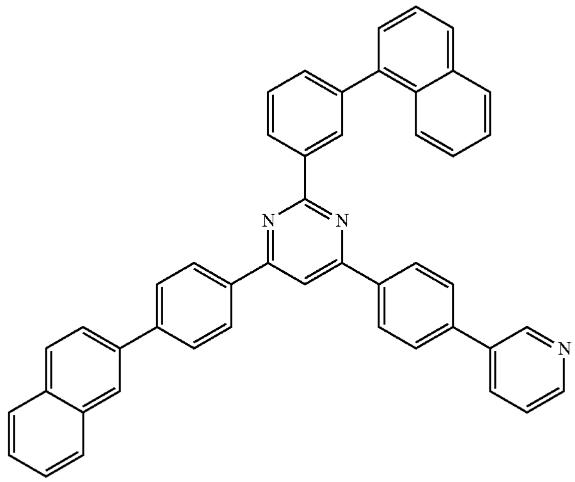
(6-160)
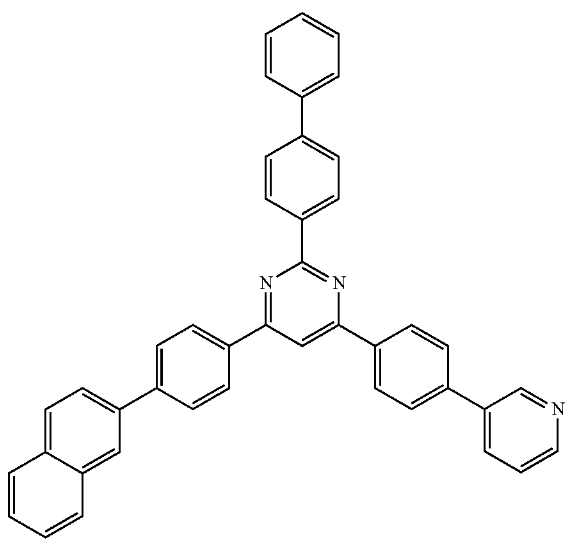
(6-161)
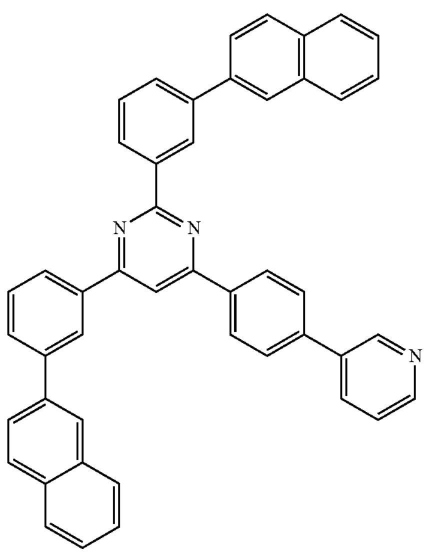
-continued
(6-162)
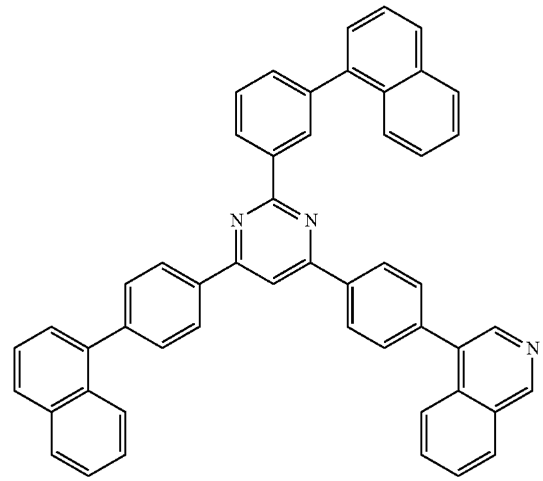
(6-163)
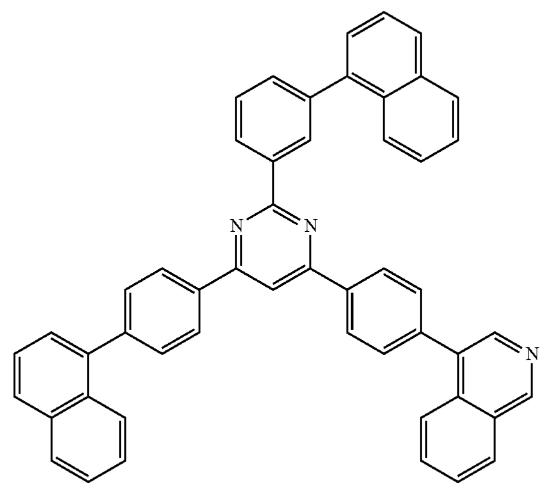
(6-164)
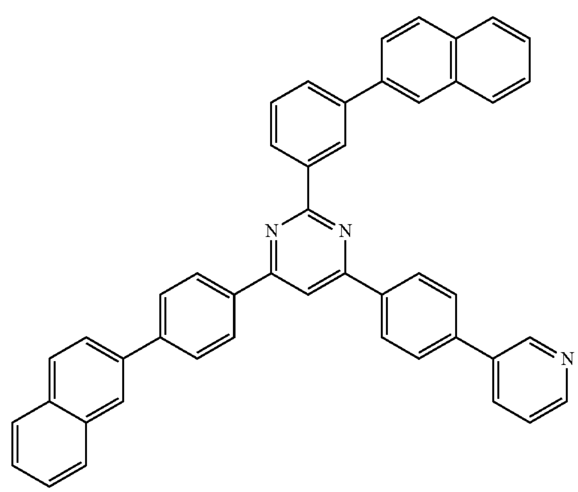

-continued
(6-165)
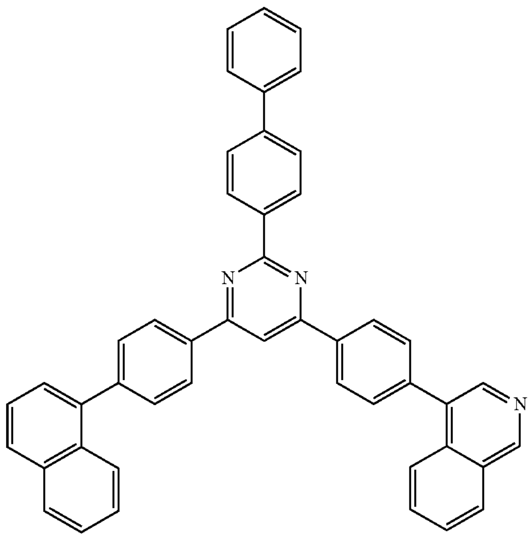
(6-166)
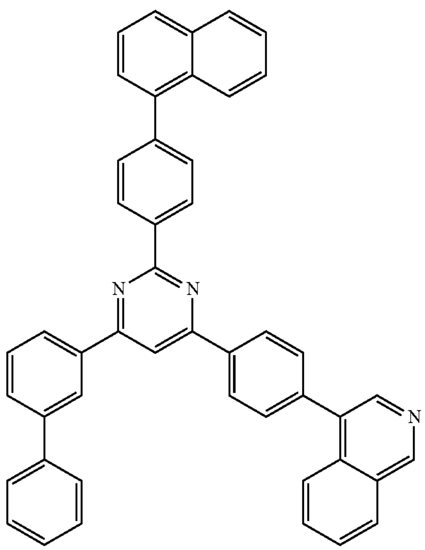
(6-167)
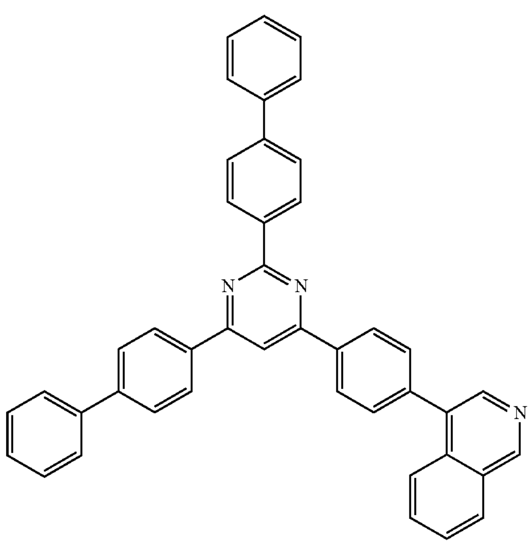
-continued
(6-168)
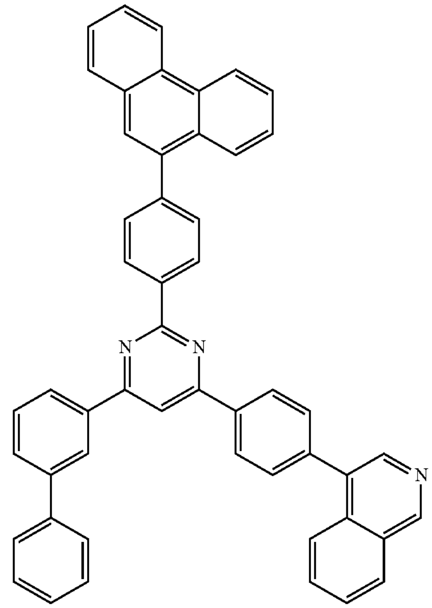
[Chemical Formula 58]
(6-169)
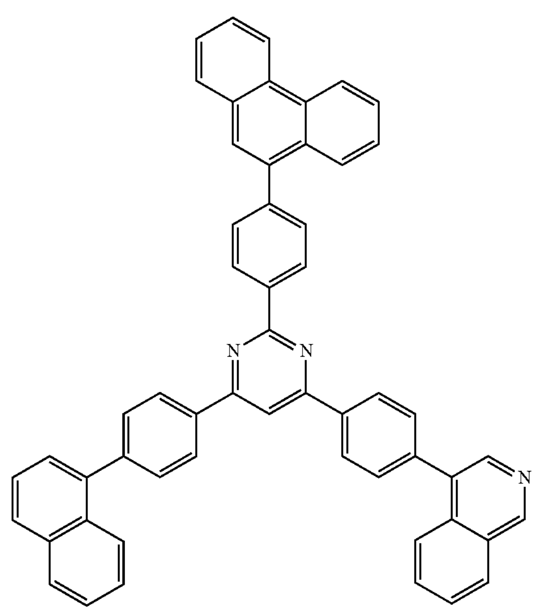

-continued
(6-170)
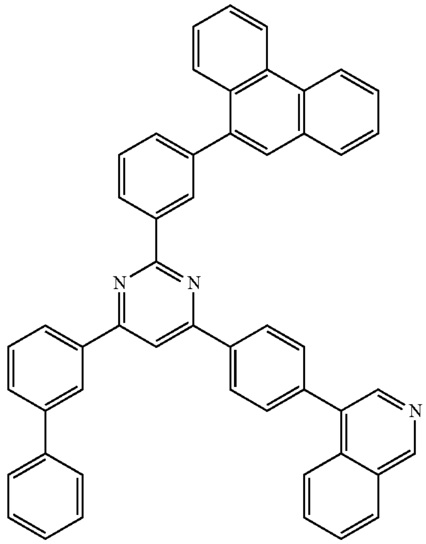
(6-171)
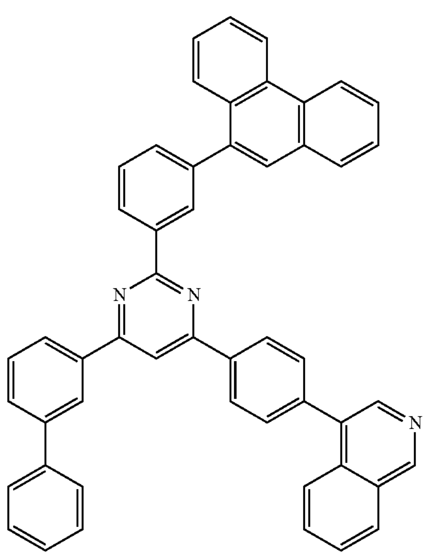
-continued
(6-172)
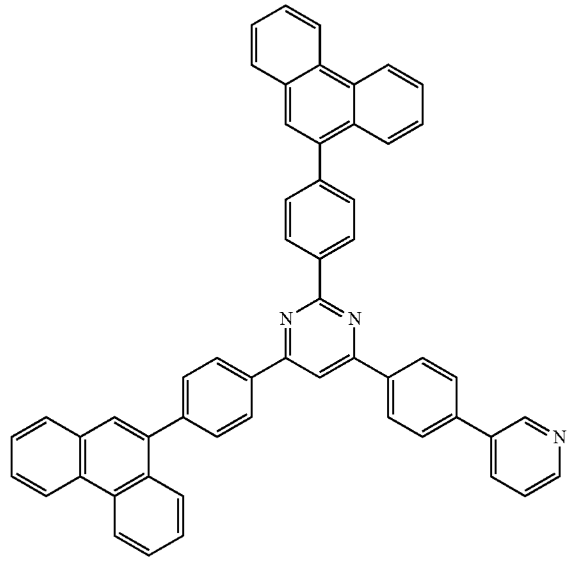
(6-173)
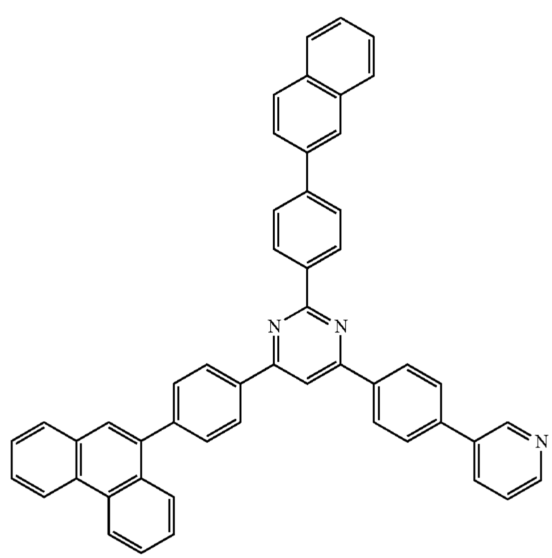

-continued
(6-174)
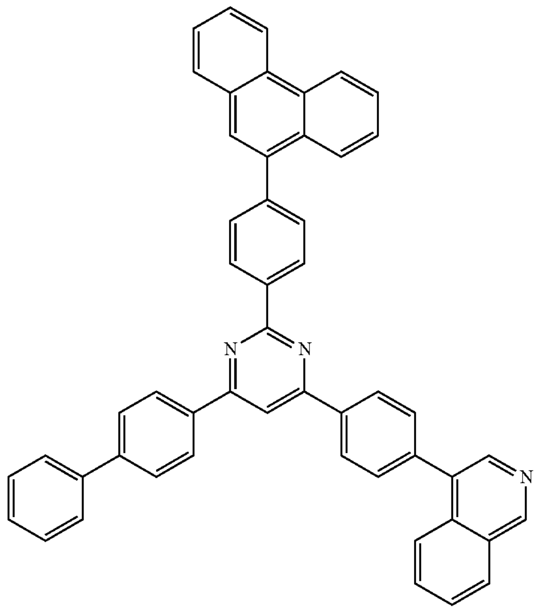
(6-175)
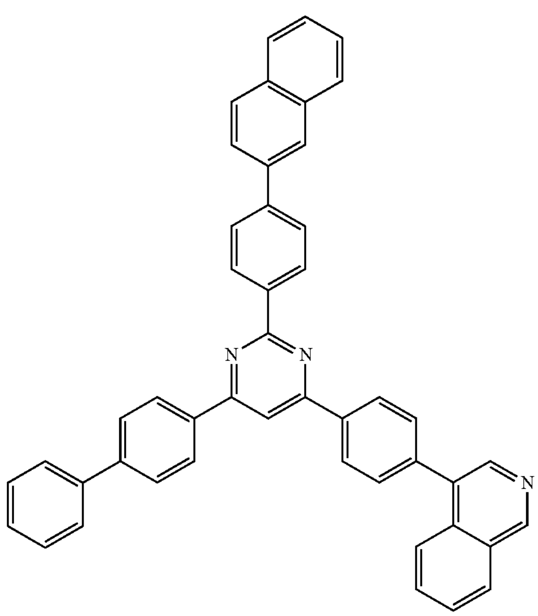
-continued
(6-176)
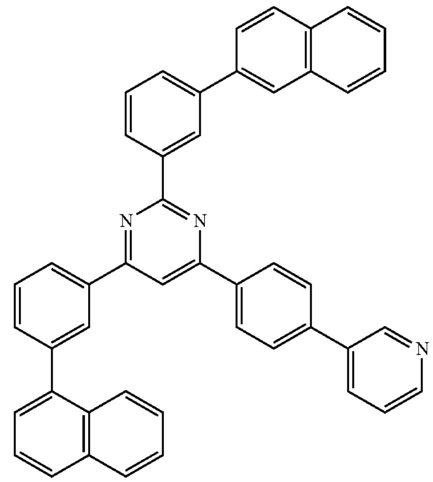
(6-177)
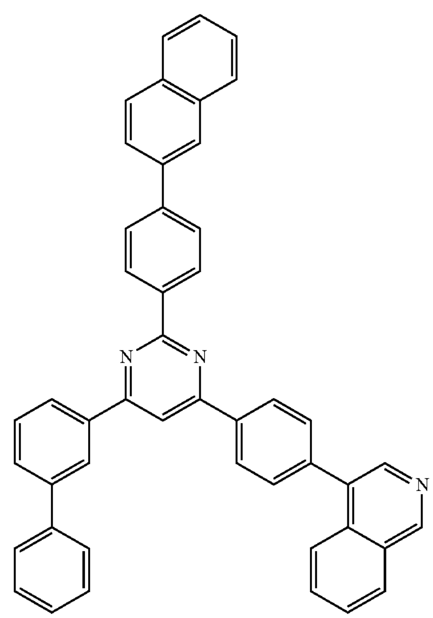

-continued
(6-178)
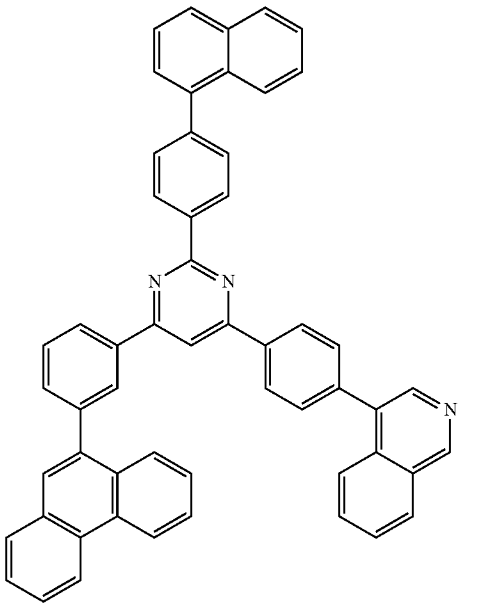
(6-179)
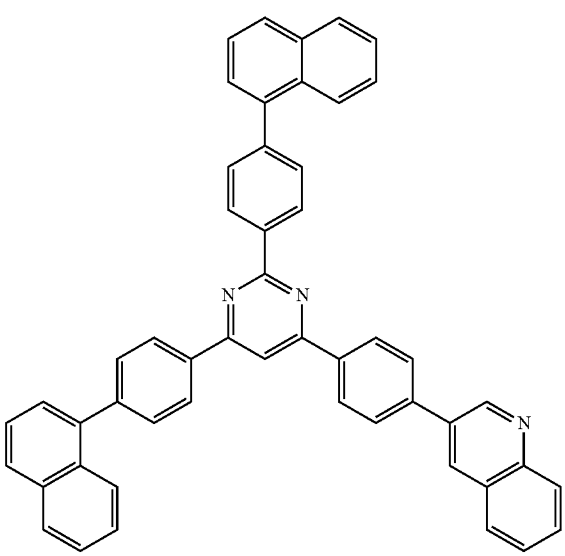
-continued
(6-180)
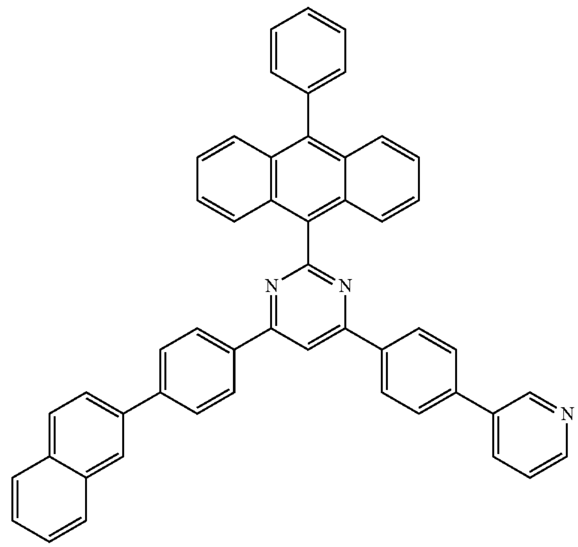
[Chemical Formula 59]
(6-181)
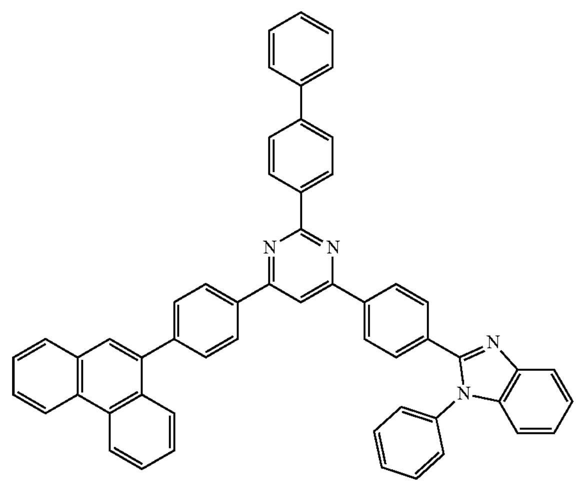
(6-182)
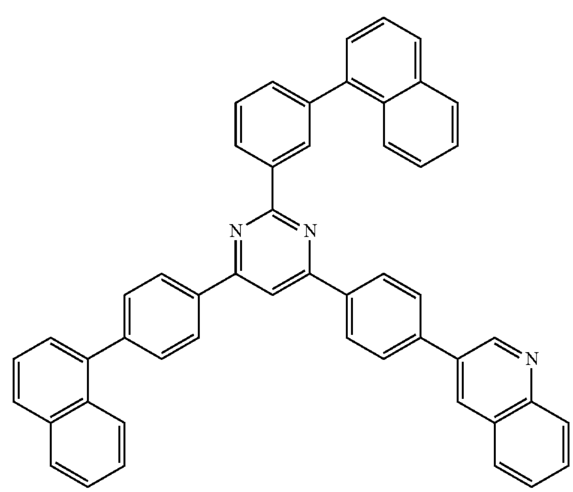

(6-183)
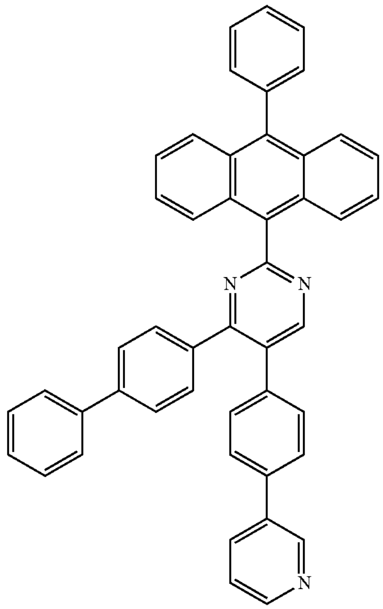
(6-184)
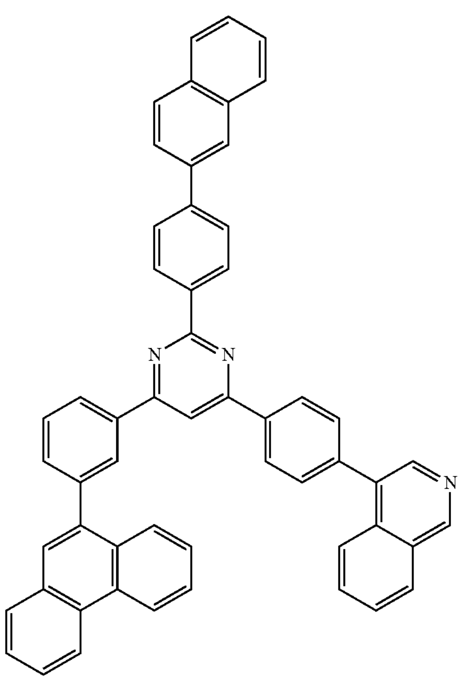
(6-185)
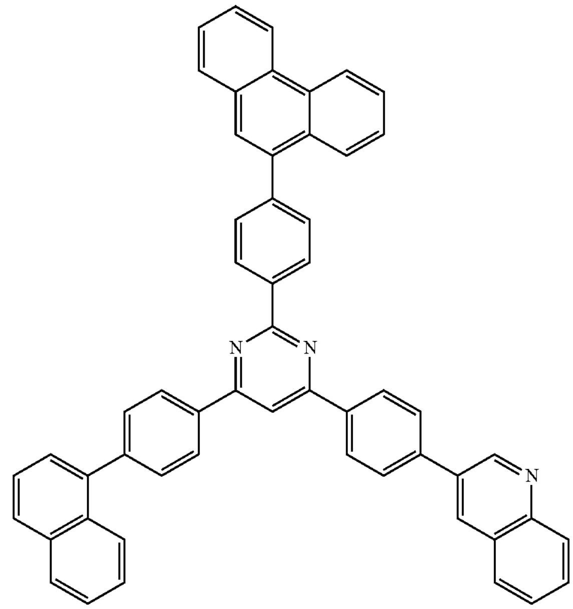
(6-186)
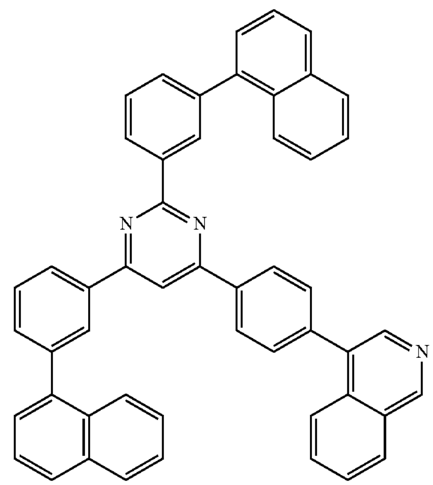
(6-187)
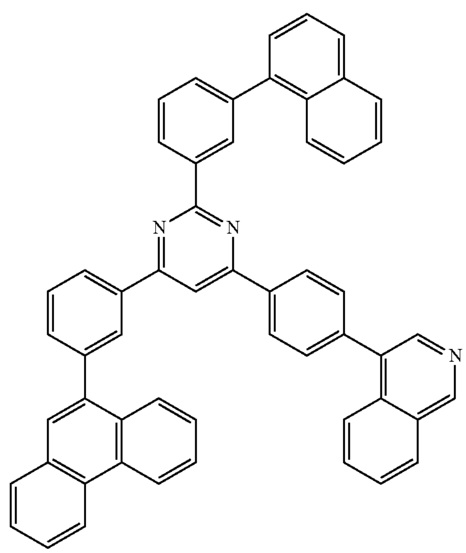

-continued
(6-188)
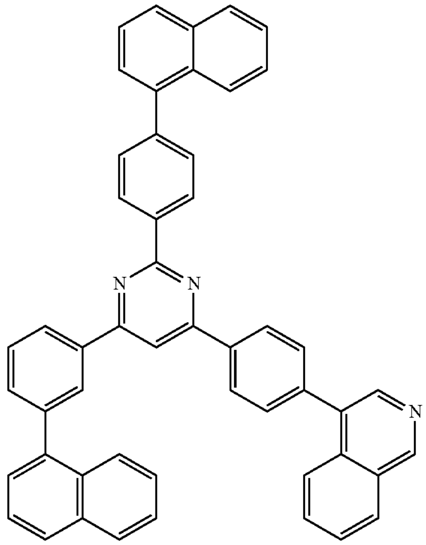
(6-189)
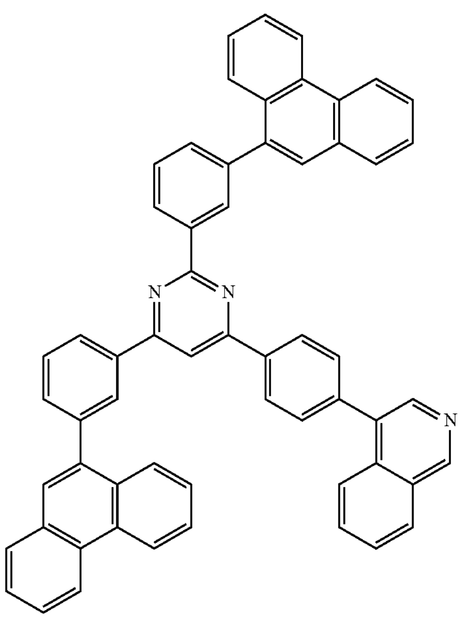
-continued
(6-190)
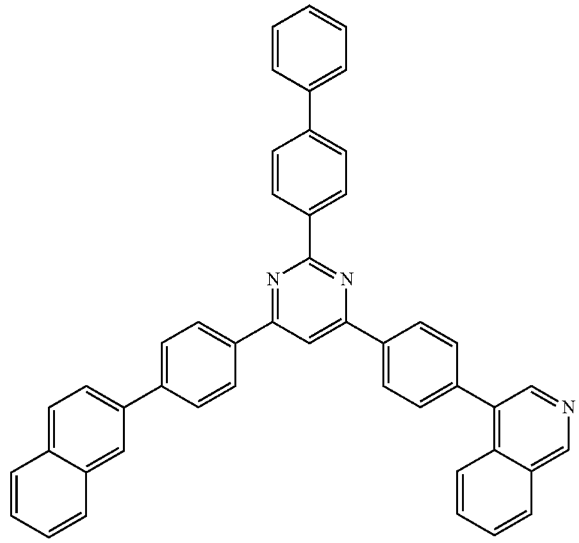
(6-191)
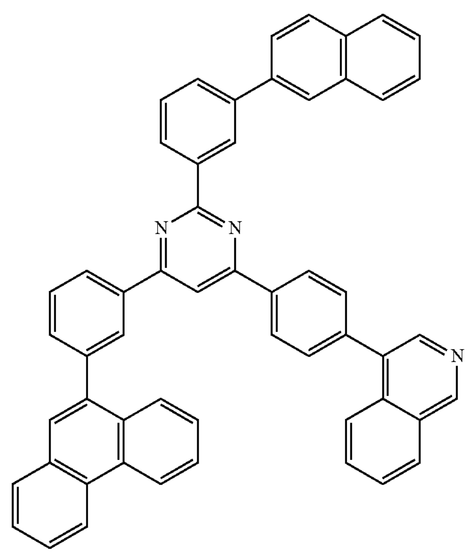

-continued
(6-192)
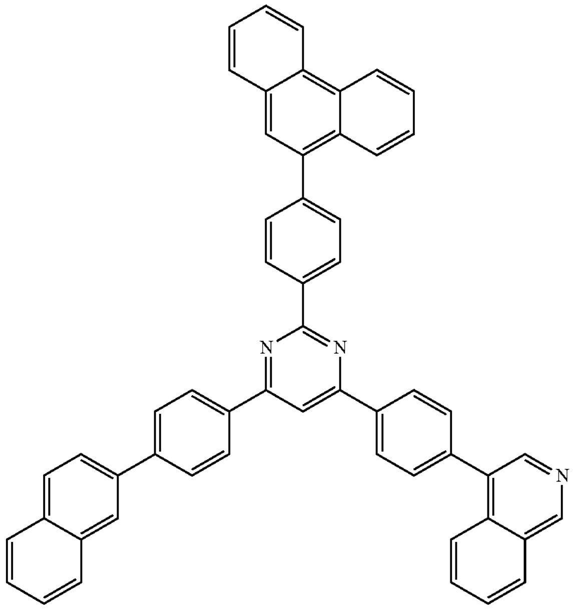
[Chemical Formula 60]
(6-193)
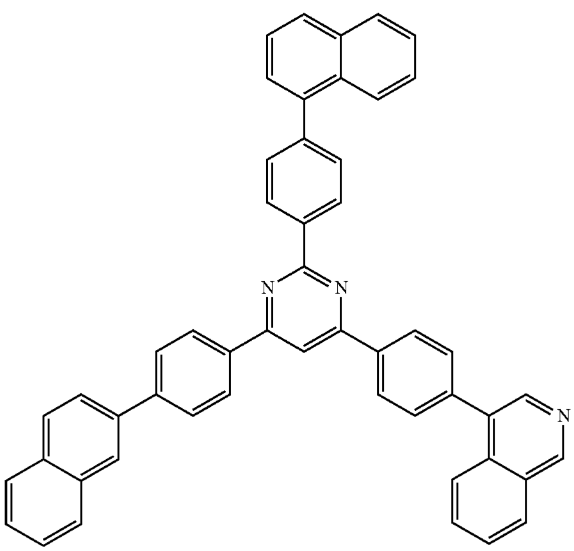
-continued
(6-194)
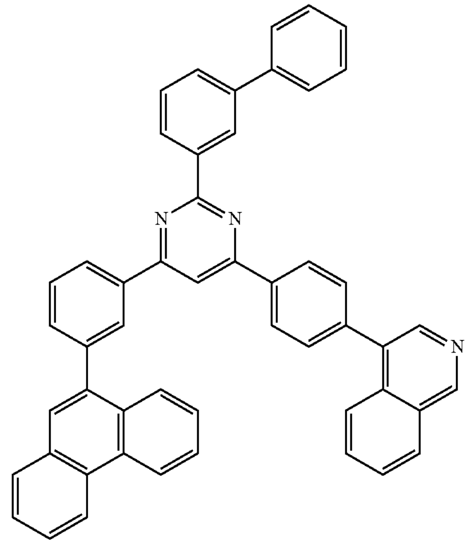
(6-195)
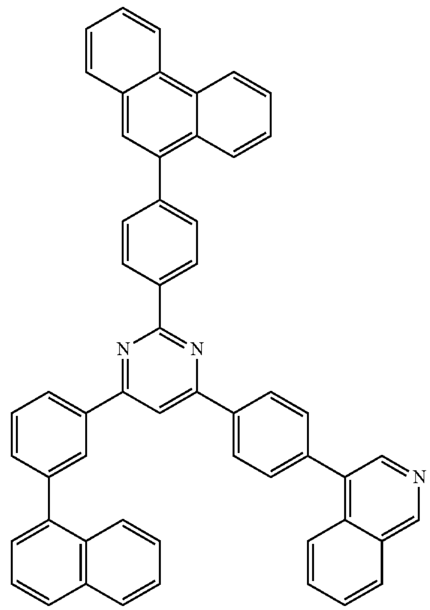
(6-196)
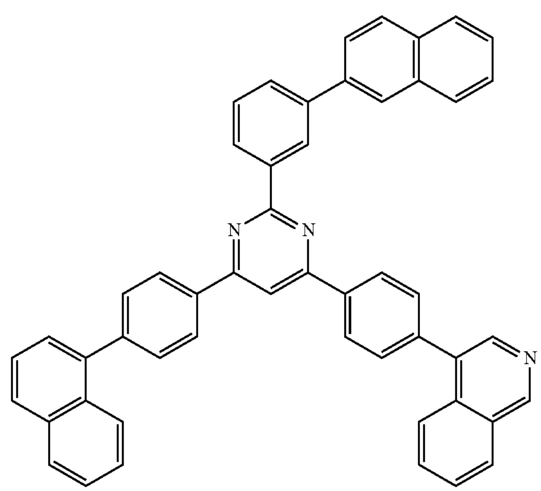

-continued
(6-197)
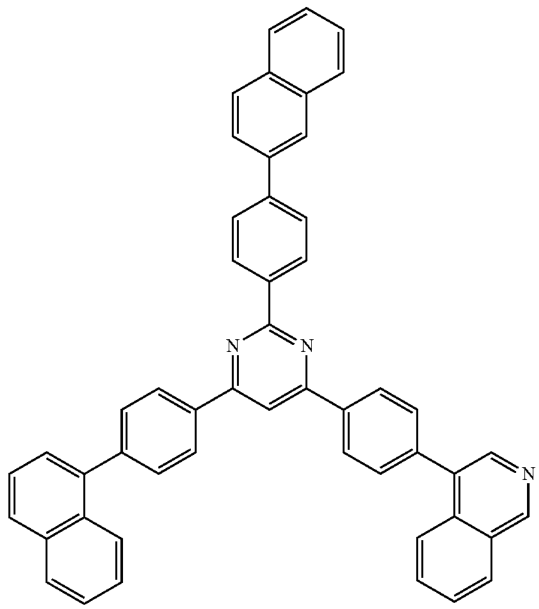
(6-198)
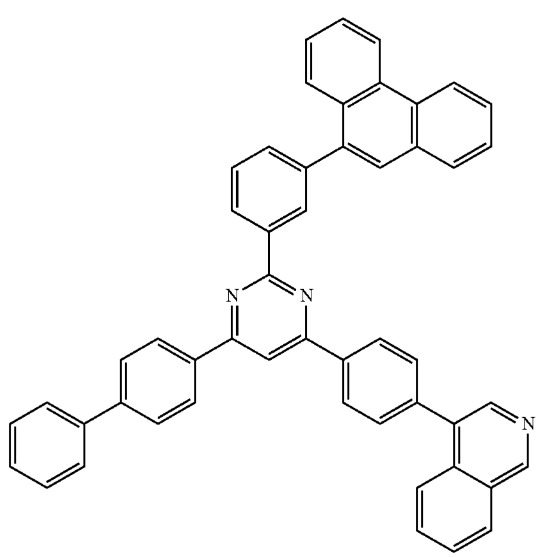
-continued
(6-199)
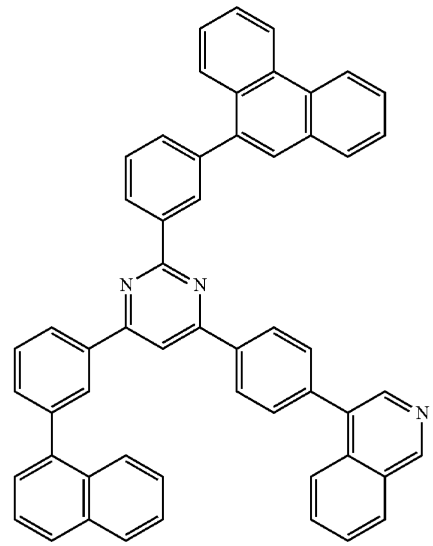
(6-200)
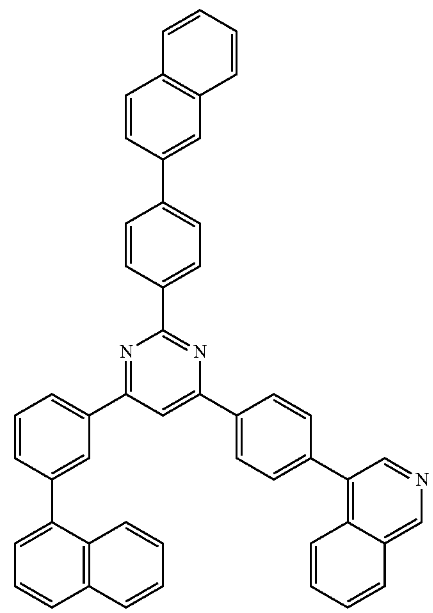
(6-201)
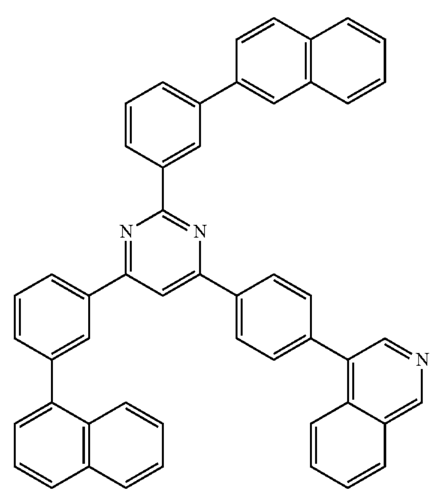

-continued
(6-202)
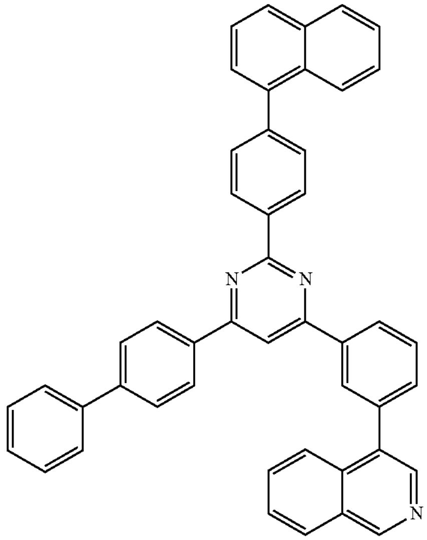
(6-203)
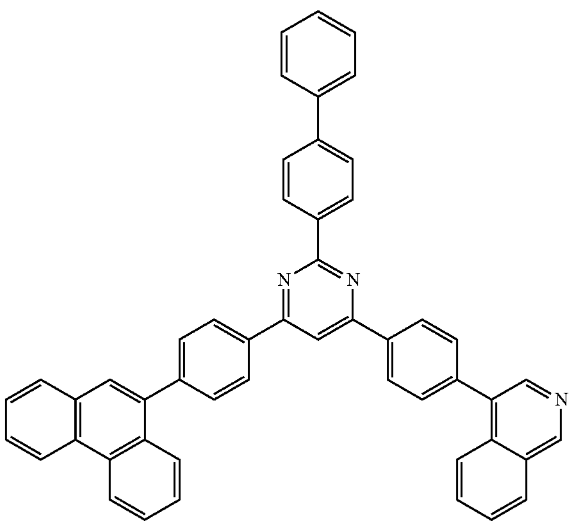
(6-204)
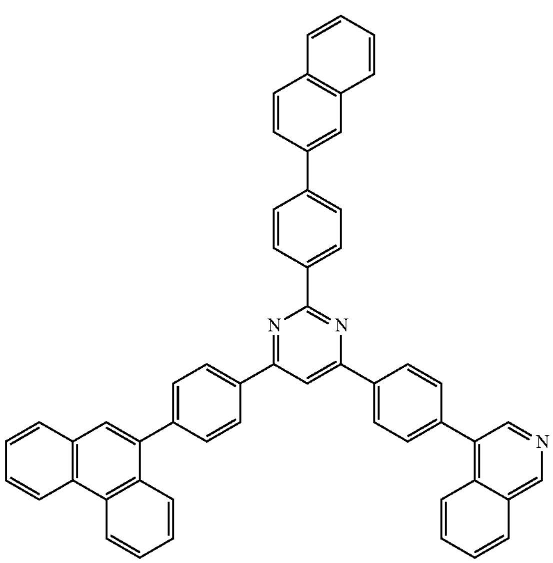
-continued
[Chemical Formula 61]
(6-205)
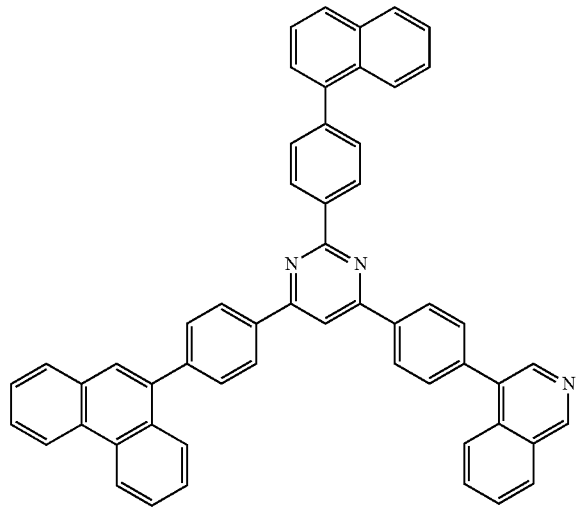
(6-206)
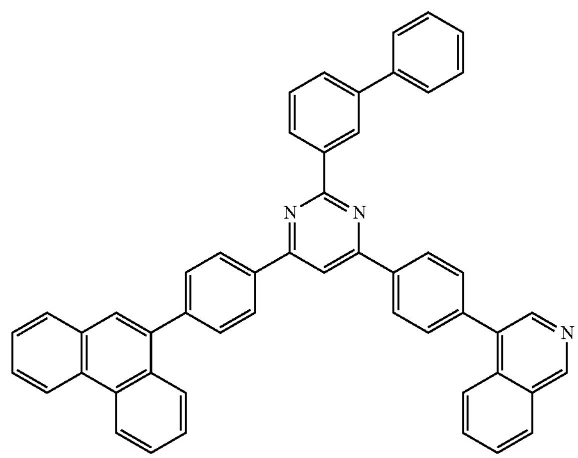
(6-207)
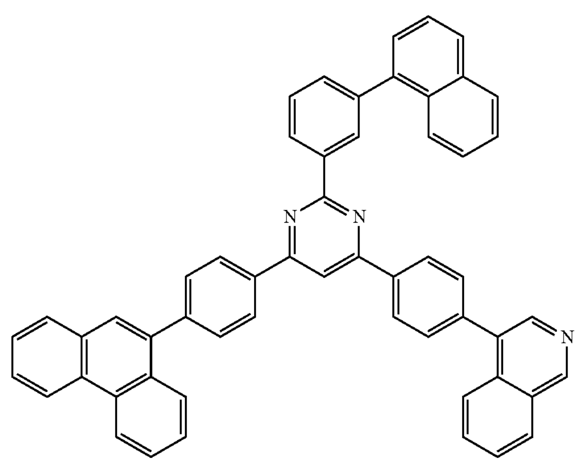

-continued
(6-208)
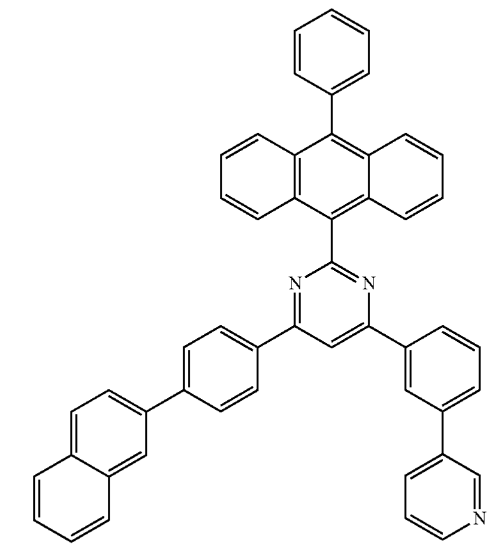
(6-209)
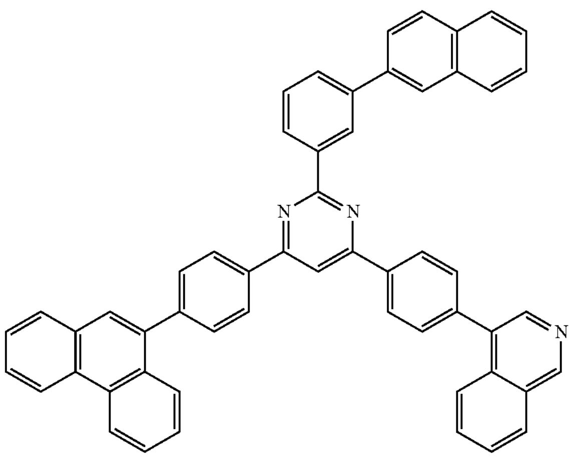
(6-210)
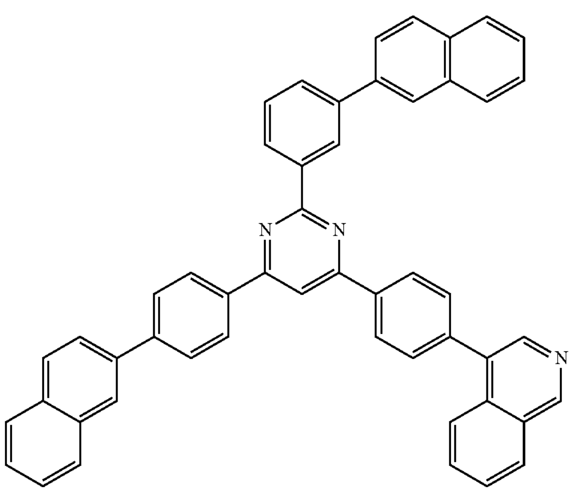
-continued
(6-211)
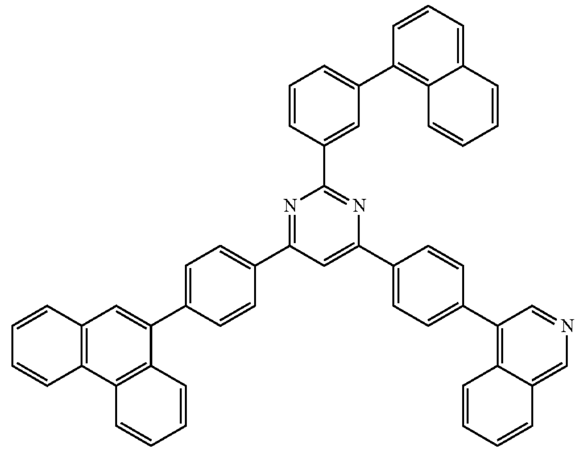
(6-212)
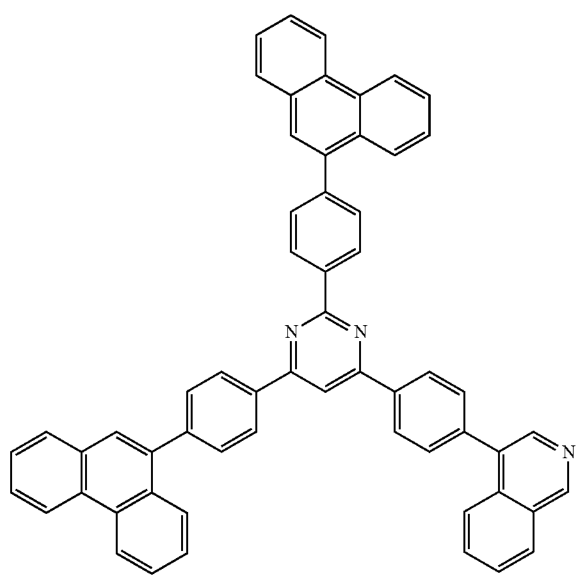

-continued
(6-213)
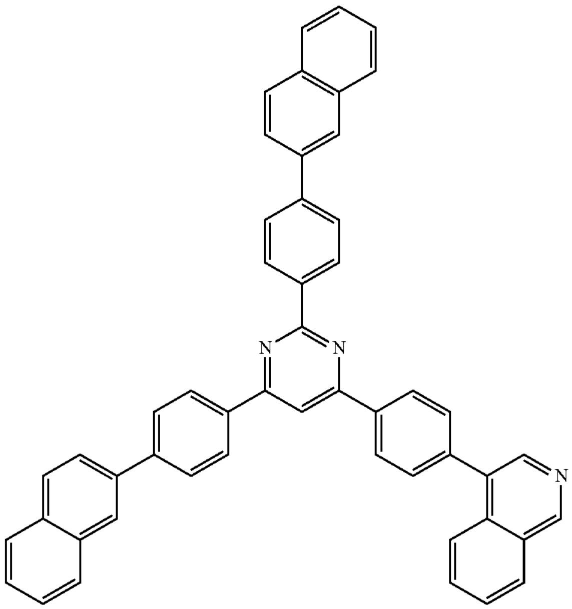
(6-214)
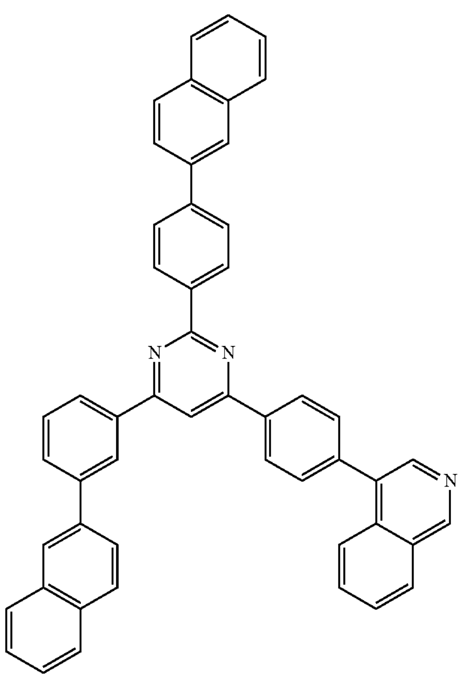
-continued
(6-215)
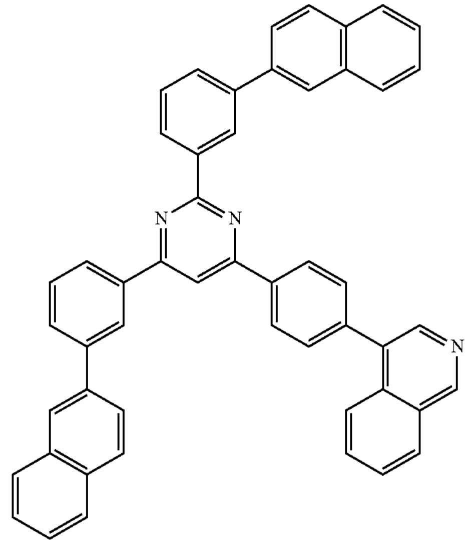
(6-216)
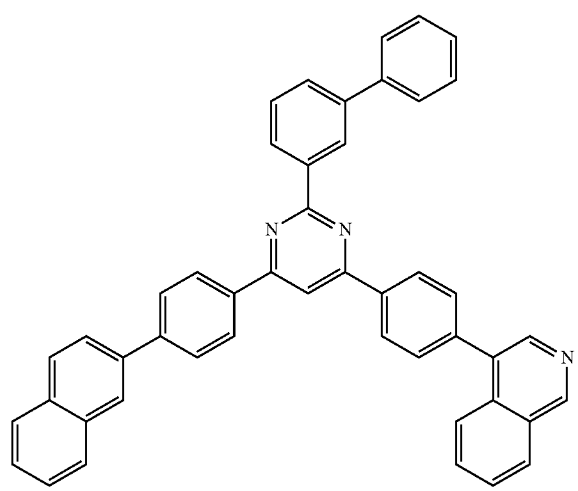

[Chemical Formula 62]
(6-217)
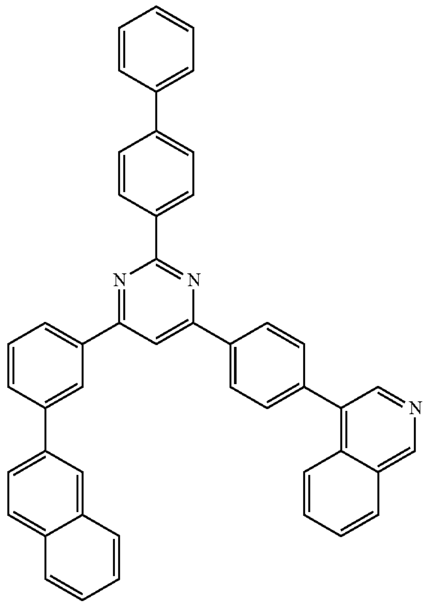
(6-218)
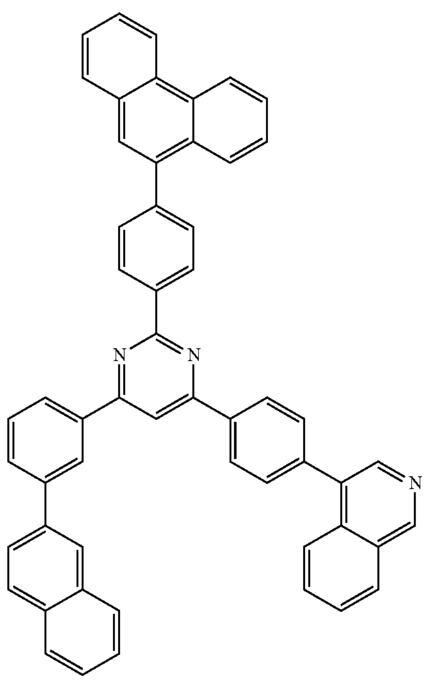
(6-219)
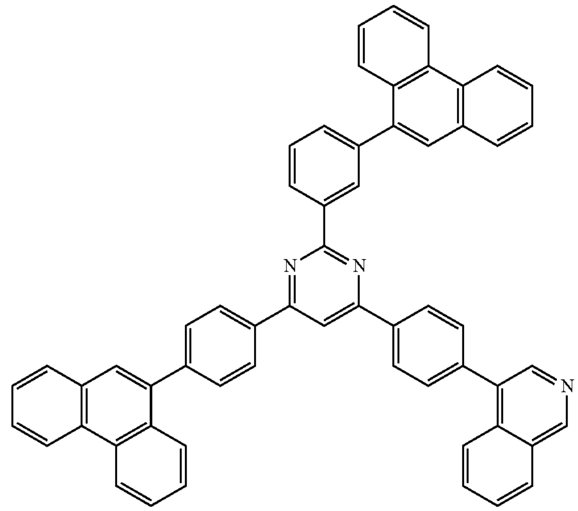
(6-220)
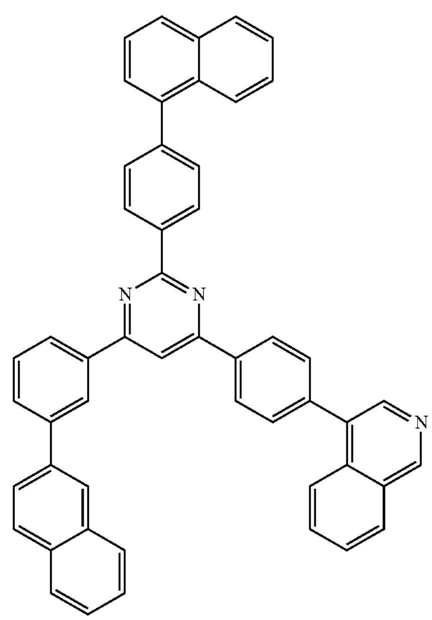

-continued
(6-221)
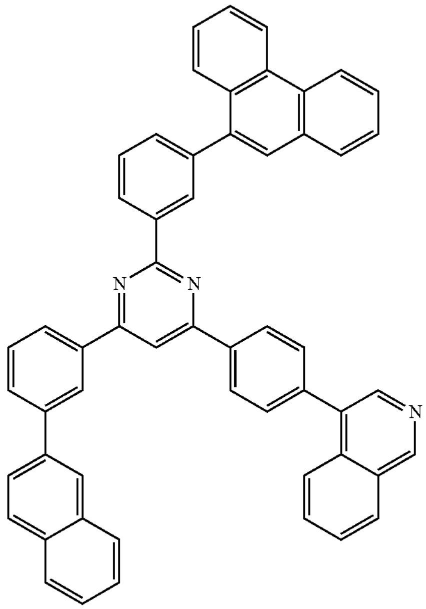
(6-222)
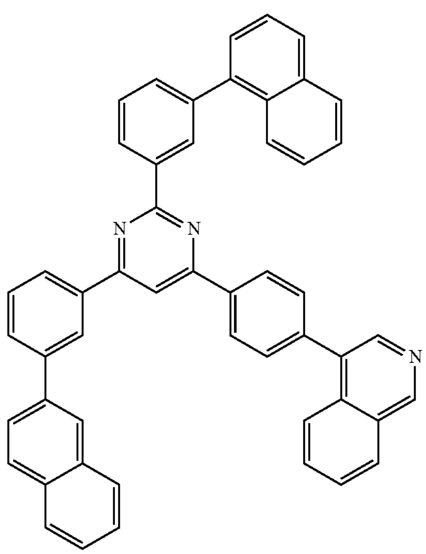
-continued
(6-223)
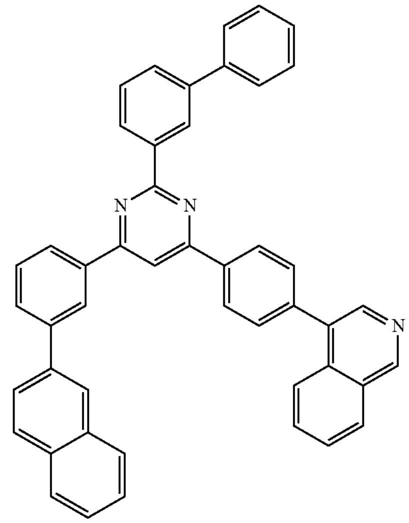
(6-224)
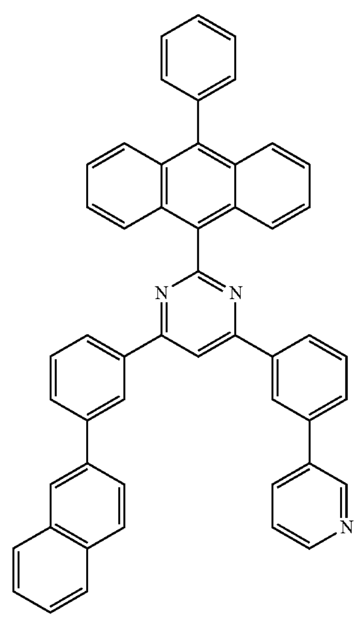

-continued
(6-225)
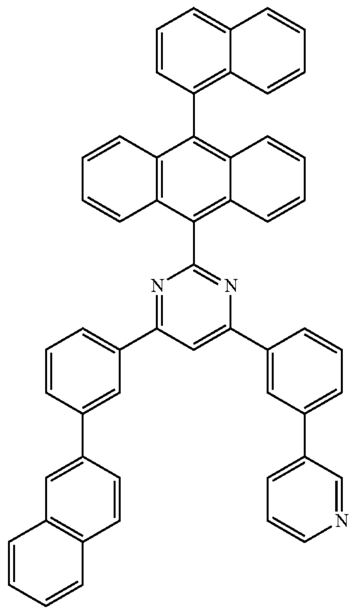
(6-226)
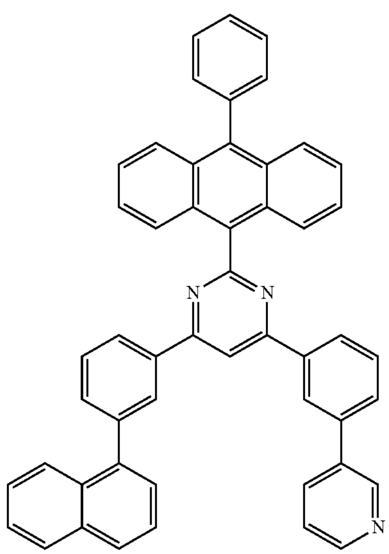
-continued
(6-227)
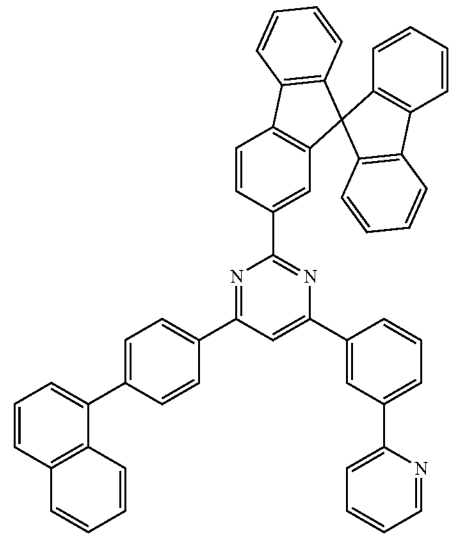
(6-228)
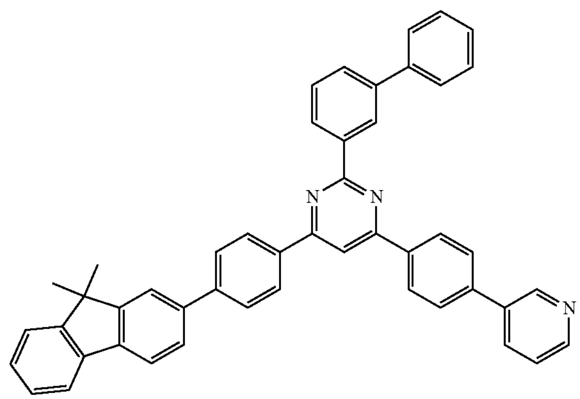
[Chemical Formula 63]
(6-229)
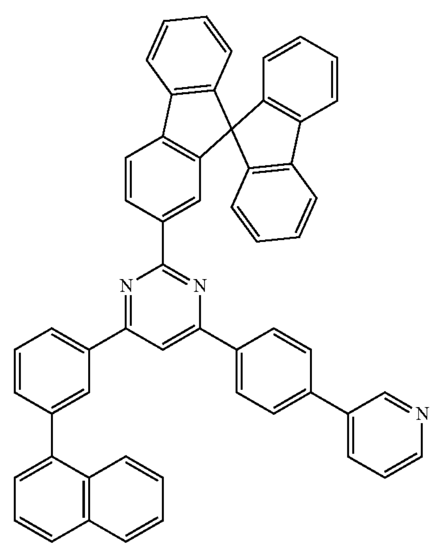

-continued
(6-230)
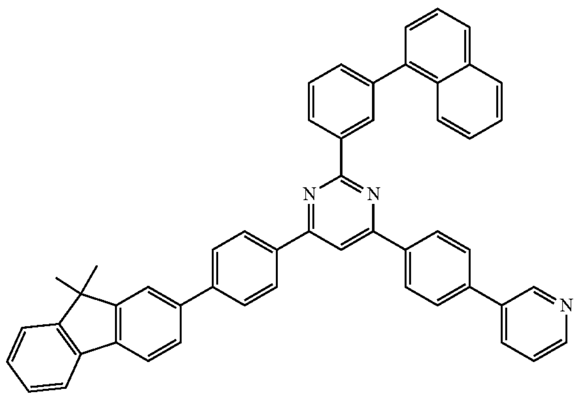
(6-231)
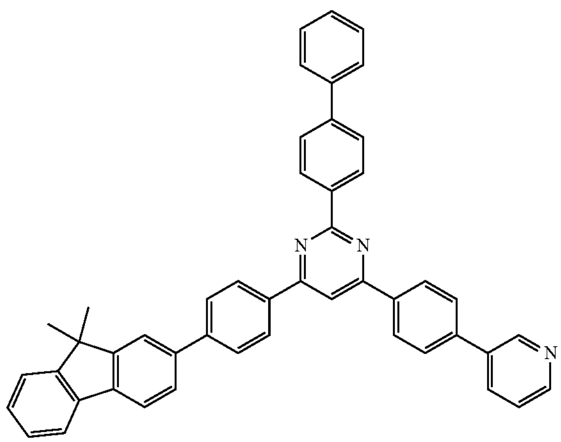
(6-232)
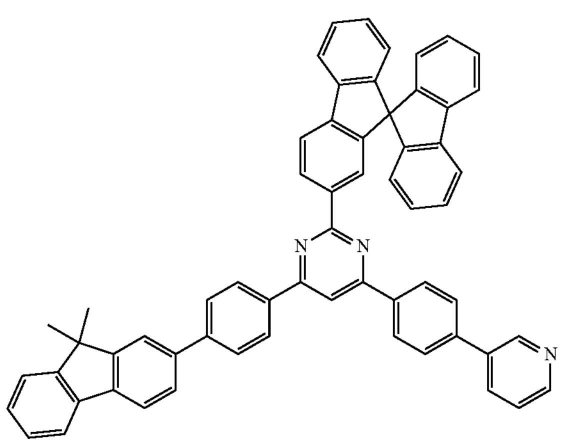
-continued
(6-233)
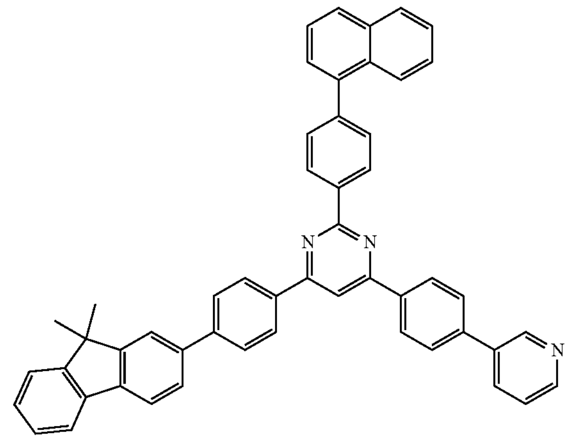
(6-234)
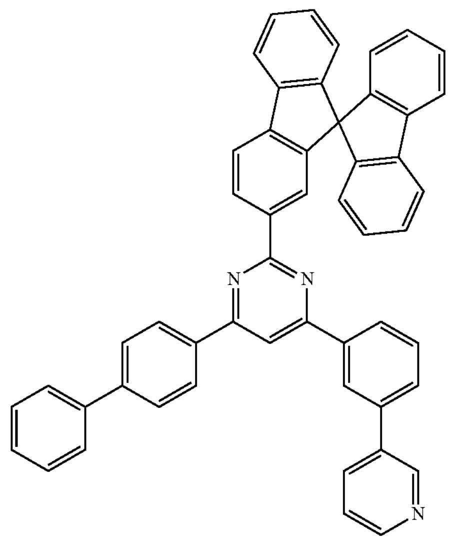
(6-235)
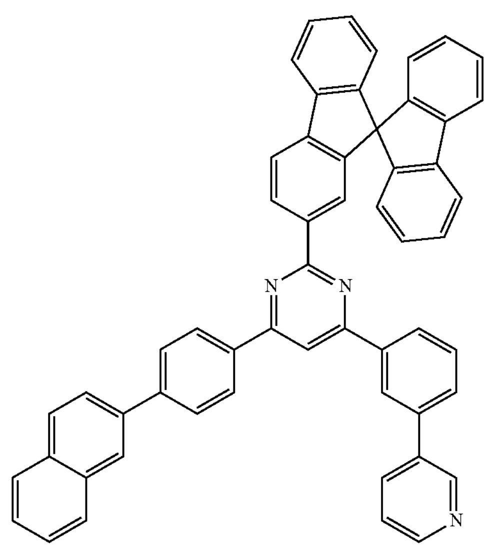

(6-236)
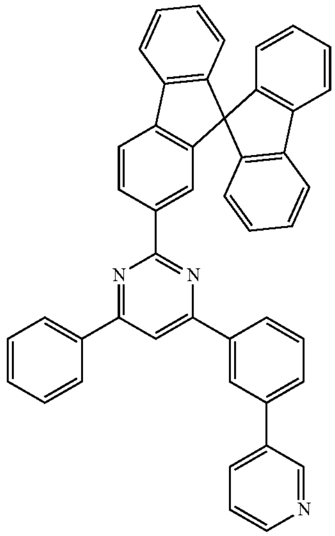
(6-237)
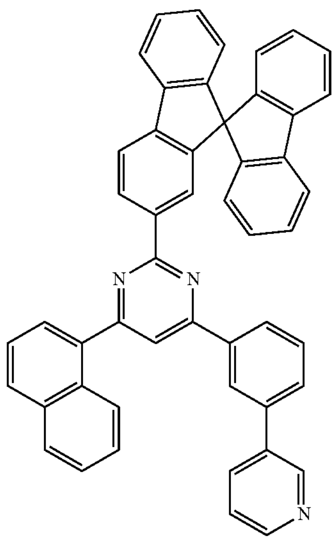
(6-238)
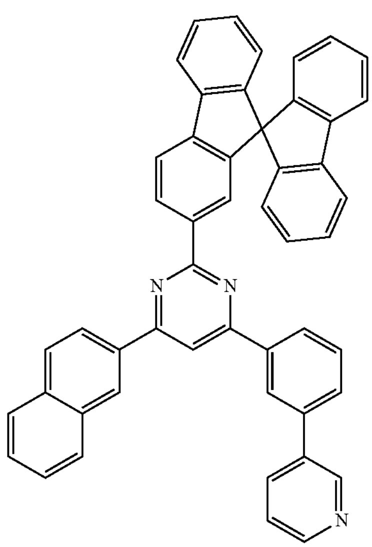
(6-239)
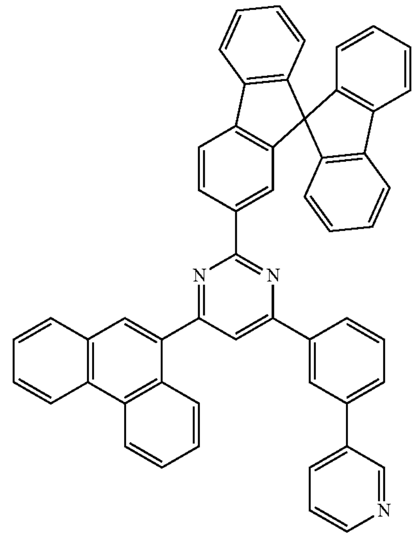
(6-240)
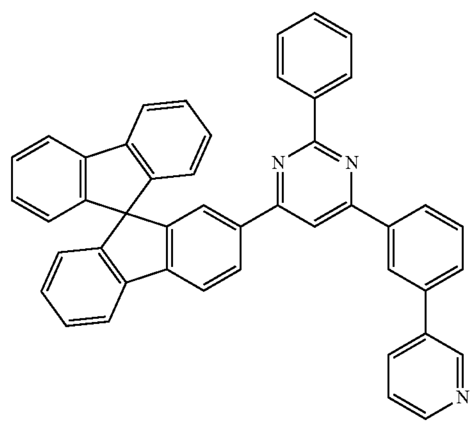
[Chemical Formula 64]
(6-241)
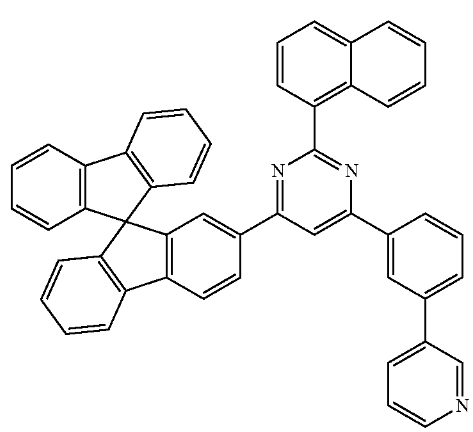

-continued
(6-242)
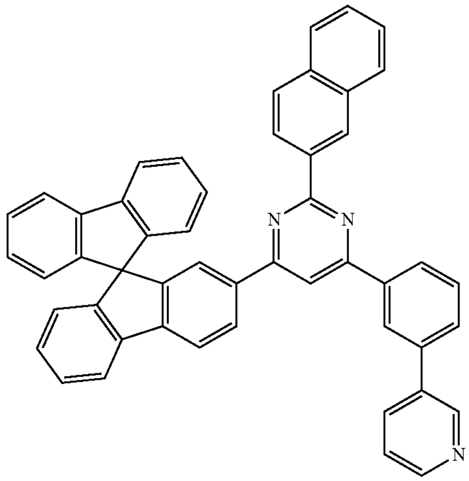
(6-243)
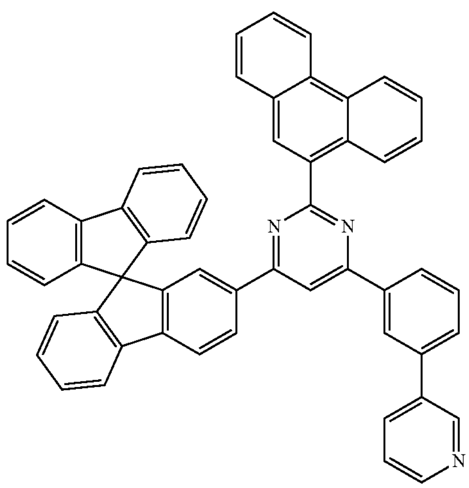
(6-244)
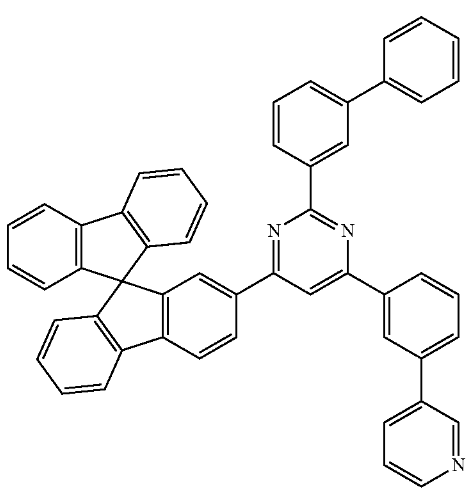
-continued
(6-245)
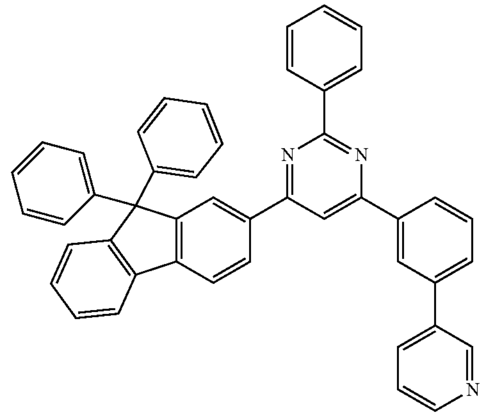
(6-246)
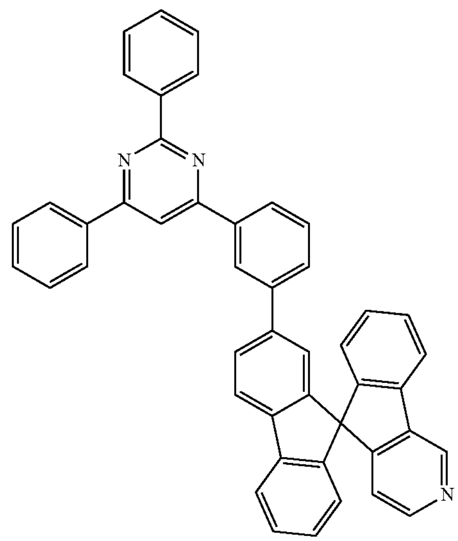
(6-247)
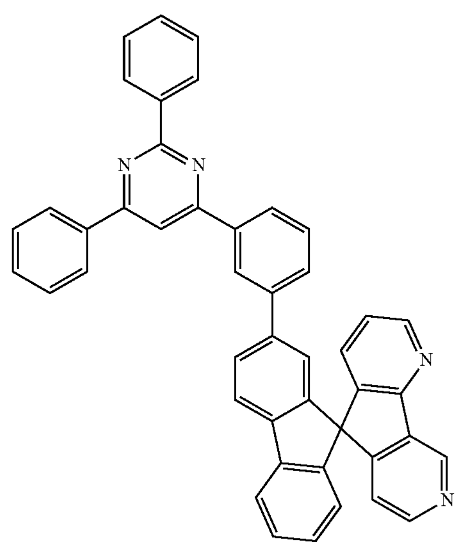

-continued
(6-248)
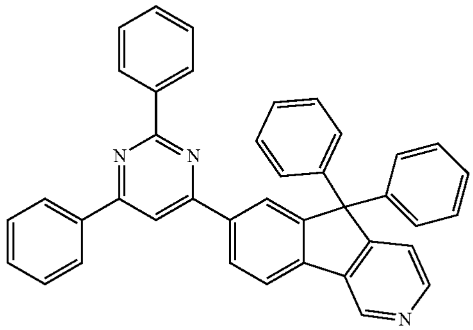
(6-249)
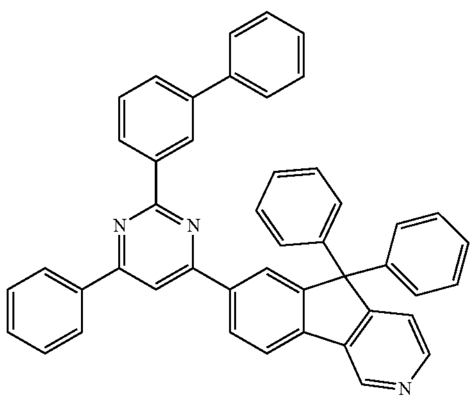
(6-250)
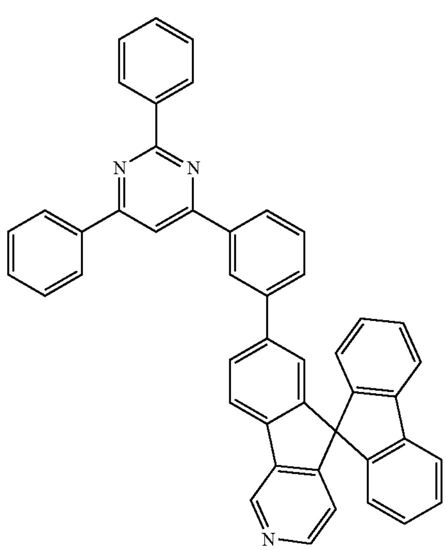
-continued
(6-251)
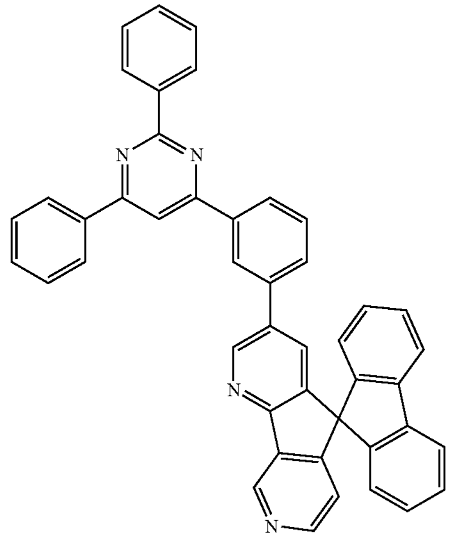
(6-252)
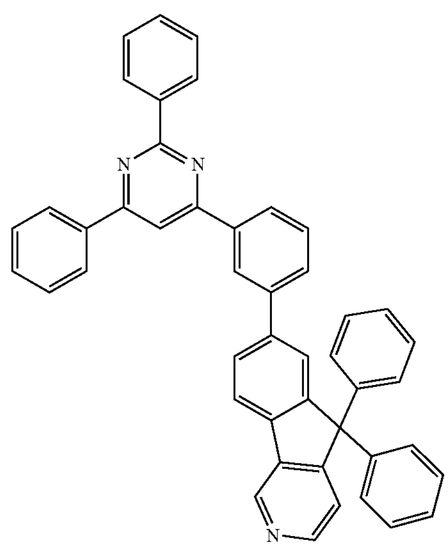

-continued
[Chemical Formula 65]
(6-253)
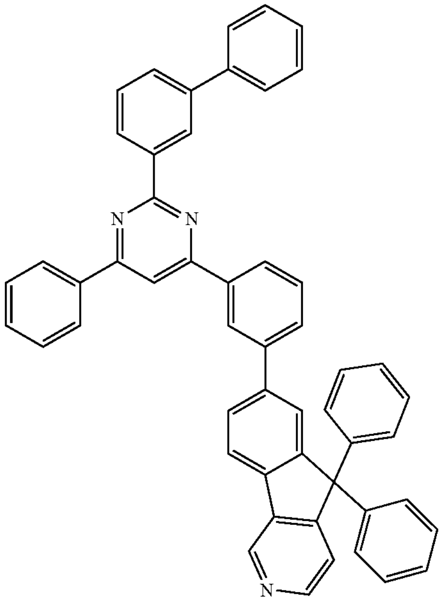
(6-254)
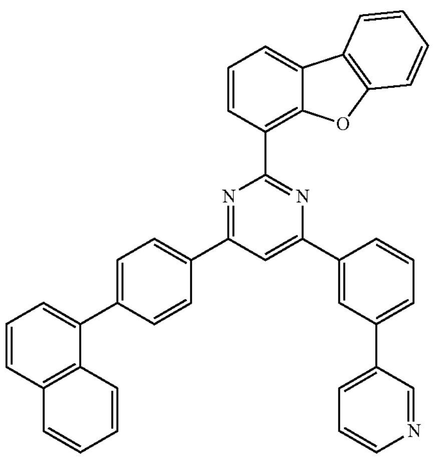
(6-255)
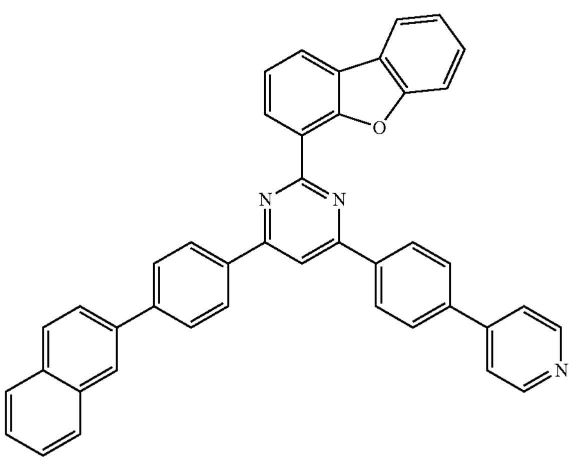
-continued
(6-256)
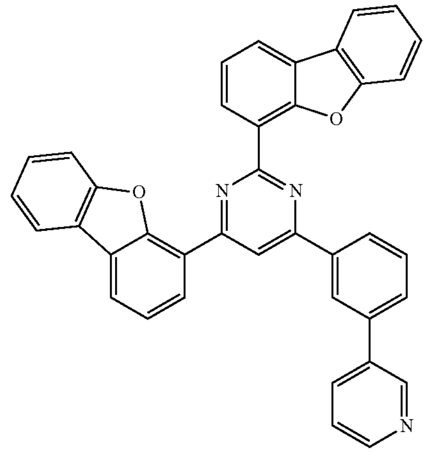
(6-257)
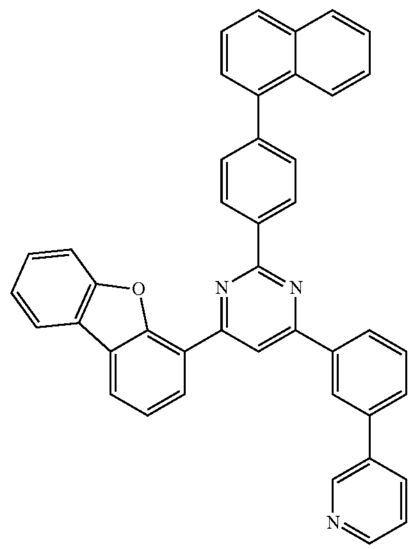
(6-258)
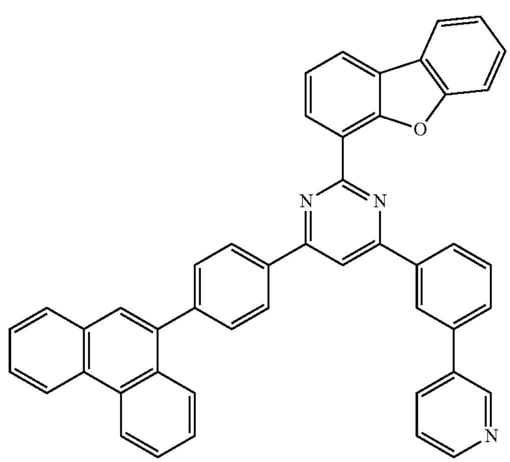

-continued
(6-259)
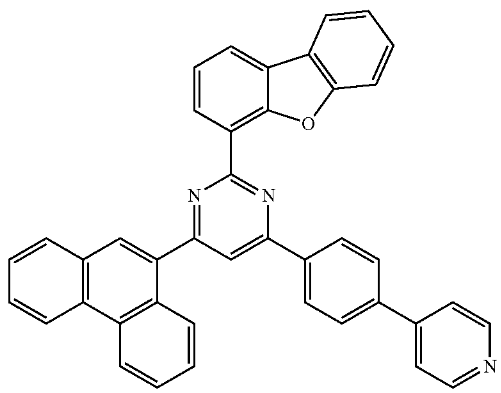
(6-260)
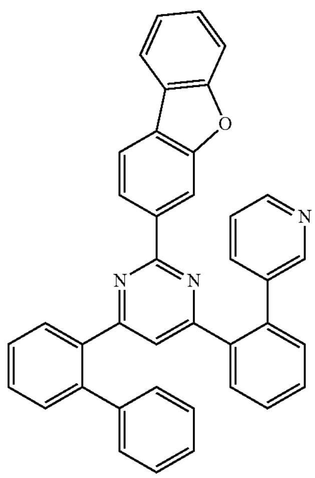
(6-261)
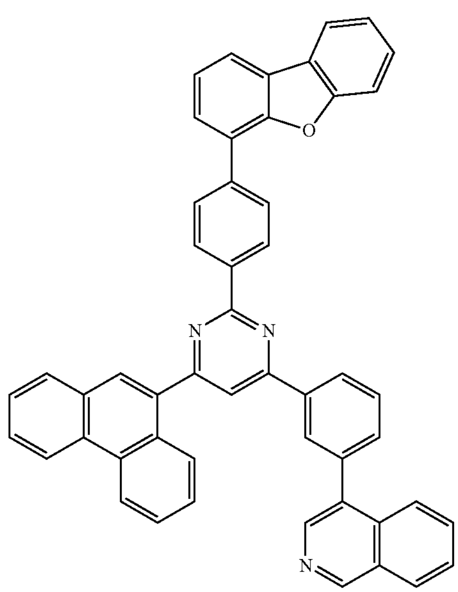
-continued
(6-262)
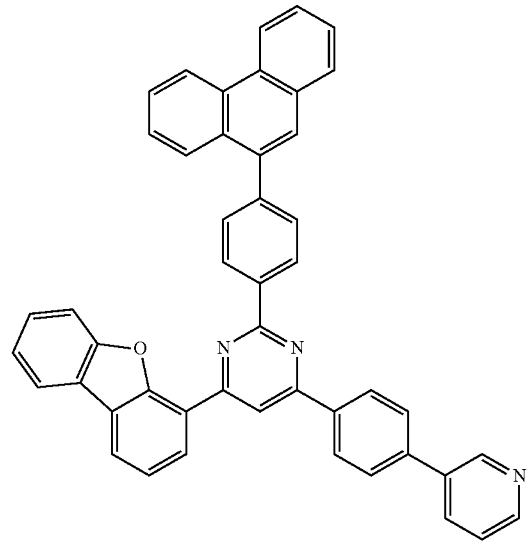
(6-263)
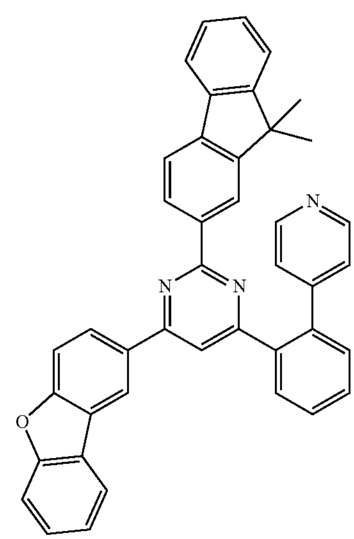

-continued (6-264)

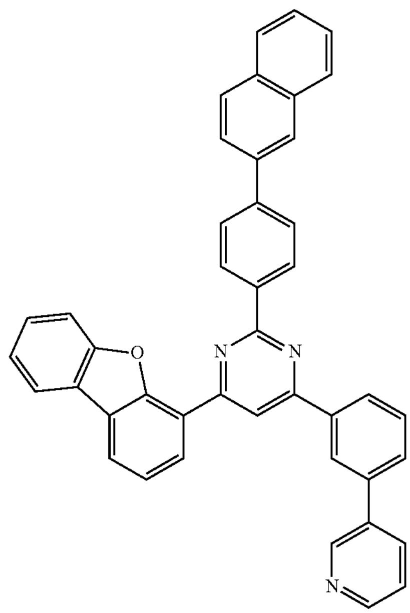

The compounds described above having a pyrimidine ring structure can be synthesized by a known method (refer to Patent Document 13, for example).

The following presents specific examples of preferred compounds among the amine derivatives of the general formula (8) preferably used in the organic EL device of the present invention and having a condensed ring structure. The present invention, however, is not restricted to these compounds.

[Chemical Formula 66]

(8-1)

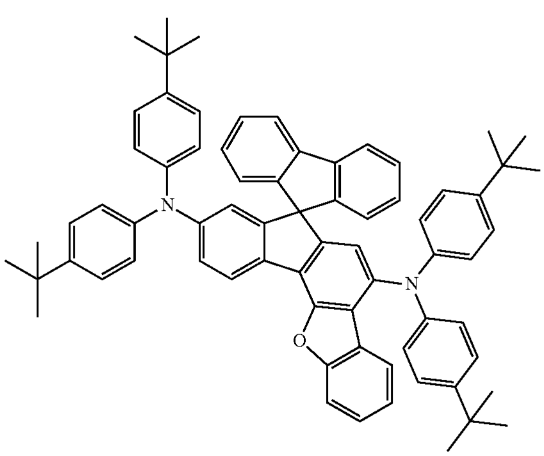

-continued (8-2)

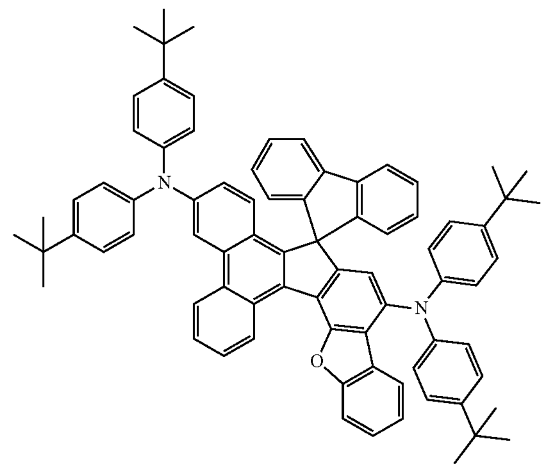

(8-3)

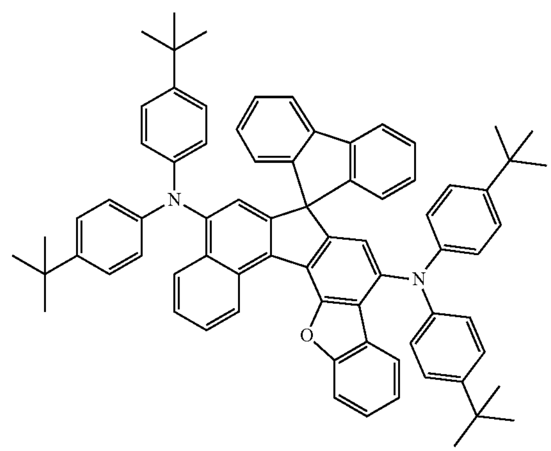

(8-4)

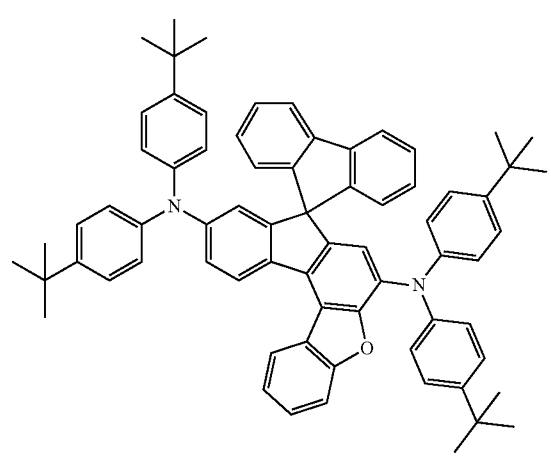

-continued
(8-5)
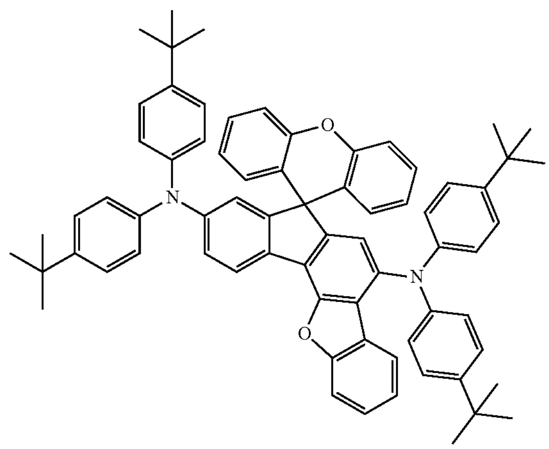
(8-6)
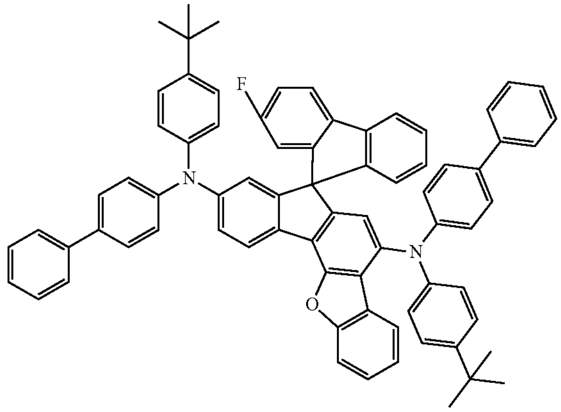
(8-7)
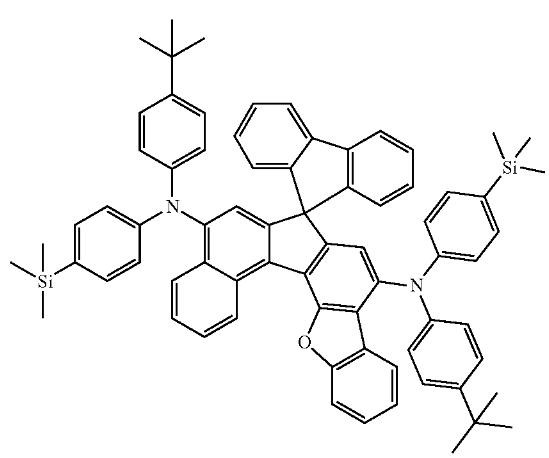
-continued
(8-8)
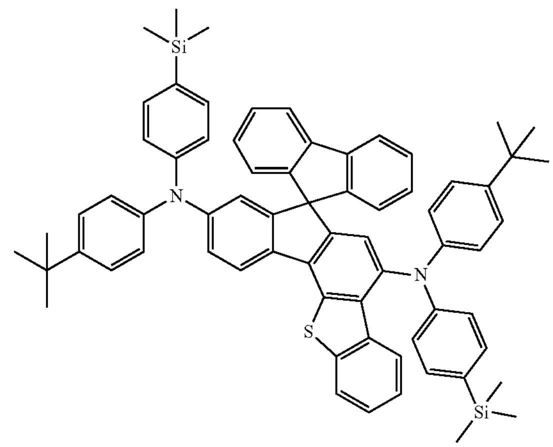
(8-9)
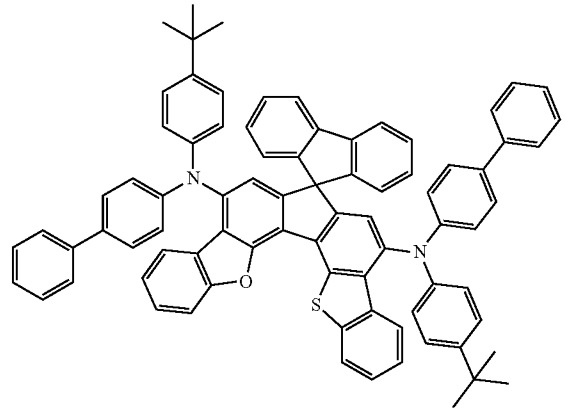
(8-10)
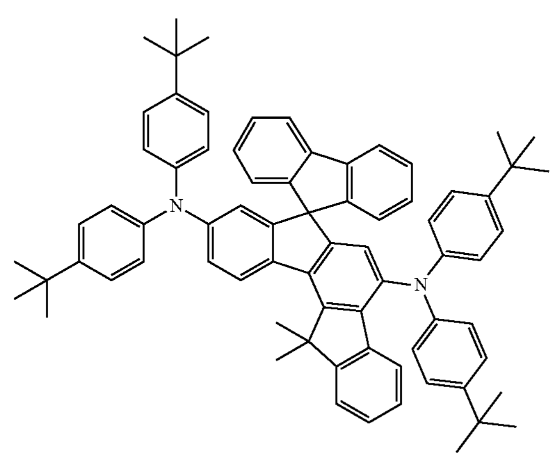

-continued
(8-11)
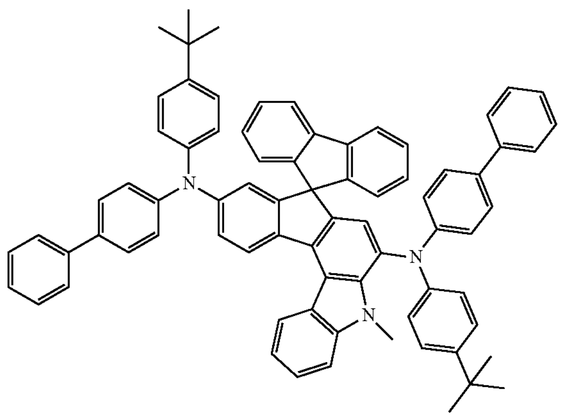
(8-12)
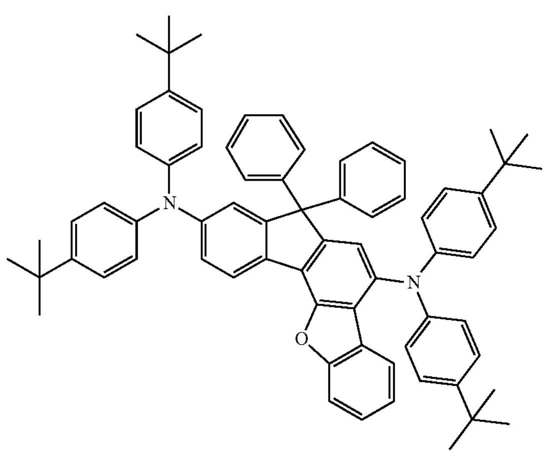
[Chemical Formula 67]
(8-13)
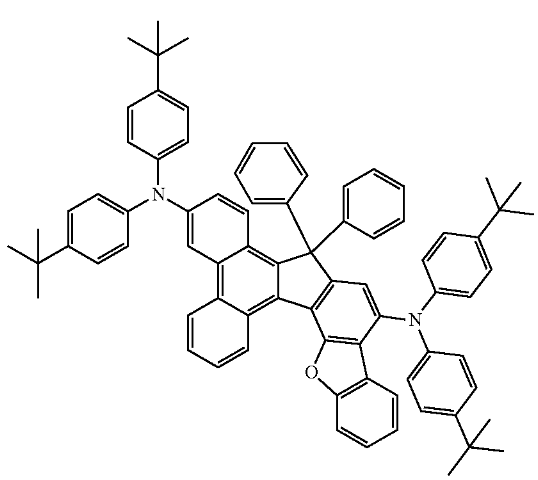
-continued
(8-14)
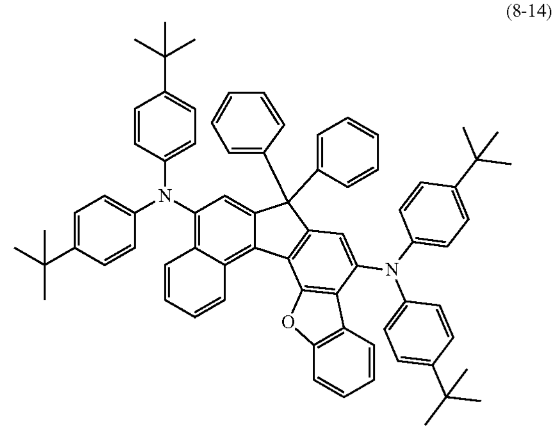
(8-15)
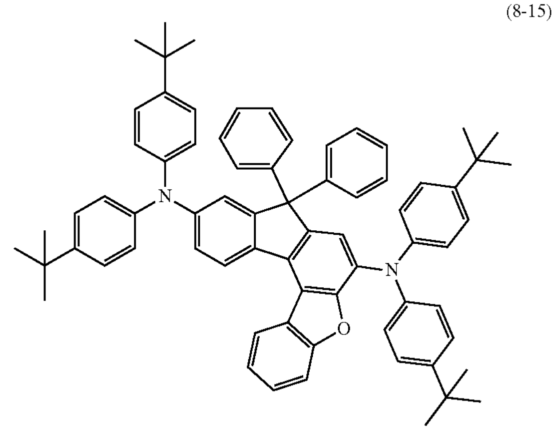
(8-16)
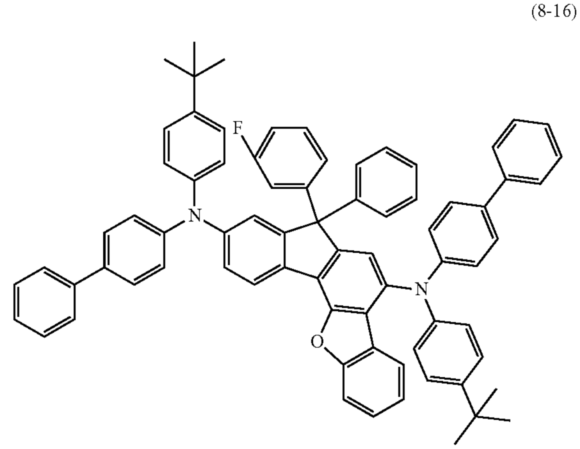

-continued
(8-17)
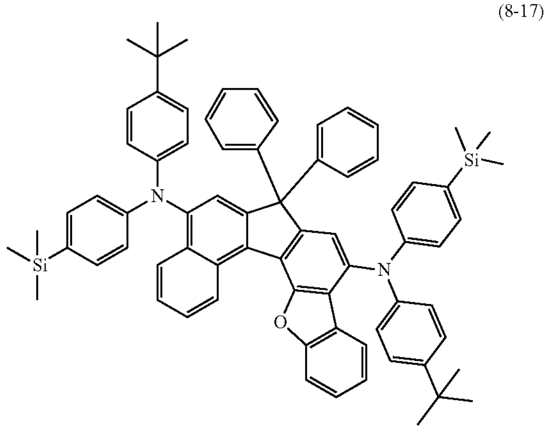
(8-18)
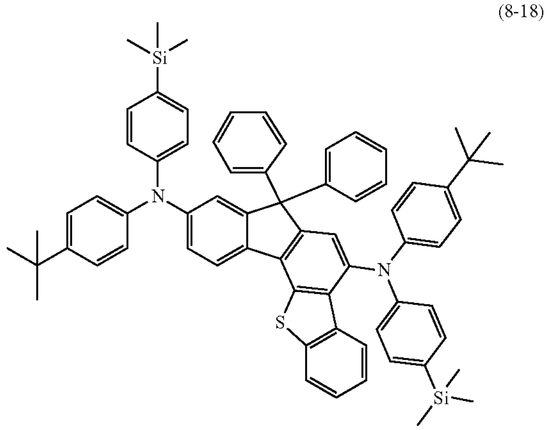
(8-19)
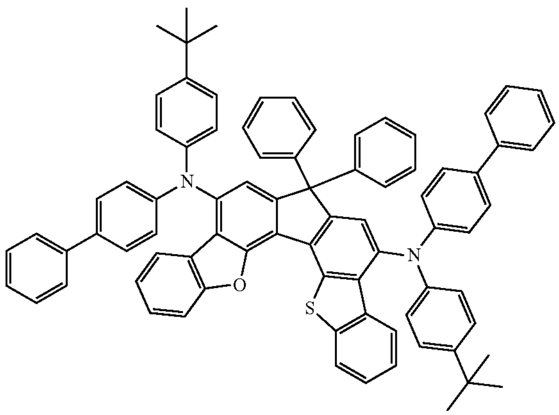
-continued
(8-20)
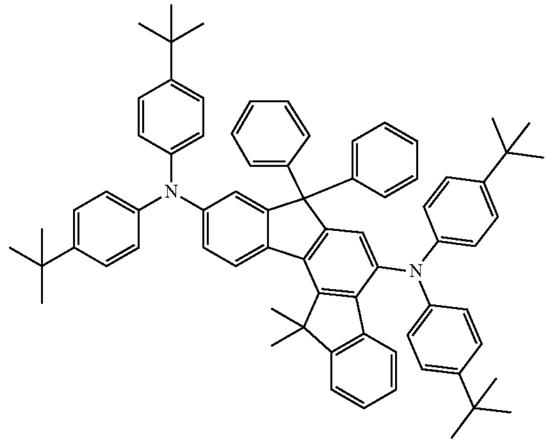
(8-21)
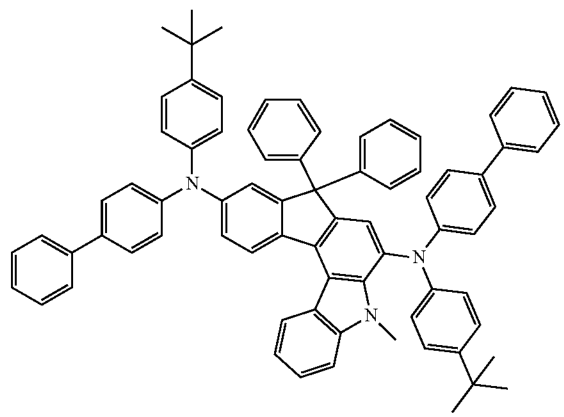
(8-22)
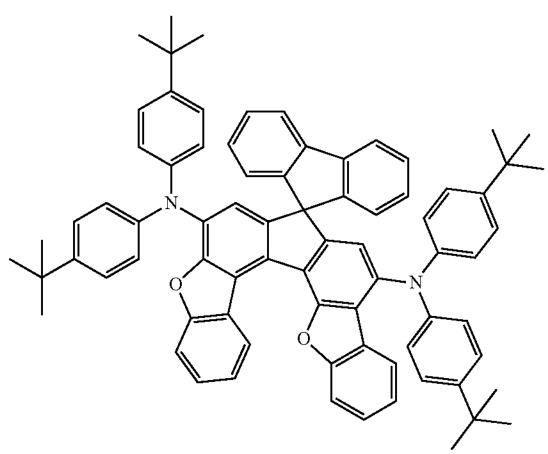

-continued (8-23)

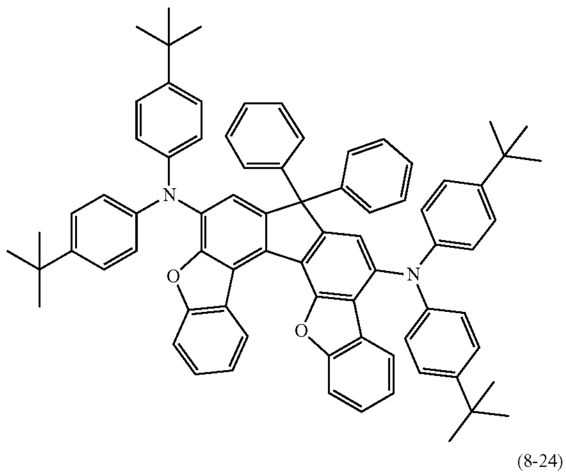

(8-24)

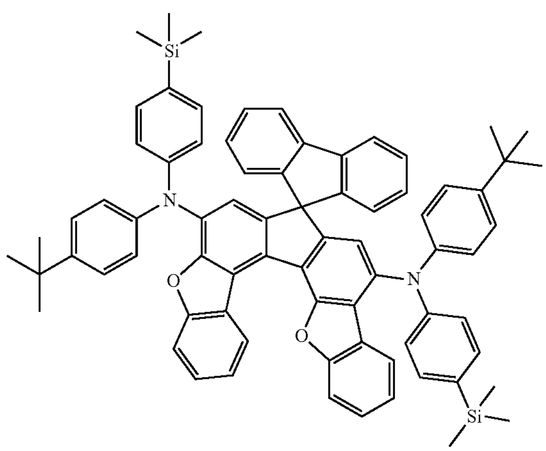

(8-25)

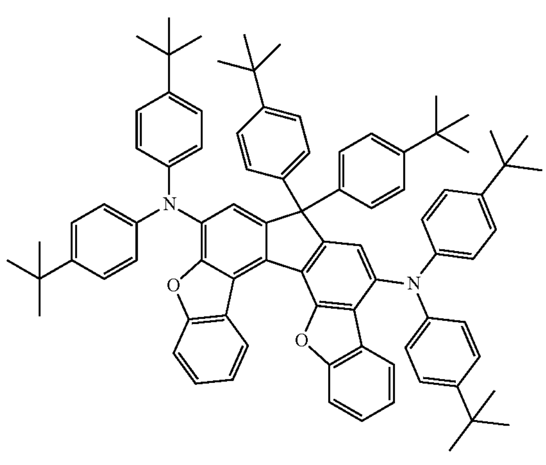

The arylamine compounds of the general formula (1) were purified by methods such as column chromatography, adsorption using, for example, a silica gel, activated carbon, or activated clay, recrystallization or crystallization using a solvent, and a sublimation purification method. The compounds were identified by an NMR analysis. A melting point, a glass transition point (Tg), and a work function were measured as material property values. The melting point can be used as an index of vapor deposition, the glass transition point (Tg) as an index of stability in a thin-film state, and the work function as an index of hole transportability and hole blocking performance.

Other compounds used for the organic EL device of the present invention were purified by methods such as column chromatography, adsorption using, for example, a silica gel, activated carbon, or activated clay, and recrystallization or crystallization using a solvent, and finally purified by sublimation.

The melting point and the glass transition point (Tg) were measured by a high-sensitive differential scanning calorimeter (DSC3100SA produced by Bruker AXS) using powder.

For the measurement of the work function, a 100 nm-thick thin film was fabricated on an ITO substrate, and an ionization potential measuring device (PYS-202 produced by Sumitomo Heavy Industries, Ltd.) was used.

The organic EL device of the present invention may have a structure including an anode, a hole injection layer, a hole transport layer, a light emitting layer, an electron transport layer, an electron injection layer, and a cathode successively formed on a substrate, optionally with an electron blocking layer between the hole transport layer and the light emitting layer, and a hole blocking layer between the light emitting layer and the electron transport layer. Some of the organic layers in the multilayer structure may be omitted, or may serve more than one function. For example, a single organic layer may serve as the electron injection layer and the electron transport layer. Further, the organic layers having a same function may have a laminate structure of two or more layers, for example, the hole transport layers may have a laminate structure of two or more layers, the light emitting layers may have a laminate structure of two or more layers, or the electron transport layers may have a laminate structure of two or more layers.

Electrode materials with high work functions such as ITO and gold are used as the anode of the organic EL device of the present invention.

As the hole injection layer of the organic EL device of the present invention, the arylamine compound of the general formula (1) subjected to p-type doping with an electron acceptor is preferably used.

As a hole injection/transport material that can be mixed with or can be used simultaneously with the arylamine compound of the general formula (1), material such as starburst-type triphenylamine derivatives and various triphenylamine tetramers; porphyrin compounds as represented by copper phthalocyanine; accepting heterocyclic compounds such as hexacyanoazatriphenylene; coating-type polymer materials, and the like can be used. These materials may be formed into a thin film by a vapor deposition method or other known methods such as a spin coating method and an inkjet method.

As the hole transport layer of the organic EL device of the present invention, the arylamine compound of the general formula (3) and the arylamine compound of the general formula (4) are preferably used.

The compounds that are not subjected to p-type doping are preferably used.

These may be individually formed into a film, may be used as a single layer formed with another hole transport material mixed, or may be formed as a laminated structure of the individually deposited layers, a laminated structure of the mixed layers, or a laminated structure of the individually deposited layer and the mixed layer. These materials may be formed into a thin-film by a vapor deposition method or other known methods such as a spin coating method and an inkjet method.

As the electron blocking layer of the organic EL device of the present invention, the arylamine compound of the general formula (1) is preferably used, and in addition, compounds having an electron blocking effect can be used, for example, an arylamine compound having a structure in which four triphenylamine structures in the molecule are joined within a molecule via a single bond or a divalent group that does not contain a heteroatom, an arylamine compound having a structure in which two triphenylamine structures in the molecule are joined within a molecule via a single bond or a divalent group that does not contain a heteroatom, carbazole derivatives such as 4,4',4"-tri(N-carbazolyl)triphenylamine (TCTA), 9,9-bis[4-(carbazol-9-yl) phenyl]fluorene, 1,3-bis(carbazol-9-yl)benzene (mCP), and 2,2-bis(4-carbazol-9-ylphenyl)adamantane (Ad-Cz); and compounds having a triphenylsilyl group and a triarylamine structure, as represented by 9-[4-(carbazol-9-yl)phenyl]-9-[4-(triphenylsilyl)phenyl]-9H-fluorene. These may be individually formed into a film, may be used as a single layer formed with another hole transport material mixed, or may be formed as a laminated structure of the individually deposited layers, a laminated structure of the mixed layers, or a laminated structure of the individually deposited layer and the mixed layer. These materials may be formed into a thin-film by a vapor deposition method or other known methods such as a spin coating method and an inkjet method.

In the organic EL device of the present invention, it is preferable that the electron acceptor in the layer adjacent to the light emitting layer (for example, the hole transport layer and the electron blocking layer) is not subjected to p-type doping.

In these layers, the arylamine compound of the general formula (3) and the arylamine compound of the general formula (4) are preferably used, and the arylamine compound of the general formula (1) is particularly preferably used.

The thicknesses of these layers are not particularly limited, as far as the thicknesses are ordinarily used, and may be, for example, 20 to 100 nm for the hole transport layer and 5 to 30 nm for the electron blocking layer.

Examples of material used for the light emitting layer of the organic EL device of the present invention can be various metal complexes, anthracene derivatives, bis(styryl)benzene derivatives, pyrene derivatives, oxazole derivatives, and polyparaphenylene vinylene derivatives, in addition to quinolinol derivative metal complexes such as $Alq_3$. Further, the light emitting layer may be made of a host material and a dopant material. Examples of the host material can be preferably anthracene derivatives. Other examples of the host material can be thiazole derivatives, benzimidazole derivatives, and polydialkyl fluorene derivatives, in addition to the above light-emitting materials. Examples of the dopant material can be preferably pyrene derivatives, amine derivatives of the general formula (8) having a condensed ring structure. Other examples of the dopant material can be quinacridone, coumarin, rubrene, perylene, derivatives thereof, benzopyran derivatives, indenophenanthrene derivatives, rhodamine derivatives, and aminostyryl derivatives. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer.

Further, the light-emitting material may be a phosphorescent material. Phosphorescent materials as metal complexes of metals such as iridium and platinum may be used. Examples of the phosphorescent materials include green phosphorescent materials such as $Ir(ppy)_3$, blue phosphorescent materials such as FIrpic and $FIr_6$, and red phosphorescent materials such as $Btp_2Ir(acac)$. Here, carbazole derivatives such as 4,4'-di(N-carbazolyl) biphenyl (CBP), TCTA, and mCP may be used as the hole injecting and transporting host material. Compounds such as p-bis(triphenylsilyl)benzene (UGH2) and 2,2',2"-(1,3,5-phenylene)-tris(1-phenyl-1H-benzimidazole) (TPBI) may be used as the electron transporting host material. In this way, a high-performance organic EL device can be produced.

In order to avoid concentration quenching, the doping of the host material with the phosphorescent light-emitting material should preferably be made by co-evaporation in a range of 1 to 30 weight percent with respect to the whole light emitting layer.

Further, Examples of the light-emitting material may be delayed fluorescent-emitting material such as a CDCB derivative of PIC-TRZ, CC2TA, PXZ-TRZ, 4CzIPN or the like (refer to Non-Patent Document 3, for example).

These materials may be formed into a thin-film by using a vapor deposition method or other known methods such as a spin coating method and an inkjet method.

The hole blocking layer of the organic EL device of the present invention may be formed by using hole blocking compounds such as various rare earth complexes, triazole derivatives, triazine derivatives, and oxadiazole derivatives, in addition to the metal complexes of phenanthroline derivatives such as bathocuproin (BCP), and the metal complexes of quinolinol derivatives such as aluminum(III) bis(2-methyl-8-quinolinate)-4-phenylphenolate (BAlq). These materials may also serve as the material of the electron transport layer. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin-film by using a vapor deposition method or other known methods such as a spin coating method and an inkjet method.

Material used for the electron transport layer of the organic EL device of the present invention can be preferably the compounds of the general formula (5) having an anthracene ring structure, and the compounds of the general formula (6) having a pyrimidine ring structure. Other examples of material can be metal complexes of quinolinol derivatives such as $Alq_3$ and BAlq, various metal complexes, triazole derivatives, triazine derivatives, oxadiazole derivatives, thiadiazole derivatives, carbodiimide derivatives, quinoxaline derivatives, phenanthroline derivatives, and silole derivatives. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin-film by using a vapor deposition method or other known methods such as a spin coating method and an inkjet method.

Examples of material used for the electron injection layer of the organic EL device of the present invention can be alkali metal salts such as lithium fluoride and cesium fluoride; alkaline earth metal salts such as magnesium fluoride; and metal oxides such as aluminum oxide. However, the electron injection layer may be omitted in the preferred selection of the electron transport layer and the cathode.

The cathode of the organic EL device of the present invention may be made of an electrode material with a low work function such as aluminum, or an alloy of an electrode material with an even lower work function such as a magnesium-silver alloy, a magnesium-indium alloy, or an aluminum-magnesium alloy.

The following describes an embodiment of the present invention in more detail based on Examples. The present invention, however, is not restricted to the following Examples.

Example 1

Synthesis of 4,4"-bis{(biphenyl-4-yl)-phenylamino}-1,1':4',1"-terphenyl (Compound 1-1)

(Biphenyl-4-yl)-phenylamine (39.5 g), 4,4"-diiodo-1,1':4',1"-terphenyl (32.4 g), a copper powder (0.42 g), potassium carbonate (27.8 g), 3,5-di-tert-butylsalicylic acid (1.69 g), sodium bisulfite (2.09 g), dodecylbenzene (32 ml), and toluene (50 ml) were added into a reaction vessel and heated up to 210° C. while removing the toluene by distillation. After the obtained product was stirred for 30 hours, the product was cooled, and toluene (50 ml) and methanol (100 ml) were added. A precipitated solid was collected by filtration and washed with a methanol/water (5/1, v/v) mixed solution (500 ml). The solid was heated after adding 1,2-dichlorobenzene (350 ml), and insoluble matter was removed by filtration. After the filtrate was left to cool, methanol (400 ml) was added, and a precipitated crude product was collected by filtration. The crude product was washed under reflux with methanol (500 ml) to obtain a gray powder of 4,4"-bis{(biphenyl-4-yl)-phenylamino}-1,1':4',1"-terphenyl (Compound 1-1; 45.8 g; yield 91%).

The structure of the obtained gray powder was identified by NMR.

$^{1}$H-NMR ($CDCl_3$) detected 40 hydrogen signals, as follows.

δ (ppm)=7.68-7.63 (4H), 7.62-7.48 (12H), 7.45 (4H), 7.38-7.10 (20H).

[Chemical Formula 68]

(1-1)

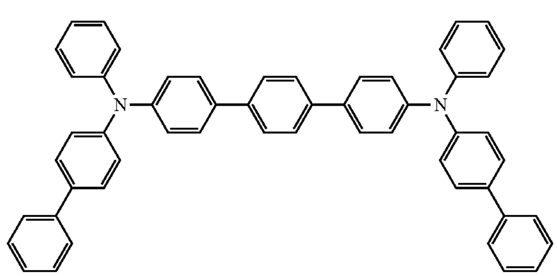

Example 2

Synthesis of 4,4"-bis{(biphenyl-4-yl)-4-tolylamino}-1,1':4',1"-terphenyl (Compound 1-10)

(Biphenyl-4-yl)-4-tolylamine (16.7 g), 4,4"-diiodo-1,1':4',1"-terphenyl (12.9 g), a copper powder (0.17 g), potassium carbonate (11.2 g), 3,5-di-tert-butylsalicylic acid (0.71 g), sodium bisulfite (0.89 g), dodecylbenzene (20 ml), and toluene (20 ml) were added into a reaction vessel and heated up to 210° C. while removing the toluene by distillation. The obtained product was stirred for 28 hours, and after the product was cooled, toluene (150 ml) was added, and insoluble matter was removed by filtration. Methanol (100 ml) was added, and a precipitated crude product was collected by filtration. Recrystallization of the crude product using a toluene/methanol mixed solvent was repeated three times to obtain a yellowish white powder of 4,4"-bis{(biphenyl-4-yl)-4-tolylamino}-1,1':4',1"-terphenyl (Compound 1-10; 12.3 g; yield 61%).

The structure of the obtained yellowish white powder was identified by NMR.

$^{1}$H-NMR ($CDCl_3$) detected 44 hydrogen signals, as follows.

δ (ppm)=7.68-7.62 (4H), 7.61-7.41 (16H), 7.38-7.08 (18H), 2.38 (6H).

[Chemical Formula 69]

(1-10)

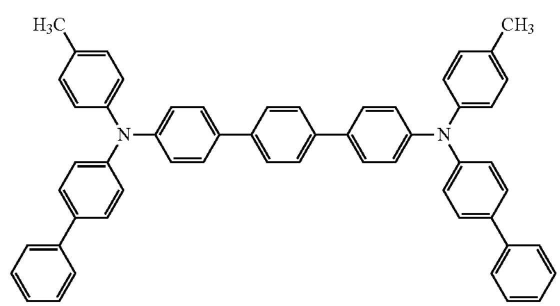

Example 3

Synthesis of 4,4"-bis{(biphenyl-4-yl)-(phenyl-$d_5$)amino}-1,1':4',1"-terphenyl (Compound 1-14)

(Biphenyl-4-yl)-(phenyl-$d_5$)amine (25.3 g), 4,4"-diiodo-1,1':4',1"-terphenyl (20.3 g), a copper powder (0.30 g), potassium carbonate (17.5 g), 3,5-di-tert-butylsalicylic acid (1.05 g), sodium bisulfite (1.31 g), dodecylbenzene (20 ml), and toluene (30 ml) were added into a reaction vessel and heated up to 210° C. while removing the toluene by distillation. After the obtained product was stirred for 23 hours, the product was cooled, and toluene (30 ml) and methanol (60 ml) were added. A precipitated solid was collected by filtration and washed with a methanol/water (1/5, v/v) mixed solution (180 ml) followed by washing with methanol (90 ml). An obtained gray powder was heated after adding 1,2-dichlorobenzene (210 ml), and insoluble matter was removed by filtration. After the filtrate was left to cool, methanol (210 ml) was added, and a precipitated crude product was collected by filtration. The crude product was washed under reflux with methanol (210 ml) to obtain a gray powder of 4,4"-bis{-(biphenyl-4-yl)-(phenyl-$d_5$)amino}-1,1':4',1"-terphenyl (Compound 1-14; 29.3 g; yield 96%).

The structure of the obtained gray powder was identified by NMR.

$^{1}$H-NMR (THF-de) detected 30 hydrogen signals, as follows.

δ (ppm)=7.69 (4H), 7.65-7.52 (12H), 7.39 (4H), 7.28 (2H), 7.20-7.14 (8H).

[Chemical Formula 70]

(1-14)

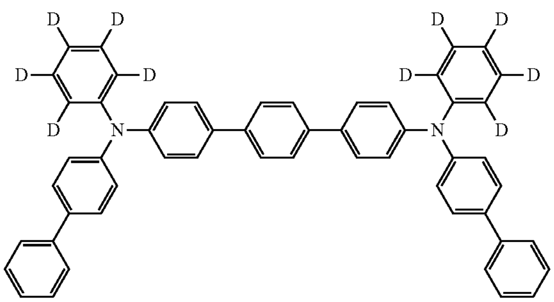

Example 4

Synthesis of 4,4"-bis{(naphthalen-1-yl)-phenylamino}-1,1':4',1"-terphenyl (Compound 1-2)

(Naphthalen-1-yl)-phenylamine (40.0 g), 4,4"-diiodo-1,1':4',1"-terphenyl (43.7 g), a copper powder (0.53 g), potassium carbonate (34.4 g), 3,5-di-tert-butylsalicylic acid (2.08 g), sodium bisulfite (2.60 g), dodecylbenzene (40 ml), and xylene (40 ml) were added into a reaction vessel and heated up to 210° C. while removing the xylene by distillation. After the obtained product was stirred for 35 hours, the product was cooled. Toluene (100 ml) was added, and a precipitated solid was collected by filtration. 1,2-dichlorobenzene (210 ml) was added to the obtained solid, and the solid was dissolved under heat, and after silica gel (30 g) was added, insoluble matter was removed by filtration. After the filtrate was left to cool, a precipitated crude product was collected by filtration. The crude product was washed under reflux with methanol to obtain a pale yellow powder of 4,4"-bis{(naphthalen-1-yl)-phenylamino}-1,1':4',1"-terphenyl (Compound 1-2; 21.9 g; yield 40%).

The structure of the obtained pale yellow powder was identified by NMR.

$^1$H-NMR (THF-$d_5$) detected 36 hydrogen signals, as follows.

δ (ppm)=7.98-7.88 (4H), 7.80 (2H), 7.60 (4H), 7.52-7.40 (8H), 7.36 (4H), 7.18 (4H), 7.08-7.01 (8H), 6.93 (2H).

[Chemical Formula 71]

(1-2)

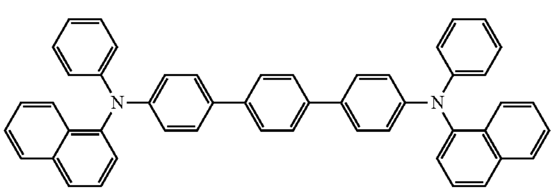

Example 5

Synthesis of 4,4"-bis{(naphthalen-2-yl)-phenylamino}-1,1':4',1"-terphenyl (Compound 1-6)

(Naphthalen-2-yl)-phenylamine (50.0 g), 4,4"-diiodo-1,1':4',1"-terphenyl (50.0 g), tert-butoxy sodium (23.9 g), and xylene (500 ml) were added into a reaction vessel and aerated with nitrogen gas for 1 hour under ultrasonic irradiation. Palladium acetate (0.47 g) and a toluene solution (2.96 ml) containing 50% (w/v) tri-tert-butylphosphine were added, and the mixture was heated up to 120° C. and stirred for 15 hours. After the mixture was left to cool, the mixture was concentrated under reduced pressure, and methanol (300 ml) was added. A precipitated solid was collected by filtration and dissolved under heat after adding 1,2-dichlorobenzene (300 ml). After silica gel (140 g) was added, insoluble matter was removed by filtration. The filtrate was concentrated under reduced pressure, and after the product was purified by recrystallization with 1,2-dichlorobenzene (250 ml), the purified product was washed under reflux with methanol to obtain a white powder of 4,4"-bis{(naphthalen-2-yl)-phenylamino}-1,1':4',1"-terphenyl (Compound 1-6; 51.0 g; yield 74%).

The structure of the obtained white powder was identified by NMR.

$^1$H-NMR (THF-da) detected 36 hydrogen signals, as follows.

δ (ppm)=7.77 (4H), 7.70 (4H), 7.64-7.58 (6H), 7.48 (2H), 7.40-7.21 (10H), 7.21-7.12 (8H), 7.04 (2H).

[Chemical Formula 72]

(1-6)

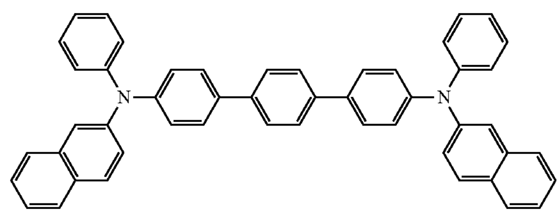

Example 6

Synthesis of 4,4"-bis[({(biphenyl-2',3', 4',5', 6'-$d_5$)-4-yl}-phenylamino]-1,1':4',1"-terphenyl (Compound 1-21)

{(Biphenyl-2',3', 4',5', 6'-$d_5$)-4-yl}-phenylamine (24.8 g), 4,4"-diiodo-1,1':4',1"-terphenyl (19.9 g), a copper powder (0.26 g), potassium carbonate (17.2 g), 3,5-di-tert-butylsalicylic acid (2.06 g), sodium bisulfite (1.30 g), and dodecylbenzene (20 ml) were added into a reaction vessel and heated up to 215° C. After the obtained product was stirred for 21 hours, the product was cooled, and toluene (30 ml) and methanol (60 ml) were added. A precipitated solid was collected by filtration and washed with a methanol/water (1/5, v/v) mixed solution. After adding 1,2-dichlorobenzene (300 ml) to the obtained solid, the solid was heated, and insoluble matter was removed by filtration. After the filtrate was left to cool, methanol (300 ml) was added, and a precipitate was collected by filtration to obtain a yellow powder of 4,4"-bis[{(biphenyl-2',3',4',5',6'-$d_5$)-4-yl}-phenylamino]-1,1':4',1"-terphenyl (Compound 1-21; 25.5 g; yield 85%).

The structure of the obtained yellow powder was identified by NMR.

$^1$H-NMR (THF-de) detected 30 hydrogen signals, as follows.

δ (ppm)=7.69 (4H), 7.65-7.52 (8H), 7.28 (4H), 7.20-7.12 (10H), 7.03 (4H).

[Chemical Formula 73]

(1-21)

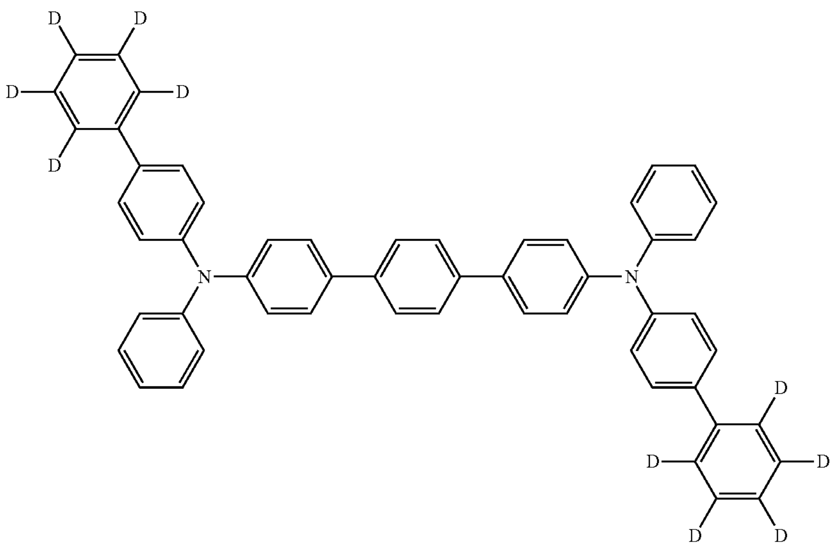

Example 7

Synthesis of 4,4"-bis{(biphenyl-3-yl)-(biphenyl-4-yl)amino}-1,1':4',1"-terphenyl (Compound 1-22)

(Biphenyl-3-yl)-(biphenyl-4-yl)amine (16.1 g), 4,4"-diiodo-1,1':4',1"-terphenyl (11.0 g), a copper powder (0.29 g), potassium carbonate (9.46 g), 3,5-di-tert-butylsalicylic acid (1.14 g), sodium bisulfite (0.71 g), and dodecylbenzene (22 ml) were added into a reaction vessel and heated up to 220° C. After the obtained product was stirred for 34 hours, the product was cooled, and toluene and heptane were added. A precipitated solid was collected by filtration and dissolved under heat after adding 1,2-dichlorobenzene (200 ml). After silica gel (50 g) was added, insoluble matter was removed by filtration. After the filtrate was concentrated under reduced pressure, toluene and acetone were added. A precipitated solid was collected by filtration, and the precipitated solid was crystallized with 1,2-dichloromethane followed by crystallization with acetone, and further crystallized with 1,2-dichloromethane followed by crystallization with methanol to obtain a pale yellow powder of 4,4"-bis{(biphenyl-3-yl)-(biphenyl-4-yl)amino}-1,1':4',1"-terphenyl (Compound 1-22; 25.5 g; yield 77%).

The structure of the obtained pale yellow powder was identified by NMR.

$^1$H-NMR (THF-de) detected 48 hydrogen signals, as follows.

δ (ppm)=7.71 (4H), 7.67-7.50 (16H), 7.47 (4H), 7.43-7.20 (20H), 7.12 (4H).

[Chemical Formula 74]

(1-22)

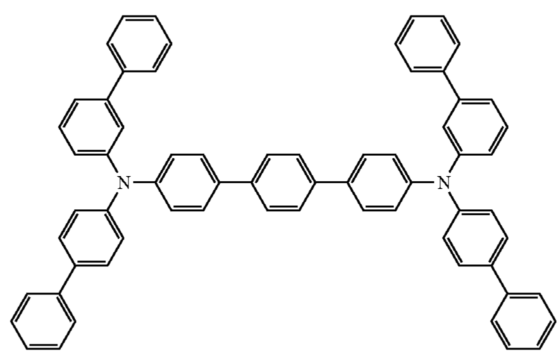

Example 8

<Synthesis of 4,4"-bis{(phenanthren-9-yl)-phenylamino}-1,1':4',1"-terphenyl (Compound 1-3)>

(Phenanthren-9-yl)-phenylamine (16.9 g), 4,4"-diiodo-1,1':4',1"-terphenyl (12.6 g), a copper powder (0.16 g), potassium carbonate (10.9 g), 3,5-di-tert-butylsalicylic acid (0.65 g), sodium bisulfite (0.83 g), and dodecylbenzene (13 ml) were added into a reaction vessel and heated up to 210° C. After the obtained product was stirred for 23 hours, the product was cooled, and toluene (26 ml) and methanol (26 ml) were added. A precipitated solid was collected by filtration and washed with a methanol/water (1/5, v/v) mixed solution (120 ml). The precipitated solid was crystallized with 1,2-dichlorobenzene followed by crystallization with methanol to obtain a white powder of 4,4"-bis{(phenanthren-9-yl)-phenylamino}-1,1':4',1"-terphenyl (Compound 1-3; 9.38 g; yield 47%).

The structure of the obtained yellow powder was identified by NMR.

$^1$H-NMR (THF-de) detected 40 hydrogen signals, as follows.

δ (ppm)=8.88-8.73 (4H), 8.09 (2H), 7.71 (2H), 7.68-7.41 (18H), 7.21-7.10 (12H), 6.92 (2H).

[Chemical Formula 75]

(1-3)

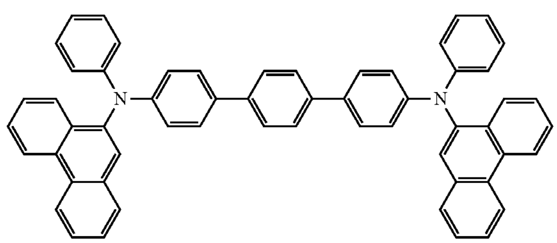

Example 9

Synthesis of 4,4"-bis{(biphenyl-3-yl)-phenylamino}-1,1':4',1"-terphenyl (Compound 1-5)

(Biphenyl-3-yl)-phenylamine (12.7 g), 4,4"-diiodo-1,1':4',1"-terphenyl (11.3 g), a copper powder (0.30 g), potassium carbonate (9.72 g), 3,5-di-tert-butylsalicylic acid (1.17 g), sodium bisulfite (0.73 g), and dodecylbenzene (23 ml) were added into a reaction vessel and heated up to 220° C. After the obtained product was stirred for 21 hours, the product was cooled, and after 1,2-dichlorobenzene (250 ml) and silica (30 g) were added, insoluble matter was removed by filtration. After the filtrate was concentrated under reduced pressure, heptane was added. A precipitated solid was collected by filtration, and the precipitated solid was crystallized with a 1,2-dichlorobenzene/heptane mixed solvent and further crystallized with a 1,2-dichlorobenzene/methanol mixed solvent to obtain a pale brown powder of 4,4"-bis{(biphenyl-3-yl)-phenylamino}-1,1':4',1"-terphenyl (Compound 1-5; 10.8 g; yield 64%).

The structure of the obtained pale brown powder was identified by NMR.

$^1$H-NMR (THF-de) detected 40 hydrogen signals, as follows.

δ (ppm)=7.69 (4H), 7.60 (4H), 7.52 (4H), 7.42-7.21 (16H), 7.20-7.13 (8H), 7.10-7.00 (4H).

[Chemical Formula 76]

(1-5)

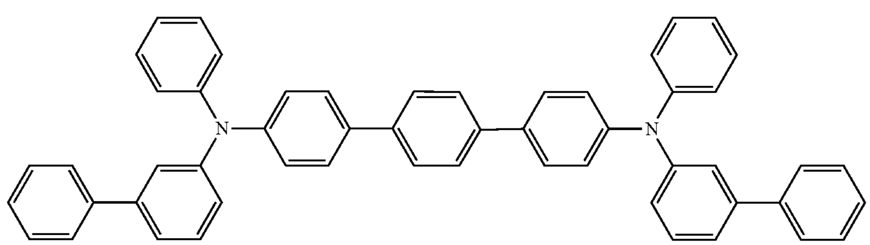

Example 10

Synthesis of 4,4"-bis{(triphenylen-2-yl)-phenylamino}-1,1':4',1"-terphenyl (Compound 1-23)

(Triphenylen-2-yl)-phenylamine (11.9 g), 4,4"-diiodo-1,1':4',1"-terphenyl (8.55 g), tert-butoxy sodium (4.09 g), and xylene (86 ml) were added into a reaction vessel and aerated with nitrogen gas for 40 minutes under ultrasonic irradiation. Palladium acetate (0.08 g) and a toluene solution (0.55 ml) containing 50% (w/v) tri-tert-butylphosphine were added, and the mixture was heated up to 100° C. After the mixture was stirred for 7 hours, the mixture was cooled. Methanol (80 ml) was added, and a precipitated solid was collected by filtration. 1,2-dichlorobenzene (300 ml) was added to the obtained solid, and the solid was heated, and after silica gel (45 g) was added, insoluble matter was removed by filtration. The filtrate was concentrated under reduced pressure, and after purified by recrystallization with 1,2-dichlorobenzene, the purified product was washed under reflux with methanol to obtain a pale yellowish green powder of 4,4"-bis{(triphenylen-2-yl)-phenylamino}-1,1':4',1"-terphenyl (Compound 1-23; 11.4 g; yield 74%).

The structure of the obtained pale yellowish green powder was identified by NMR.

$^{1}$H-NMR (THF-de) detected 44 hydrogen signals, as follows.

δ (ppm)=8.72-8.62 (8H), 8.45 (2H), 8.36 (2H), 7.75 (4H), 7.70-7.21 (26H), 7.09 (2H).

[Chemical Formula 77]

(1-23)

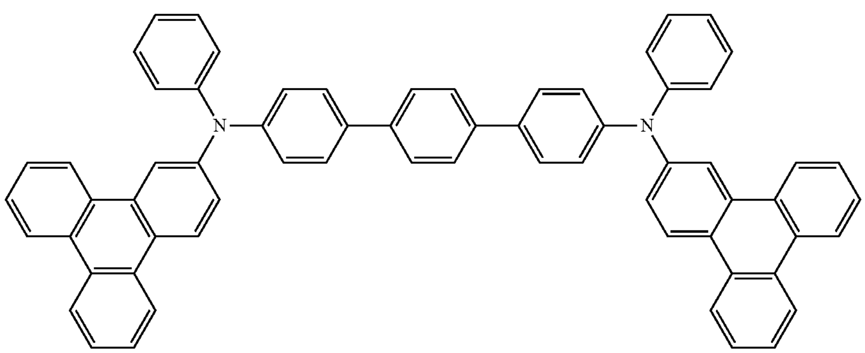

methanol (250 ml) was added, and a precipitated solid was collected by filtration. The precipitated solid was crystallized with a 1,2-dichlorobenzene/methanol mixed solvent followed by washing under reflux with methanol to obtain a yellowish white powder of 4,4"-bis{di(naphthalen-2-yl)amino}-1,1':4',1"-terphenyl (Compound 1-24; 10.5 g; yield 70%).

The structure of the obtained yellowish white powder was identified by NMR.

$^{1}$H-NMR (THF-de) detected 40 hydrogen signals, as follows.

δ (ppm)=7.82-7.75 (6H), 7.72 (4H), 7.68-7.60 (8H), 7.56 (4H), 7.40-7.30 (14H), 7.24 (4H).

[Chemical Formula 78]

(1-24)

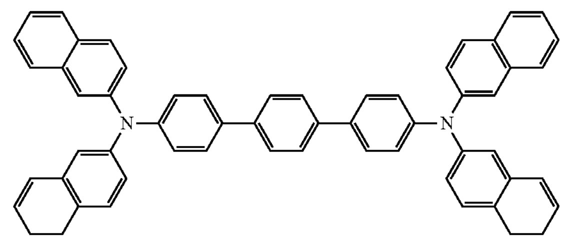

Example 11

Synthesis of 4,4"-bis{di(naphthalen-2-yl)amino}-1,1':4',1"-terphenyl (Compound 1-24)

Di(naphthalen-2-yl)amine (12.2 g), 4,4"-diiodo-1,1':4',1"-terphenyl (9.49 g), a copper powder (0.14 g), potassium carbonate (8.2 g), 3,5-di-tert-butylsalicylic acid (0.51 g), sodium bisulfite (0.69 g), dodecylbenzene (15 ml), and toluene (20 ml) were added into a reaction vessel and heated up to 210° C. while removing the toluene by distillation. After the obtained product was stirred for 28 hours, the product was cooled, and 1,2-dichlorobenzene (20 ml) and methanol (20 ml) were added. A precipitated solid was collected by filtration and washed with a methanol/water (1/4, v/v) mixed solution (200 ml). Then, the solid was dissolved under heat after adding 1,2-dichlorobenzene (100 ml), and after silica gel was added, insoluble matter was removed by filtration. After the filtrate was left to cool, Example 12

Synthesis of 4,4"-bis[{4-(naphthalen-2-yl)phenyl}-phenylamino]-1,1':4',1"-terphenyl (Compound 1-25)

{4-(Naphthalen-2-yl)phenyl}-phenylamine (16.6 g), 4,4"-diiodo-1,1':4',1"-terphenyl (11.8 g), a copper powder (0.18 g), potassium carbonate (10.5 g), 3,5-di-tert-butylsalicylic acid (0.61 g), sodium bisulfite (0.83 g), dodecylbenzene (15 ml), and toluene (20 ml) were added into a reaction vessel and heated up to 210° C. while removing the toluene by distillation. After the obtained product was stirred for 19 hours, the product was cooled, and toluene (20 ml) and methanol (20 ml) were added. A precipitated solid was collected by filtration, washed with a methanol/water (1/4, v/v) mixed solution (180 ml), and further washed with methanol (100 ml). An obtained brownish yellow powder was heated after adding 1,2-dichlorobenzene (175 ml), and insoluble matter was removed by filtration. After the filtrate was left to cool, methanol (200 ml) was added, and a precipitated solid was collected by filtration. The precipitated solid was crystallized with a 1,2-dichlorobenzene/methanol mixed solvent followed by washing under reflux with methanol to obtain a brownish white powder of 4,4"-bis[{4-(naphthalen-2-yl)phenyl}-phenylamino]-1,1':4',1"-terphenyl (Compound 1-25; 11.9 g; yield 53%).

The structure of the obtained brownish white powder was identified by NMR.

$^1$H-NMR (THF-de) detected 44 hydrogen signals, as follows.

δ (ppm)=8.10 (2H), 7.93-7.78 (8H), 7.76-7.70 (8H), 7.62 (4H), 7.44 (4H), 7.30 (4H), 7.25-7.16 (12H), 7.05 (2H).

[Chemical Formula 79]

(1-25)

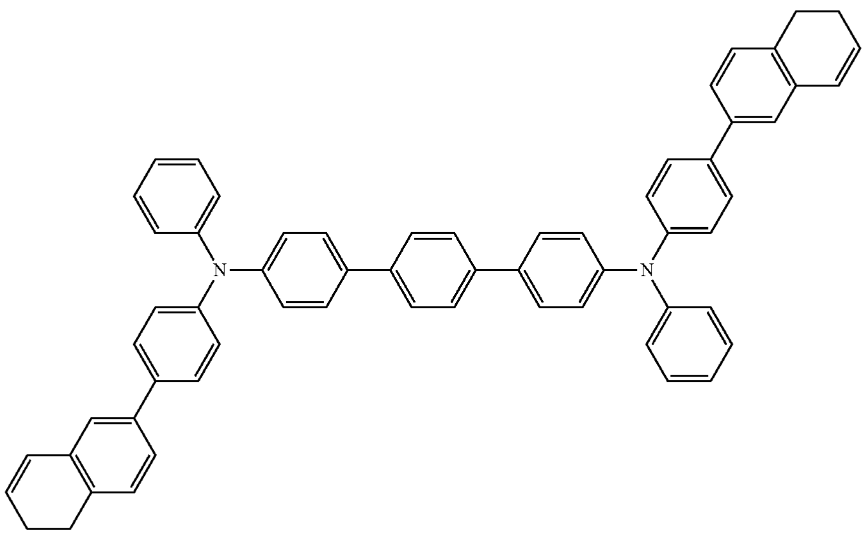

Example 13

Synthesis of 4-{(biphenyl-4-yl)-phenylamino}-4"-[({4-(1-phenyl-indol-4-yl)phenyl}-phenylamino]-1,1':4',1"-terphenyl (Compound 1-26)

(4'-Bromo-1,1'-biphenyl-4-yl)-{4-(1-phenyl-indol-4-yl)phenyl}-phenylamine (7.25 g), {4-(4,4,5,5-tetramethyl-1,3,2-dioxabororan-2-yl)phenyl}-(1,1'-biphenyl-4-yl)-phenylamine (5.76 g), a 2 M potassium carbonate aqueous solution (12.3 ml), toluene (80 ml), and ethanol (20 ml) were added into a reaction vessel and aerated with nitrogen gas for 40 minutes under ultrasonic irradiation. After adding tetrakistriphenylphosphinepalladium (0.43 g), the mixture was heated and refluxed for 7 hours while being stirred. After the mixture was left to cool, water (50 ml) and toluene (100 ml) were added, and insoluble matter was removed by filtration. An organic layer was collected by liquid separation, then dried over anhydrous magnesium sulfate and concentrated under reduced pressure to obtain a crude product. After the crude product was purified by column chromatography (support: silica gel, eluent:toluene/heptane), the purified product was crystallized with THF followed by crystallization with methanol to obtain a pale yellow powder of 4-{(biphenyl-4-yl)-phenylamino}-4"-[{4-(1-phenyl-indol-4-yl)phenyl}-phenylamino]-1,1':4',1"-terphenyl (Compound 1-26; 6.80 g; yield 67%).

The structure of the obtained pale yellow powder was identified by NMR.

$^1$H-NMR (THF-de) detected 45 hydrogen signals, as follows.

δ (ppm)=7.70 (4H), 7.68-7.50 (16H), 7.42-7.11 (23H), 7.05 (1H), 6.88 (1H).

[Chemical Formula 80]

(1-26)

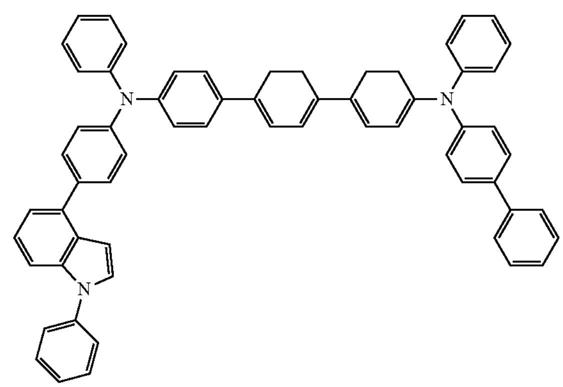

Example 14

Synthesis of 4,4"-bis{(biphenyl-4-yl)-phenylamino}-1,1':3',1"-terphenyl (Compound 1-27)

3-Bromoiodobenzene (8.83 g), (biphenyl-4-yl)-{4-(4,4,5,5-tetramethyl-[1,3,2]dioxaborolan-2-yl)phenyl}-phenylamine (30.5 g), potassium carbonate (13.0 g), water (30 ml), toluene (0.300 ml), and ethanol (75 ml) were added into a nitrogen-substituted reaction vessel and aerated with nitrogen gas under ultrasonic irradiation for 30 minutes. The mixture was heated after adding tetrakis (triphenylphosphine)palladium (1.1 g), and stirred at 80° C. for 16 hours. The mixture was cooled to a room temperature, and methanol (300 ml) was added. A precipitated solid was collected by filtration, and the solid was dissolved under heat after adding 1,2-dichlorobenzene (270 ml). Silica gel (16 g) was added, and the mixture was stirred for 30 minutes. After insoluble matter was removed by filtration, a crude product precipitated by adding methanol (300 ml) was collected by filtration. The crude product was washed under reflux with methanol (200 ml) to obtain a white powder of 4,4"-bis{(biphenyl-4-yl)-phenylamino}-1,1':3',1"-terphenyl (Compound 1-27; 14.3 g; yield 71%).

The structure of the obtained white powder was identified by NMR.

$^{1}$H-NMR ($CDCl_3$) detected 40 hydrogen signals, as follows.

δ (ppm)=7.87 (1H), 7.64-7.50 (12H), 7.48-7.32 (6H), 7.31-6.98 (21H).

[Chemical Formula 81]

(1-27)

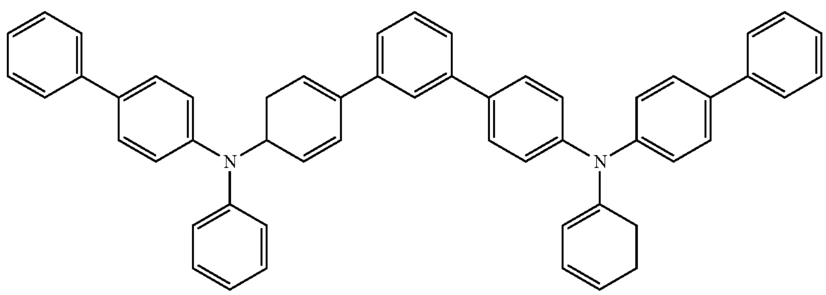

Example 15

Synthesis of 4,4"-bis {(biphenyl-4-yl)-(phenyl-$d_5$) amino}-1,1':3',1"-terphenyl (Compound 1-28)

1,3-dibromobenzene (6.51 g), (biphenyl-4-yl)-{4-(4,4,5,5-tetramethyl-[1,3,2]dioxaborolan-2-yl)phenyl}-(phenyl-$d_5$)amine (26.9 g), potassium carbonate (11.4 g), water (50 ml), toluene (200 ml), and ethanol (50 ml) were added into a nitrogen-substituted reaction vessel and aerated with nitrogen gas under ultrasonic irradiation for minutes. The mixture was heated after adding tetrakis(triphenylphosphine) palladium (0.95 g), and stirred at 70° C. for 12 hours. The mixture was cooled to a room temperature, and methanol (200 ml) was added. A precipitated solid was collected by filtration, and the solid was dissolved under heat after adding 1,2-dichlorobenzene (400 ml). Silica gel (20 g) was added, and the mixture was stirred for 30 minutes. After insoluble matter was removed by filtration, a precipitate formed by adding methanol (500 ml) was collected by filtration. The precipitate was dissolved by adding 1,2-dichlorobenzene (100 ml), and a crude product precipitated by adding toluene (100 ml) and methanol (100 ml) was collected by filtration. The crude product was washed under reflux with methanol (250 ml) to obtain a white powder of 4,4"-bis{(biphenyl-4-yl)-(phenyl-$d_5$)amino}-1,1':3',1"-terphenyl (Compound 1-28; 18.3 g; yield 91%).

The structure of the obtained white powder was identified by NMR.

$^{1}$H-NMR ($CDCl_3$) detected 30 hydrogen signals, as follows.

δ (ppm)=7.87 (1H), 7.64-7.32 (18H), 7.31-6.98 (11H).

[Chemical Formula 82]

(1-28)

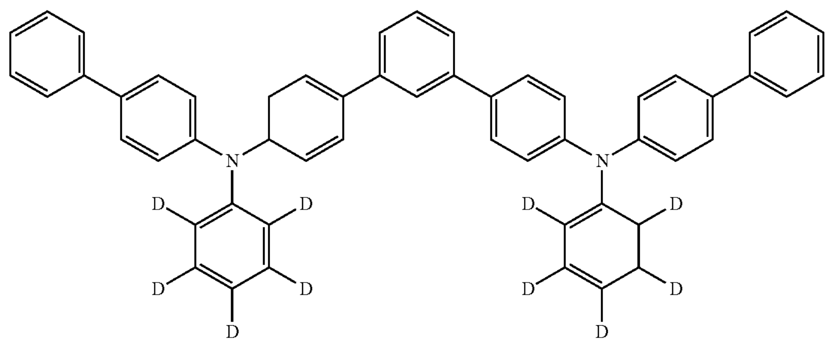

Example 16

Synthesis of 4,4"-bis{(naphthalen-1-yl)-phenylamino}-1,1':3',1"-terphenyl (Compound 1-29)

The reaction was carried out under the same conditions as those of Example 15, except that (biphenyl-4-yl)-{4-(4,4,5,5-tetramethyl-[1,3,2]dioxaborolan-2-yl)phenyl}-(phenyl-$d_5$)amine was replaced with (naphthalen-1-yl)-{4-(4,4,5,5-tetramethyl-[1,3,2]dioxaborolan-2-yl)phenyl}-phenylamine. As a result, a white powder of 4,4"-bis{(naphthalen-1-yl)-phenylamino}-1,1':3',1"-terphenyl (Compound 1-29; 8.8 g; yield 59%) was obtained.

The structure of the obtained white powder was identified by NMR.

$^1$H-NMR ($CDCl_3$) detected 36 hydrogen signals, as follows.

δ (ppm)=7.99 (2H), 7.92 (2H), 7.81 (2H), 7.72 (1H, 7.57-6.92 (29H).

(1-29)

[Chemical Formula 83]

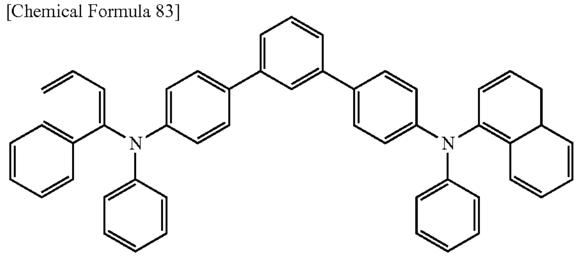

Example 17

Synthesis of 4,4"-bis[{4-(dibenzofuran-4-yl)phenyl}-phenylamino]-1,1':3',1"-terphenyl (Compound 1-32)

The reaction was carried out under the same conditions as those of Example 15, except that (biphenyl-4-yl)-{4-(4,4,5,5-tetramethyl-[1,3,2]dioxaborolan-2-yl)phenyl}-(phenyl-$d_5$)amine was replaced with {4-(dibenzofuran-4-yl)phenyl}-{4-(4,4,5,5-tetramethyl-[1,3,2]dioxaborolan-2-yl)phenyl}-phenylamine. As a result, a white powder of 4,4"-bis[{4-(dibenzofuran-4-yl)phenyl}-phenylamino]-1,1':3',1"-terphenyl (Compound 1-32; 6.8 g; yield 86%) was obtained.

The structure of the obtained white powder was identified by NMR.

$^1$H-NMR ($CDCl_3$) detected 44 hydrogen signals, as follows.

δ (ppm)=8.01 (2H), 7.97-7.82 (8H), 7.67-7.24 (34H).

[Chemical Formula 84]

(1-32)

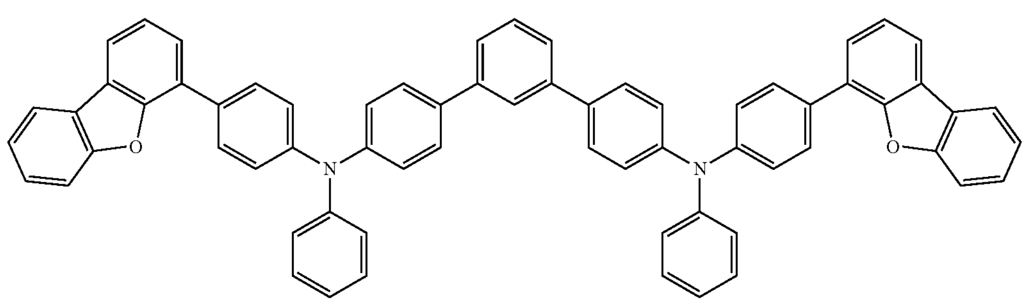

Example 18

Synthesis of 2,4"-bis{(biphenyl-4-yl)-phenylamino}-1,1':4',1"-terphenyl (Compound 1-50)

4-Bromo-4-({(biphenyl-4-yl)-phenylamino}-biphenyl (16.8 g), (biphenyl-4-yl)-{2-(4,4,5,5-tetramethyl-[1,3,2]dioxaborolan-2-yl)phenyl}-phenylamine (19.0 g), potassium carbonate (7.4 g), water (26 ml), toluene (200 ml), and ethanol (50 ml) were added into a nitrogen-substituted reaction vessel and aerated with nitrogen gas under ultrasonic irradiation for 30 minutes. After adding tetrakis(triphenylphosphine) palladium (0.87 g), the mixture was heated and refluxed for 20 hours while being stirred. After the mixture was cooled to a room temperature, an organic layer was collected by liquid separation, then dried over anhydrous magnesium sulfate and concentrated to obtain a crude product. After the crude product was purified by column chromatography (support: silica gel, eluent:heptane/toluene), the purified product was crystallized with an ethyl acetate/methanol mixed solvent to obtain a white powder of 2,4"-bis{(biphenyl-4-yl)-phenylamino}-1,1':4',1"-terphenyl (Compound 1-50; 20.8 g; yield 82%).

The structure of the obtained white powder was identified by NMR.

$^1$H-NMR ($CDCl_3$) detected 40 hydrogen signals, as follows.

δ (ppm)=7.61 (2H), 7.56-6.83 (38H).

[Chemical Formula 85]

(1-50)

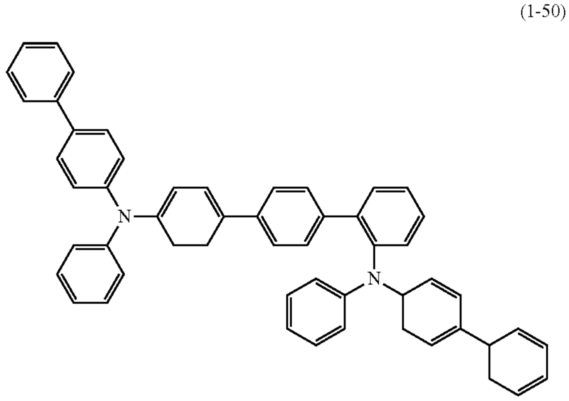

Example 19

Synthesis of 4,4"-bis{(triphenylen-2-yl)-phenylamino}-1,1':3',1"-terphenyl (Compound 1-51)

4,4"-Dibromo-1,1':3',1"-terphenyl (8.2 g), (triphenylen-2-yl)-phenylamine (15.4 g), tert-butoxy sodium (5.1 g), and toluene (180 ml) were added into a nitrogen-substituted reaction vessel and aerated with nitrogen gas under ultrasonic irradiation for 30 minutes. Palladium acetate (0.11 g) and a toluene solution (0.31 ml) containing 50% (w/v) tri-tert-butylphosphine were added, and the mixture was heated and refluxed for 5 hours while being stirred.

The mixture was cooled to a room temperature and subjected to an extraction procedure using 1,2-dichlorobenzene and then to purification by adsorption with a silica gel, followed by crystallization with a 1,2-dichlorobenzene/methanol mixed solvent to obtain a yellowish white powder of 4,4"-bis {(triphenylen-2-yl)-phenylamino}-1,1':3',1"-terphenyl (Compound 1-51; 11.67 g; yield 64%).

The structure of the obtained yellowish white powder was identified by NMR.

$^1$H-NMR ($CDCl_3$) detected 44 hydrogen signals, as follows.

δ (ppm)=8.67 (4H), 8.57 (4H), 8.41 (2H), 8.36 (2H), 7.88 (1H), 7.70-7.10 (31H).

[Chemical Formula 86]

(1-51)

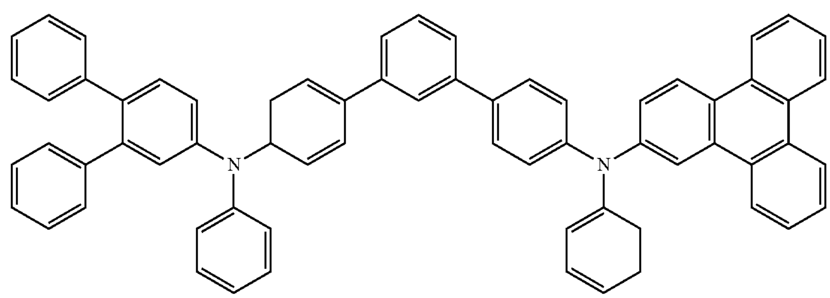

Example 20

Synthesis of 4,4"-bis{(phenanthren-9-yl)-phenylamino}-1,1':3',1"-terphenyl (Compound 1-52)

The reaction was carried out under the same conditions as those of Example 19, except that (triphenylen-2-yl)-phenylamine was replaced with (phenanthren-9-yl)-phenylamine. As a result, a yellowish white powder of 4,4"-bis{(phenanthren-9-yl)-phenylamino}-1,1':3',1"-terphenyl (Compound 1-52; 8.0 g; yield 50%) was obtained.

The structure of the obtained yellowish white powder was identified by NMR.

$^1$H-NMR ($CDCl_3$) detected 40 hydrogen signals, as follows.

δ (ppm)=8.81-8.71 (4H), 8.10 (2H), 7.83-7.39 (20H), 7.29-6.97 (14H).

[Chemical Formula 87]

(1-52)

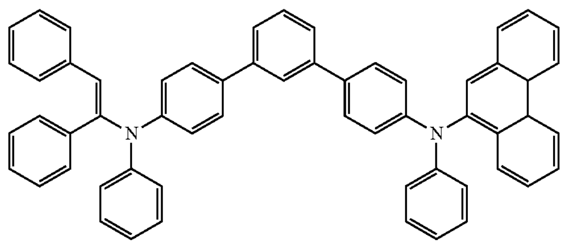

Example 21

Synthesis of 4-{bis(biphenyl-4-yl)amino}-2"-{(biphenyl-4-yl)-phenylamino}-1,1':4',1"-terphenyl (Compound 1-53)

2-{(biphenyl-4-yl)-phenylamino}-4"-bromo-1,1':4',1"-terphenyl (12.1 g), bis(biphenyl-4-yl)amine (8.0 g), tris(dibenzylideneacetone)palladium (0.6 g), tri-tert-butylphosphine (0.22 g), and tert-butoxy sodium (6.3 g) were added into a nitrogen-substituted reaction vessel, heated and refluxed for 3 hours while being stirred. After the mixture was cooled to a room temperature, methanol (600 ml) was added, and a precipitated crude product was collected by filtration. The crude product was dissolved in toluene, and after insoluble matter was removed by filtration, purification by crystallization with methanol was carried out. Then, recrystallization with a THF/methanol mixed solvent was carried out to obtain a white powder of 4-{bis(biphenyl-4-yl)amino}-2"-{(biphenyl-4-yl)-phenylamino}-1,1':4',1"-terphenyl (Compound 1-53; 15 g; yield 87%).

The structure of the obtained white powder was identified by NMR.

$^1$H-NMR ($CDCl_3$) detected 44 hydrogen signals, as follows.

δ (ppm)=7.62 (4H), 7.58-6.91 (38H), 6.87 (2H).

[Chemical Formula 88]

(1-53)

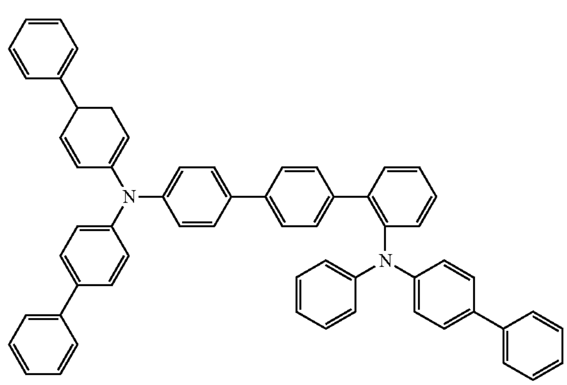

Example 22

Synthesis of 4,4"-bis{(naphthalen-1-yl)-(phenyl-$d_5$)amino}-1,1':3',1"-terphenyl. (Compound 1-54)

The reaction was carried out under the same conditions as those of Example 15, except that (biphenyl-4-yl)-{4-(4,4,5,5-tetramethyl-[1,3,2]dioxaborolan-2-yl)phenyl}-(phenyl-$d_5$)amine was replaced with (naphthalen-1-yl)-({4-(4,4,5,5-tetramethyl-[1,3,2]dioxaborolan-2-yl)phenyl}-(phenyl-$d_5$)amine. As a result, a white powder of 4,4"-bis{(naphthalen-1-yl)-(phenyl-$d_5$)amino}-1,1':3',1"-terphenyl (Compound 1-54; 5.2 g; yield 30%) was obtained.

The structure of the obtained white powder was identified by NMR.

$^1$H-NMR ($CDCl_3$) detected 26 hydrogen signals, as follows.

δ (ppm)=7.99 (2H), 7.92 (2H), 7.81 (2H), 7.72 (1H), 7.55-7.36 (15H), 7.13-7.07 (4H).

[Chemical Formula 89]

(1-54)

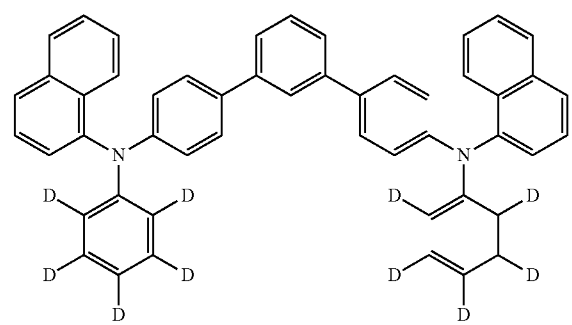

Example 23

Synthesis of 2-{bis(biphenyl-4-yl)amino}-4"-{(biphenyl-4-yl)-phenylamino}-1,1':4',1"-terphenyl (Compound 1-56)

The reaction was carried out under the same conditions as those of Example 18, except that (biphenyl-4-yl)-{2-(4,4,5,5-tetramethyl-[1,3,2]dioxaborolan-2-yl)phenyl}-phenylamine was replaced with bis(biphenyl-4-yl)-{2-(4,4,5,5-tetramethyl-[1,3,2]dioxaborolan-2-yl)phenyl}amine. As a result, a white powder of 2-{bis(biphenyl-4-yl)amino}-4"-{(biphenyl-4-yl)-phenylamino}-1,1':4',1"-terphenyl (Compound 1-56; 15.7 g; yield 94%) was obtained.

The structure of the obtained white powder was identified by NMR.

$^1$H-NMR ($CDCl_3$) detected 44 hydrogen signals, as follows.

δ (ppm)=7.60 (2H), 7.56-6.97 (42H).

[Chemical Formula 90]

(1-56)

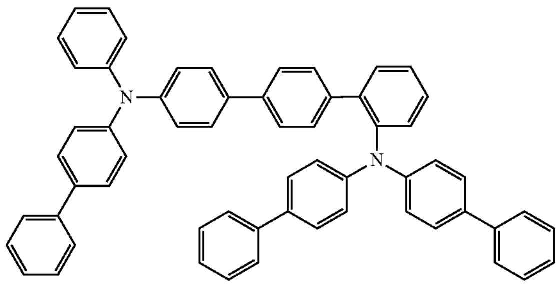

Example 24

Synthesis of 2,4"-bis{bis(biphenyl-4-yl)amino}-1,1':4',1"-terphenyl (Compound 1-57)

The reaction was carried out under the same conditions as those of Example 18, except that 4-bromo-4'-{(biphenyl-4-yl)-phenylamino}-biphenyl was replaced with 4-bromo-4'-{bis(biphenyl-4-yl)amino}-biphenyl, and (biphenyl-4-yl)-{2-(4,4,5,5-tetramethyl-[1,3,2]dioxaborolan-2-yl)phenyl}-phenylamine was replaced with 2-{bis(biphenyl-4-yl) amino}phenylboronic acid. As a result, a white powder of 2,4"-bis{bis(biphenyl-4-yl)amino}-1,1':4',1"-terphenyl (Compound 1-57; 12 g; yield 76%) was obtained.

The structure of the obtained white powder was identified by NMR.

$^1$H-NMR ($CDCl_3$) detected 48 hydrogen signals, as follows.

δ (ppm)=7.65-6.98 (48H).

[Chemical Formula 91]

(1-57)

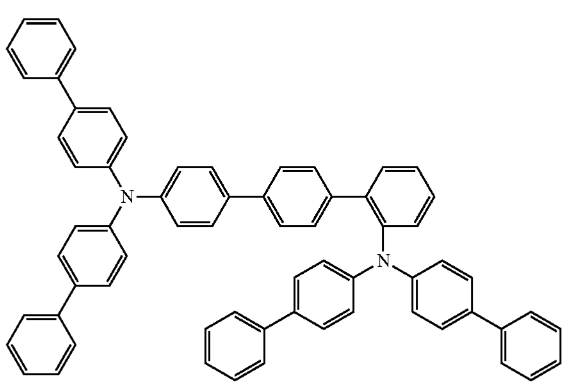

Example 25

Synthesis of 4,4"-bis{(biphenyl-4-yl)-(naphthalen-1-yl)amino}-1,1':3',1"-terphenyl (Compound 1-59)

The reaction was carried out under the same conditions as those of Example 19, except that (triphenylen-2-yl)-phenylamine was replaced with (biphenyl-4-yl)-(naphthalen-1-yl)amine. As a result, a white powder of 4,4"-bis{(biphenyl-4-yl)-(naphthalen-1-yl)amino}-1,1':3',1"-terphenyl (Compound 1-59; 6.4 g; yield 36%) was obtained.

The structure of the obtained white powder was identified by NMR.

$^1$H-NMR ($CDCl_3$) detected 44 hydrogen signals, as follows.

δ (ppm)=8.02 (2H), 7.94 (2H), 7.84 (2H), 7.76 (1H), 7.62-7.38 (27H), 7.33 (2H), 7.19-7.13 (8H).

[Chemical Formula 92]

(1-59)

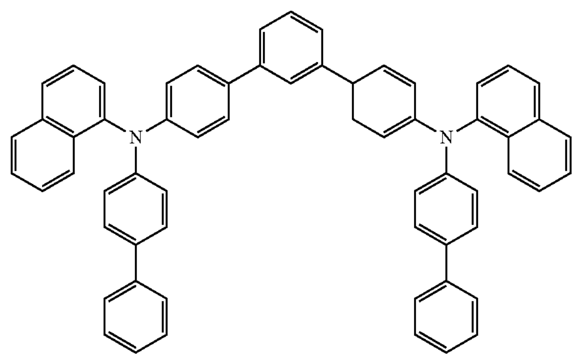

Example 26

Synthesis of 4,4"-bis{(9,9-dimethyl-9H-fluoren-2-yl)-phenylamino}-1,1':3',1"-terphenyl (Compound 1-60)

The reaction was carried out under the same conditions as those of Example 19, except that (triphenylen-2-yl)-phenylamine was replaced with (9,9-dimethyl-9H-fluoren-2-yl)-phenylamine. As a result, a white powder of 4,4"-bis{(9,9-dimethyl-9H-fluoren-2-yl)-phenylamino}-1,1':3',1"-terphenyl (Compound 1-60; 14.6 g; yield 80%) was obtained.

The structure of the obtained white powder was identified by NMR.

$^1$H-NMR ($CDCl_3$) detected 48 hydrogen signals, as follows.

δ (ppm)=7.84 (1H), 7.70-7.03 (35H), 1.48 (12H).

[Chemical Formula 93]

(1-60)

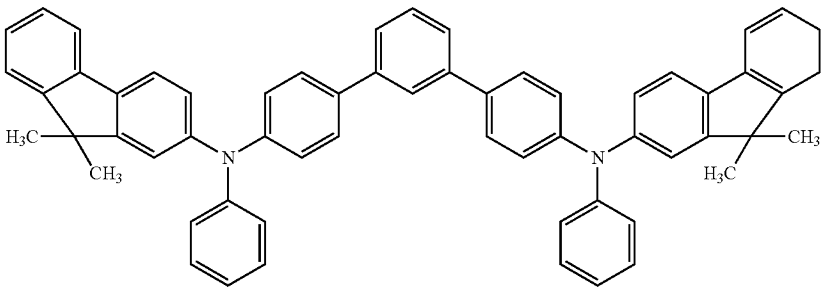

Example 27

Synthesis of 2-{bis(biphenyl-4-yl)amino}-4"-{(naphthalen-1-yl)-phenylamino}-1,1':4',1"-terphenyl (Compound 1-62)

The reaction was carried out under the same conditions as those of Example 18, except that 4-bromo-4'-{(biphenyl-4-yl)-phenylamino}-biphenyl was replaced with 4-bromo-4'-{(naphthalen-1-yl)-phenylamino}-biphenyl, and (biphenyl-4-yl)-{2-(4,4,5,5-tetramethyl-[1,3,2]dioxaborolan-2-yl)phenyl}-phenylamine was replaced with 2-{bis(biphenyl-4-yl)amino}phenylboronic acid. As a result, a white powder of 2-{bis(biphenyl-4-yl)amino}-4"-{(naphthalen-1-yl)-phenylamino}-1,1':4',1"-terphenyl (Compound 1-62; 12.8 g; yield 75%) was obtained.

The structure of the obtained white powder was identified by NMR.

$^{1}$H-NMR ($CDCl_3$) detected 42 hydrogen signals, as follows.

δ (ppm)=7.99 (2H), 7.93 (2H), 7.81 (2H), 7.57-6.96 (36H).

[Chemical Formula 94]

(1-62)

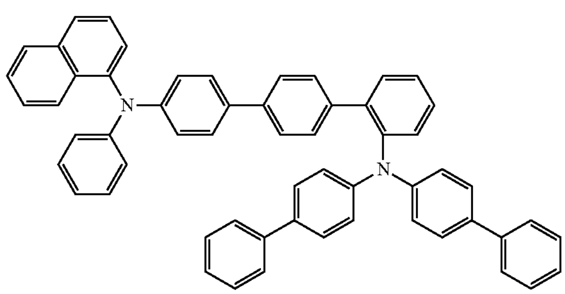

Example 28

Synthesis of 2-{(biphenyl-4-yl)-phenylamino}-4"-{((9,9-dimethyl-9H-fluoren-2-yl)-phenylamino}-1,1':4',1"-terphenyl (Compound 1-63)

The reaction was carried out under the same conditions as those of Example 18, except that 4-bromo-4'-{(biphenyl-4-yl)-phenylamino}-biphenyl was replaced with 4-bromo-4'-{(9,9-dimethyl-9H-fluoren-2-yl)-phenylamino}-biphenyl. As a result, a white powder of 2-{(biphenyl-4-yl)-phenylamino}-4"-{((9,9-dimethyl-9H-fluoren-2-yl)-phenylamino}-1,1':4',1"-terphenyl (Compound 1-63; 11.7 g; yield 73%) was obtained.

The structure of the obtained white powder was identified by NMR.

$^{1}$H-NMR ($CDCl_3$) detected 44 hydrogen signals, as follows.

δ (ppm)=7.68 (1H), 7.64-6.84 (37H), 1.48 (6H).

[Chemical Formula 95]

(1-63)

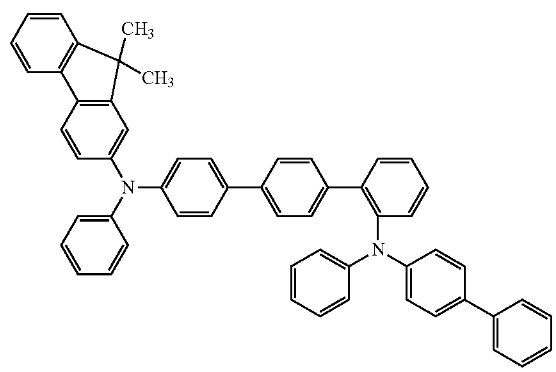

Example 29

Synthesis of 4,4"-bis{(biphenyl-4-yl)-(naphthalen-1-yl)amino}-1,1':2',1"-terphenyl (Compound 1-67)

The reaction was carried out under the same conditions as those of Example 19, except that 4,4"-dibromo-1,1':3',1"-terphenyl was replaced with 4,4"-dibromo-1,1':2',1"-terphenyl, and (triphenylen-2-yl)-phenylamine was replaced with (biphenyl-4-yl)-(naphthalen-1-yl)amine. As a result, a white powder of 4,4"-bis{(biphenyl-4-yl)-(naphthalen-1-yl)amino}-1,1':2',1'"-terphenyl (Compound 1-67; 5.0 g; yield 30%) was obtained.

The structure of the obtained white powder was identified by NMR.

$^{1}$H-NMR ($CDCl_3$) detected 44 hydrogen signals, as follows.

δ (ppm)=7.93-7.84 (4H), 7.79 (2H), 7.60-7.26 (24H), 7.25-6.92. (14H).

[Chemical Formula 96]

(1-67)

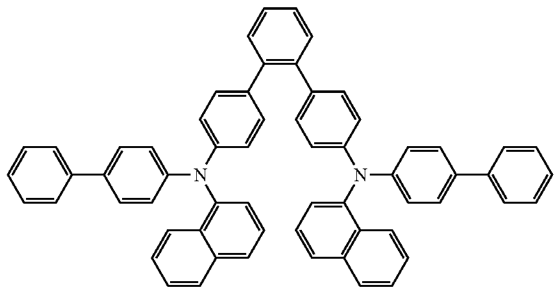

Example 30

Synthesis of 4,4"-bis[{4-(naphthalen-1-yl)phenyl}-phenylamino]-1,1':2',1"-terphenyl (Compound 1-68)

The reaction was carried out under the same conditions as those of Example 19, except that 4,4"-dibromo-1,1':3',1"-terphenyl was replaced with 4,4"-dibromo-1,1':2',1"-terphenyl, and (triphenylen-2-yl)-phenylamine was replaced with {4-(naphthalen-1-yl)phenyl}-phenylamine. As a result, a white powder of 4,4"-bis[{4-(naphthalen-1-yl)phenyl}-phenylamino]-1,1':2',1"-terphenyl (Compound 1-68; 7.3 g; yield 43%) was obtained.

The structure of the obtained white powder was identified by NMR.

$^1$H-NMR ($CDCl_3$) detected 44 hydrogen signals, as follows.

δ (ppm)=8.01 (2H), 7.91 (2H), 7.84 (2H), 7.53-6.98 (38H).

[Chemical Formula 97]

(1-68)

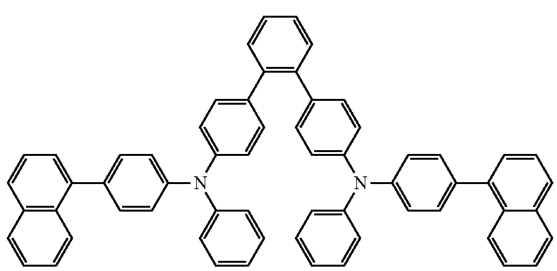

Example 31

Synthesis of 2,2"-bis[{4-(naphthalen-1-yl)phenyl}-phenylamino]-1,1':3',1"-terphenyl (Compound 1-69)

The reaction was carried out under the same conditions as those of Example 14, except that 3-bromoiodobenzene was replaced with 1,3-diiodobenzene, and (biphenyl-4-yl)-{4-(4,4,5,5-tetramethyl-[1,3,2]dioxaborolan-2-yl)phenyl}-phenylamine was replaced with 2-[({4-(naphthalen-1-yl)phenyl}-phenylamino]-phenylboronic acid. As a result, a white powder of 2,2"-bis[{4-(naphthalen-1-yl)phenyl}-phenylamino]-1,1':3',1"-terphenyl (Compound 1-69; 7.3 g; yield 43%) was obtained.

The structure of the obtained white powder was identified by NMR.

$^1$H-NMR ($CDCl_3$) detected 44 hydrogen signals, as follows.

δ (ppm)=7.94-6.85 (44H).

[Chemical Formula 98]

(1-69)

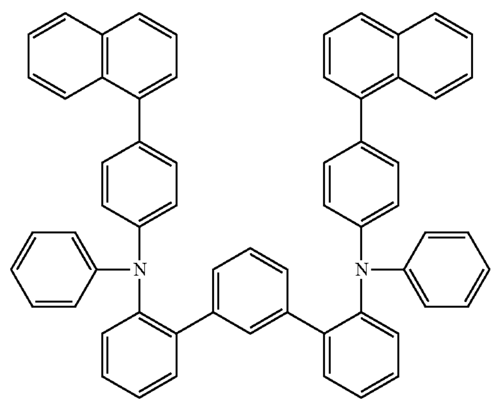

Example 32

Synthesis of 4,4"-bis[{4-(naphthalen-1-yl)phenyl}-phenylamino]-1,1':3',1"-terphenyl (Compound 1-71)

The reaction was carried out under the same conditions as those of Example 19, except that (triphenylen-2-yl)-phenylamine was replaced with {4-(naphthalen-1-yl)phenyl}-phenylamine. As a result, a white* powder of 4,4"-bis[{4-(naphthalen-1-yl)phenyl}-phenylamino]-1,1':3',1"-terphenyl (Compound 1-71; 16.7 g; yield 79%) was obtained.

The structure of the obtained white powder was identified by NMR.

$^1$H-NMR ($CDCl_3$) detected 44 hydrogen signals, as follows.

δ (ppm)=8.08 (2H), 7.94 (2H), 7.90-7.80 (3H), 7.65-7.00 (37H).

[Chemical Formula 99]

(1-71)

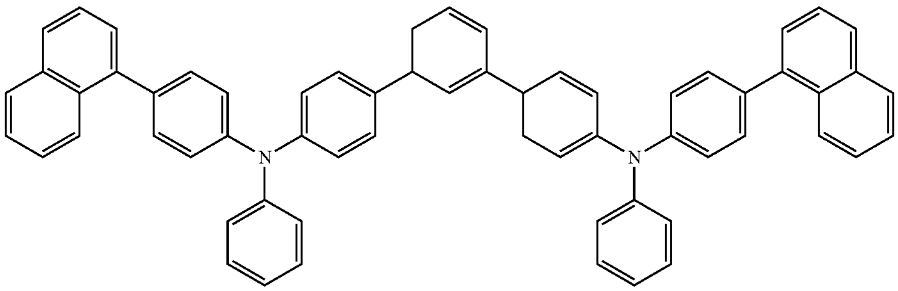

Example 33

Synthesis of 2,2"-bis{(9,9-dimethyl-9H-fluoren-2-yl)-phenylamino}-1,1':4',1"-terphenyl (Compound 1-75)

The reaction was carried out under the same conditions as those of Example 15, except that 1,3-dibromobenzene was replaced with 1,4-dibromobenzene, and (biphenyl-4-yl)-{4-(4,4,5,5-tetramethyl-[1,3,2]dioxaborolan-2-yl)phenyl}-(phenyl-$d_5$)amine was replaced with 2-{(9,9-dimethyl-9H-fluoren-2-yl)-phenylamino}-phenylboronic acid. As a result, a white powder of 2,2"-bis{(9,9-dimethyl-9H-fluoren-2-yl)-phenylamino}-1,1':4',1"-terphenyl (Compound 1-75; 13.7 g; yield 76%) was obtained.

The structure of the obtained white powder was identified by NMR.

$^1$H-NMR (THF-de) detected 48 hydrogen signals, as follows.

δ (ppm)=7.53 (2H), 7.35-6.81 (30H), 6.76 (2H), 6.67 (2H), 1.29 (12H).

[Chemical Formula 100]

(1-75)

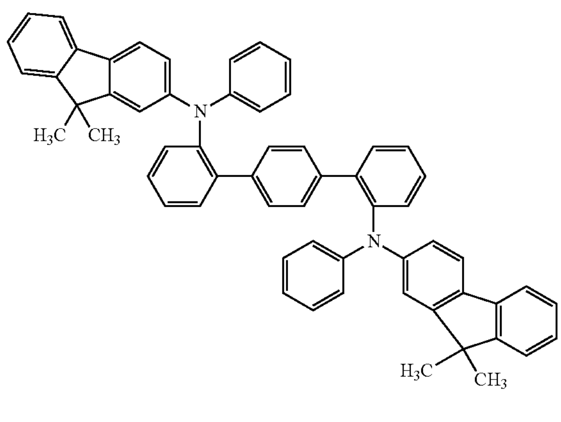

Example 34

Synthesis of 2,2"-bis{bis(biphenyl-4-yl)amino}-1,1':4',1"-terphenyl (Compound 1-76)

The reaction was carried out under the same conditions as those of Example 15, except that 1,3-dibromobenzene was replaced with 1,4-dibromobenzene, and (biphenyl-4-yl)-{4-(4,4,5,5-tetramethyl-[1,3,2]dioxaborolan-2-yl)phenyl}-(phenyl-$d_5$)amine was replaced with 2-{bis(biphenyl-4-yl)amino}-phenylboronic acid. As a result, a white powder of 2,2"-bis{bis(biphenyl-4-yl)amino}-1,1':4',1"-terphenyl (Compound 1-76; 15.7 g; yield 78%) was obtained.

The structure of the obtained white powder was identified by NMR.

$^1$H-NMR (THF-de) detected 4.8 hydrogen signals, as follows.

δ (ppm)=7.51-7.45 (8H), 7.33-7.18 (28H), 7.00 (4H), 6.90-6.82 (8H).

[Chemical Formula 101]

(1-76)

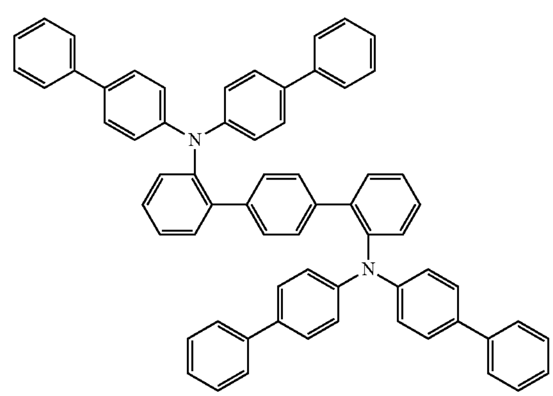

Example 35

Synthesis of 2-{(9,9-dimethyl-9H-fluoren-2-yl)-phenylamino}-2"-[{4-(naphthalen-1-yl)phenyl}-phenylamino]-1,1':4',1"-terphenyl (Compound 1-81)

The reaction was carried out under the same conditions as those of Example 18, except that 4-bromo-4'-{(biphenyl-4-yl)-phenylamino}-biphenyl was replaced with 4-bromo-2'-{4-(naphthalen-1-yl)phenyl}-phenylamino}-biphenyl, and (biphenyl-4-yl)-{2-(4,4,5,5-tetramethyl-[1,3,2]dioxaborolan-2-yl)phenyl}-phenylamine was replaced with 2-{(9,9-dimethyl-9H-fluoren-2-yl)-phenylamino}-phenylboronic acid. As a result, a white powder of 2-{(9,9-dimethyl-9H-fluoren-2-yl)-phenylamino}-2"-[{4-(naphthalen-1-yl)phenyl}-phenylamino]-1,1':4',1"-terphenyl (Compound 1-81; 7.3 g; yield 48%) was obtained.

The structure of the obtained white powder was identified by NMR.

$^1$H-NMR (THF-de) detected 46 hydrogen signals, as follows.

δ (ppm)=7.89-7.76 (3H), 7.55-6.69 (37H), 1.29 (6H).

[Chemical Formula 102]

(1-81)

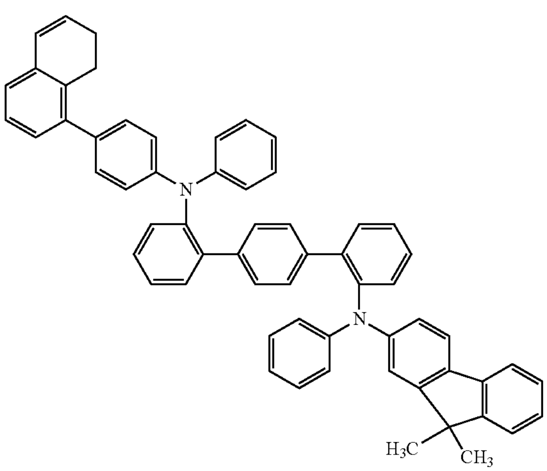

Example 36

Synthesis of 4,4"-bis{N-phenyl-N-(2-phenyl-biphenyl-4-yl)amino}-1,1'; 4',1"-terphenyl (Compound 1-103)

4,4"-diiodo-1,1';4',1"-terphenyl (13.0 g), N-phenyl-N-(2-phenyl-biphenyl-4-yl)amine (20.0 g), copper powder (0.18 g), potassium carbonate (11.3 g), 3,5-di-tert-butylsalicylic acid (0.7 g), sodium bisulfite (0.86 g), and dodecylbenzene (30 mL) were added into a nitrogen-substituted reaction vessel, and heated and stirred for 24 hours at 210° C. After cooling, xylene (30 mL) and methanol (60 mL) were added, and then a solid matter was collected by filtration. Toluene (250 mL) and silica gel (20 g) were added to the solid matter, and after stirring while heating to 90° C., insoluble matters were removed by hot filtration. After concentration, a crude product deposited by adding ethyl acetate and methanol was collected, and subjected to recrystallization from chlorobenzene and reflux washing with methanol, so as to obtain 16.9 g of white powder of 4,4"-bis{N-phenyl-N-(2-phenyl-biphenyl-4-yl)amino}-1,1';4',1"-terphenyl (Compound 1-103) (yield: 72%).

[Chemical Formula 103]

(1-103)

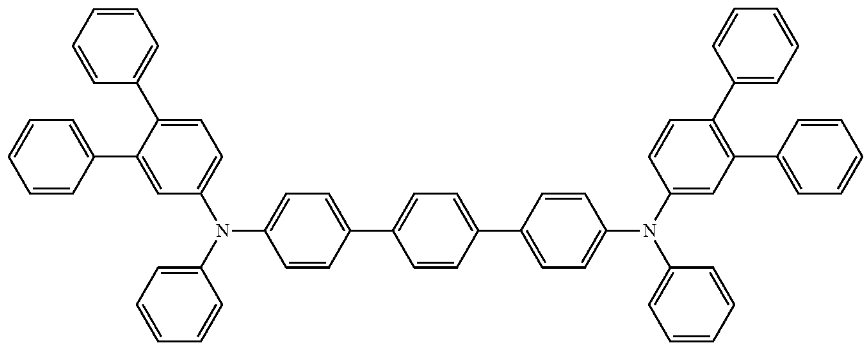

The structure of the obtained white powder was identified by NMR.

$^1$H-NMR ($CDCl_3$) detected 48 hydrogen signals, as follows.

δ (ppm)=7.68 (4H), 7.62-7.55 (4H), 7.39-7.06 (40H).

Example 37

Synthesis of 4,4"-bis{N-phenyl-N-(2-phenyl-biphenyl-4-yl)amino}-1,1';2',1"-terphenyl (Compound 1-104)

The reaction was carried out under the same conditions as those of Example 19, except that 4,4"-dibromo-1,1':3',1"-terphenyl was replaced with 4,4"-dibromo-1,1':2',1"-terphenyl, and (triphenylen-2-yl)phenylamine was replaced with N-phenyl-N-(2-phenyl-biphenyl-4-yl)amine. As a result, 4.3 g of white powder of 4,4"-bis{N-phenyl-N-(2-phenyl-biphenyl-4-yl)amino}-1,1';2',1"-terphenyl (Compound 1-104) (yield: 42%) was obtained.

[Chemical Formula 104]

(1-104)

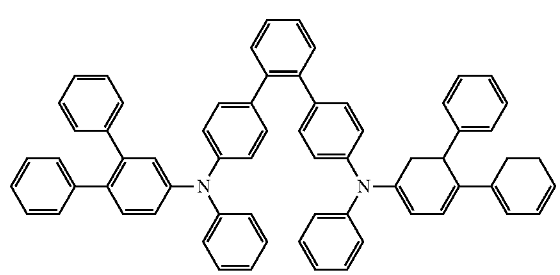

The structure of the obtained white powder was identified by NMR.

$^1$H-NMR ($CDCl_3$) detected 48 hydrogen signals, as follows.

δ (ppm)=7.50-7.39 (4H), 7.31-6.97 (44H).

Example 38

Synthesis of 4,4"-bis{N-phenyl-N-(2-phenyl-biphenyl-4-yl)amino}-1,1';3',1"-terphenyl (Compound 1-105)

The reaction was carried out under the same conditions as those of Example 19, except that (triphenylen-2-yl)phenylamine was replaced with N-phenyl-N-(2-phenyl-biphenyl-4-yl)amine. As a result, 7.7 g of white powder of 4,4"-bis{N-phenyl-N-(2-phenyl-biphenyl-4-yl)amino}-1,1';3',1"-terphenyl (Compound 1-105) (yield: 53%) was obtained.

[Chemical Formula 105]

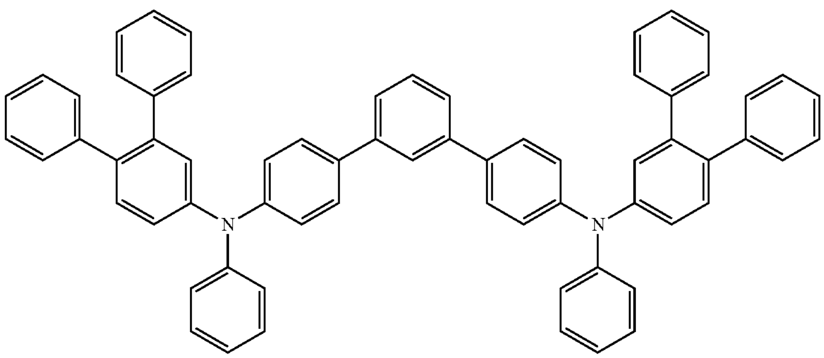

(1-105)

The structure of the obtained pale yellow powder was identified by NMR.

$^1$H-NMR ($CDCl_3$) detected 48 hydrogen signals, as follows.

δ (ppm)=7.81 (2H), 7.61-7.48 (14H), 7.39-7.06 (32H).

Example 39

The melting points and the glass transition points of the arylamine compounds of the general formula (1) were measured using a high-sensitive differential scanning calorimeter (DSC3100SA produced by Bruker AXS).

| | Melting point | Glass transition point |
|---|---|---|
| Compound of Example 1 | 263° C. | 111° C. |
| Compound of Example 2 | 210° C. | 113° C. |
| Compound of Example 3 | 265° C. | 111° C. |
| Compound of Example 4 | 279° C. | 107° C. |
| Compound of Example 5 | 266° C. | 104° C. |
| Compound of Example 6 | 263° C. | 111° C. |
| Compound of Example 7 | 262° C. | 117° C. |
| Compound of Example 8 | 303° C. | 149° C. |
| Compound of Example 10 | 365° C. | 163° C. |
| Compound of Example 11 | 289° C. | 138° C. |
| Compound of Example 13 | No melting point observed | 125° C. |
| Compound of Example 14 | 252° C. | 108° C. |
| Compound of Example 15 | 252° C. | 108° C. |
| Compound of Example 16 | No melting point observed | 106° C. |
| Compound of Example 17 | No melting point observed | 135° C. |
| Compound of Example 18 | No melting point observed | 107° C. |

-continued

| | Melting point | Glass transition point |
|---|---|---|
| Compound of Example 19 | 323° C. | 159° C. |
| Compound of Example 20 | 290° C. | 146° C. |
| Compound of Example 21 | No melting point observed | 119° C. |
| Compound of Example 22 | No melting point observed | 106° C. |
| Compound of Example 23 | No melting point observed | 118° C. |

-continued

| | Melting point | Glass transition point |
|---|---|---|
| Compound of Example 24 | No melting point observed | 133° C. |
| Compound of Example 25 | No melting point observed | 136° C. |
| Compound of Example 26 | 286° C. | 124° C. |
| Compound of Example 27 | No melting point observed | 117° C. |
| Compound of Example 28 | 218° C. | 114° C. |
| Compound of Example 29 | No melting point observed | 127° C. |
| Compound of Example 31 | No melting point observed | 110° C. |
| Compound of Example 32 | No melting point observed | 122° C. |
| Compound of Example 33 | 269° C. | 117° C. |
| Compound of Example 34 | 277° C. | 122° C. |
| Compound of Example 35 | No melting point observed | 117° C. |
| Compound of Example 36 | 249° C. | 124° C. |
| Compound of Example 37 | No melting point observed | 115° C. |
| Compound of Example 38 | No melting point observed | 122° C. |

The arylamine compounds of the general formula (1) have glass transition points of 100° C. or higher, demonstrating that the compounds have a stable thin-film state.

Example 40

A 100 nm-thick vapor-deposited film was fabricated on an ITO substrate using the arylamine compounds of the general formula (1), and a work function was measured using an ionization potential measuring device (PYS-202 produced by Sumitomo Heavy Industries, Ltd.).

| | Work function |
|---|---|
| Compound of Example 1 | 5.65 eV |
| Compound of Example 3 | 5.65 eV |
| Compound of Example 4 | 5.67 eV |
| Compound of Example 5 | 5.66 eV |
| Compound of Example 6 | 5.69 eV |
| Compound of Example 7 | 5.63 eV |
| Compound of Example 8 | 5.70 eV |
| Compound of Example 9 | 5.72 eV |
| Compound of Example 10 | 5.62 eV |
| Compound of Example 11 | 5.61 eV |
| Compound of Example 12 | 5.62 eV |
| Compound of Example 13 | 5.67 eV |
| Compound of Example 14 | 5.75 eV |
| Compound of Example 15 | 5.75 eV |
| Compound of Example 16 | 5.79 eV |
| Compound of Example 17 | 5.68 eV |
| Compound of Example 18 | 5.76 eV |
| Compound of Example 19 | 5.70 eV |
| Compound of Example 20 | 5.79 eV |
| Compound of Example 21 | 5.71 eV |
| Compound of Example 22 | 5.79 eV |
| Compound of Example 23 | 5.72 eV |
| Compound of Example 24 | 5.70 eV |
| Compound of Example 25 | 5.71 eV |
| Compound of Example 26 | 5.65 eV |
| Compound of Example 27 | 5.70 eV |
| Compound of Example 28 | 5.67 eV |
| Compound of Example 29 | 5.69 eV |
| Compound of Example 30 | 5.75 eV |
| Compound of Example 31 | 5.84 eV |
| Compound of Example 32 | 5.76 eV |
| Compound of Example 33 | 5.72 eV |
| Compound of Example 34 | 5.67 eV |
| Compound of Example 35 | 5.76 eV |
| Compound of Example 36 | 5.67 eV |
| Compound of Example 37 | 5.75 eV |
| Compound of Example 38 | 5.76 eV |

As the results show, the arylamine compounds of the general formula. (1) have desirable energy levels compared to the work function 5.4 eV of common hole transport materials such as NPD and TPD, and thus possess desirable hole transportability.

Example 41

Synthesis of N5',N5',N9',N9'-tetrakis{4-(tert-butyl) phenyl}spiro(fluorene-9,7'-fluoreno[4,3-b]benzofuran)-5',9'-diamine (Compound 8-1)

5',9'-dibromospiro(fluorene-9,7'-fluoreno[4,3-b]benzofuran) (5.0 g), bis{4-(tert-butyl)phenyl}amine (6.0 g), palladium acetate (0.08 g), sodium tert-butoxide (3.4 g), tri-tert-butylphosphine (0.07 g), and toluene (60 mL) were added into a nitrogen-substituted reaction vessel, and heated and refluxed for 2 hours while being stirred. After the mixture was cooled to a room temperature, dichloromethane and water were added, and an organic layer was collected by liquid separation. The organic layer was concentrated and then purified by column chromatography to obtain 3.1 g of powder of N5',N5',N9',N9'-tetrakis{4-(tert-butyl) phenyl}spiro(fluorene-9,7'-fluoreno[4,3-b]benzofuran)-5',9'-diamine (Compound 8-1) (yield: 36%).

[Chemical Formula 106]

(8-1)

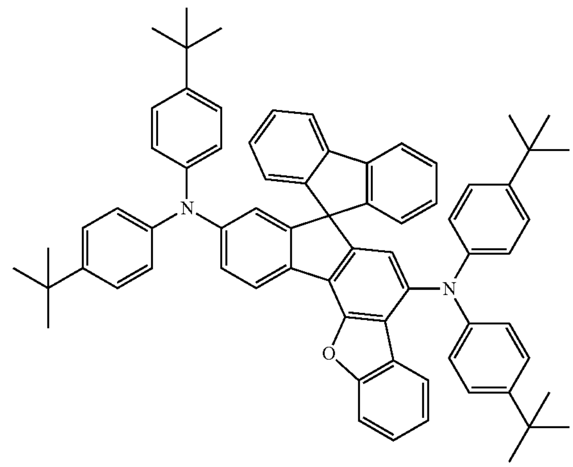

Example 42

Synthesis of N2,N2,N7,N7-tetrakis{4-(tert-butyl) phenyl}spiro(dibenzo[5, 6:7,8]fluoreno[4,3-b]benzofuran-5,9'-fluorene)-2,7-diamine (Compound 8-2)

The reaction was carried out under the same conditions as those of Example 41, except that 5',9'-dibromospiro(fluorene-9,7'-fluoreno[4,3-b]benzofuran was replaced with 2,7-dibromospiro(dibenzo[5,6:7,8]fluoreno[4,3-b]benzofuran-5,9'-fluorene). As a result, 2.5 g of powder of N2,N2,N7,N7-tetrakis{4-(tert-butyl)phenyl}spiro(dibenzo[5, 6:7,8]fluoreno[4,3-b]benzofuran-5,9'-fluorene)-2,7-diamine (Compound 8-2) (yield: 31%) was obtained.

[Chemical Formula 107]

(8-2)

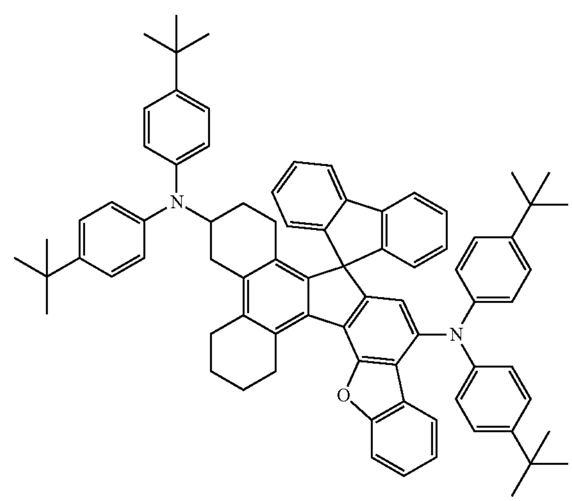

Example 43

Synthesis of N5,N5,N9,N9-tetrakis{4-(tert-butyl)phenyl}spiro(benzo[5,6]fluoreno[4,3-b]benzofuran-7,9'-fluorene)-5,9-diamine (Compound 8-3)

The reaction was carried out under the same conditions as those of Example 41, except that 5',9'-dibromospiro(fluorene-9,7'-fluoreno[4,3-b]benzofuran was replaced with 5,9-dibromospiro(benzo[5,6]fluoreno[4,3-b]benzofuran-7,9'-fluorene). As a result, 3.0 g of powder of N5,N5, N9,N9-tetrakis {4-(tert-butyl)phenyl}spiro(benzo[5,6]fluoreno[4,3-b]benzofuran-7,9'-fluorene)-5,9-diamine (Compound 8-3) (yield: 36%) was obtained.

[Chemical Formula 108]

(8-3)

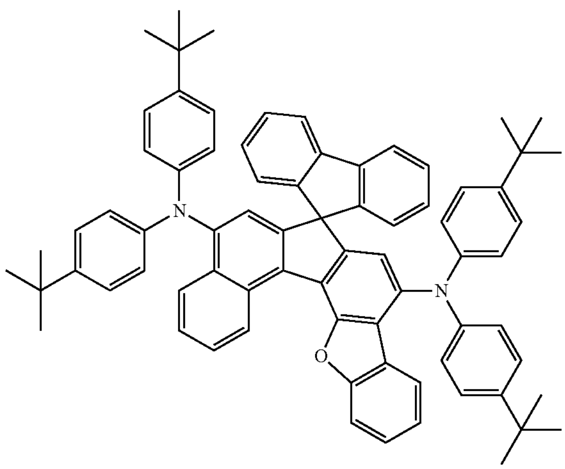

Example 44

Synthesis of N6',N6',N10',N10'-tetrakis{4-(tert-butyl)phenyl}spiro(fluorene-9,8'-fluoreno[4,3-b]benzofuran)-6',10'-diamine (Compound 8-4)

The reaction was carried out under the same conditions as those of Example 41, except that 5',9'-dibromospiro(fluorene-9,7'-fluoreno[4,3-b]benzofuran was replaced with 6',10'-dibromospiro(fluorene-9,8'-fluoreno[4,3-b]benzofuran). As a result, 2.5 g of powder of N6',N6',N10',N10'-tetrakis{4-(tert-butyl)phenyl}spiro(fluorene-9,8'-fluoreno[4,3-b]benzofuran)-6',10'-diamine (Compound 8-4) (yield: 34%) was obtained.

[Chemical Formula 109]

(8-4)

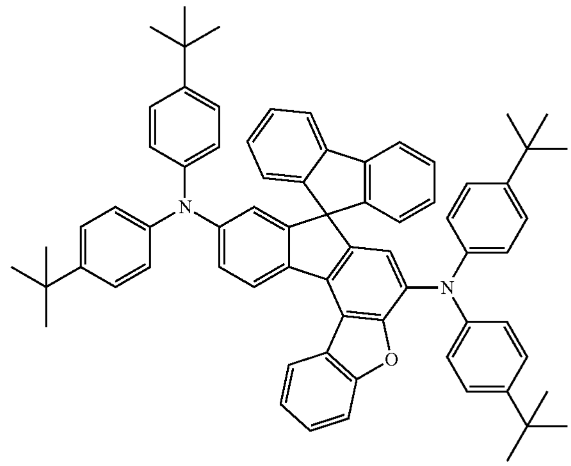

Example 45

Synthesis of N5,N5,N9,N9-tetrakis{4-(tert-butyl)phenyl}spiro(fluoreno[4,3-b]benzofuran-7,9'-xanthene)-5,9-diamine (Compound 8-5)

The reaction was carried out under the same conditions as those of Example 41, except that 5',9'-dibromospiro(fluorene-9,7'-fluoreno[4,3-b]benzofuran was replaced with 5,9-dibromospiro(fluoreno[4,3-b]benzofuran-7,9'-xanthene). As a result, 2.4 g of powder of N5,N5,N9,N9-tetrakis{4-(tert-butyl)phenyl}spiro(fluoreno[4,3-b]benzofuran-7,9'-xanthene)-5,9-diamine (Compound 8-5) (yield: 28%) was obtained.

[Chemical Formula 110]

(8-5)

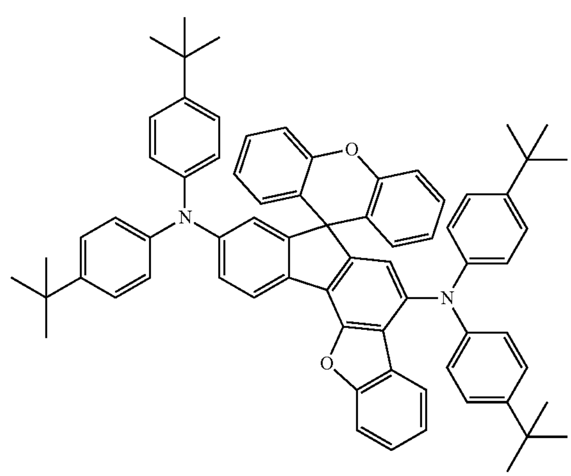

Example 46

Synthesis of N5',N9'-bis(biphenyl-4-yl)-N5',N9'-bis{4-(tert-butyl)phenyl}-2-fluorospiro(fluorene-9,7'-fluoreno[4,3-b]benzofuran)-5',9'-diamine (Compound 8-6)

The reaction was carried out under the same conditions as those of Example 41, except that 5',9'-dibromospiro(fluorene-9,7'-fluoreno[4,3-b]benzofuran) was replaced with 5',9'-dibromo-2-fluorospiro(fluorene-9,7'-fluoreno[4,3-b]benzofuran), and bis{4-(tert-butyl)phenyl}amine was replaced with (biphenyl-4-yl)-{4-(tert-butyl)phenyl}amine. As a result 2.4 g of powder of N5',N9'-bis(biphenyl-4-yl)-N5',N9'-bis{4-(tert-butyl)phenyl}-2-fluorospiro(fluorene-9,7'-fluoreno[4,3-b]benzofuran)-5',9'-diamine (Compound 8-6) (yield: 28%) was obtained.

[Chemical Formula 111]

(8-6)

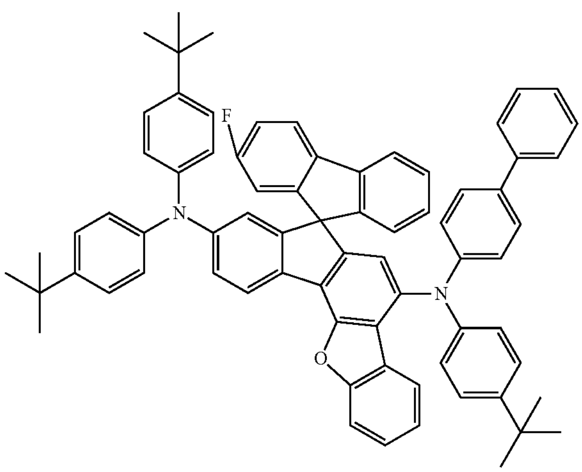

Example 47

Synthesis of N5,N9-bis{4-(tert-butyl)phenyl}-N5,N9-bis{4-(trimethylsilyl)phenyl}spiro(benzo[5,6]fluoreno[4,3-b]benzofuran-7,9'-fluorene)-5,9-diamine (Compound 8-7)

The reaction was carried out under the same conditions as those of Example 41, except that 5',9'-dibromospiro(fluorene-9,7'-fluoreno[4,3-b]benzofuran was replaced with 5,9-dibromospiro(benzo[5,6]fluoreno[4,3-b]benzofuran-7,9'-fluorene), and bis{4-(tert-butyl)phenyl}amine was replaced with {4-(tert-butyl)phenyl}-{4-(trimethylsilyl)phenyl}amine. As a result, 3.0 g of powder of N5,N9-bis{4-(tert-butyl)phenyl}-N5,N9-bis{4-(trimethylsilyl)phenyl}spiro(benzo[5,6]fluoreno[4,3-b]benzofuran-7,9'-fluorene)-5,9-diamine (Compound 8-7) (yield: 35%) was obtained.

[Chemical Formula 112]

(8-7)

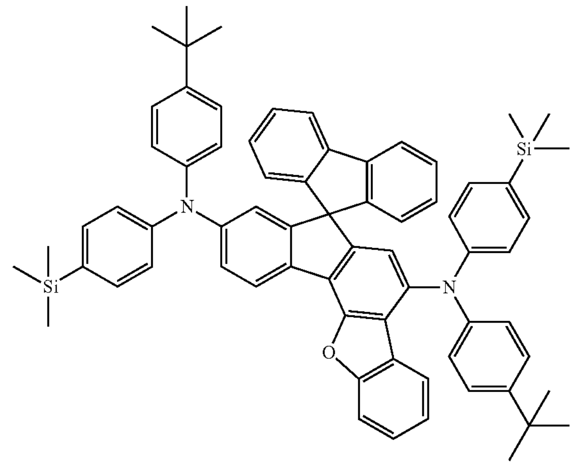

Example 48

Synthesis of N5',N9'-bis{4-(tert-butyl)phenyl}-N5',N9'-bis{4-(trimethyl silyl)phenyl}spiro(fluorene-9,7'-fluoreno[4,3-b]benzothiophene)-5',9'-diamine (Compound 8-8)

The reaction was carried out under the same conditions as those of Example 41, except that 5',9'-dibromospiro(fluorene-9,7'-fluoreno[4,3-b]benzofuran was replaced with 5',9'-dibromospiro(fluorene-9,7'-fluoreno[4,3-b]benzothiophene), and bis{4-(tert-butyl)phenyl}amine was replaced with {4-(tert-butyl)phenyl}-{4-(trimethylsilyl)phenyl}amine. As a result, 3.2 g of powder of N5',N9'-bis{4-(tert-butyl)phenyl}-N5',N9'-bis{4-(trimethyl silyl)phenyl}spiro(fluorene-9,7'-fluoreno[4,3-b]benzothiophene)-5',9'-diamine (Compound 8-8) (yield: 37%) was obtained.

[Chemical Formula 113]

(8-8)

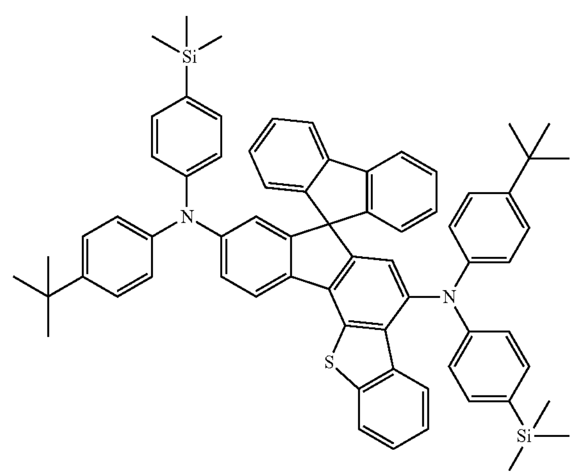

Example 49

Synthesis of N5,N9-bis(biphenyl-4-yl)-N5,N9-bis{4-(tert-butyl)phenyl}spiro(benzo[4',5']thieno[2',3':5,6]fluoreno[4,3-b]benzofuran-7,9'-fluorene)-5,9-diamine (Compound 8-9)

The reaction was carried out under the same conditions as those of Example 41, except that 5',9'-dibromospiro(fluorene-9,7'-fluoreno[4,3-b]benzofuran was replaced with 5,9-dibromospiro(benzo[4',5']thieno[2',3':5,6]fluoreno[4,3-b]benzofuran-7,9'-fluorene), and bis{4-(tert-butyl)phenyl}amine was replaced with {4-(tert-butyl)phenyl}-{biphenyl-4-yl}amine. As a result, 2.8 g of powder of N5,N9-bis(biphenyl-4-yl)-N5,N9-bis{4-(tert-butyl)phenyl}spiro(benzo[4',5']thieno[2',3':5,6]fluoreno[4,3-b]benzofuran-7,9'-fluorene)-5,9-diamine (Compound 8-9) (yield: 34%) was obtained.

[Chemical Formula 114]

(8-9)

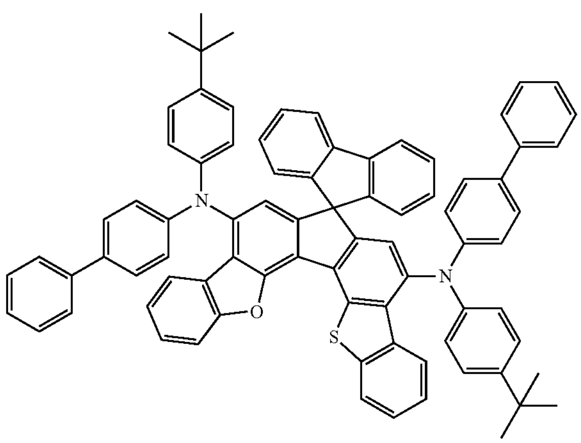

Example 50

Synthesis of N5',N5',N9',N9'-tetrakis{4-(tert-butyl)phenyl}-12',12'-dim ethyl-12'H-spiro(fluorene-9,7'-indeno[1,2-a]fluorene)-5',9'-diamine (Compound 8-10)

The reaction was carried out under the same conditions as those of Example 41, except that 5',9'-dibromospiro(fluorene-9,7'-fluoreno[4,3-b]benzofuran was replaced with 5',9'-dibromo-12',12'-dimethyl-12'H-spiro(fluorene-9,7'-indeno[1,2-a]fluorene). As a result, 1.8 g of powder of N5',N5',N9',N9'-tetrakis{4-(tert-butyl)phenyl}-12',12'-dim ethyl-12'H-spiro(fluorene-9,7'-indeno[1,2-a]fluorene)-5',9'-diamine (Compound 8-10) (yield: 49%) was obtained.

[Chemical Formula 115]

(8-10)

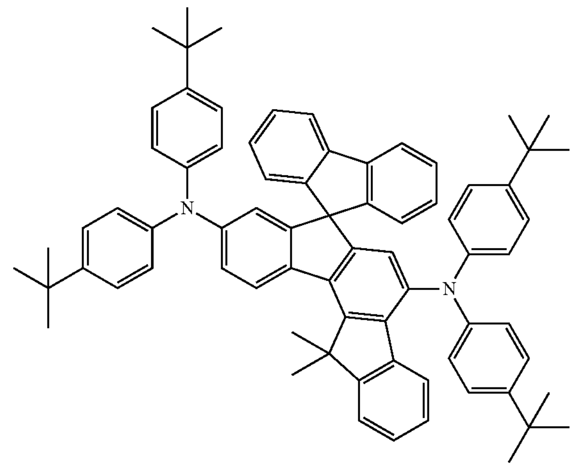

Example 51

Synthesis of N6',N10'-bis(biphenyl-4-yl)-N6',N10'-bis{4-(tert-butyl)phenyl}-5'-methyl-5'H-spiro(fluorene-9,8'-indeno[2,1-c]carbazole)-6',10'-diamine (Compound 8-11)

The reaction was carried out under the same conditions as those of Example 41, except that 5',9'-dibromospiro(fluorene-9,7'-fluoreno[4,3-b]benzofuran was replaced with 6',10'-dibromo-5'-methyl-5'H-spiro(fluorene-9,8'-indeno[2,1-c]carbazole), and bis{4-(tert-butyl)phenyl}amine was replaced with {4-(tert-butyl)phenyl}-{biphenyl-4-yl}amine. As a result, 2.3 g of powder of N6',N10'-bis(biphenyl-4-yl)-N6',N10'-bis{4-(tert-butyl)phenyl}-5'-methyl-5'H-spiro(fluorene-9,8'-indeno[2,1-c]carbazole)-6',10'-diamine (Compound 8-11) (yield: 41%) was obtained.

[Chemical Formula 116]

(8-11)

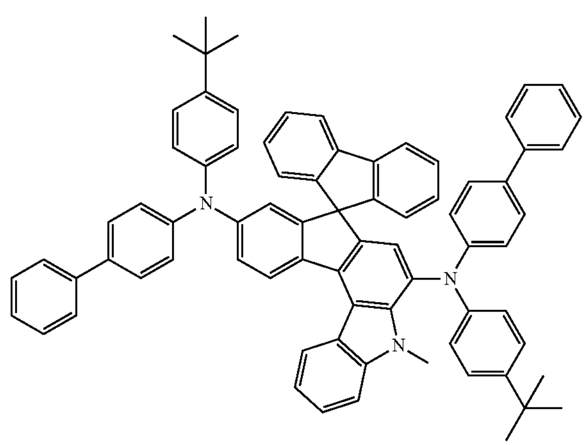

Example 52

The organic EL device, as shown in FIG. 1, was fabricated by vapor-depositing a hole injection layer 3, a hole transport layer 4, a light emitting layer 5, an electron transport layer 6, an electron injection layer 7, and a cathode (aluminum electrode) 8 in this order on a glass substrate 1 on which an ITO electrode was formed as a transparent anode 2 beforehand.

Specifically, the glass substrate 1 having ITO having a film thickness of 150 nm formed thereon was subjected to ultrasonic washing in isopropyl alcohol for 20 minutes and then dried for 10 minutes on a hot plate heated to 200° C. Thereafter, after performing an UV ozone treatment for 15 minutes, the glass substrate with ITO was installed in a vacuum vapor deposition apparatus, and the pressure was reduced to 0.001 Pa or lower. Subsequently, as the hole injection layer 3 covering the transparent anode 2, an electron acceptor (Acceptor-1) of the structural formula below and Compound (1-1) of Example 1 were formed in a film thickness of 30 nm by dual vapor deposition at a vapor deposition rate ratio of Acceptor-1/Compound (1-1)=3/97. As the hole transport layer 4 on the hole injection layer 3, Compound 1-1 of Example 1 was formed in a film thickness of 40 nm. As the light emitting layer 5 on the hole transport layer 4, Compound EMD-1 of the structural formula below and Compound EMH-1 of the structural formula below were formed in a film thickness of 20 nm by dual vapor deposition at a vapor deposition rate ratio of EMD-1/EMH-1-5/95. As the electron transport layer 6 on the light emitting layer 5, Compound (5b-1) having an anthracene ring structure of the structural formula below and Compound ETM-1 of the structural formula below were formed in a film thickness of 30 nm by dual vapor deposition at a vapor deposition rate ratio of Compound (5b-1)/ETM-1-50/50. As the electron injection layer 7 on the electron transport layer 6, lithium fluoride was formed in a film thickness of 1 nm. Finally, aluminum was vapor-deposited in a thickness of 100 nm to form the cathode 8. The characteristics of the thus fabricated organic EL device were measured in the atmosphere at an ordinary temperature. Table 1 summarizes the results of the measurement of emission characteristics performed by applying a direct current voltage to the fabricated organic EL device.

[Chemical Formula 117]

(Acceptor-1)

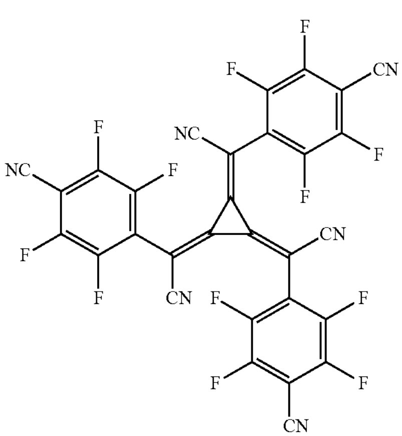

-continued

[Chemical Formula 118]

(1-1)

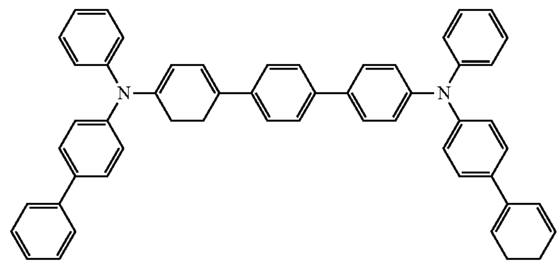

[Chemical Formula 119]

(EMD-1)

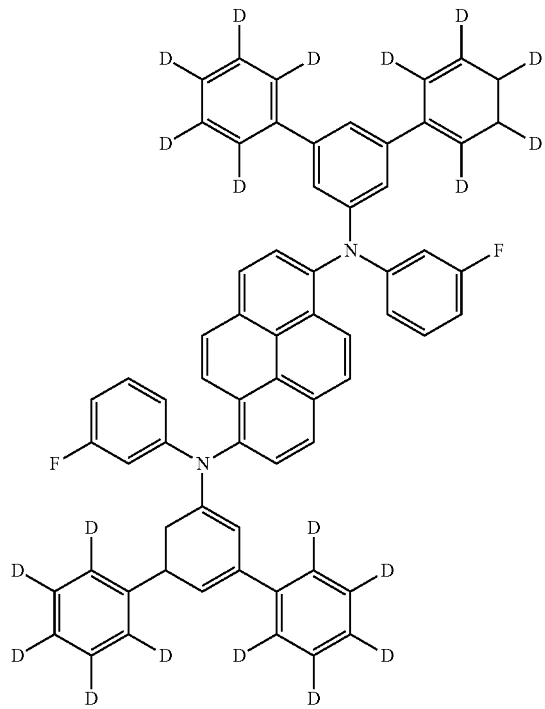

[Chemical Formula 120]

(EMH-1)

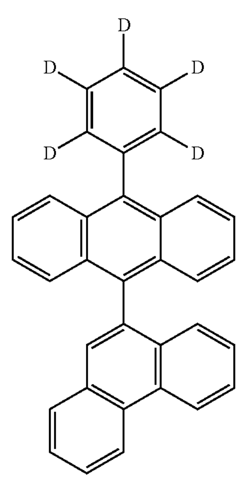

-continued

[Chemical Formula 121]

(5b-1)

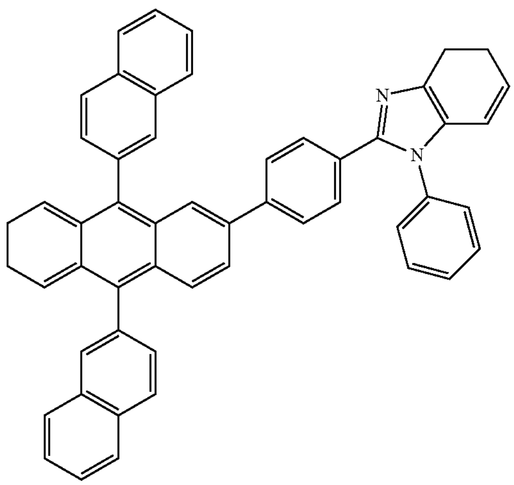

[Chemical Formula 122]

(ETM-1)

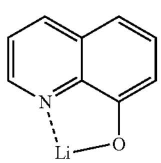

Example 53

An organic EL device was fabricated under the same conditions used in Example 52, except that Compound (6-125) having a pyrimidine ring structure was used as the material of the electron transport layer 6 instead of Compound (5b-1) having an anthracene ring structure, and Compound (6-125) and Compound ETM-1 of the above structural formula were formed in a film thickness of 30 nm by dual vapor deposition at a vapor deposition rate ratio of Compound (6-125)/ETM-1-50/50. The characteristics of the thus fabricated organic EL device were measured in the atmosphere at an ordinary temperature. Table 1 summarizes the results of the measurement of emission characteristics performed by applying a direct current voltage to the fabricated organic EL device.

[Chemical Formula 123]

(6-125)

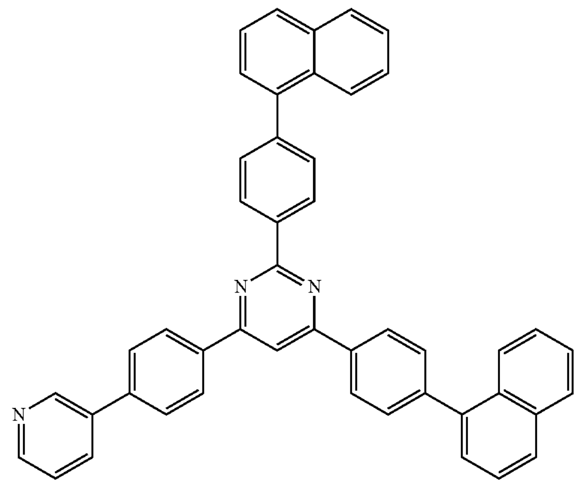

Example 54

An organic EL device was fabricated under the same conditions used in Example 52, except that the amine derivative (8-1) having a condensed ring structure was used as the material of the light emitting layer 5 instead of Compound EMD-1 of the above structural formula, and the amine derivative (8-1) having a condensed ring structure and Compound EMH-1 of the above structural formula were formed in a film thickness of 25 nm by dual vapor deposition at a vapor deposition rate ratio of amine derivative (8-1)/EMH-1-5/95. The characteristics of the thus fabricated organic EL device were measured in the atmosphere at an ordinary temperature. Table 1 summarizes the results of the measurement of emission characteristics performed by applying a direct current voltage to the fabricated organic EL device.

[Chemical Formula 124]

(8-1)

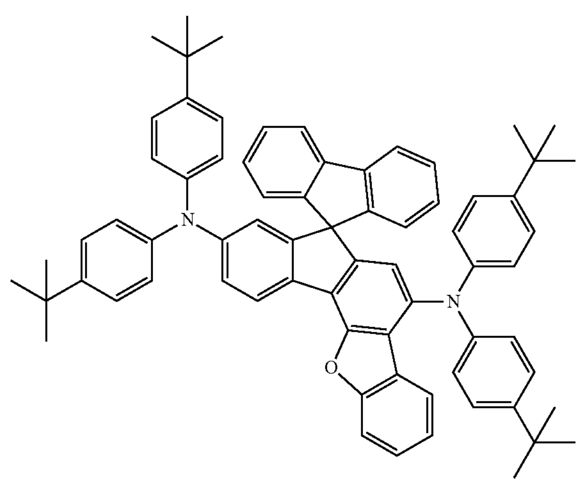

Example 55

An organic EL device was fabricated under the same conditions used in Example 53, except that the amine derivative (8-1) having a condensed ring structure was used as the material of the light emitting layer 5 instead of Compound EMD-1 of the above structural formula, and the amine derivative (8-1) having a condensed ring structure and Compound EMH-1 of the above structural formula were formed in a film thickness of 25 nm by dual vapor deposition at a vapor deposition rate ratio of amine derivative (8-1)/EMH-1-5/95. The characteristics of the thus fabricated organic EL device were measured in the atmosphere at an ordinary temperature. Table 1 summarizes the results of the measurement of emission characteristics performed by applying a direct current voltage to the fabricated organic EL device.

Example 56

An organic EL device was fabricated under the same conditions used in Example 52, except that Compound (1-2) of Example 4 was used as the material of the hole injection layer instead of Compound (1-1) of Example 1, and the electron acceptor (Acceptor-1) of the above structural formula and Compound (1-2) of Example 4 were formed in a film thickness of 30 nm by dual vapor deposition at a vapor deposition rate ratio of Acceptor-1/Compound (1-2)=3/97, and Compound (1-2) of Example 4 was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

[Chemical Formula 125]

(1-2)

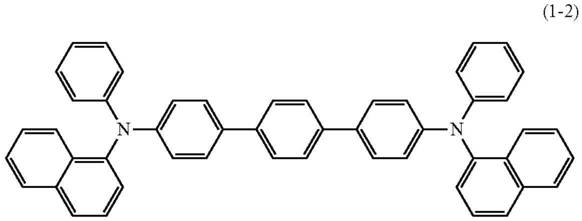

An organic EL device was fabricated under the same conditions used in Example 53, except that Compound (1-2) of Example 4 was used as the material of the hole injection layer 3 instead of Compound (1-1) of Example 1, and the electron acceptor (Acceptor-1) of the above structural formula and Compound (1-2) of Example 4 were formed in a film thickness of 30 nm by dual vapor deposition at a vapor deposition rate ratio of Acceptor-1/Compound (1-2)=3/97, and Compound (1-2) of Example 4 was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

Example 58

An organic EL device was fabricated under the same conditions used in Example 54, except that Compound (1-2) of Example 4 was used as the material of the hole injection layer 3 instead of Compound (1-1) of Example 1, and the electron acceptor (Acceptor-1) of the above structural formula and Compound (1-2) of Example 4 were formed in a film thickness of 30 nm by dual vapor deposition at a vapor deposition rate ratio of Acceptor-1/Compound (1-2)=3/97, and Compound (1-2) of Example 4 was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

Example 59

An organic EL device was fabricated under the same conditions used in Example 55, except that Compound (1-2) of Example 4 was used as the material of the hole injection layer 3 instead of Compound (1-1) of Example 1, and the electron acceptor (Acceptor-1) of the above structural formula and Compound (1-2) of Example 4 were formed in a film thickness of 30 nm by dual vapor deposition at a vapor deposition rate ratio of Acceptor-1/Compound (1-2)=3/97, and Compound (1-2) of Example 4 was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

Comparative Example 1

For comparison, an organic EL device was fabricated under the same conditions used in Example 52, except that HTM-1 of the structural formula below was used as the material of the hole injection layer 3 instead of Compound (1-1) of Example 1, and the electron acceptor (Acceptor-1) of the above structural formula and HTM-1 of the structural formula below were formed in a film thickness of 30 nm by dual vapor deposition at a vapor deposition rate ratio of Acceptor-1/HTM-1-3/97, and HTM-1 of the structural formula below was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

[Chemical Formula 126]

(HTM-1)

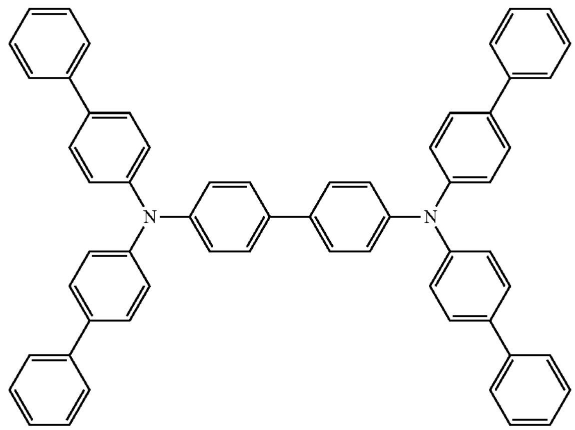

Comparative Example 2

For comparison, an organic EL device was fabricated under the same conditions used in Example 53, except that HTM-1 of the above structural formula was used as the material of the hole injection layer 3 instead of Compound (1-1) of Example 1, and the electron acceptor (Acceptor-1) of the above structural formula and HTM-1 of the above structural formula were formed in a film thickness of 30 nm by dual vapor deposition at a vapor deposition rate ratio of Acceptor-1/HTM-1-3/97, and HTM-1 of the above structural formula was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

Comparative Example 3

For comparison, an organic EL device was fabricated under the same conditions used in Example 54, except that HTM-1 of the above structural formula was used as the material of the hole injection layer 3 instead of Compound (1-1) of Example 1, and the electron acceptor (Acceptor-1) of the above structural formula and HTM-1 of the above structural formula were formed in a film thickness of 30 nm by dual vapor deposition at a vapor deposition rate ratio of Acceptor-1/HTM-1-3/97, and HTM-1 of the above structural formula was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

Comparative Example 4

For comparison, an organic EL device was fabricated under the same conditions used in Example 55, except that HTM-1 of the above structural formula was used as the material of the hole injection layer 3 instead of Compound (1-1) of Example 1, and the electron acceptor (Acceptor-1) of the above structural formula and HTM-1 of the above structural formula were formed in a film thickness of 30 nm by dual vapor deposition at a vapor deposition rate ratio of Acceptor-1/HTM-1-3/97, and HTM-1 of the above structural formula was used as the material of the hole transport layer 4 instead of Compound (1-1) of Example 1, and formed in a film thickness of 40 nm. The characteristics of the thus fabricated organic EL device were measured in the atmosphere at an ordinary temperature. Table 1 summarizes the results of the measurement of emission characteristics performed by applying a direct current voltage to the fabricated organic EL device.

Comparative Example 5

For comparison, an organic EL device was fabricated under the same conditions used in Example 53, except that the electron acceptor (Acceptor-1) of the above structural formula and Compound (1-1) of Example 1 were used as the material of the hole transport layer 4 instead of Compound (1-1) of Example 1, and the electron acceptor (Acceptor-1) of the above structural formula and Compound (1-1) of Example 1 were formed in a film thickness of 40 nm by dual vapor deposition at a vapor deposition rate ratio of Acceptor-1/Compound (1-1)=3/97. The characteristics of the thus fabricated organic EL device were measured in the atmosphere at an ordinary temperature. Table 1 summarizes the results of the measurement of emission characteristics performed by applying a direct current voltage to the fabricated organic EL device.

Comparative Example 6

For comparison, an organic EL device was fabricated under the same conditions used in Example 55, except that the electron acceptor (Acceptor-1) of the above structural formula and Compound (1-1) of Example 1 were used as the material of the hole transport layer 4 instead of Compound (1-1) of Example 1, and the electron acceptor (Acceptor-1) of the above structural formula and Compound (1-1) of Example 1 were formed in a film thickness of 40 nm by dual vapor deposition at a vapor deposition rate ratio of Acceptor-1/Compound (1-1)=3/97. The characteristics of the thus fabricated organic EL device were measured in the atmosphere at an ordinary temperature. Table 1 summarizes the results of the measurement of emission characteristics performed by applying a direct current voltage to the fabricated organic EL device.

Comparative Example 7

For comparison, an organic EL device was fabricated under the same conditions used in Example 57, except that the electron acceptor (Acceptor-1) of the above structural formula and Compound (1-2) of Example 4 were used as the material of the hole transport layer 4 instead of Compound (1-2) of Example 4, and the electron acceptor (Acceptor-1) of the above structural formula and Compound (1-2) of Example 4 were formed in a film thickness of 40 nm by dual vapor deposition at a vapor deposition rate ratio of Acceptor-1/Compound (1-2)=3/97. The characteristics of the thus fabricated organic EL device were measured in the atmosphere at an ordinary temperature. Table 1 summarizes the results of the measurement of emission characteristics performed by applying a direct current voltage to the fabricated organic EL device.

Comparative Example 8

For comparison, an organic EL device was fabricated under the same conditions used in Example 59, except that the electron acceptor (Acceptor-1) of the above structural formula and Compound (1-2) of Example 4 were used as the material of the hole transport layer 4 instead of Compound (1-2) of Example 4, and the electron acceptor (Acceptor-1) of the above structural formula and Compound (1-2) of Example 4 were formed in a film thickness of 40 nm by dual vapor deposition at a vapor deposition rate ratio of Acceptor-1/Compound (1-2)=3/97. The characteristics of the thus fabricated organic EL device were measured in the atmosphere at an ordinary temperature. Table 1 summarizes the results of the measurement of emission characteristics performed by applying a direct current voltage to the fabricated organic EL device.

Table 1 summarizes the results of the measurement of device lifetime performed with organic EL devices fabricated in Examples 52 to 59 and Comparative Examples 1 to 8. The device lifetime was measured as the time elapsed until the emission luminance of 2,000 cd/m$^2$ (initial luminance) at the start of emission was attenuated to 1,900 cd/m$^2$ (corresponding to attenuation to 95% with respect to the initial luminance as 100%, 95% attenuation) when carrying out constant current driving.

TABLE 1

| | Hole injection layer | Hole transport layer | Light emitting layer | Electron transport layer | Voltage [V] (@10 mA/cm$^2$) | Luminance [cd/m$^2$] (@10 mA/cm$^2$) | Current efficiency [cd/A] (@10 mA/cm$^2$) | Power efficiency [lm/W] (@10 mA/cm$^2$) | Device lifetime (Attenuation to 95%) |
|---|---|---|---|---|---|---|---|---|---|
| Ex. 52 | Compound 1-1/ Acceptor-1 | Compound 1-1 | EMD-1/ EMH-1 | Compound 5b-1/ ETM-1 | 3.90 | 657 | 6.57 | 5.30 | 116 h |
| Ex. 53 | Compound 1-1/ Acceptor-1 | Compound 1-1 | EMD-1/ EMH-1 | Compound 6-125/ ETM-1 | 3.87 | 719 | 7.20 | 5.85 | 137 h |
| Ex. 54 | Compound 1-1/ Acceptor-1 | Compound 1-1 | Compound 8-1/ EMH-1 | Compound 5b-1/ ETM-1 | 3.82 | 643 | 6.44 | 5.29 | 117 h |
| Ex. 55 | Compound 1-1/ Acceptor-1 | Compound 1-1 | Compound 8-1/ EMH-1 | Compound 6-125/ ETM-1 | 3.85 | 691 | 6.92 | 5.65 | 135 h |
| Ex. 56 | Compound 1-2/ Acceptor-1 | Compound 1-2 | EMD-1/ EMH-1 | Compound 5b-1/ ETM-1 | 3.93 | 626 | 6.27 | 5.01 | 120 h |
| Ex. 57 | Compound 1-2/ Acceptor-1 | Compound 1-2 | EMD-1/ EMH-1 | Compound 6-125/ ETM-1 | 3.89 | 676 | 6.77 | 5.48 | 142 h |
| Ex. 58 | Compound 1-2/ Acceptor-1 | Compound 1-2 | Compound 8-1/ EMH-1 | Compound 5b-1/ ETM-1 | 3.81 | 606 | 6.06 | 4.99 | 143 h |
| Ex. 59 | Compound 1-2/ Acceptor-1 | Compound 1-2 | Compound 8-1/ EMH-1 | Compound 6-125/ ETM-1 | 3.82 | 662 | 6.63 | 5.45 | 128 h |
| Com. Ex. 1 | HTM-1/ Acceptor-1 | HTM-1 | EMD-1/ EMH-1 | Compound 5b-1/ ETM-1 | 3.86 | 502 | 5.03 | 4.10 | 55 h |
| Com. Ex. 2 | HTM-1/ Acceptor-1 | HTM-1 | EMD-1/ EMH-1 | Compound 6-125/ ETM-1 | 3.84 | 543 | 5.44 | 4.45 | 69 h |
| Com. Ex. 3 | HTM-1/ Acceptor-1 | HTM-1 | Compound 8-1/ EMH-1 | Compound 5b-1/ ETM-1 | 3.75 | 483 | 4.84 | 4.07 | 6 h |
| Com. Ex. 4 | HTM-1/ Acceptor-1 | HTM-1 | Compound 8-1/ EMH-1 | Compound 6-125/ ETM-1 | 3.77 | 520 | 5.21 | 4.35 | 58 h |
| Com. Ex. 5 | Compound 1-1/ Acceptor-1 | Compound 1-1/ Acceptor-1 | EMD-1/ EMH-1 | Compound 6-125/ ETM-1 | 3.84 | 55 | 0.55 | 0.45 | 1 h |
| Com. Ex. 6 | Compound 1-1/ Acceptor-1 | Compound 1-1/ Acceptor-1 | Compound 8-1/ EMH-1 | Compound 6-125/ ETM-1 | 3.86 | 62 | 0.62 | 0.50 | 1 h |
| Com. Ex. 7 | Compound 1-2/ Acceptor-1 | Compound 1-2/ Acceptor-1 | EMD-1/ EMH-1 | Compound 6-125/ ETM-1 | 3.91 | 78 | 0.78 | 0.63 | 1 h |
| Com. Ex. 8 | Compound 1-2/ Acceptor-1 | Compound 1-2/ Acceptor-1 | Compound 8-1/ EMH-1 | Compound 6-125/ ETM-1 | 3.91 | 81 | 0.80 | 0.64 | 1 h |

As shown in Table 1, the luminous efficiency upon passing a current with a current density of 10 mA/cm$^2$ was 0.55 to 0.80 cd/A for the organic EL devices in Comparative Examples 5 to 8 having the hole transport layer that was also doped with an electron acceptor, whereas was a high efficiency of 4.84 to 5.44 cd/A for the organic EL devices in Comparative Examples 1 to 4 having the hole transport layer that was not doped with an electron acceptor. The luminous efficiency was a further higher efficiency of 6.06 to 7.20 cd/A for the organic EL devices in Examples 52 to 59 using the arylamine derivative of the general formula (1) in the hole injection layer. The power efficiency was 0.45 to 0.64 lm/W for the organic EL devices in Comparative Examples 5 to 8 having the hole transport layer that was also doped with an electron acceptor, whereas was a high efficiency of 4.07 to 4.45 lm/W for the organic EL devices in Comparative Examples 1 to 4 having the hole transport layer that was not doped with an electron acceptor. The power efficiency was a further higher efficiency of 4.99 to 5.85 lm/W for the organic EL devices in Examples 52 to 59 using the arylamine compound of the general formula (1) in the hole injection layer. The device lifetime (95% attenuation) was 1 hour for the organic EL devices in Comparative Examples 5 to 8 having the hole transport layer that was also doped with an electron acceptor, whereas was a long lifetime of 6 to 69 hours for the organic EL devices in Comparative Examples 1 to 4 having the hole transport layer that was not doped with an electron acceptor. The device lifetime was 116 to 143 hours, which showed large increase of lifetime, for the organic EL devices in Examples 52 to 59 using the arylamine compound of the general formula (1) in the hole injection layer.

It has been found that in the organic EL devices of the present invention, holes can be efficiently injected and transported from the electrode to the hole transport layer by selecting the particular arylamine compound (having the particular structure) as the material of the hole injection layer, and subjecting to p-type doping with an electron acceptor, and the carrier balance in the organic EL device can be improved to achieve an organic EL device having a higher luminous efficiency and a longer lifetime than the conventional organic EL devices by selecting the particular arylamine compound (having the particular structure) without p-type doping as the material of the hole transport layer.

INDUSTRIAL APPLICABILITY

The organic EL devices of the present invention with the combination of the particular arylamine compound (having the particular structure) and the electron acceptor that achieves excellent carrier balance in the organic EL device has an improved luminous efficiency and an improved durability of the organic EL device, and can be applied, for example, to home electric appliances and illuminations.

DESCRIPTION OF REFERENCE NUMERAL

1 Glass substrate
2 Transparent anode
3 Hole injection layer
4 Hole transport layer
5 Light emitting layer
6 Electron transport layer
7 Electron injection layer
8 Cathode

The invention claimed is:

1. An organic electroluminescent device comprising at least an anode, a hole injection layer, a hole transport layer, a light emitting layer, an electron transport layer, and a cathode, in this order, wherein the hole injection layer includes an arylamine compound represented by the following general formula (1) and an electron acceptor:

[Chemical Formula 1]

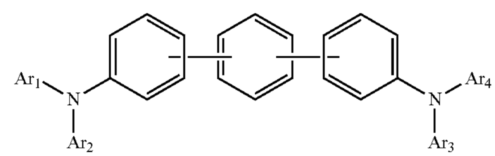

(1)

wherein $Ar_1$ to $Ar_4$ may be the same or different, and represent a substituted or unsubstituted aromatic hydrocarbon group, a substituted or unsubstituted aromatic heterocyclic group, or a substituted or unsubstituted condensed polycyclic aromatic group, and when $Ar_1$ to $Ar_4$ represents a substituted aromatic hydrocarbon group, the substituent is selected from the group consisting of phenyl, biphenylyl, terphenylyl, naphthyl, anthracenyl, phenanthrenyl, fluorenyl, indenyl, pyrenyl, perylenyl, fluoranthenyl, triphenylenyl, pyridyl, pyrimidinyl, triazinyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, naphthyridinyl, phenanthrolinyl, acridinyl, and carbolinyl;

wherein $Ar_1$ and $Ar_2$ are different groups, or $Ar_3$ and $Ar_4$ are different groups, and wherein any one of $Ar_1$ to $Ar_4$ is an unsubstituted phenyl.

2. The organic electroluminescent device according to claim 1, wherein the layers that are adjacent to the light emitting layer do not include an electron acceptor.

3. The organic electroluminescent device according to claim 1, wherein the electron acceptor is an electron acceptor selected from trisbromophenylamine hexachloroantimony, tetracyanoquinodimethane (TCNQ), 2,3,5,6-tetrafluoro-tetracyano-1,4-benzoquinodimethane (F4TCNQ), and a radialene derivative.

4. The organic electroluminescent device according to claim 1, wherein the electron acceptor is a radialene derivative represented by the following general formula (2):

[Chemical Formula 2]

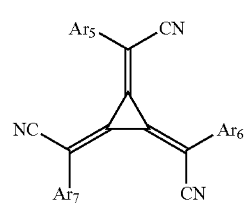

(2)

wherein $Ar_5$ to $Ar_7$ may be the same or different, and represent an aromatic hydrocarbon group, an aromatic heterocyclic group, or a condensed polycyclic aromatic group, having an electron acceptor group as a substituent.

5. The organic electroluminescent device according to claim 1, wherein the hole transport layer includes an arylamine compound having a structure in which two to six triphenylamine structures are joined within a molecule via a single bond or a divalent group that does not contain a heteroatom.

6. The organic electroluminescent device according to claim 5, wherein the arylamine compound having a structure in which two to six triphenylamine structures are joined within a molecule via a single bond or a divalent group that does not contain a heteroatom is an arylamine compound represented by the following general formula (3):

[Chemical Formula 3]

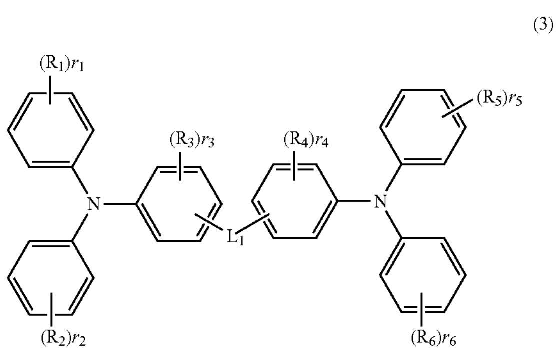

wherein $R_1$ to $R_6$ represent a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy; $r_1$ to $r_6$ may be the same or different, $r_1$, $r_2$, $r_5$, and $r_6$ representing an integer of 0 to 5, and $r_3$ and $r_4$ representing an integer of 0 to 4, where when $r_1$, $r_2$, $r_5$, and $r_6$ are an integer of 2 to 5, or when $r_3$ and $r_4$ are an integer of 2 to 4, $R_1$ to $R_6$, a plurality of which bind to the same benzene ring, may be the same or different and may bind to each other via a single bond, substituted or unsubstituted methylene, an oxygen atom, or a sulfur atom to form a ring; and $L_1$ represents a divalent linking group.

7. The organic EL device according to claim 5, wherein the arylamine compound is an arylamine compound of the following general formula (4):

[Chemical Formula 4]

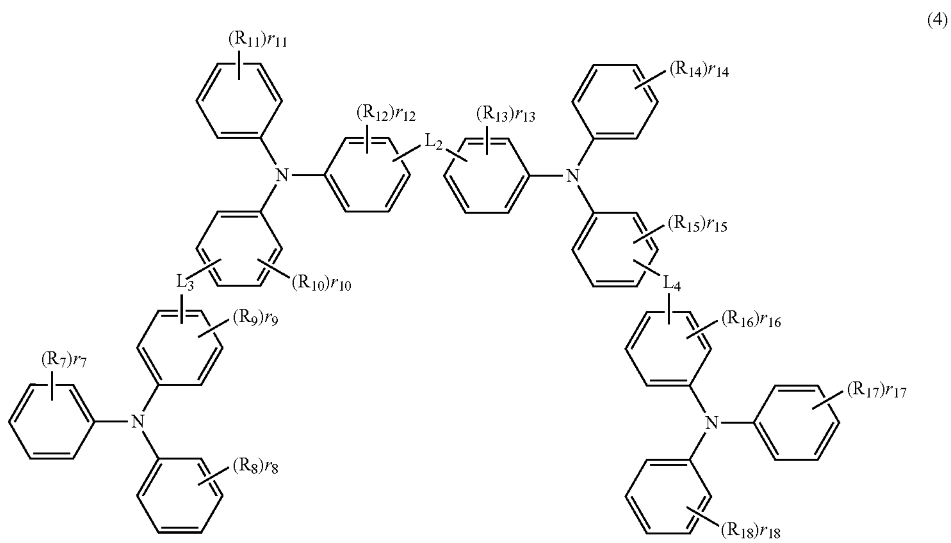

wherein $R_7$ to $R_{18}$ represent a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy; $r_7$ to $r_{18}$ may be the same or different, $r_7$, $r_8$, $r_{11}$, $r_{14}$, $r_{17}$, and $r_{18}$ representing an integer of 0 to 5, and $r_9$, $r_{10}$, $r_{12}$, $r_{13}$, $r_{15}$, and $r_{16}$ representing an integer of 0 to 4 where when $r_7$, $r_8$, $r_{11}$, $r_{14}$, $r_{17}$, and $r_{18}$ are an integer of 2 to 5, or when $r_9$, $r_{10}$, $r_{12}$, $r_{13}$, $r_{15}$, and $r_{16}$ are an integer of 2 to 4, $R_7$ to $R_{18}$, a plurality of which bind to the same benzene ring, may be the same or different and may bind to each other via a single bond, substituted or unsubstituted methylene, an oxygen atom, or a sulfur atom to form a ring; and $L_2$, $L_3$, and $L_4$ may be the same or different, and represent a divalent linking group or a single bond.

8. The organic EL device according to claim 1, wherein the electron transport layer includes a compound represented by the following general formula (5) having an anthracene ring structure:

[Chemical Formula 5]

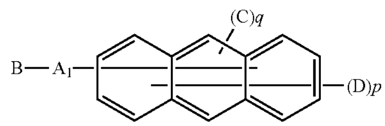
(5)

wherein $A_1$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond; B represents a substituted or unsubstituted aromatic heterocyclic group; C represents a substituted or unsubstituted aromatic hydrocarbon group, a substituted or unsubstituted aromatic heterocyclic group, or a substituted or unsubstituted condensed polycyclic aromatic group; D may be the same or different, and represents a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group; and p represents 7 or 8, and q represents 1 or 2 while maintaining a relationship that a sum of p and q is 9.

9. The organic EL device according to claim 1, wherein the electron transport layer includes a compound represented by the following general formula (6) having a pyrimidine ring structure:

[Chemical Formula 6]

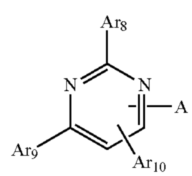
(6)

wherein $Ar_8$ represents a substituted or unsubstituted aromatic hydrocarbon group, a substituted or unsubstituted aromatic heterocyclic group, or a substituted or unsubstituted condensed polycyclic aromatic group; $Ar_9$ and $Ar_{10}$ may be the same or different, and represent a hydrogen atom, a substituted or unsubstituted aromatic hydrocarbon group, a substituted or unsubstituted aromatic heterocyclic group, or a substituted or unsubstituted condensed polycyclic aromatic group; and A represents a monovalent group represented by the following structural formula (7), where $Ar_9$ and $Ar_{10}$ are not simultaneously a hydrogen atom:

[Chemical Formula 7]

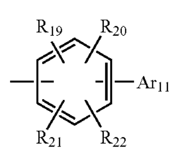
(7)

wherein $Ar_{11}$ represents a substituted or unsubstituted aromatic heterocyclic group; and $R_{19}$ to $R_{22}$ may be the same or different, and represent a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group, where $R_{19}$ to $R_{22}$ may bind to $Ar_{11}$ via a single bond, substituted or unsubstituted methylene, an oxygen atom, or a sulfur atom to form a ring.

10. The organic EL device according to claim 1, wherein the light emitting layer includes a blue light emitting dopant.

11. The organic EL device according to claim 10, wherein the light emitting layer includes a pyrene derivative as the blue light emitting dopant.

12. The organic EL device according to claim 10, wherein the blue light emitting dopant includes a light emitting dopant which is an amine derivative having a condensed ring structure represented by the following general formula (8):

[Chemical Formula 8]

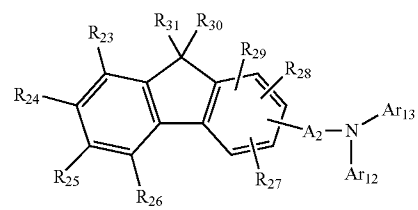
(8)

wherein $A_2$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond; $Ar_{12}$ and $Ar_{13}$ may be the same or different, represent a substituted or unsubstituted aromatic hydrocarbon group, a substituted or unsubstituted aromatic heterocyclic group, or a substituted or unsubstituted condensed polycyclic aromatic group, and may bind to each other via a single bond, substituted or unsubstituted methylene, an oxygen atom, or a sulfur atom to form a ring; $R_{23}$ to $R_{26}$ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, substituted or unsubstituted aryloxy, or a disubstituted amino group substituted by groups selected from an aromatic hydrocarbon group, an aromatic heterocyclic group, and a condensed polycyclic aromatic group, where these groups may bind to each other via a single bond, substituted or unsubstituted methylene, an oxygen atom, or a sulfur atom to form a ring, and may bind to the benzene ring binding to $R_{23}$ to $R_{26}$ via substituted or unsubstituted methylene, an oxygen atom, a sulfur atom, or a monosubstituted amino group to form a ring; $R_{27}$ to $R_{29}$ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy, where these groups may bind to each other via a single bond, substituted or unsubstituted methylene, an oxygen atom, or a sulfur atom to form a ring, and may bind to the benzene ring binding to $R_{27}$ to $R_{29}$ via substituted or unsubstituted methylene, an oxygen atom, a sulfur atom, or a monosubstituted amino group to form a ring; and $R_{30}$ and $R_{31}$ may be the same or different, and represent linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy, where these groups may bind to each other via a single bond, substituted or unsubstituted methylene, an oxygen atom, a sulfur atom, or a monosubstituted amino group to form a ring.

13. The organic EL device according to claim 1, wherein the light emitting layer includes an anthracene derivative.

14. The organic EL device according to claim 13, wherein the light emitting layer includes a host material which is the anthracene derivative.

15. The organic electroluminescent device according to claim 2, wherein the electron acceptor is an electron acceptor selected from trisbromophenylamine hexachloroantimony, tetracyanoquinodimethane (TCNQ), 2,3,5,6-tetrafluoro-tetracyano-1,4-benzoquinodimethane (F4TCNQ), and a radialene derivative.

16. The organic electroluminescent device according to claim 2, wherein the electron acceptor is a radialene derivative represented by the following general formula (2):

[Chemical Formula 2]

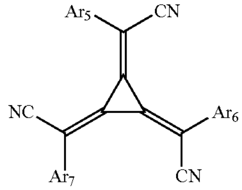

(2)

wherein $Ar_5$ to $Ar_7$ may be the same or different, and represent an aromatic hydrocarbon group, an aromatic heterocyclic group, or a condensed polycyclic aromatic group, having an electron acceptor group as a substituent.

17. The organic electroluminescent device according to claim 2, wherein the hole transport layer includes an arylamine compound having a structure in which two to six triphenylamine structures are joined within a molecule via a single bond or a divalent group that does not contain a heteroatom.

18. The organic EL device according to claim 2, wherein the electron transport layer includes a compound represented by the following general formula (5) having an anthracene ring structure:

[Chemical Formula 5]

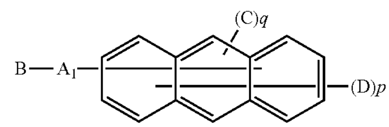

(5)

wherein $A_1$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond; B represents a substituted or unsubstituted aromatic heterocyclic group; C represents a substituted or unsubstituted aromatic hydrocarbon group, a substituted or unsubstituted aromatic heterocyclic group, or a substituted or unsubstituted condensed polycyclic aromatic group; D may be the same or different, and represents a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group; and p represents 7 or 8, and q represents 1 or 2 while maintaining a relationship that a sum of p and q is 9.

19. The organic EL device according to claim 2, wherein the electron transport layer includes a compound represented by the following general formula (6) having a pyrimidine ring structure:

[Chemical Formula 6]

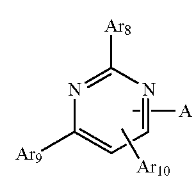

(6)

wherein $Ar_8$ represents a substituted or unsubstituted aromatic hydrocarbon group, a substituted or unsubstituted aromatic heterocyclic group, or a substituted or unsubstituted condensed polycyclic aromatic group; $Ar_9$ and $Ar_{10}$ may be the same or different, and represent a hydrogen atom, a substituted or unsubstituted aromatic hydrocarbon group, a substituted or unsubstituted aromatic heterocyclic group, or a substituted or unsubstituted condensed polycyclic aromatic group; and A represents a monovalent group represented by the following structural formula (7), where $Ar_9$ and $Ar_{10}$ are not simultaneously a hydrogen atom:

[Chemical Formula 7]

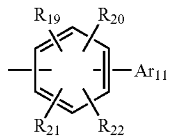

(7)

wherein $Ar_{11}$ represents a substituted or unsubstituted aromatic heterocyclic group; and $R_{19}$ to $R_{22}$ may be the same or different, and represent a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group, where $R_{19}$ to $R_{22}$ may bind to $Ar_{11}$ via a single bond, substituted or unsubstituted methylene, an oxygen atom, or a sulfur atom to form a ring.

20. The organic EL device according to claim 2, wherein the light emitting layer includes a blue light emitting dopant.

* * * * *